(12) United States Patent
Watanabe et al.

(10) Patent No.: US 10,620,537 B2
(45) Date of Patent: Apr. 14, 2020

(54) RESIST UNDERLAYER FILM COMPOSITION, PATTERNING PROCESS, METHOD FOR FORMING RESIST UNDERLAYER FILM, AND COMPOUND FOR RESIST UNDERLAYER FILM COMPOSITION

(71) Applicant: SHIN-ETSU CHEMICAL CO., LTD., Tokyo (JP)

(72) Inventors: Takeru Watanabe, Jyoetsu (JP); Rie Kikuchi, Jyoetsu (JP); Daisuke Kori, Jyoetsu (JP); Yusuke Biyajima, Jyoetsu (JP); Tsutomu Ogihara, Jyoetsu (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 0 days.

(21) Appl. No.: 15/621,482

(22) Filed: Jun. 13, 2017

(65) Prior Publication Data
US 2018/0011405 A1    Jan. 11, 2018

(30) Foreign Application Priority Data

Jul. 7, 2016 (JP) ................................. 2016-134895

(51) Int. Cl.
| | |
|---|---|
| G03F 7/039 | (2006.01) |
| G03F 7/09 | (2006.01) |
| G03F 7/038 | (2006.01) |
| G03F 7/027 | (2006.01) |
| G03F 7/075 | (2006.01) |
| G03F 7/025 | (2006.01) |
| G03F 7/11 | (2006.01) |
| G03F 7/20 | (2006.01) |
| H01L 21/033 | (2006.01) |
| H01L 21/311 | (2006.01) |

(52) U.S. Cl.
CPC ............ *G03F 7/0392* (2013.01); *G03F 7/025* (2013.01); *G03F 7/027* (2013.01); *G03F 7/038* (2013.01); *G03F 7/0397* (2013.01); *G03F 7/0752* (2013.01); *G03F 7/091* (2013.01); *G03F 7/094* (2013.01); *G03F 7/11* (2013.01); *G03F 7/202* (2013.01); *H01L 21/0332* (2013.01); *H01L 21/311* (2013.01); *H01L 21/31144* (2013.01); *H01L 21/31116* (2013.01); *H01L 21/31138* (2013.01)

(58) Field of Classification Search
CPC ...... G03F 7/0392; G03F 7/0752; G03F 7/091; G03F 7/0397; G03F 7/027; G03F 7/038; G03F 7/025; G03F 7/094; G03F 7/11; G03F 7/202; H01L 21/31144; H01L 21/311; H01L 21/0332; C07C 69/618; C07C 69/533; C07C 69/587; C07C 69/609

USPC ................. 430/271.1, 280.1, 285.1
See application file for complete search history.

(56) References Cited

U.S. PATENT DOCUMENTS

| | | | | |
|---|---|---|---|---|
| 4,824,892 A | * | 4/1989 | Eiglmeier | C07C 69/533 252/407 |
| 2002/0106909 A1 | | 8/2002 | Kato et al. | |
| 2005/0255712 A1 | | 11/2005 | Kato et al. | |
| 2007/0078198 A1 | * | 4/2007 | Otsuji | C07C 69/54 523/120 |
| 2007/0231745 A1 | * | 10/2007 | Oohashi | G03F 7/027 430/302 |
| 2008/0318188 A1 | * | 12/2008 | Stansbury | A61K 6/083 433/215 |
| 2009/0274978 A1 | | 11/2009 | Ohashi et al. | |

(Continued)

FOREIGN PATENT DOCUMENTS

| | | |
|---|---|---|
| JP | 2002-334869 A | 11/2002 |
| JP | 2004-205685 A | 7/2004 |

(Continued)

OTHER PUBLICATIONS

English translation of JP-2010-093065 A, published Apr. 22, 2010, the translation was generated Mar. 4, 2018, 36 pages at INPIT website.*
English translation of JP-2015-40224 A, published Mar. 2, 2015, the translation was generated Mar. 4, 2018, 51 pages at INPIT website.*

(Continued)

*Primary Examiner* — Cynthia Hamilton
(74) *Attorney, Agent, or Firm* — Oliff PLC

(57) ABSTRACT

A resist underlayer film composition for use in a multilayer resist method, containing one or more compounds shown by formula (1), and an organic solvent, $$W\text{-}(X)_n \quad (1)$$

W represents an n-valent organic group having 2 to 50 carbon atoms. X represents a monovalent organic group shown by formula (1X). "n" represents an integer of 1 to 10,

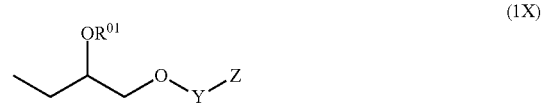

(1X)

The dotted line represents a bonding arm. $R^{01}$ represents an acryloyl or methacryloyl group. Y represents a single bond or a carbonyl group. Z represents a monovalent organic group having 1 to 30 carbon atoms. A resist underlayer film composition can be cured by high energy beam irradiation and form a resist underlayer film having excellent filling and planarizing properties and appropriate etching resistance and optical characteristics in a fine patterning process by a multilayer resist method in the semiconductor apparatus manufacturing process.

25 Claims, 3 Drawing Sheets

(56) References Cited

U.S. PATENT DOCUMENTS

| | | | | |
|---|---|---|---|---|
| 2012/0041102 A1* | 2/2012 | Chun | ............. | C08G 59/1438 |
| | | | | 523/456 |
| 2012/0145971 A1* | 6/2012 | Lee | ............. | G03F 7/0007 |
| | | | | 252/582 |
| 2013/0302990 A1 | 11/2013 | Watanabe et al. | | |
| 2013/0303655 A1* | 11/2013 | Eckert | ............. | A61K 6/083 |
| | | | | 523/116 |
| 2017/0144954 A1* | 5/2017 | Makinoshima | ............. | G03F 7/11 |

FOREIGN PATENT DOCUMENTS

| | | | |
|---|---|---|---|
| JP | 2007-199653 A | | 8/2007 |
| JP | 2009-269953 A | | 11/2009 |
| JP | 2010-078729 A | | 4/2010 |
| JP | 2010-093065 A | * | 4/2010 |
| JP | 5141858 B2 | | 2/2013 |
| JP | 2013-253227 A | | 12/2013 |
| JP | 2015-40224 A | * | 3/2015 |
| WO | 2004/066377 A1 | | 8/2004 |
| WO | WO-2015/168771 A1 | * | 11/2015 |

OTHER PUBLICATIONS

Mc Grath et al "PHoto-curable polymers based upon methacrylates and diemthacrylate contaiing carbazole", Polymer Preprints year 2000, vol. 41, No. 2, pp. 1363-1364. (Year: 2000).*

May 1, 2018 Office Action issued in Korean Patent Application No. 2017-0084625.

* cited by examiner (G)

(H)

(I)

(J)

(K)

RESIST UNDERLAYER FILM COMPOSITION, PATTERNING PROCESS, METHOD FOR FORMING RESIST UNDERLAYER FILM, AND COMPOUND FOR RESIST UNDERLAYER FILM COMPOSITION

BACKGROUND OF THE INVENTION

Field of the Invention

The present invention relates to a resist underlayer film composition used for fine patterning by a multilayer resist method in a semiconductor apparatus manufacturing process, a patterning process and a method for forming a resist underlayer film using the resist underlayer film composition, and a compound useful for the resist underlayer film composition.

Description of the Related Art

As Large-Scale Integrated circuits (LSIs) advance toward high integration and high processing speed, miniaturization of pattern size is progressing rapidly. Along with the miniaturization, lithography technology has achieved a fine patterning by shortening wavelength of a light source and selecting an appropriate resist composition accordingly. The composition mainly used is a positive photoresist composition for monolayer. The monolayer positive photoresist composition contains a resist resin that has a skeleton having etching resistance to dry etching with chlorine- or fluorine-based gas plasma, and provides a switching mechanism that makes an exposed part soluble, thereby dissolving the exposed part to form a pattern and processing a substrate to be processed by dry etching using the remaining resist pattern as an etching mask.

However, when the pattern becomes finer, that is, the pattern width is reduced without changing the thickness of the photoresist film to be used, resolution performance of the photoresist film is lowered. In addition, pattern development of the photoresist film using a developer excessively increases a so-called aspect ratio of the pattern, resulting in pattern collapse. Therefore, the photoresist film has been thinned along with the miniaturization of the pattern.

On the other hand, a substrate to be processed has been generally processed by dry etching using a pattern-formed photoresist film as an etching mask. In practice, however, there is no dry etching method capable of providing an absolute etching selectivity between the photoresist film and the substrate to be processed. The resist film is thus damaged and collapses during processing the substrate, and the resist pattern cannot be accurately transferred to the substrate to be processed. Accordingly, higher dry etching resistance has been required in a photoresist composition along with the miniaturization of the pattern. In the meantime, a resin used for the photoresist composition has required to have low absorption at exposure wavelength in order to improve the resolution. The resin used for the photoresist composition thus shifts to a novolak resin, polyhydroxystyrene, and a resin having an aliphatic polycyclic skeleton as the exposure light shifts from i-line to KrF and ArF, which have shorter wavelength. This shift actually accelerates an etching rate under dry etching conditions for processing the substrate, and recent photoresist compositions having high resolution tend to have lower etching resistance.

Thus, the substrate to be processed has to be dry etched with a thinner photoresist film having lower etching resistance. A need to provide a composition used in this process and the process itself has become urgent.

A multilayer resist method is one of solutions for these problems. This method is as follows: a middle layer film having a different etching selectivity from a photoresist film (i.e., a resist upper layer film) is placed between the resist upper layer film and a substrate to be processed; a pattern is formed in the resist upper layer film; the pattern is transferred to the middle layer film by dry etching using the resist upper layer film pattern as a dry etching mask; the pattern is further transferred to the substrate to be processed by dry etching using the middle layer film as a dry etching mask.

One of the multilayer resist methods is a 3-layer resist method, which can be employed with a typical resist composition used in the monolayer resist method. For example, this 3-layer resist method includes the following steps: forming an organic film containing a novolak resin or the like as a resist underlayer film on a substrate to be processed; forming a silicon-containing film thereon as a resist middle layer film; forming a usual organic photoresist film thereon as a resist upper layer film. Since the organic resist upper layer film exhibits an excellent etching selectivity ratio relative to the silicon-containing resist middle layer film when dry etching is performed with fluorine-based gas plasma, the resist upper layer film pattern can be transferred to the silicon-containing resist middle layer film by dry etching with fluorine-based gas plasma. This method allows the pattern to be transferred to the silicon-containing film (the resist middle layer film) even using a resist composition that is difficult to form a pattern having a sufficient film thickness for directly processing the substrate to be processed or a resist composition that has insufficient dry etching resistance for processing the substrate. Then, dry etching with oxygen-based gas plasma or hydrogen-based gas plasma allows the pattern to be transferred to the organic film (the resist underlayer film) containing a novolak resin or the like, which has a sufficient dry etching resistance for processing the substrate. As to the resist underlayer film, many materials are already known as disclosed in Patent Document 1.

On the other hand, in recent years, many studies are made on a semiconductor apparatus having a novel structure such as a multi-gate structure. Accordingly, there is a growing need for a resist underlayer film having more excellent filling and planarizing properties than conventional one. For example, when a substrate to be processed used as a base has a fine pattern structure such as holes, trenches, and fins, gap-filling property is required to fill the gap of the pattern with a resist underlayer film without voids. In addition, when the substrate to be processed used as a base has a step or when both of a pattern-dense portion and a no-pattern region exist in one wafer, the film surface needs to be plagiarized by a resist underlayer film. By planarizing the surface of the underlayer film, fluctuation in film thickness of a resist middle layer film and a resist upper layer film formed thereon cam be controlled, and the reduction of a focus margin in lithography or a margin in a subsequent step of processing the substrate can be controlled.

The organic film composition excellent in filling and planarizing properties is not limited to a material of the underlayer film for multilayer resist. This composition can also be widely used as a planarizing material for manufacturing a semiconductor apparatus, e.g., for planarizing a substrate prior to patterning by nanoimprinting. For global planarizing in the semiconductor apparatus manufacturing process, a chemical mechanical polishing (CMP) process is now generally used. However, the CMP process is costly, so that the organic film composition excellent in filling and planarizing properties is also expected to be used for the global planarizing method, instead of CMP.

To form a planarizing film for planarizing an uneven semiconductor substrate, there is proposed a resist underlayer film composition that can be cured by irradiation with an electron beam (Patent Document 2). However, this resist underlayer film composition has insufficient planarizing property for demands in cutting-edge devices and low etching resistance, and also has difficulty in optical characteristics. Moreover, there is a recent need of a resist underlayer film composition that can be cured by irradiation with an excimer lamp, which can be easily introduced in the semiconductor apparatus manufacturing process.

PRIOR ART DOCUMENTS

Patent Documents

Patent Document 1: Japanese Unexamined Patent Application Publication No. 2004-205685
Patent Document 2: Japanese Patent No. 5141358

SUMMARY OF THE INVENTION

The present invention has been accomplished in view of the above circumstances, and an object thereof is to provide: a resist underlayer film composition that can be cured by irradiation with a high energy beam and can form a resist underlayer film having excellent filling and planarizing properties as well as appropriate etching resistance and optical characteristics in a fine patterning process by a multilayer resist method in the semiconductor apparatus manufacturing process; a patterning process and a method for forming a resist underlayer film using the resist underlayer film composition; and a novel compound useful for the resist underlayer film composition.

To achieve this object, the present invention provides a resist underlayer film composition for use in a multilayer resist method, comprising:
(A) one or more than one compound shown by the following general formula (1); and
(B) an organic solvent,

wherein W represents an n-valent organic group having 2 to 50 carbon atoms; X represents a monovalent organic group shown by the following general formula (1X); and "n" represents an integer of 1 to 10,

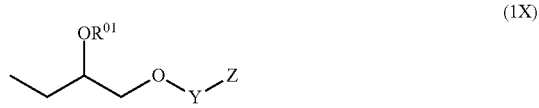

wherein the dotted line represents a bonding arm; $R^{01}$ represents an acryloyl group or a methacryloyl group; Y represents a single bond or a carbonyl group; and Z represents a monovalent organic group having 1 to 30 carbon atoms.

The resist underlayer film composition containing such a compound can be cured by high energy beam irradiation and can form a resist underlayer film having excellent filling and planarizing properties as well as appropriate etching resistance and optical characteristics in a fine patterning process by a multilayer resist method in the semiconductor apparatus manufacturing process.

Additionally, Z in the general formula (1X) is preferably a group shown by the following general formula (1Z),

wherein the dotted line represents a bonding arm; $Z^1$ represents an (m+1)-valent aromatic group having 6 to 20 carbon atoms; and "m" represents an integer of 1 to 5.

The resist underlayer film composition containing such a compound can improve curability by high energy beam irradiation, and reduce film shrinkage during curing, thus controlling deterioration of planarity due to the shrinkage. This allows formation of a resist underlayer film having high planarity.

Alternatively, it is preferred that in the general formula (1X), Z is a group shown by the following general formula (2Z), and Y is a carbonyl group,

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

The resist underlayer film composition containing such a compound can improve curability by high energy beam irradiation, and can control in-plane variation of film thickness in some cases, thus controlling deterioration of planarity due to the variation. This allows formation of a resist underlayer film having high planarity.

Additionally, it is preferred that in the component (A), "n" in the general formula (1) is an integer of 2 to 10, and the component (A) has an aromatic part in an amount of 20 mass % or more.

The resist underlayer film composition containing such component (A) has excellent curing efficiency at high energy beam irradiation, and can form a resist underlayer film having excellent etching resistance.

Additionally, the compound shown by the general formula (1) is preferably contained in an amount of 20 mass % or more with respect to a total amount of a solid contained in the resist underlayer film composition.

Such a resist underlayer film composition has excellent curing efficiency at high energy beam irradiation, and can form a resist underlayer film having excellent planarizing property.

Additionally, the compound shown by the general formula (1) preferably comprises a compound shown by any one of the following general formulae (2-1) to (2-68),

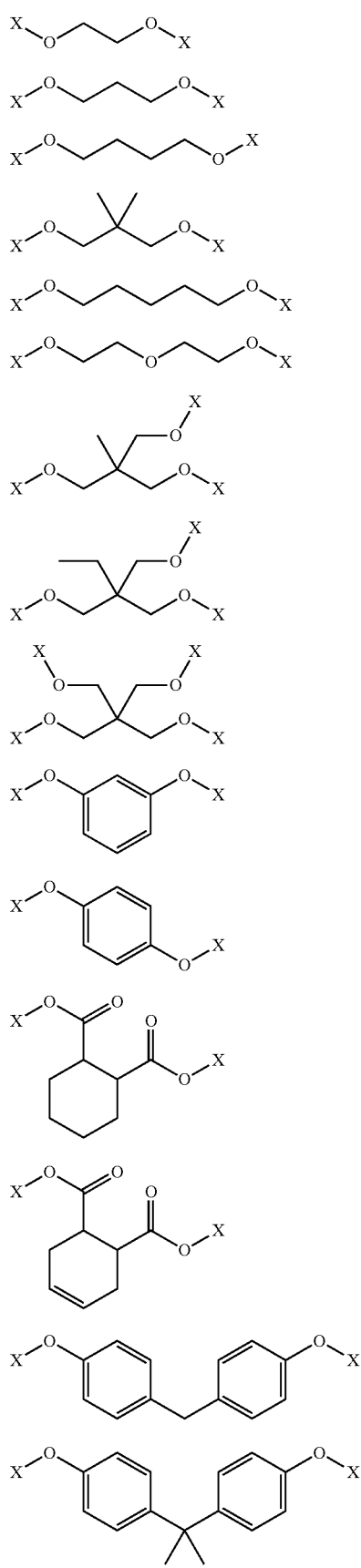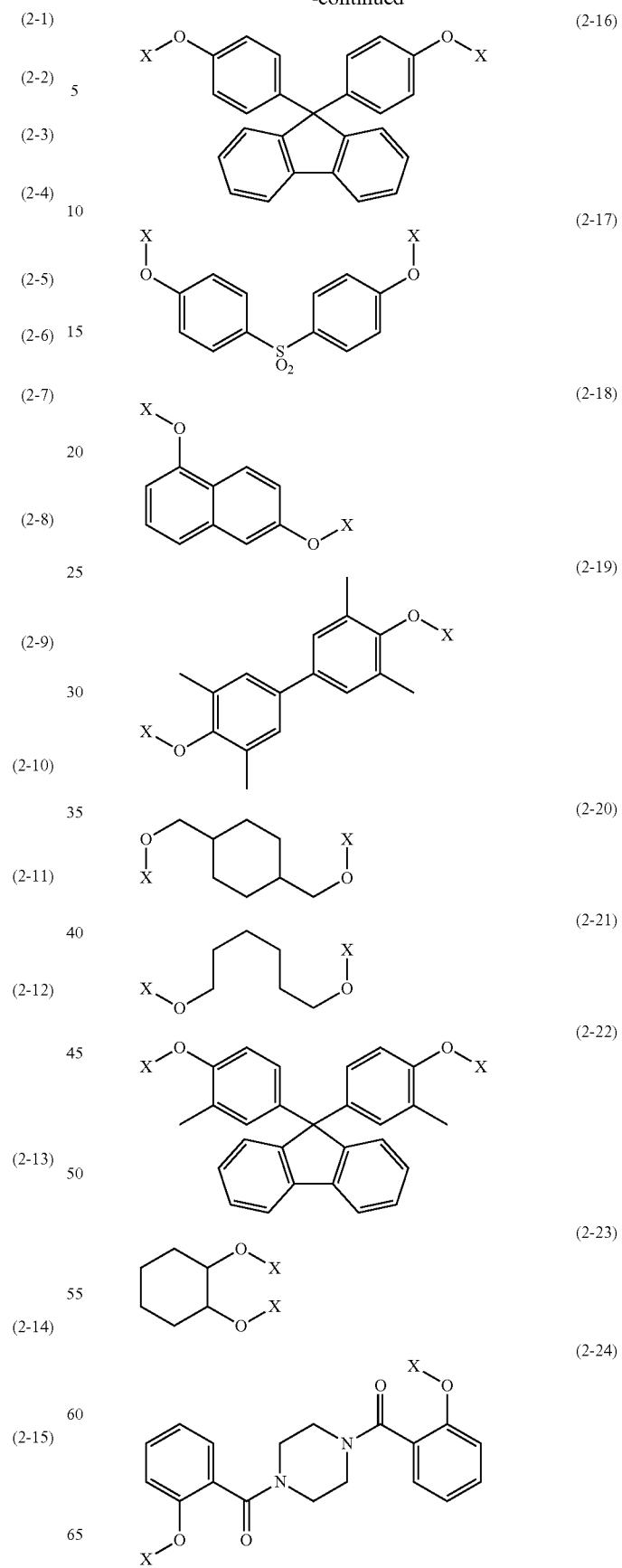

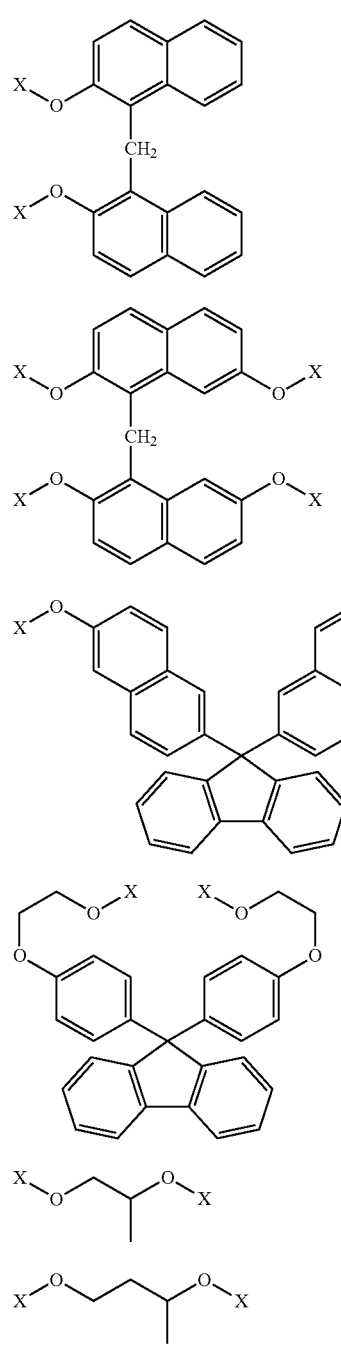
(2-25)
(2-26)
(2-27)
(2-28)
(2-29)
(2-30)
(2-31)
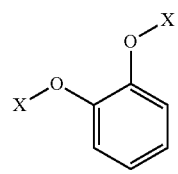
(2-32)
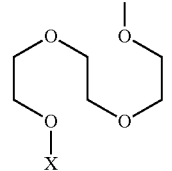
(2-33)
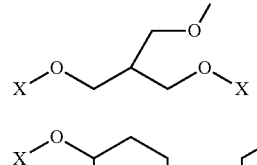
(2-34)
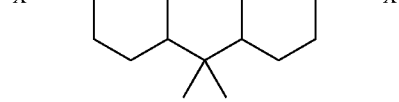
(2-35)
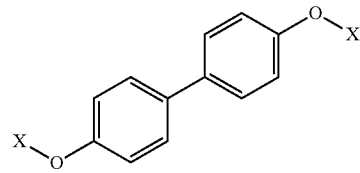
(2-36)
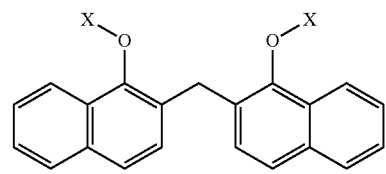
(2-37)
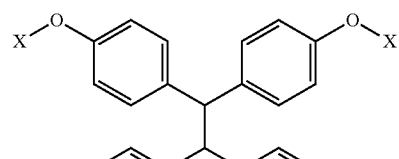
(2-38)
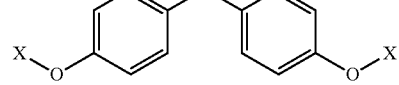
(2-39)
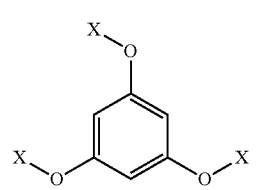

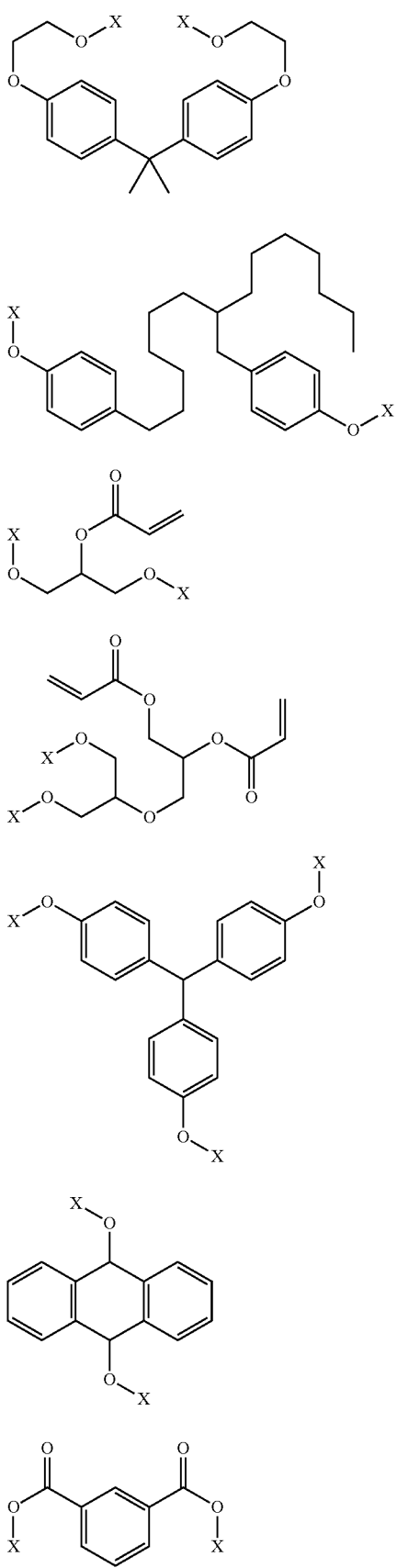
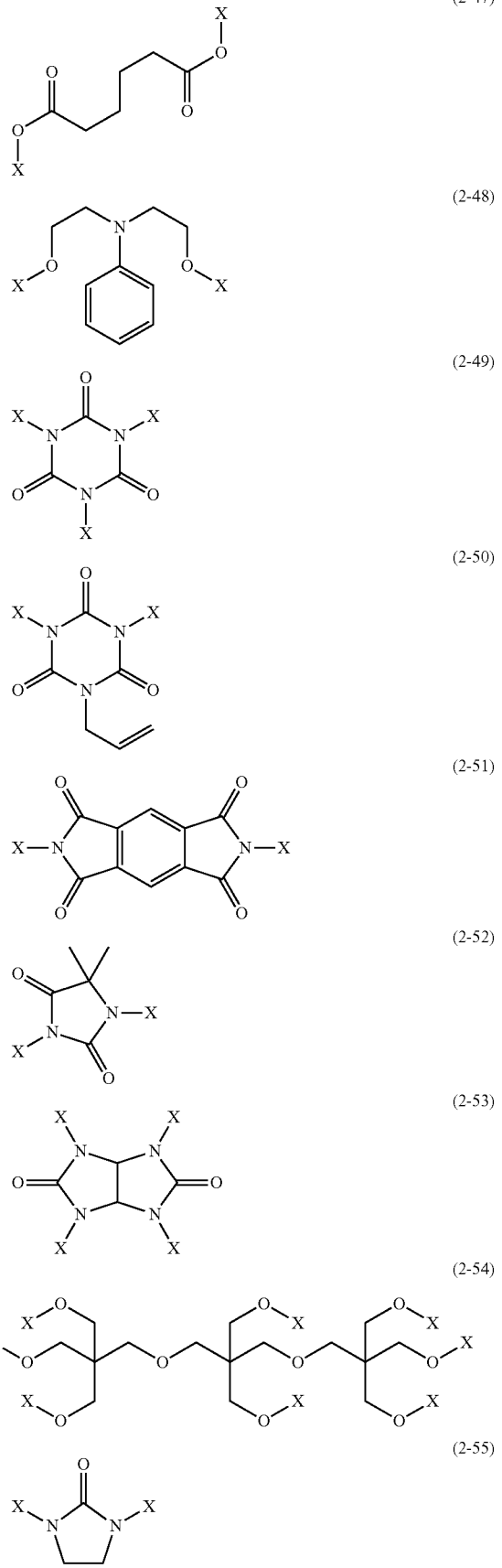

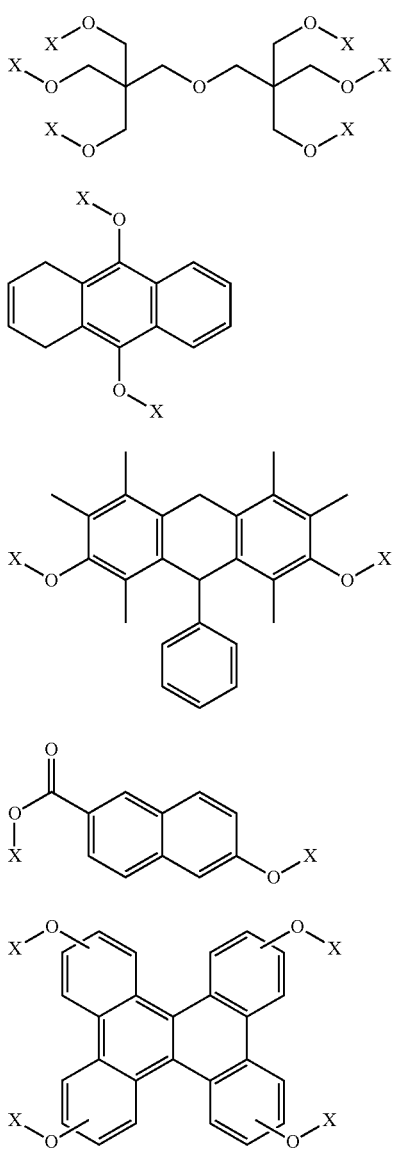
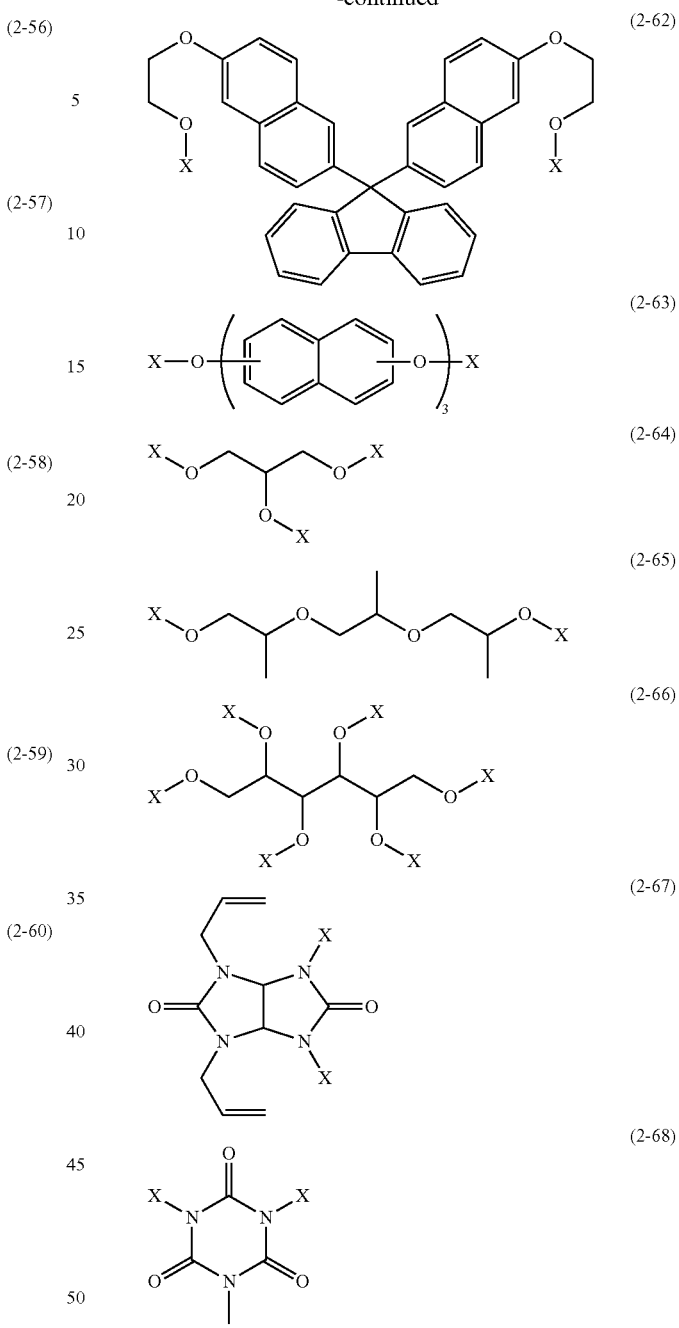
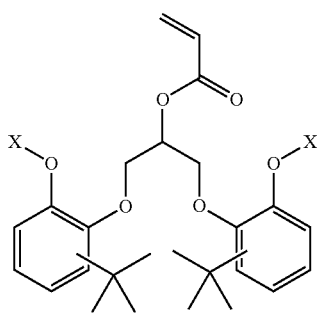

wherein X is as defined above.

The resist underlayer film composition containing such a compound enables a cured film having excellent filling and planarizing properties to be formed by high energy beam irradiation. In particular, this resist underlayer film composition can be easily produced.

The compound shown by the general formula (1) preferably has a minimum complex viscosity of 10 Pa·s or less when the complex viscosity is measured within a range of 50° C. to 300° C.

The resist underlayer film composition containing such a compound can form a resist underlayer film having high filling and planarizing properties.

Additionally, the compound shown by the general formula (1) preferably has a complex viscosity of 1,000 Pa·s or less at 100° C.

The resist underlayer film composition containing such a compound enables a resist underlayer film formed from the composition by high energy beam irradiation to have better planarity.

The resist underlayer film composition may further comprise:

(A') a compound shown by the following general formula (3), $$W\text{-}(X^2)_n \quad (3)$$

wherein W and "n" are as defined above, $X^2$ represents a monovalent organic group shown by the following general formula (3X),

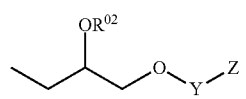
(3X)

wherein the dotted line represents a bonding arm; Y and Z are as defined above; $R^{02}$ represents an acryloyl group, a methacryloyl group, or a hydrogen atom, provided that at least a part of $R^{02}$ is a hydrogen atom.

Additionally, Z in the general formula (3X) is preferably a group shown by the following general formula (1Z),

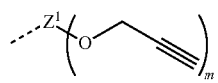
(1Z)

wherein the dotted line represents a bonding arm; $Z^1$ represents an (m+1)-valent aromatic group having 6 to 20 carbon atoms; and "m" represents an integer of 1 to 5.

Alternatively, it is preferred that in the general formula (3X), Z is a group shown by the following general formula (2Z), and Y is a carbonyl group,

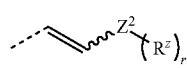
(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

Additionally, the compound shown by the general formula (3) preferably comprises a compound shown by any one of the following general formulae (4-1) to (4-68),

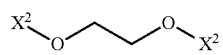
(4-1)

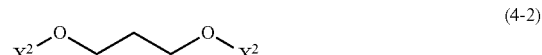
(4-2)

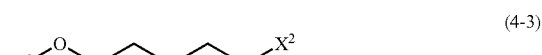
(4-3)

(4-4)

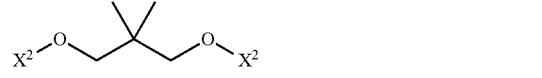
(4-5)

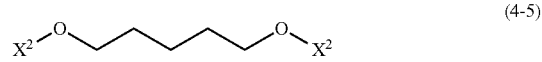
(4-6)

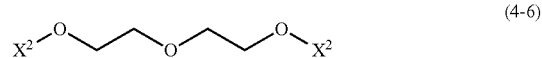
(4-7)

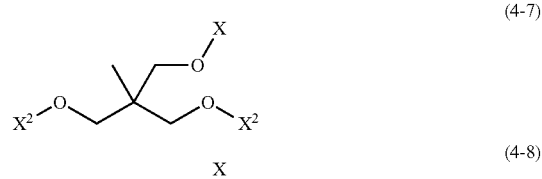
(4-8)

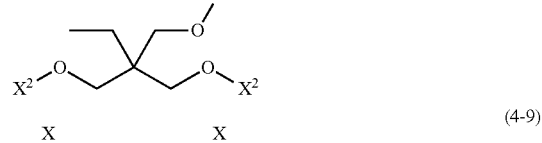
(4-9)

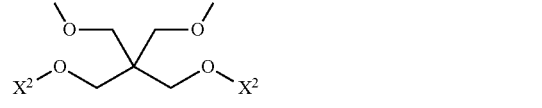
(4-10)

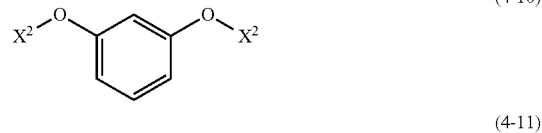
(4-11)

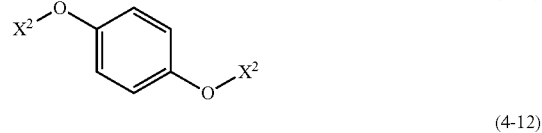
(4-12)

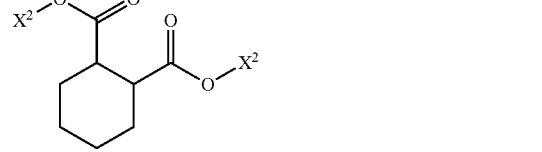
(4-13)

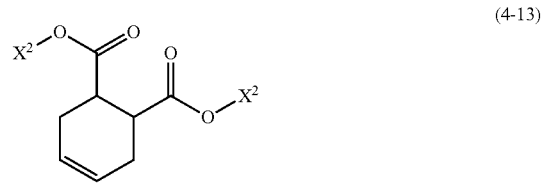
(4-14)

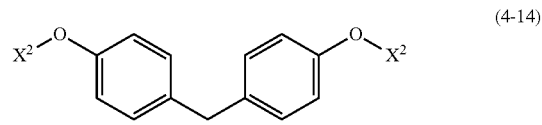
(4-15)

-continued
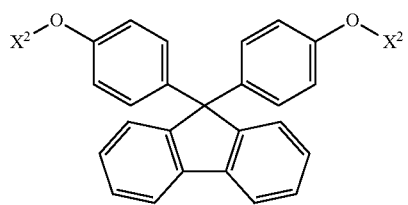 (4-16)
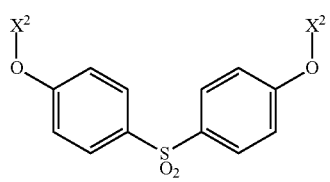 (4-17)
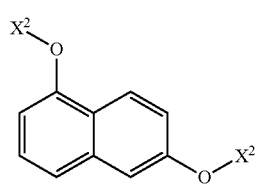 (4-18)
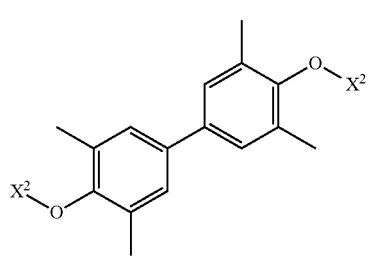 (4-19)
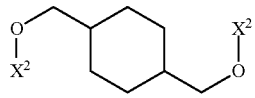 (4-20)
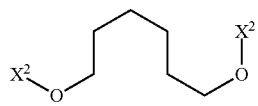 (4-21)
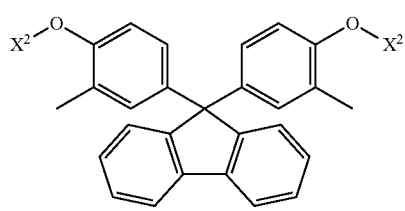 (4-22)
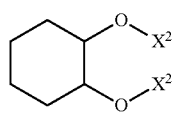 (4-23)
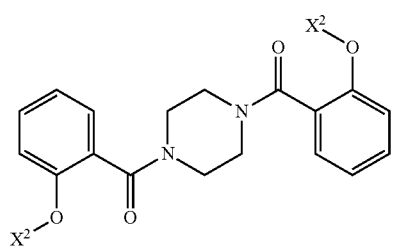 (4-24)
-continued
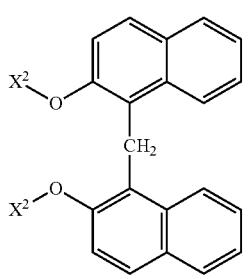 (4-25)
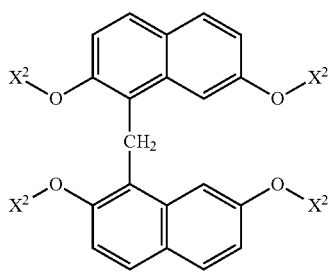 (4-26)
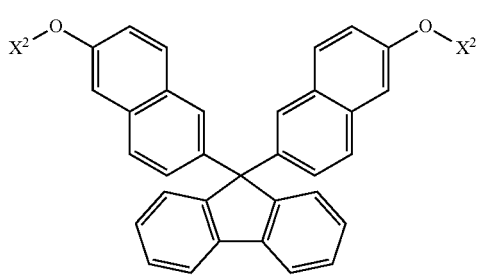 (4-27)
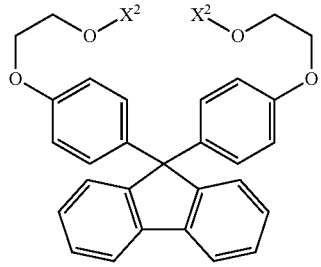 (4-28)
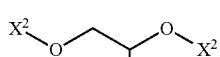 (4-29)
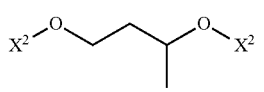 (4-30)
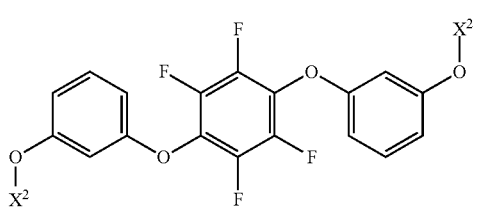 (4-31)

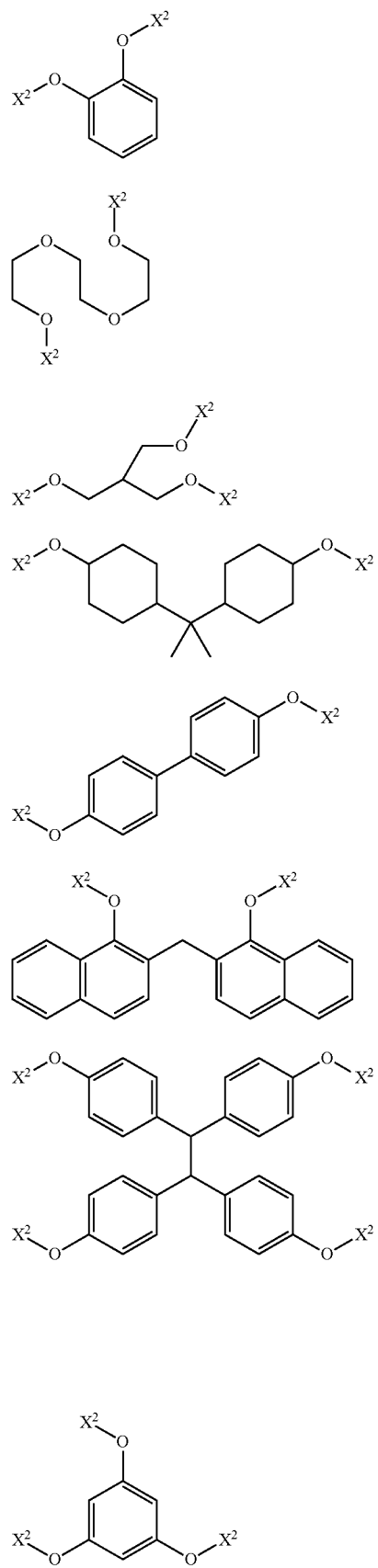
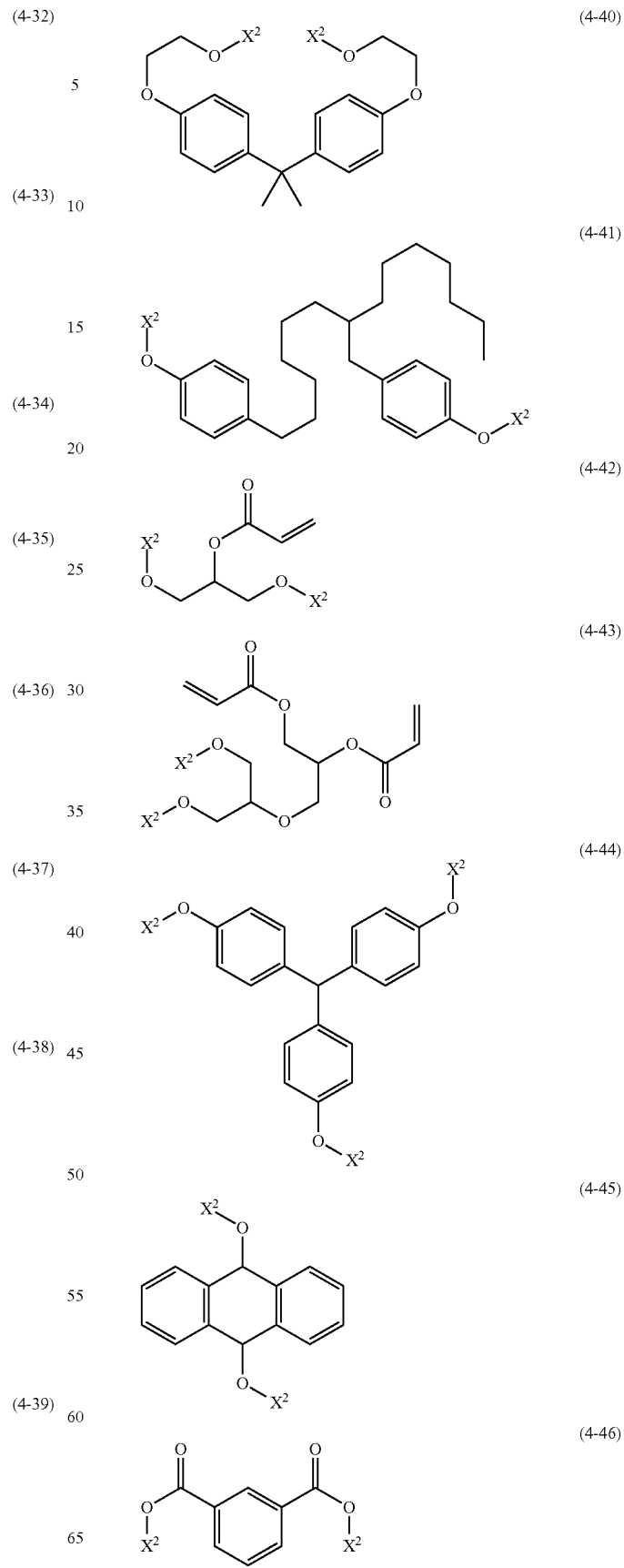

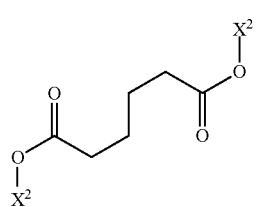 (4-47)
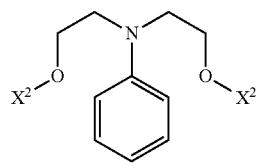 (4-48)
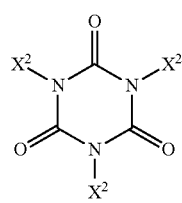 (4-49)
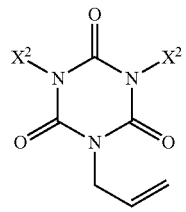 (4-50)
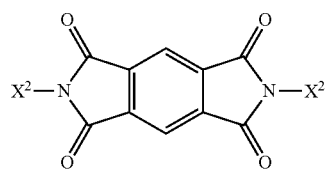 (4-51)
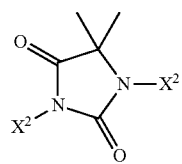 (4-52)
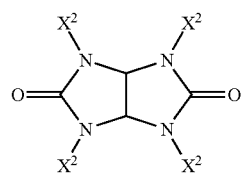 (4-53)
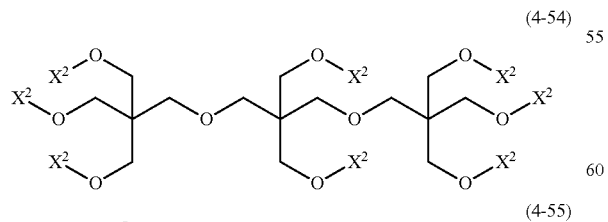 (4-54)
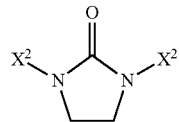 (4-55)
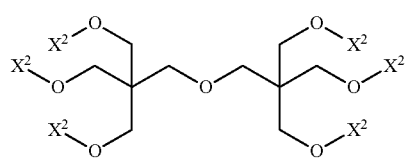 (4-56)
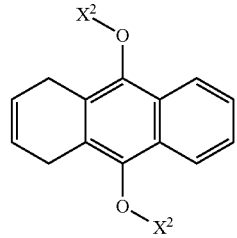 (4-57)
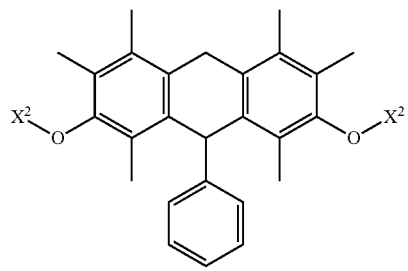 (4-58)
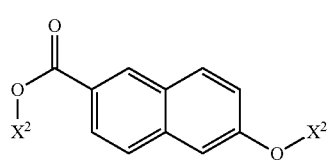 (4-59)
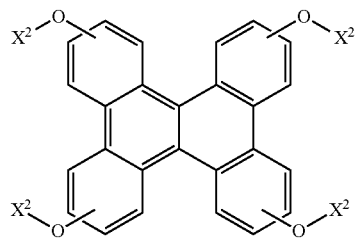 (4-60)
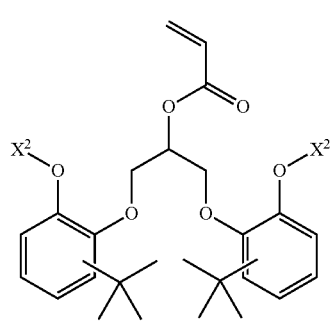 (4-61)

-continued (4-62)
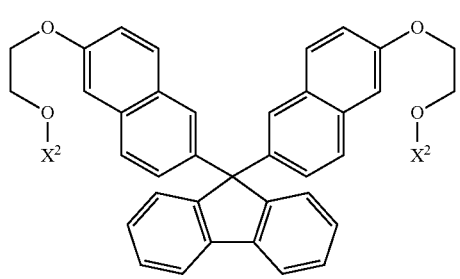

(4-63)
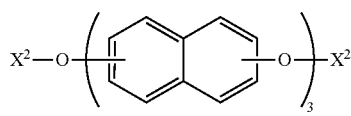

(4-64)
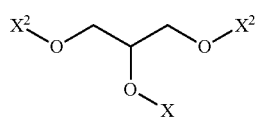

(4-65)
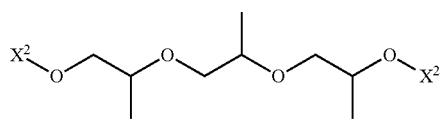

(4-66)
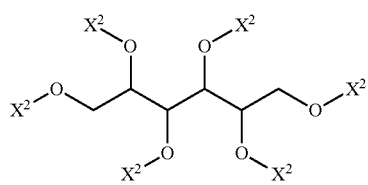

(4-67)
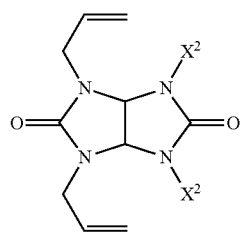

(4-68)
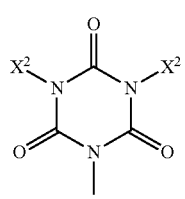

wherein $X^2$ is as defined above.

Thus, the inventive resist underlayer film composition may contain the compound shown by the general formula (3) (i.e., a compound corresponding to component (A) in which a part of $R^{01}$ in X is a hydrogen atom). The compound in which a part of $R^{01}$ is a hydrogen atom enables the inventive resist underlayer film composition to have excellent coating property and then film-forming property when it is applied on a substrate.

Additionally, (B) the organic solvent is preferably a mixture of one or more organic solvents having a boiling point of lower than 180° C. and one or more organic solvents having a boiling point, of 180° C. or higher.

Such a resist underlayer film composition can prolong time for evaporating most solvents and lowering flowability of the composition that is applied and baked to form a film. As a result, a resist underlayer film having higher filling and planarizing properties can be formed.

Additionally, the resist underlayer film composition preferably further comprises:

(C) a liquid polyfunctional acrylate compound having a boiling point of 200° C. or higher.

The resist underlayer film composition containing such a compound enables formation of a resist underlayer film having high filling and planarizing properties, regardless of design of a substrate to be processed, such as pattern density.

Additionally, the component (C) is preferably a polyacrylate of an acyclic polyol.

The resist underlayer film composition containing such component (C) enables a resist underlayer film formed from the composition by high energy beam irradiation to have better planarity, regardless of design of a substrate to be processed, such as pattern density.

Additionally, the resist underlayer film composition may further comprise one or more of (D) an acid generator, (E) a surfactant, (F) a crosslinking agent, (G) a plasticizer, (H) a colorant, (I) a photo-polymerization initiator, (J) a sensitizer, or (K) a stabilizer.

To the inventive resist underlayer film composition may be added (D) an acid generator for enhancing curing, (E) a surfactant for improving coating property by spin coating, (F) a crosslinking agent for further promoting crosslinking curing reaction, (G) a plasticizer for further improving filling and planarizing properties, (H) a colorant for adjusting absolution property (optical characteristics), (I) a photo-polymerization initiator or (J) a sensitizer for promoting photo-curing, or (K) a stabilizer for improving preservation stability. The presence/absence or selection of these additives allows fine adjustment of properties required by customers, such as film-forming property, curability, filling and planarizing properties, optical characteristics, and preservation stability, providing a practically preferable resist underlayer film composition.

Furthermore, the present invention provides a patterning process for forming a pattern in a substrate to be processed, the patterning process comprising the steps of:

(I-1) applying the above resist underlayer film composition on at substrate to be processed, and irradiating the composition with a high energy beam to form a resist underlayer film;

(I-2) forming a resist upper layer film on the resist underlayer film by using a resist upper layer film material composed of a photoresist composition;

(I-3) subjecting the resist upper layer film to pattern exposure and development with a developer to form a pattern in the resist upper layer film; and (I-4) transferring the pattern to the resist underlayer film by dry etching using the resist upper layer film having the formed pattern as a mask.

Furthermore, the present invention provides a patterning process for forming a pattern in a substrate to be processed, the patterning process comprising the steps of:

(II-1) applying the above resist underlayer film composition on a substrate to be processed and irradiating the composition with a high energy beam to form a resist underlayer film;

(II-2) forming a resist middle layer film on the resist underlayer film;

(II-3) forming a resist upper layer film on the resist middle layer film by using a resist upper layer film material composed of a photoresist composition;

(II-4) subjecting the resist upper layer film to pattern exposure and development with a developer to form a pattern in the resist upper layer film;

(II-5) transferring the pattern to the resist middle layer film by dry etching using the resist upper layer film having the formed pattern as a mask; and (II-6) transferring the pattern to the resist underlayer film by dry etching using the resist middle layer film having the transferred pattern as a mask.

Furthermore, the present invention provides a patterning process for forming a pattern in a substrate to be processed, the patterning process comprising the steps of:

(III-1) applying the above resist, underlayer film composition on a substrate to be processed and irradiating the composition with a high energy beam to form a resist underlayer film;

(III-2) forming an inorganic hard mask intermediate film selected from a silicon oxide film, a silicon nitride film, or a silicon oxynitride film on the resist underlayer film;

(III-3) forming an organic anti-reflective film on the inorganic hard mask intermediate film;

(III-4) forming a resist upper layer film on the organic anti-reflective film by using a resist upper layer film material composed of a photoresist composition;

(III-5) subjecting the resist upper layer film to pattern exposure and development with at developer to form a pattern in the resist upper layer film;

(III-6) transferring the pattern to the organic anti-reflective film and the inorganic hard mask intermediate film by dry etching using the resist upper layer film having the formed pattern as a mask; and (III-7) transferring the pattern to the resist underlayer film by dry etching using the inorganic hard mask intermediate film having the transferred pattern as a mask.

In this manner, the inventive resist underlayer film composition can suitably be used in various patterning processes such as 2-layer resist process, 3-layer resist process using a resist middle layer film, and 4-layer resist process additionally using an organic anti-reflective film. These patterning processes enable reduction of a step of a substrate to be processed by forming the resist underlayer film, and thus are suitable for photolithography of a resist upper layer film.

Additionally, the resist underlayer film may be formed by applying the resist underlayer film composition on the substrate to be processed, performing a heat treatment at 50° C. to 300° C. for 10 to 600 seconds, and then irradiating the composition with the high energy beam.

Such a process accelerates crosslinking reaction when the resist underlayer film is formed, thus highly suppressing mixing with the upper layer film. Moreover, appropriate adjustment of the heat treatment temperature and time in the above ranges allows the resist underlayer film to have filling, planarizing, and curing properties suitable for use.

Alternatively, the resist underlayer film may be formed by applying the resist underlayer film composition on the substrate to be processed, and irradiating the composition with the high energy beam without a heat treatment.

Such a process can prevent deterioration of planarity of the resist underlayer film due to thermal shrinkage when the resist underlayer film is formed.

Additionally, the substrate to be processed may be a substrate having a structure or a step with a height of 30 nm or more.

The inventive patterning process, which uses the inventive resist underlayer film composition that can form a resist underlayer film having high filling and planarizing properties, is especially useful for fine patterning of a substrate having such a structure or a step.

Additionally, a light source of the high energy beam may be a xenon excimer lamp.

The xenon excimer lamp, which can be easily incorporated to the semiconductor apparatus manufacturing process, can be used as the light source of the high energy beam for curing. That is, the inventive patterning process is industrially valuable.

Furthermore, the present invention provides a method for forming a resist underlayer film, the method comprising:

applying the above resist underlayer film composition on a substrate to be processed;

subjecting the resist underlayer film composition to a heat treatment at 50° C. to 300° C. for 10 to 600 seconds; and then irradiating the composition with a high energy beam to form a cured film.

This method includes a heat treatment to evaporate the solvent and cause the resist underlayer film composition to flow by heating, which enables adjustment of filling and planarizing properties of the resist underlayer film.

Furthermore, the present invention provides a method for forming a resist underlayer film, the method comprising:

applying the above resist underlayer film composition on a substrate to be processed; and irradiating the composition with a high energy beam to form a cured film without a heat treatment.

This method can prevent deterioration of planarity due to thermal shrinkage by irradiating with a high energy beam without a heat treatment.

In this method, the substrate to be processed may be a substrate having a structure or a step with a height of 30 nm or more.

The inventive method for forming a resist underlayer film, which uses the inventive resist underlayer film composition that can form a resist underlayer film having high filling and planarizing properties, is especially useful for forming a resist underlayer film on a substrate having such a structure or a step.

Additionally, a light source of the high energy beam may be a xenon excimer lamp.

Thus, the xenon excimer lamp, which can be easily incorporated to the semiconductor apparatus manufacturing process, can be used as the light source of the high energy beam for curing.

Furthermore, the present invention provides a compound for a resist underlayer film composition, shown by the following general formula (1),

wherein W represents an n-valent organic group having 2 to 50 carbon atoms; X represents a monovalent organic group shown by the following general formula (1X); and "n" represents an integer of 1 to 10,

wherein the dotted line represents a bonding arm; $R^{01}$ represents an acryloyl group or a methacryloyl group; Y represents a single bond or a carbonyl group; and Z represents a group shown by the following general formula (1Z),

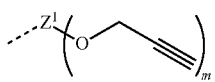

(1Z)

wherein the dotted line represents a bonding arm; $Z^1$ represents an (m+1)-valent aromatic group having 6 to 20 carbon atoms; and "m" represents an integer of 1 to 5.

Such a compound enables a resist underlayer film composition mainly containing this compound to have curability by high energy beam irradiation, excellent filling and planarizing properties, and sufficient etching rate, and is especially useful for the resist underlayer film composition, the patterning process, and the method for forming a resist underlayer film of the present invention. In addition, various properties can be optimized as required by customers, by appropriately adjusting W, $R^{01}$, Y, $Z^1$, "n", and "m" in the above ranges.

Additionally, the compound shown by the general formula (1) preferably comprises a compound shown by any one of the following general formulae (2-1) to (2-68),

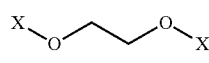 (2-1)

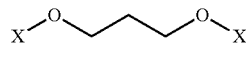 (2-2)

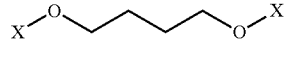 (2-3)

 (2-4)

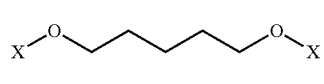 (2-5)

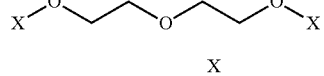 (2-6)

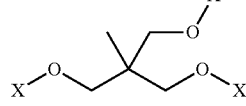 (2-7)

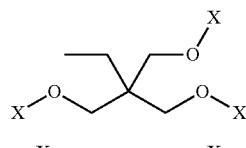 (2-8)

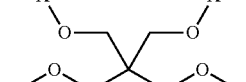 (2-9)

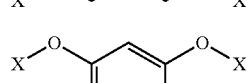 (2-10)

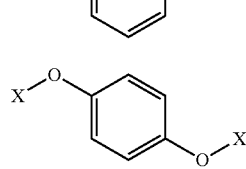 (2-11)

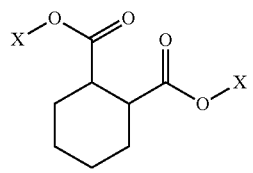 (2-12)

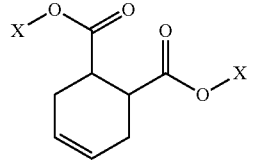 (2-13)

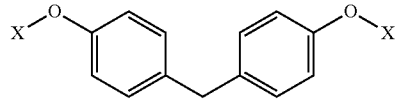 (2-14)

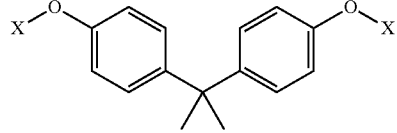 (2-15)

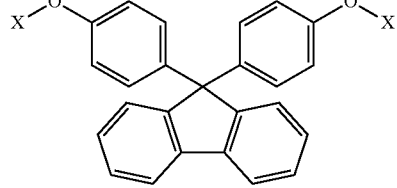 (2-16)

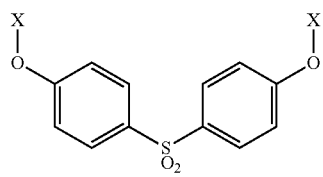 (2-17)

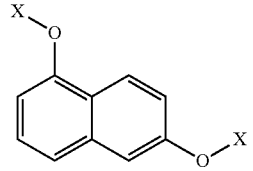 (2-18)

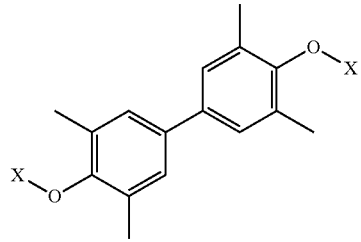 (2-19)

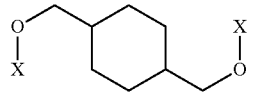 (2-20)

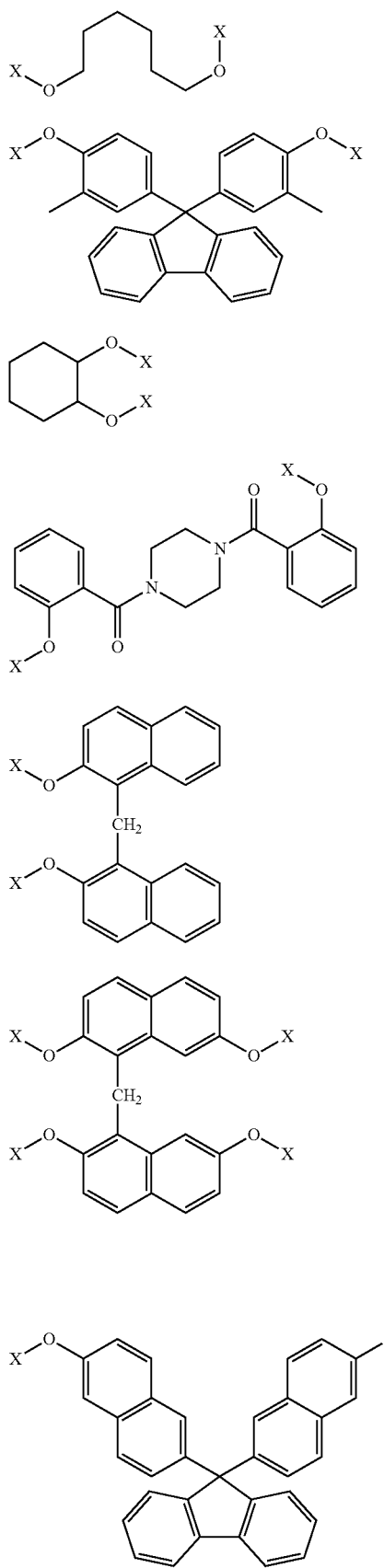
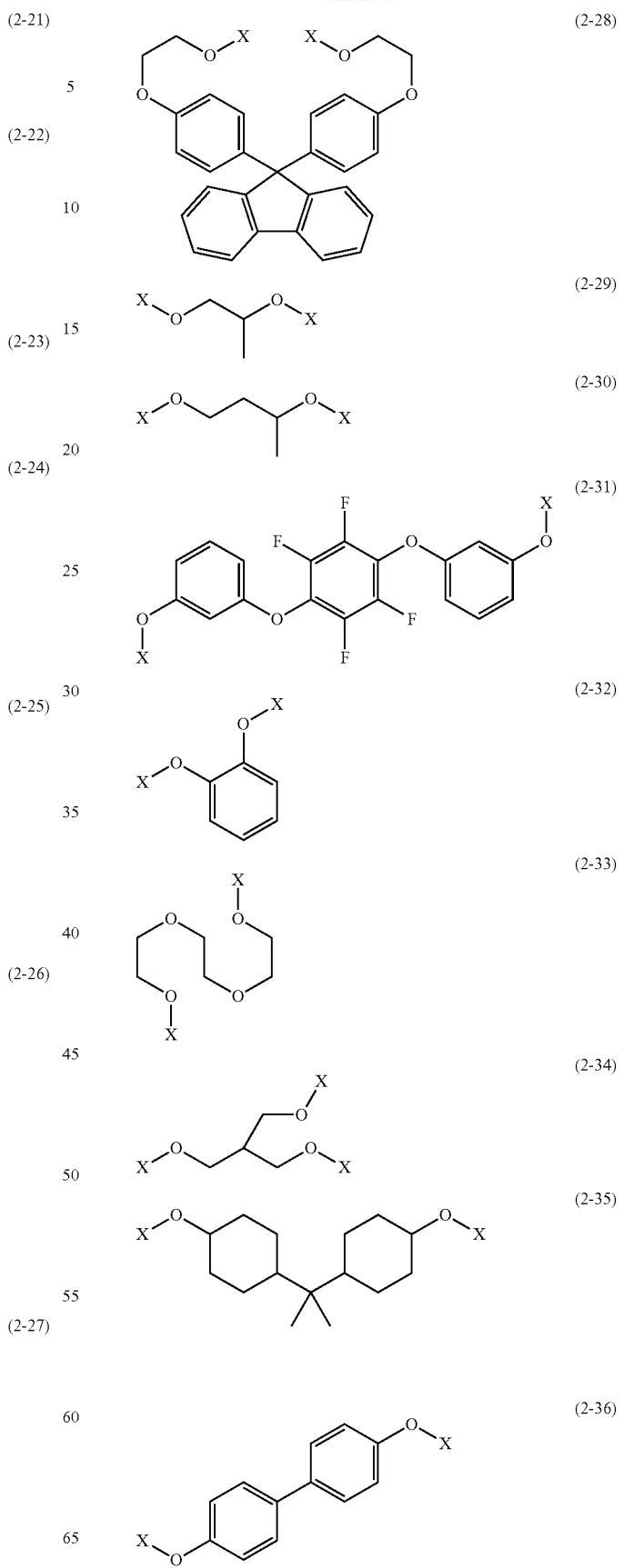

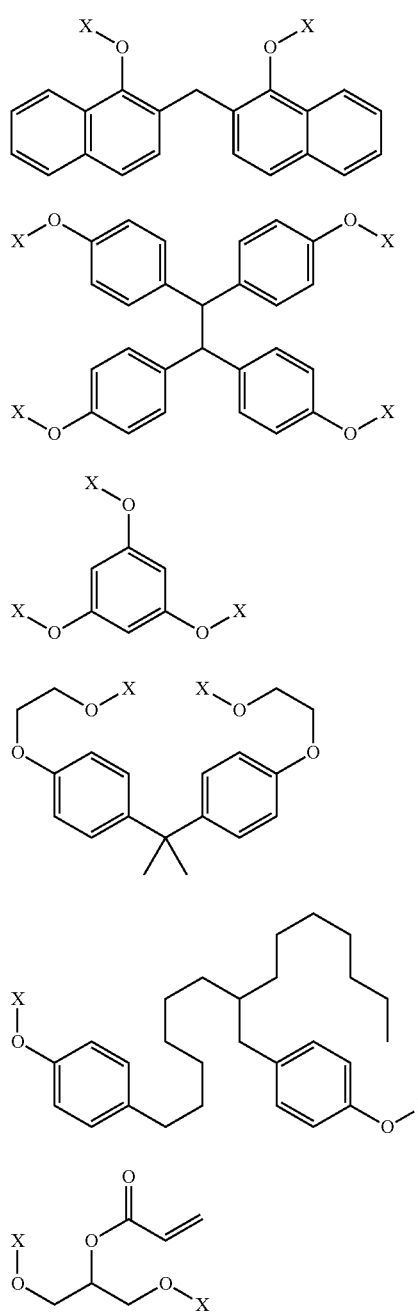
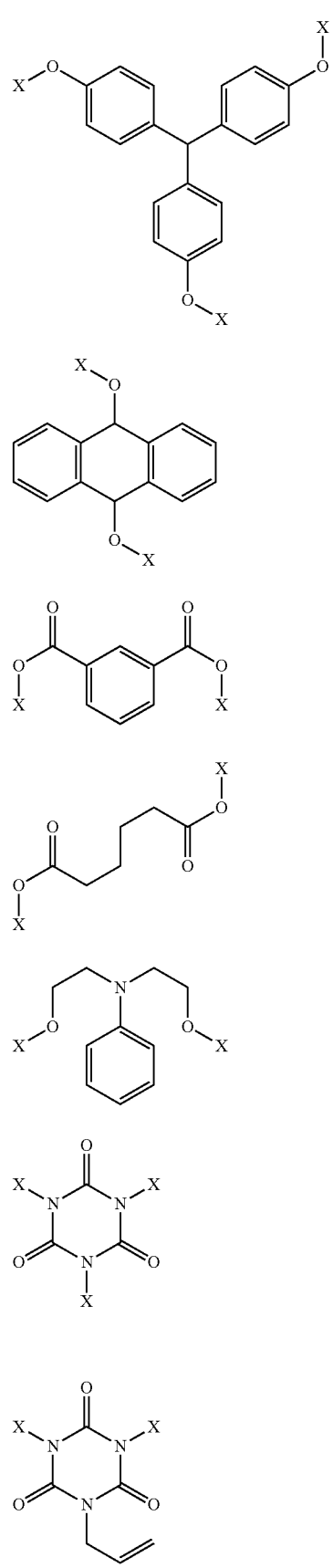

31
-continued
(2-51)
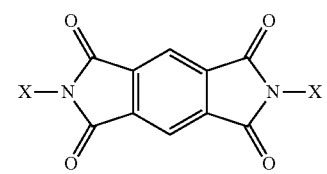
(2-52)
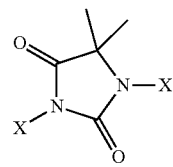
(2-53)
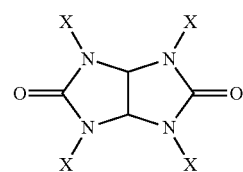
(2-54)
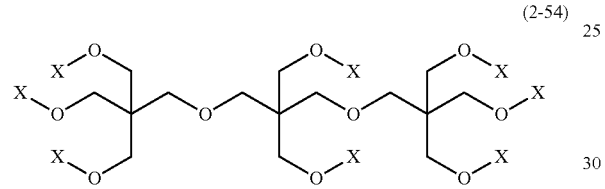
(2-55)
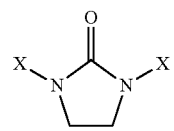
(2-56)
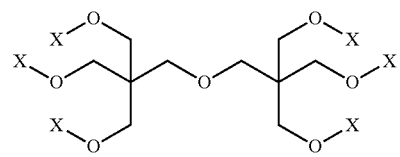
(2-57)
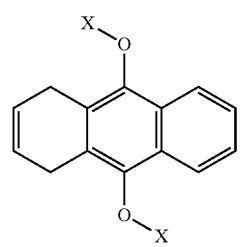
(2-58)
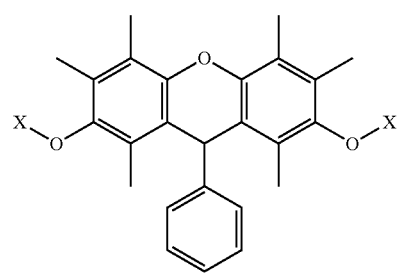
32
-continued
(2-59)
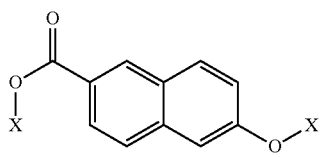
(2-60)
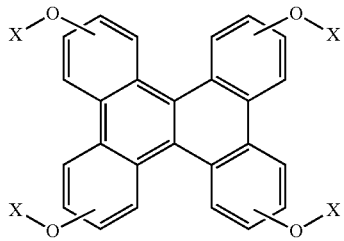
(2-61)
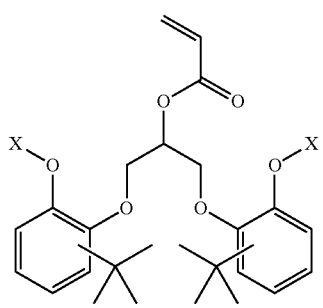
(2-62)
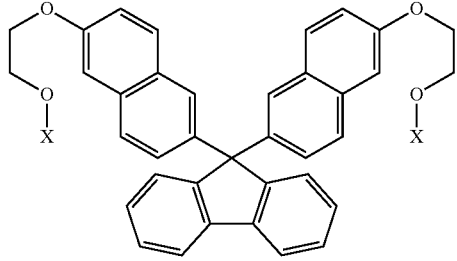
(2-63)
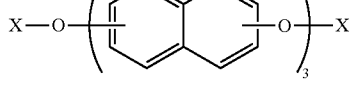
(2-64)
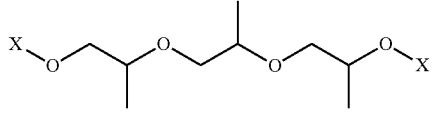
(2-65)
(2-66)
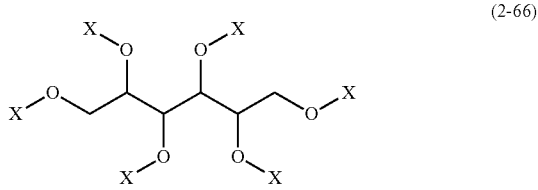

(2-67)

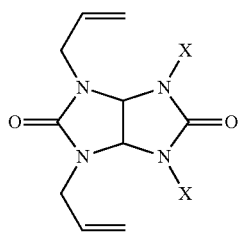

(2-68)

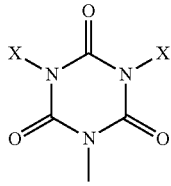

wherein X is as defined above.

Such a compound for a resist underlayer film composition can be particularly easily produced, and is especially useful for the resist underlayer film composition, the patterning process, and the method for forming a resist underlayer film of the present invention. In addition, this compound can optimize various properties as required by customers, by appropriately adjusting X in the above range.

Furthermore, the present invention provides a compound for a resist underlayer film composition, shown by the following general formula (1'), W—(X')$_n$   (1')

wherein W represents an n-valent organic group having 2 to 50 carbon atoms; X' represents a monovalent organic group shown by the following general formula (1X'); and "n" represents an integer of 1 to 10,

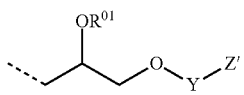   (1X')

wherein the dotted line represents a bonding arm; R$^{01}$ represents an acryloyl group or a methacryloyl group; Y represents a carbonyl group; and Z' represents a group shown by the following general formula (2Z),

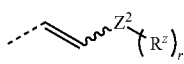   (2Z)

wherein the dotted line represents a bonding arm; Z$^2$ represents an (r+1)-valent aromatic group having 6 to 10 carbon atoms; R$^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of R$^Z$ are contained, the plurality of R$^Z$ are optionally bonded to each other to form a ring together with the carbon atoms bonded thereto; and "r" represents an integer of 0 to 5.

Such a compound enables a resist underlayer film composition mainly containing this compound to have curability by high energy beam irradiation, excellent filling and planarizing properties, and sufficient etching rate, and is especially useful for the resist underlayer film composition, the patterning process, and the method for forming a resist underlayer film of the present invention. In addition, various properties can be optimized as required by customers, by appropriately adjusting W, R$^{01}$, R$^Z$, Y, Z$^2$, "n", and "r" in the above ranges.

Additionally, the compound shown by the general formula (1') preferably comprises a compound shown by any one of the following general formulae (5-1) to (5-68),

   (5-1)

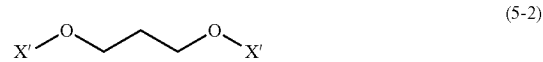   (5-2)

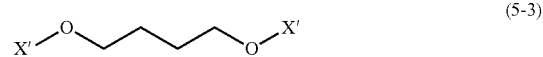   (5-3)

   (5-4)

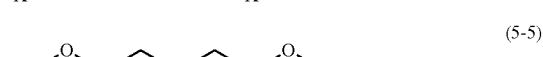   (5-5)

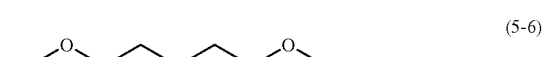   (5-6)

   (5-7)

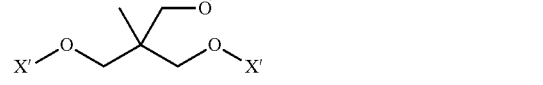   (5-8)

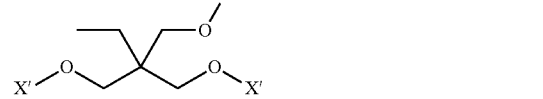   (5-9)

   (5-10)

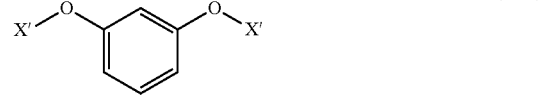   (5-11)

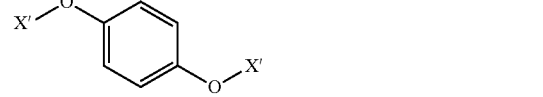   (5-12)

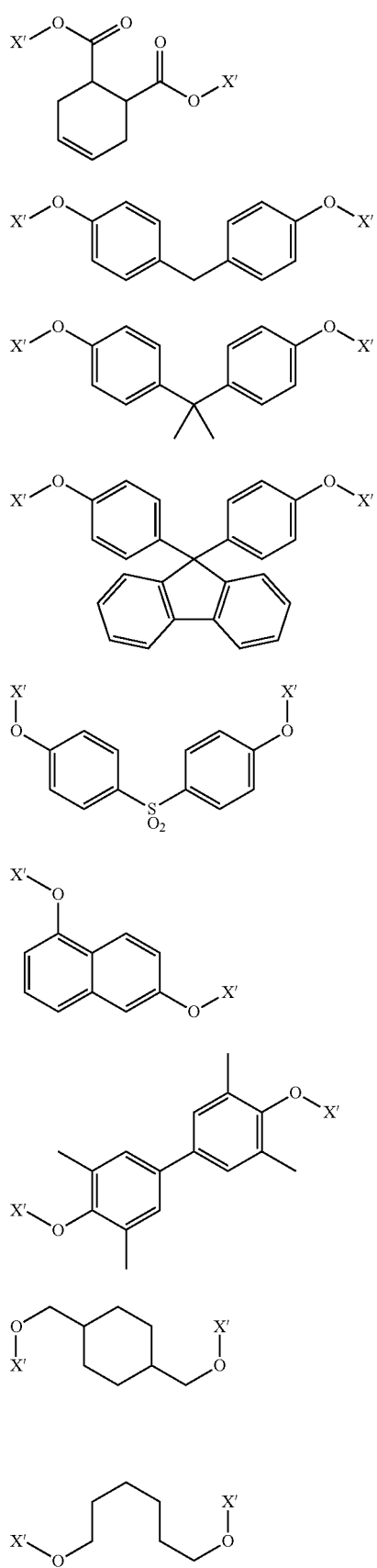
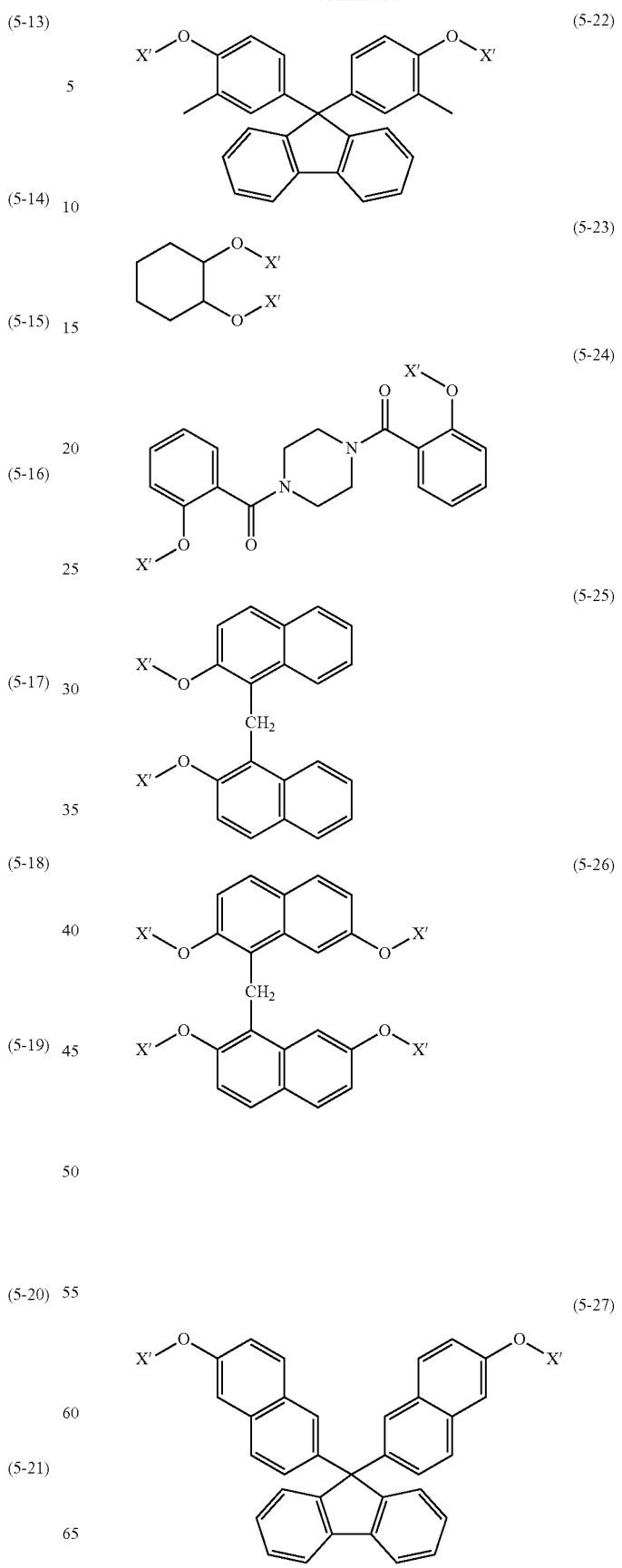

(5-28) 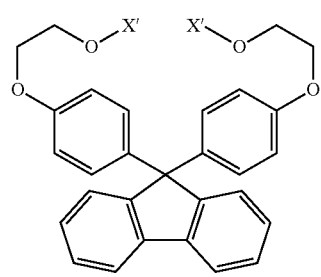
(5-29) 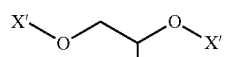
(5-30) 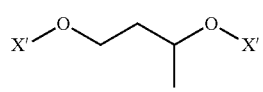
(5-31) 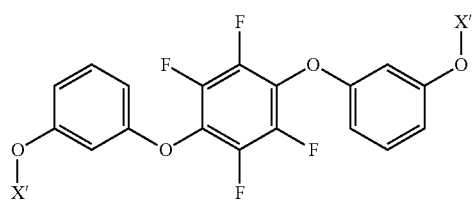
(5-32) 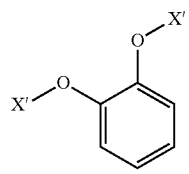
(5-33) 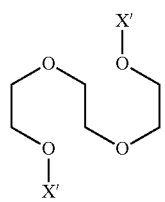
(5-34) 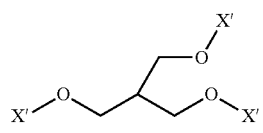
(5-35) 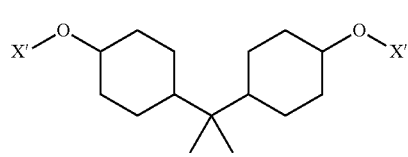
(5-36) 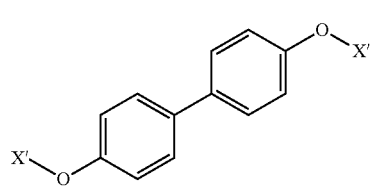
(5-37) 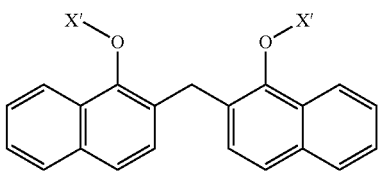
(5-38) 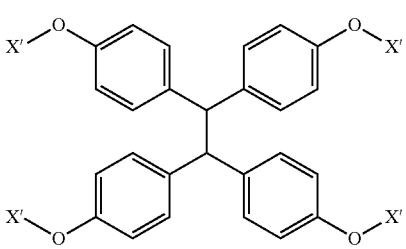
(5-39) 
(5-40) 
(5-41) 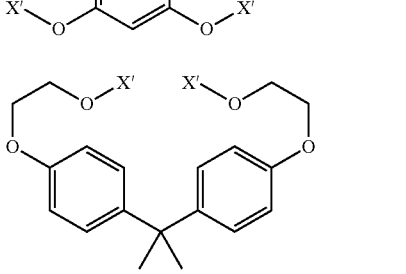
(5-42) 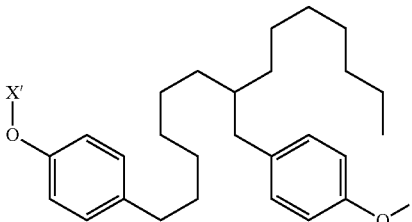
(5-43) 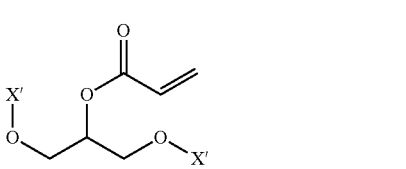

(5-44)
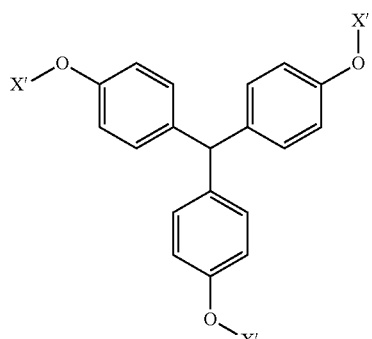
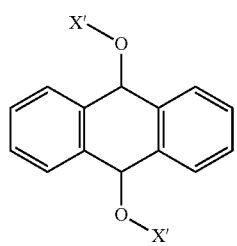
(5-45)
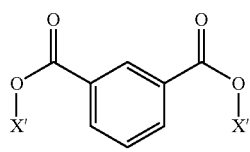
(5-46)
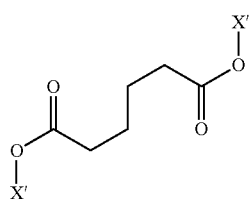
(5-47)
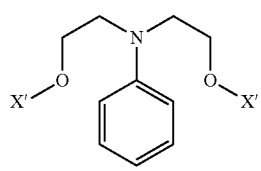
(5-48)
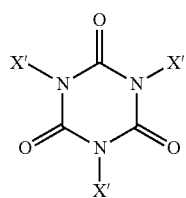
(5-49)
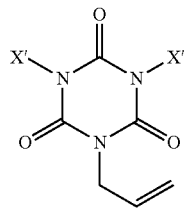
(5-50)
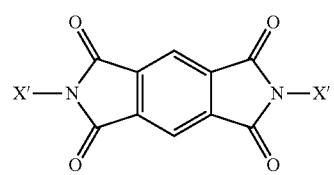
(5-51)
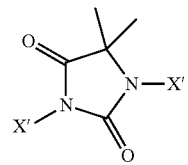
(5-52)
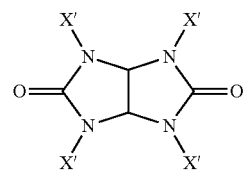
(5-53)
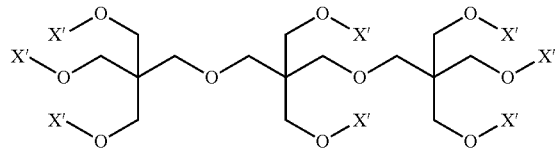
(5-54)
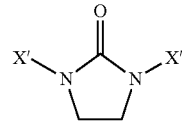
(5-55)
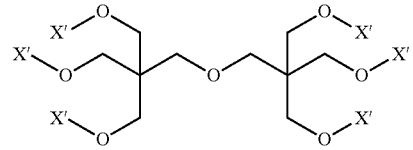
(5-56)
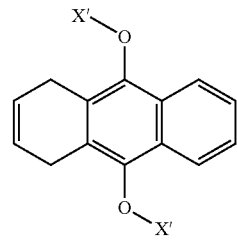
(5-57)
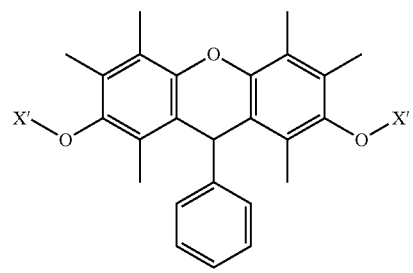
(5-58)

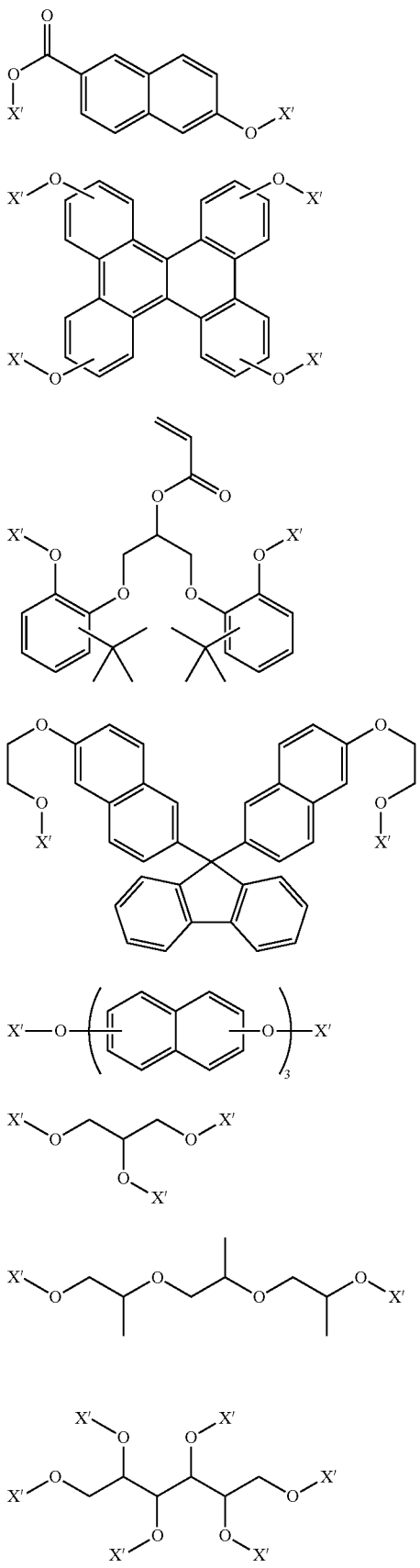

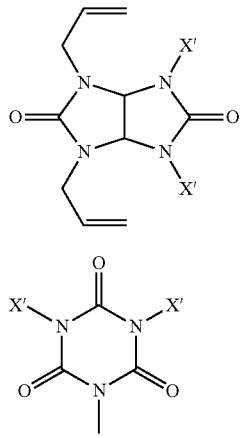

wherein X' is as defined above.

Such a compound for a resist underlayer film composition can be particularly easily produced, and is especially useful for the resist underlayer film composition, the patterning process, and the method for forming a resist underlayer film of the present invention. In addition, this compound can optimize various properties as required by customers, by appropriately adjusting X' in the above range.

As mentioned above, the present invention can provides a resist underlayer film composition that can be cured by high energy beam irradiation, can reduce film shrinkage during curing, can form a resist underlayer film having excellent filling and planarizing properties as well as appropriate etching resistance and optical characteristics in a fine patterning process by a multilayer resist method in the semiconductor apparatus manufacturing process, and can be easily produced. Moreover, the inventive patterning process enables a fine pattern to be formed even on a substrate having a step, by various patterning processes such as 2-layer resist process, 3-layer resist process using a resist middle layer film, and 4-layer resist process additionally using an organic anti-reflective film. Moreover, the inventive method for forming a resist underlayer film can form a resist underlayer film having excellent planarity even on a substrate to be processed having a step by high energy beam irradiation for curing. Furthermore, the inventive compound for a resist underlayer film composition can be easily produced and is useful for the inventive resist underlayer film composition described above.

DETAILED DESCRIPTION OF THE PREFERRED EMBODIMENTS

Figure 1:
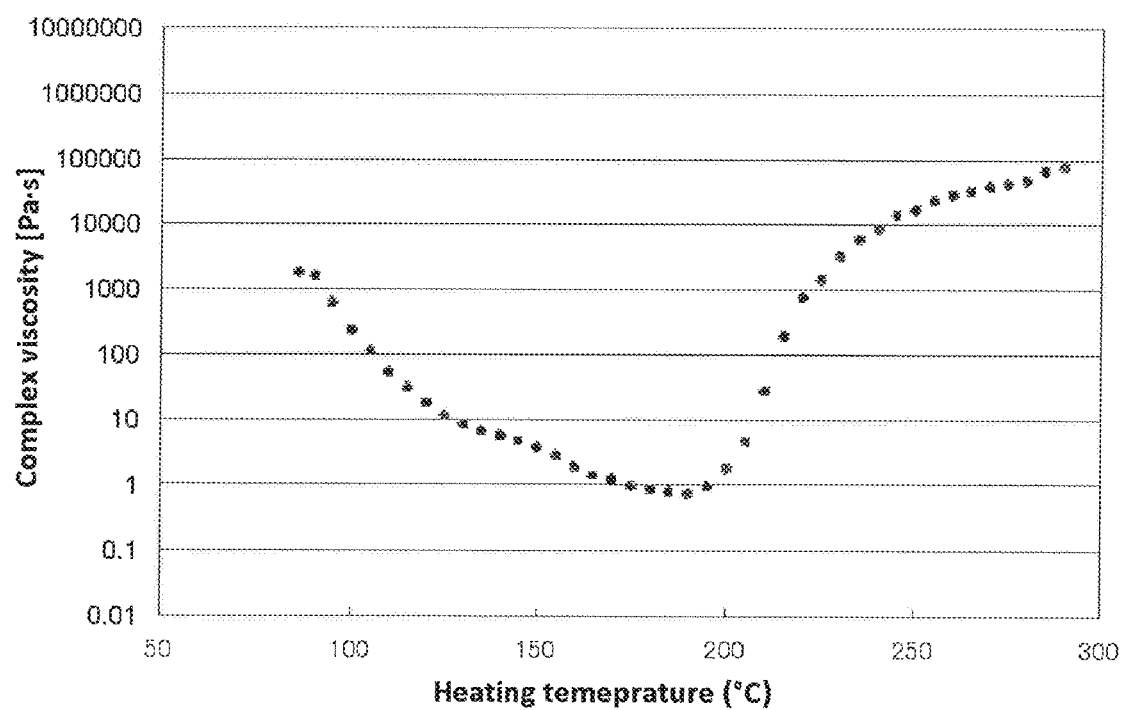
FIG. 1 is a graph showing the complex viscosity of an example of component (A) of the resist underlayer film composition according to the present invention, as measured within a range of 50° C. to 300° C.

Hereinafter, the present invention will be described in more detail. As mentioned above, there are demanded a resist underlayer film composition that can be cured by high energy beam irradiation and can form a resist underlayer film having excellent filling and planarizing properties as well as appropriate etching resistance and optical characteristics in a fine patterning process by a multilayer resist method in the semiconductor apparatus manufacturing process; a patterning process and a method for forming a resist underlayer film using the resist underlayer film composition; and a novel compound useful for the resist underlayer film composition.

The present inventors have investigated various resist underlayer film compositions and patterning processes to enable highly filling and planarizing a substrate by forming an underlayer film that utilizes curing by high energy beam irradiation in a multilayer resist method using a resist underlayer film. Consequently, they found that a resist underlayer film composition mainly containing a compound with a specific structure, a patterning process and a method for forming a resist underlayer film using this resist underlayer film composition are very effective, bringing the present invention to completion.

<Resist Underlayer Film Composition>

The inventive resist underlayer film composition, for use in a multilayer resist method, contains (A) one or more than one compound shown by the following general formula (1); and (B) an organic solvent, $$W\text{―}(X)_n \tag{1}$$

wherein W represents an n-valent organic group having 2 to 50 carbon atoms; X represents a monovalent organic group shown by the following general formula (1X); and "n" represents an integer of 1 to 10,

(1X)

wherein the dotted line represents a bonding arm; $R^{01}$ represents an acryloyl group or a methacryloyl group; Y represents a single bond or a carbonyl group; and Z represents a monovalent organic group having 1 to 30 carbon atoms.

[(A) Compound Shown by Formula (1)]

The inventive resist underlayer film composition contains (A) one or more than one compound shown by the general formula (1). By containing this compound, the resist underlayer film composition can have curability by high energy beam irradiation and excellent flowability, and thus enables a flat resist underlayer film to be formed without voids even on a substrate having a step.

In the general formula (1), W represents an n-valent organic group having 2 to 50 carbon atoms, and "n" represents an integer of 1 to 10. That is, W represents an organic group with a valency of 1 to 10, obtained by removing 1 to 10 hydrogen atoms from an organic compound having 2 to 50 carbon atoms. The organic compound having 2 to 50 carbon atoms, which corresponds to W with 1 to 10 additional hydrogen atoms, may contain a linear, branched, or cyclic, saturated or unsaturated hydrocarbon group, an aromatic hydrocarbon group, a hetero-aromatic group, an ether group, a hydroxyl group, an ester group, a carbonyl group, an amino group, a halogen group, a sulfide group, a carboxyl group, a sulfo group, an amide group, an imide group, a cyano group, an aldehyde group, an imino group, a urea group, a carbamate group, a carbonate group, a nitro group, or a sulfonyl group. "n" is preferably 2 to 4. Properties such as etching resistance, heat resistance, optical constant, polarity, and flexibility can be adjusted by appropriately selecting W and "n" according to use. More specifically, preferable examples of W include the following structures, although not limited thereto. In the following formulae, "p" independently represents an integer of 1 to 3, "q" independently represents an integer of 0 to 3, and the dotted line represents a bonding arm.

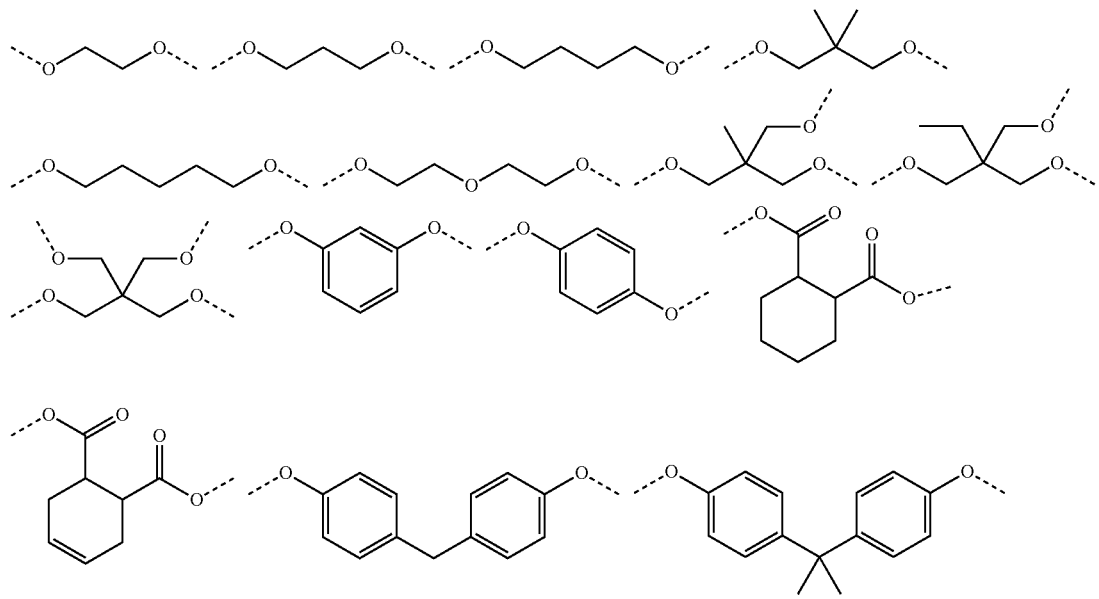

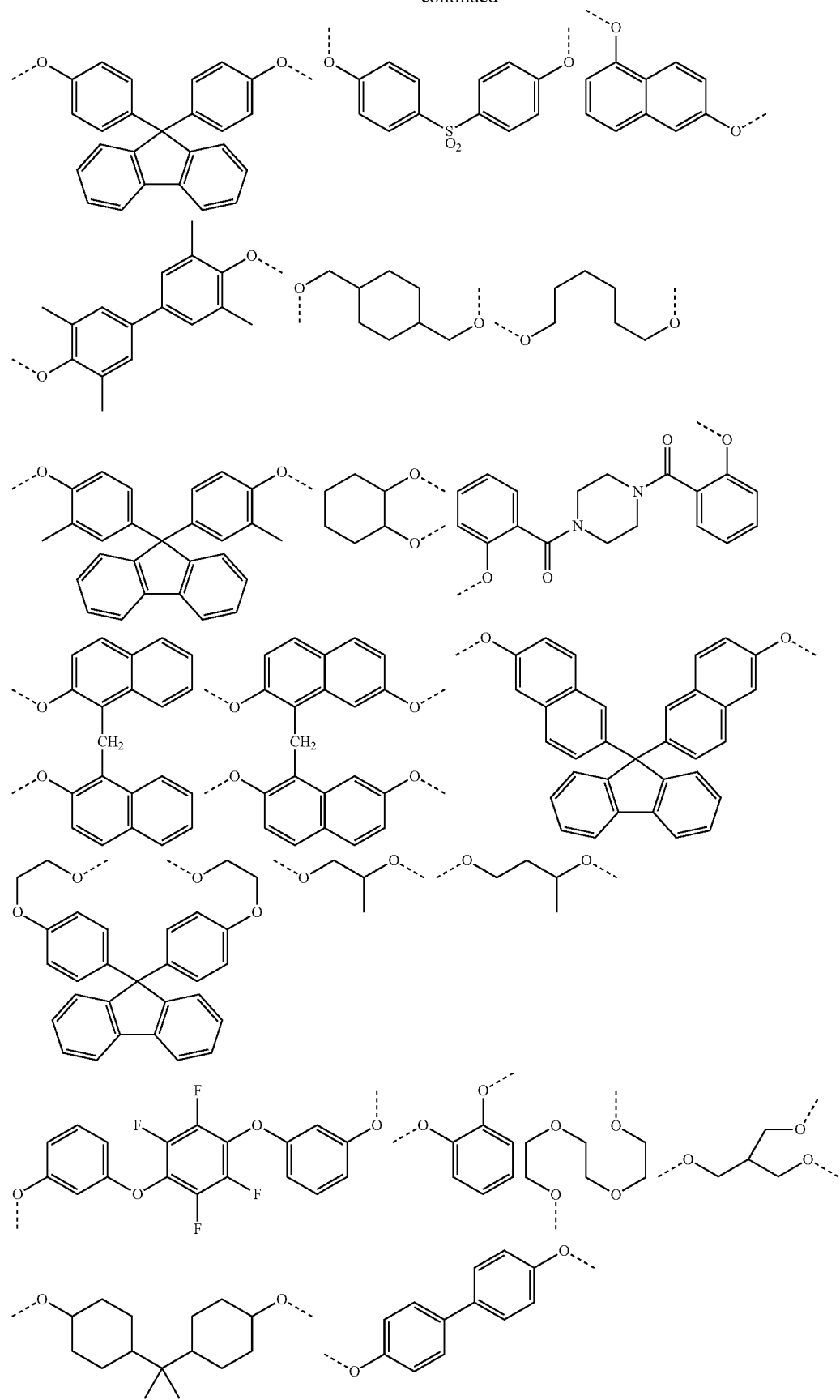

-continued
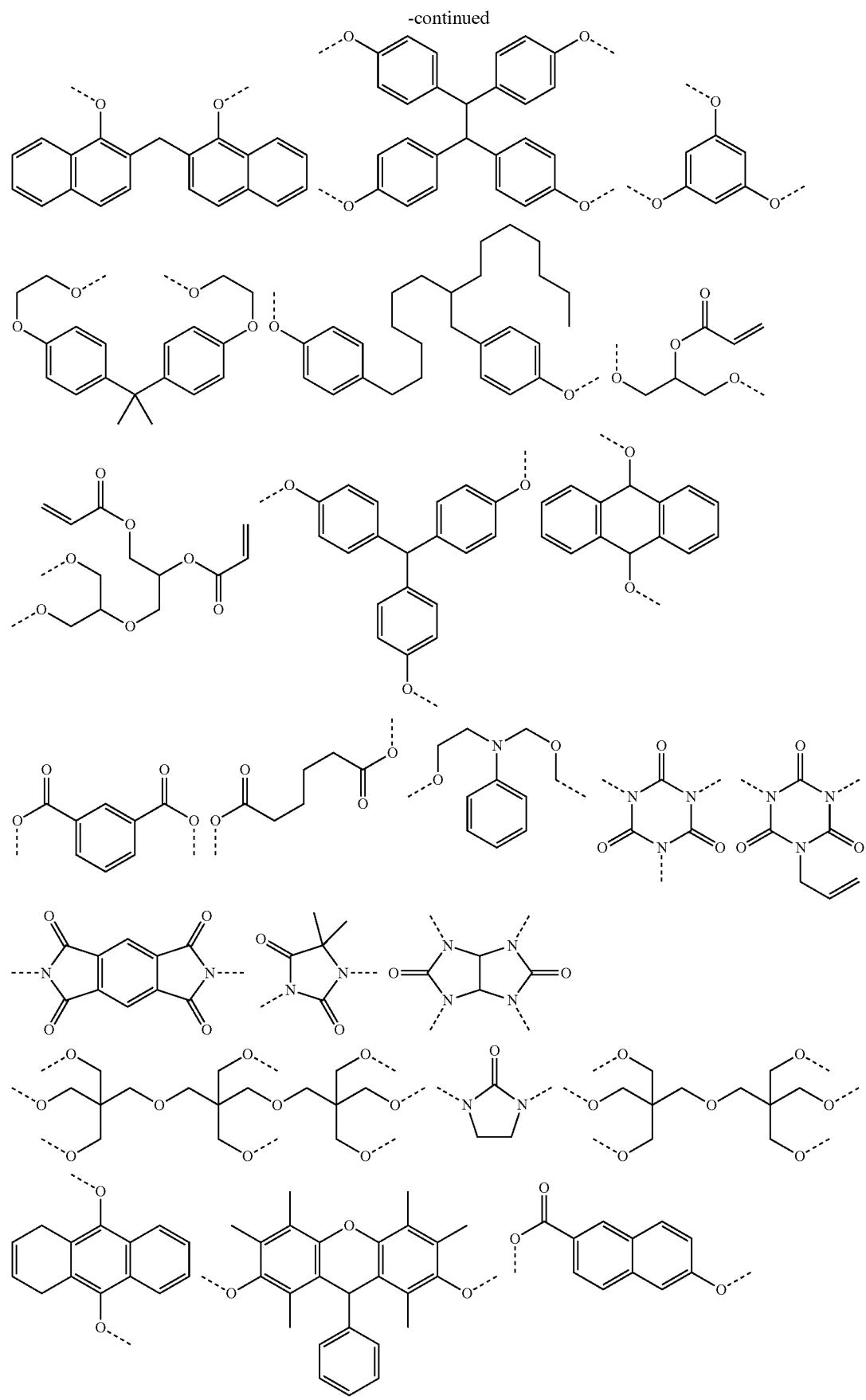

-continued
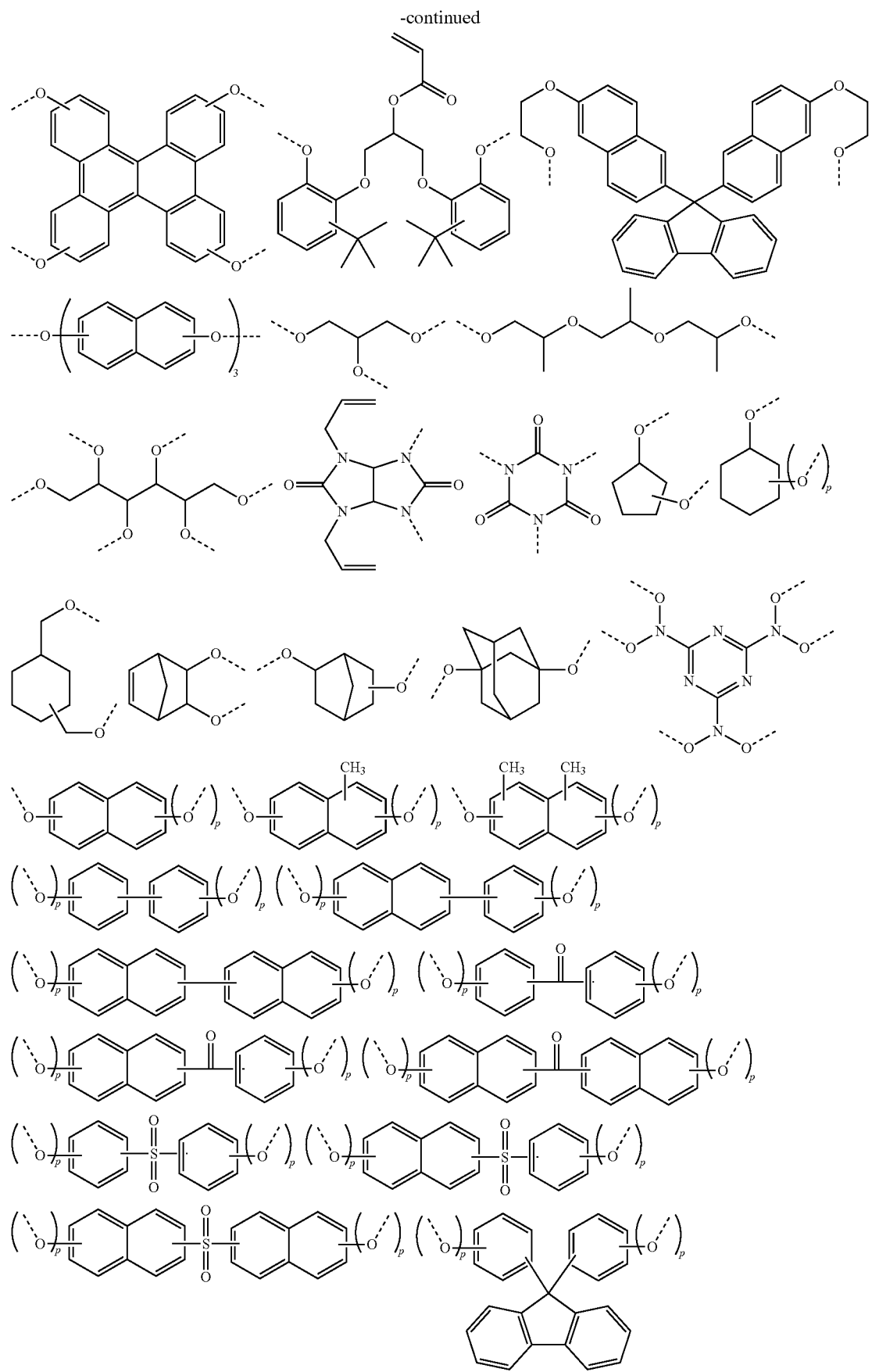

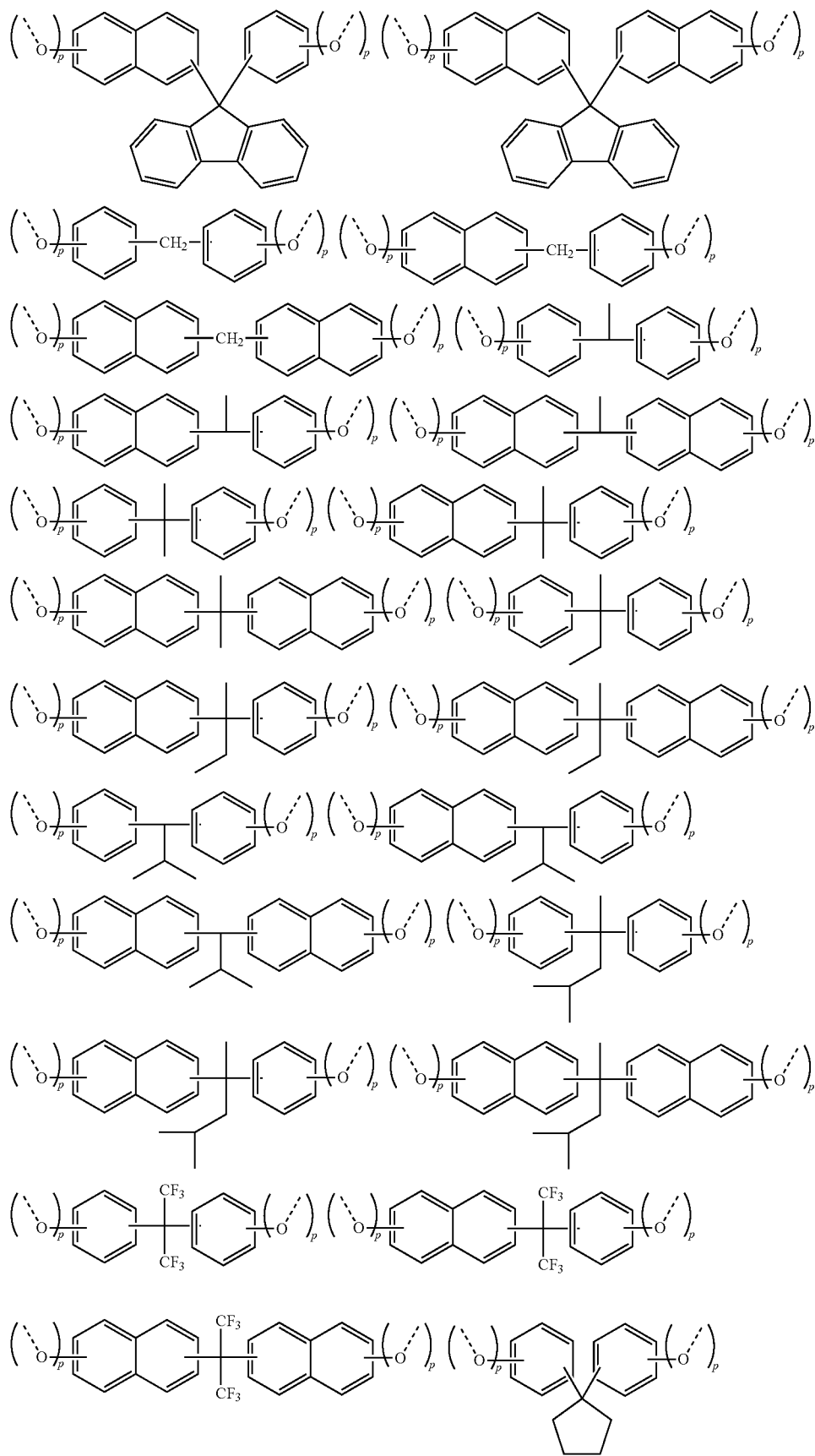

-continued
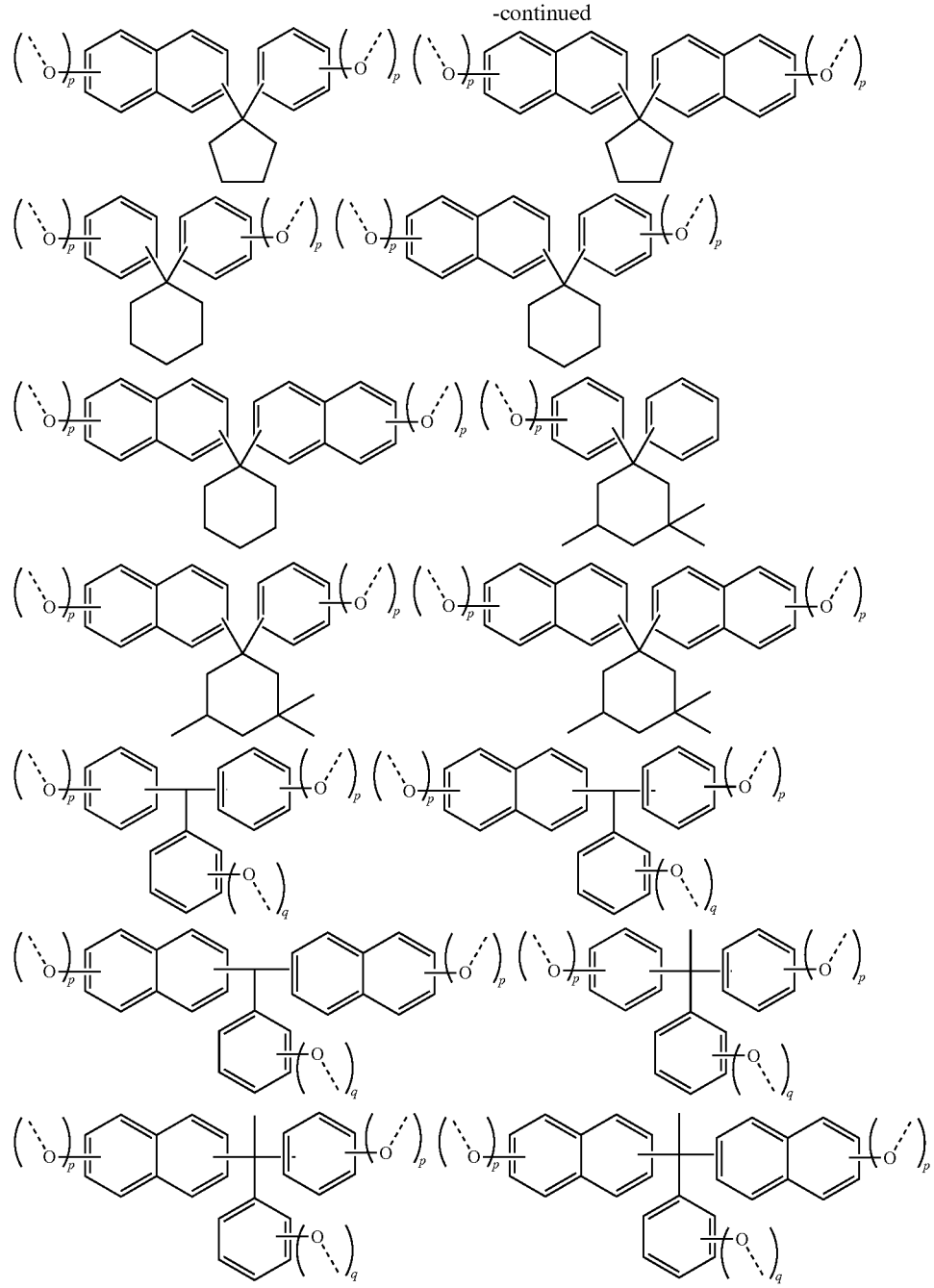
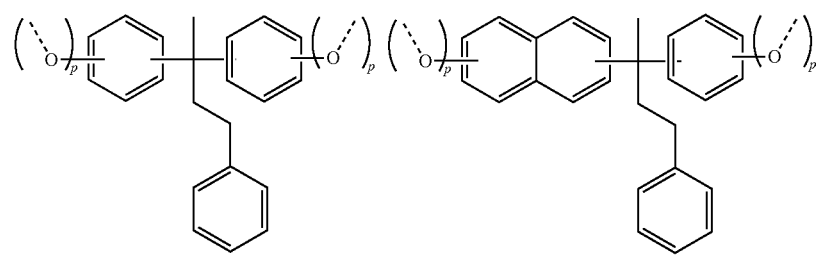

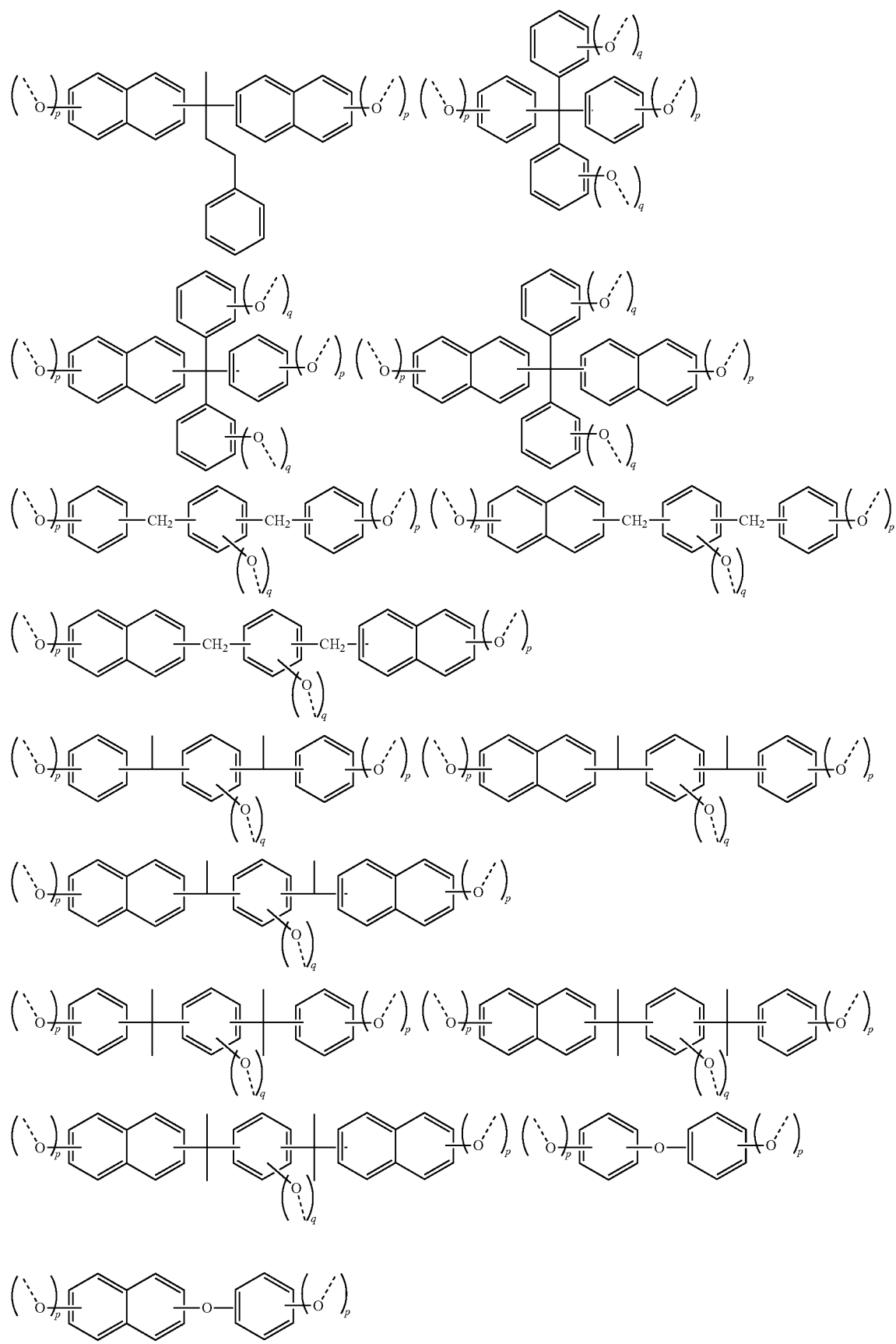

-continued

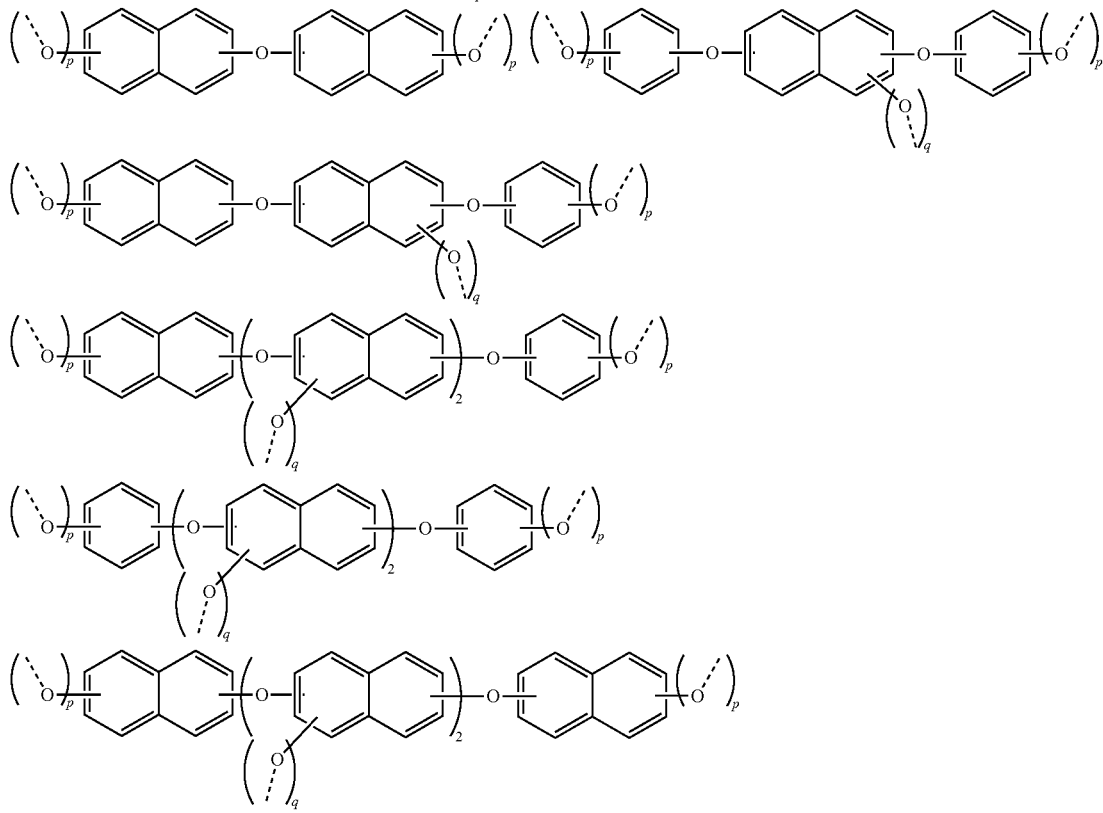

In view of etching resistance and optical characteristics, W preferably has a naphthalene ring, and in view of optical characteristics, W more preferably has no benzene ring. Such a compound exhibits appropriate optical characteristics at 193 nm wavelength. Thus, use of a resist underlayer film composition containing this compound enables reflection to be controlled at exposure especially in multilayer ArF lithography, thus providing excellent resolution. With respect to optical constant of the resist underlayer film, refractive index n is preferably in the range of about 1.4 to 1.9, and extinction coefficient k is preferably in the range of about 0.1 to 0.5 to control the reflection.

In the general formula (1), X represents a monovalent organic group shown by the general formula (1X). In the general formula (1X), $R^{01}$ represents an acryloyl group or a methacryloyl group. The case where $R^{01}$ is an acryloyl group is preferable, for especially excellent curability can be obtained by irradiation with a high energy beam. Y represents a single bond or a carbonyl group.

In the general formula (1X), Z represents a monovalent organic group having 1 to 30 carbon atoms. That is, Z represents a monovalent organic group obtained by removing one hydrogen atom from an organic compound having 1 to 30 carbon atoms. Z is preferably a linear, branched, or cyclic, saturated or unsaturated hydrocarbon group having 1 to 30 carbon atoms, an aromatic hydrocarbon group, or a hetero-aromatic group, and may contain an ether group, a hydroxyl group, an ester group, a carbonyl group, an amino group, a halogen group, a sulfide group, a carboxyl group, a sulfo group, an amide group, an imide group, a cyano group, an aldehyde group, an imino group, a urea group, a carbamate group, a carbonate group, a nitro group, or a sulfonyl group. Properties such as etching resistance, heat resistance, optical constant, polarity, and flexibility can be adjusted by appropriately selecting Z according to use. Z is particularly preferably a substituted or unsubstituted aromatic hydrocarbon group. When Z has a substituent, the substituent preferably includes a polymerizable group such as an acryloyl group, a methacryloyl group, a vinyloxy group, a styryl group, an allyl group, and a propargyl group to improve curability.

In the present invention, the compound shown by the general formula (1) may be used alone or as a mixture of two or more kinds. The molecular weight of the compound shown by the general formula (1) is preferably 300 to 5,000, particularly preferably 500 to 2,500 in formula weight. When the molecular weight is 300 or more, good film-forming property can be obtained, and there is no fear that an apparatus is contaminated by increased sublimates during curing. When the molecular weight is 5,000 or less, good filling and planarizing properties can be obtained.

Z in the general formula (1X) is preferably a group shown by the following general formula (1Z),

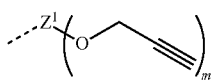

(1Z)

wherein the dotted line represents a bonding arm; $Z^1$ represents an (m+1)-valent aromatic group having 6 to 20 carbon atoms; and "m" represents an integer of 1 to 5.

When Z in the general formula (1X) is a group shown by the general formula (1Z), curability by high energy beam irradiation can be improved, film shrinkage during curing can be reduced, and thus deterioration of planarity due to the shrinkage can be controlled. This enables a resist underlayer film to be formed with high planarity.

In the general formula (1Z), $Z^1$ represents an (m+1)-valent aromatic group having 6 to 20 carbon atoms, and "m" represents an integer of 1 to 5. That is, $Z^1$ represents an (m+1)-valent group obtained by removing m+1 hydrogen atoms from an aromatic compound having 6 to 20 carbon atoms. The aromatic compound having 6 to 20 carbon atoms is particularly preferably benzene, naphthalene, phenanthrene, anthracene, pyrene, biphenyl, toluene, xylene, methylnaphthalene, or fluorene. "m" is more preferably an integer of 1 to 3.

Alternatively, it is preferred that in the general formula (1X), Z is a group shown by the following general formula (2Z), and Y is a carbonyl group,

(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen, atom, and a halogen atom; when a plurality of $R^Z$ are contained, the plurality of $R^Z$ are optionally bonded to each other to form a ring together with the carbon atoms bonded thereto; and "r" represents an integer of 0 to 5.

When in the general formula (1X), Z is a group shown by the general formula (2Z), and Y is a carbonyl group, curability by high energy beam irradiation can be improved, in-plane variation of film thickness can be controlled in some cases, and thus deterioration of planarizing property due to the variation can be controlled. This enables a resist underlayer film to be formed with high planarity.

In the general formula (2Z), $Z^2$ represents an (r+1)-valent aromatic group having 6 to 10 carbon atoms, and "r" represents an integer of 0 to 5. That is, $Z^2$ represents an (r+1)-valent group obtained by removing r+1 hydrogen atoms from an aromatic compound, having 6 to 10 carbon atoms. The aromatic compound having 6 to 10 carbon atoms is particularly preferably benzene or naphthalene. "r" is more preferably an integer of 0 to 3, particularly preferably an integer of 0 to 2.

In the general formula (2Z), $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom. Illustrative examples of $R^Z$ include a fluorine atom, a chlorine atom, a bromine atom, a hydroxyl group, a nitro group, a methyl group, an ethyl group, a propyl group, an isopropyl group, a butyl group, a s-butyl group, a t-butyl group, an isobutyl group, a pentyl group, a hexyl group, a cyclohexyl group, a phenyl group, a trifluoromethyl group, a methoxy group, an ethoxy group, a butoxy group, an acetoxy group, an acetamide group, and a cyano group, although not limited thereto. $R^Z$ is particularly preferably a hydroxyl group, a methoxy group, an ethoxy group, or a butoxy group. When a plurality of $R^Z$ are contained, the plurality of $R^Z$ are optionally bonded to each other to form a ring together with the carbon atoms bonded thereto.

Preferable examples of the group shown by the general formula (2Z) are shown below, although not limited thereto. In the following formulae, Me denotes a methyl group, and the same is applied to the following cases.

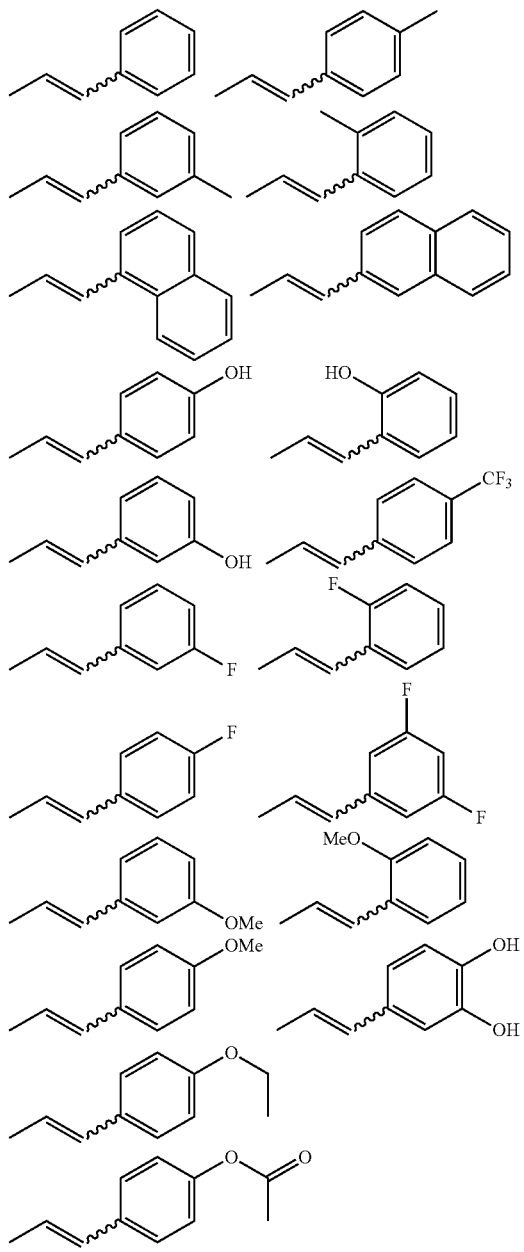

-continued

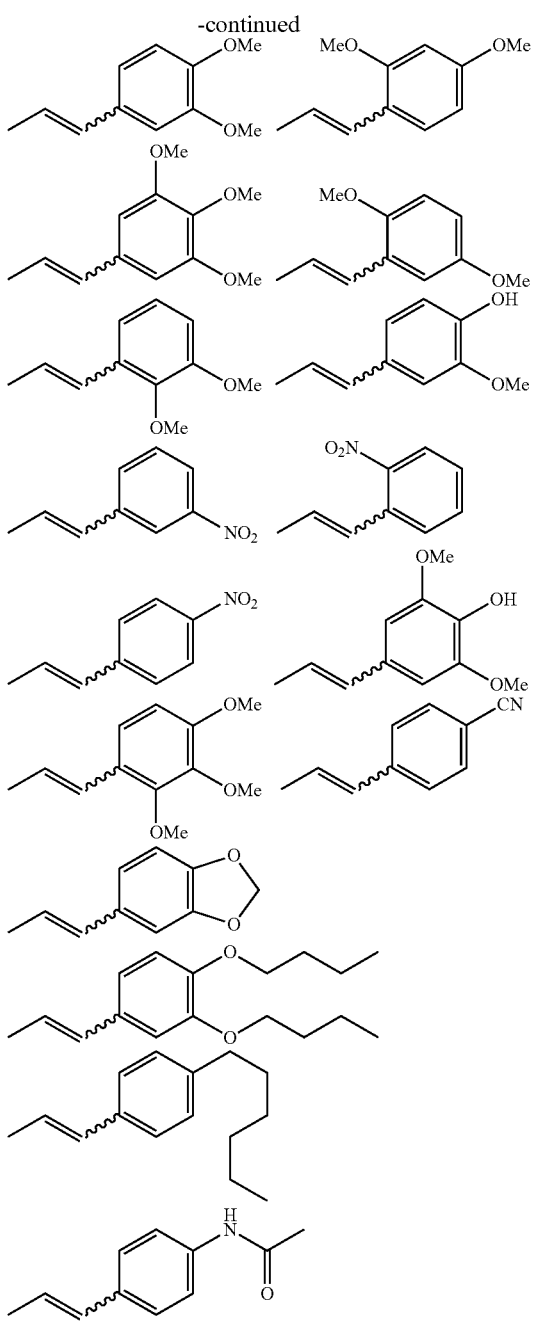

It is preferred that in the component (A), "n" in the general formula (1) is an integer of 2 to 10, and the component (A) has an aromatic part in an amount of 20 mass % or more.

Herein, the aromatic part means an aromatic ring alone in the compound, and excludes a functional group directly bonded to the aromatic ring.

The component (A) in which "n" in the general formula (1) is an integer of 2 to 10 enables particularly excellent curing efficiency in curing by high energy beam irradiation. Moreover, the component (A) having an aromatic part in an amount of 20 mass % or more enables a resist underlayer film to be formed with excellent etching resistance, in particular.

Additionally, the compound shown by the general formula (1) is preferably contained in an amount of 20 mass % or more with respect to a total amount of a solid contained in the resist underlayer film composition.

Such a resist underlayer film composition has excellent curing efficiency in curing by high energy beam irradiation, and can form a resist underlayer film having excellent planarizing property.

Additionally, the compound shown by the general formula (1) preferably includes a compound shown by any one of the following general formulae (2-1) to (2-68).

 (2-1)

 (2-2)

 (2-3)

 (2-4)

 (2-5)

 (2-6)

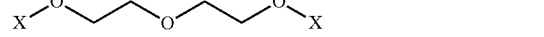 (2-7)

 (2-8)

 (2-9)

 (2-10)

 (2-11)

 (2-12)

 (2-13)

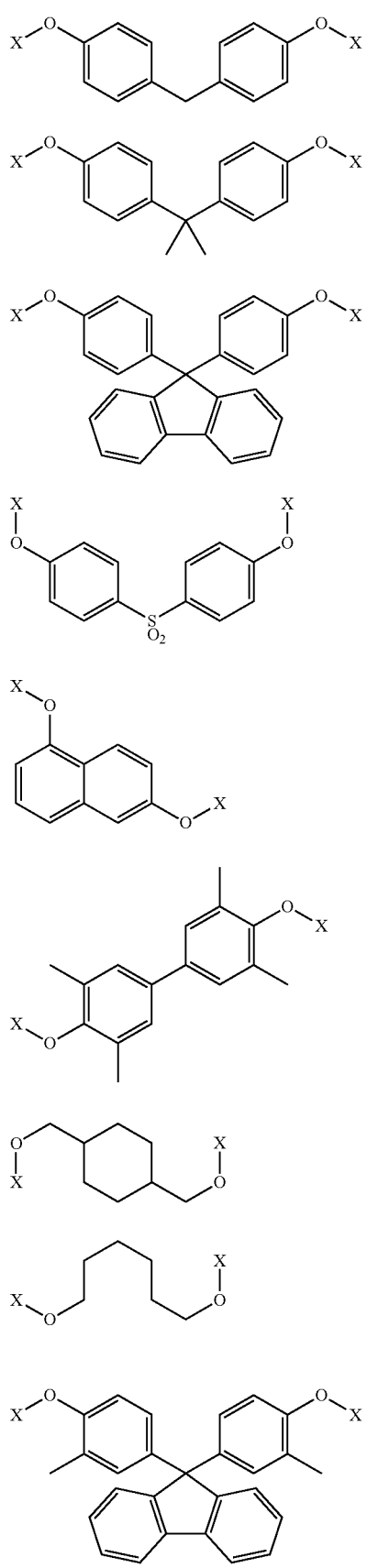
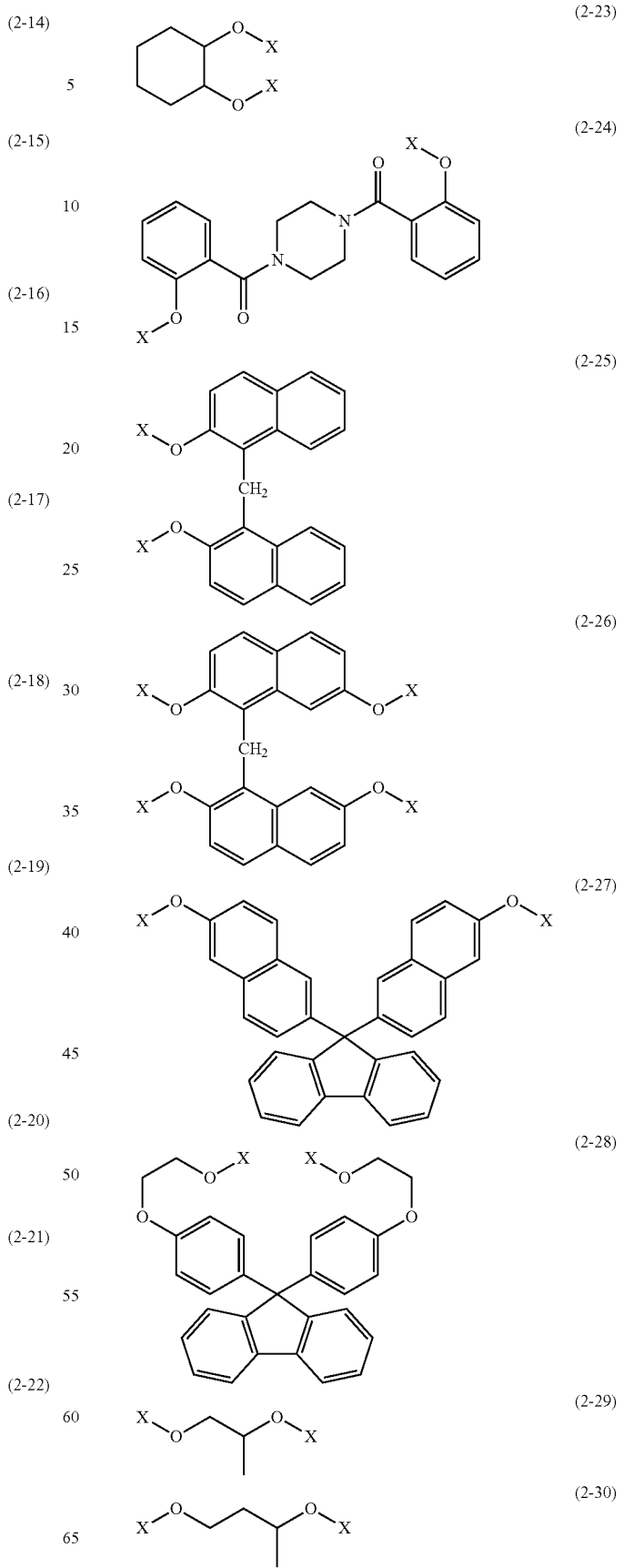

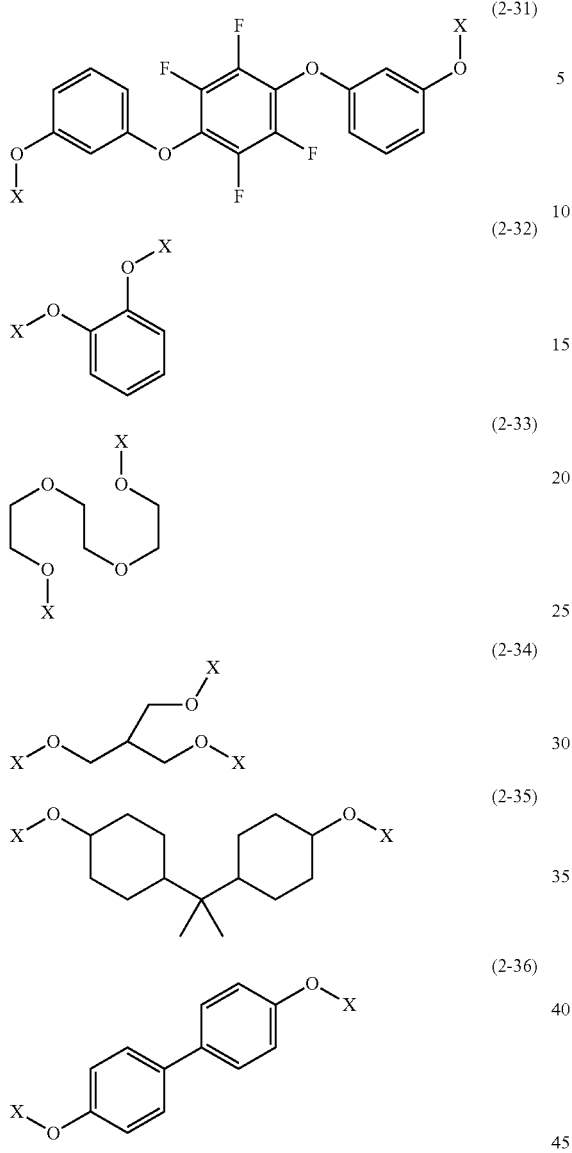
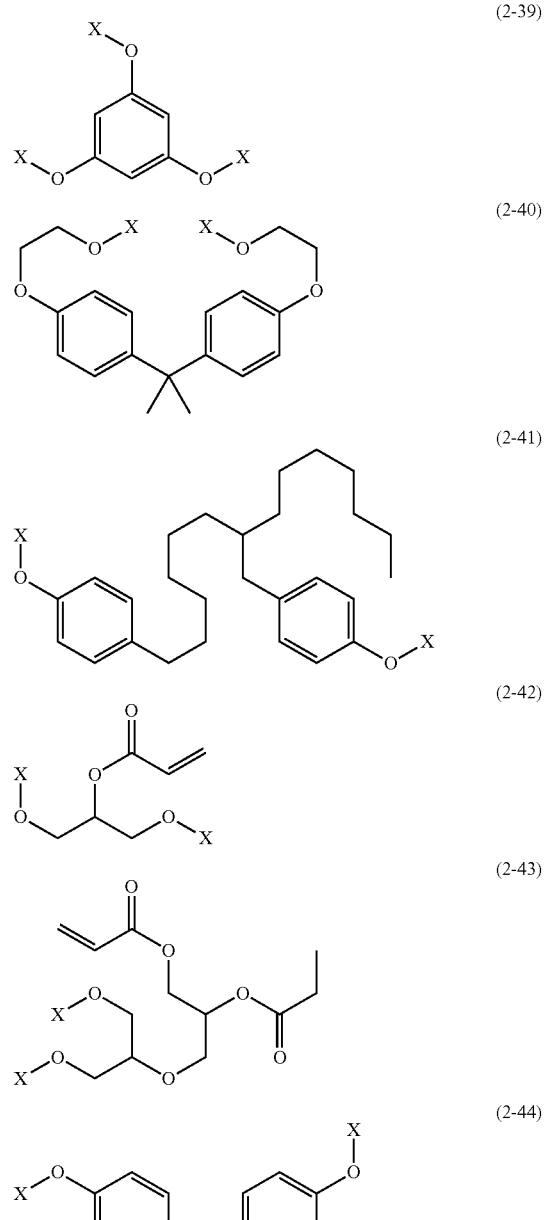
wherein X is as defined above.
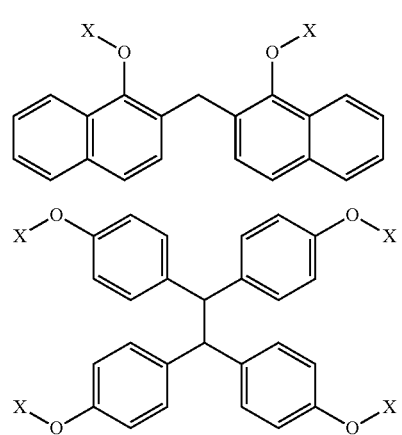

(2-46)
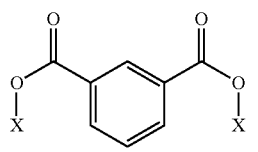
(2-47)
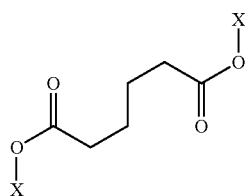
(2-48)
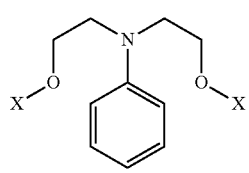
(2-49)
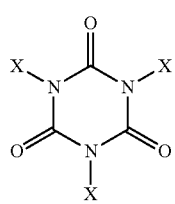
(2-50)
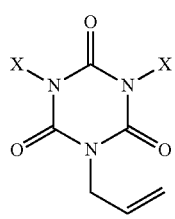
(2-51)
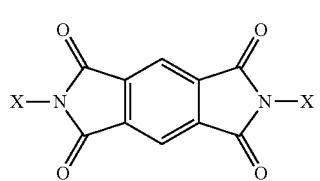
(2-52)
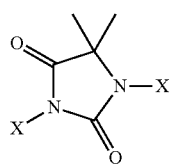
(2-53)
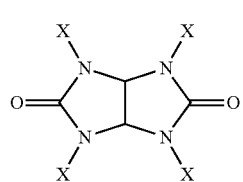
(2-54)
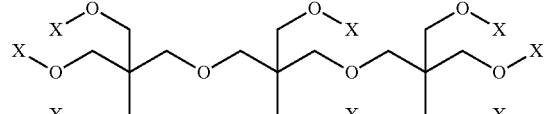
(2-55)
(2-56)
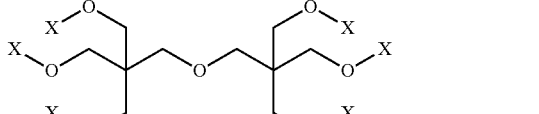
(2-57)
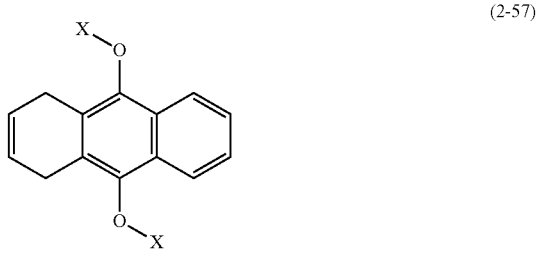
(2-58)
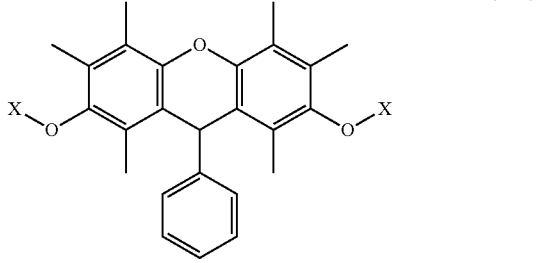
(2-59)
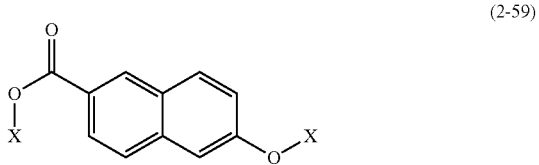
(2-60)
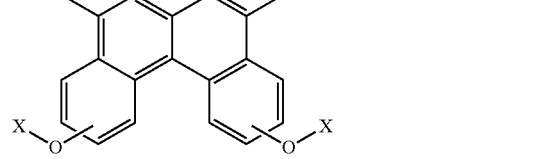

(2-61)
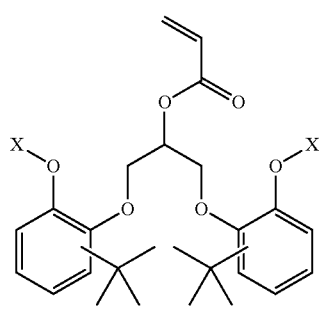
(2-62)
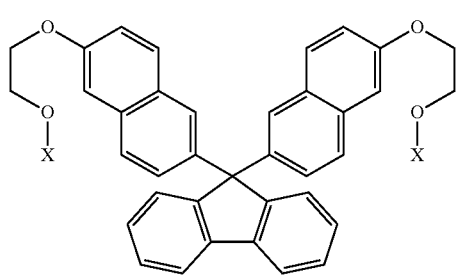
(2-63)
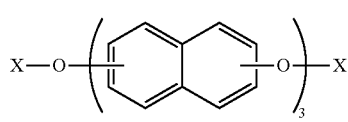
(2-64)
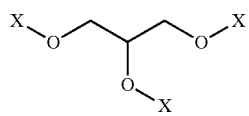
(2-65)
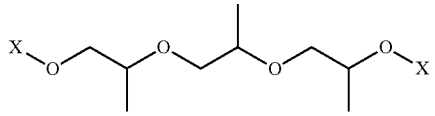
(2-66)
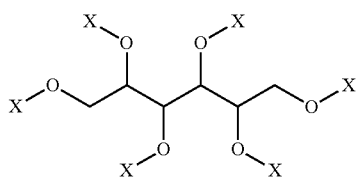
(2-67)
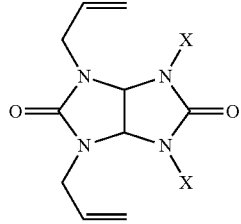
(2-68)
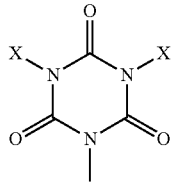
wherein X is as defined above.
Illustrative examples of the compound shown by the general formula (1) include the following compounds, although the compound is not limited thereto.
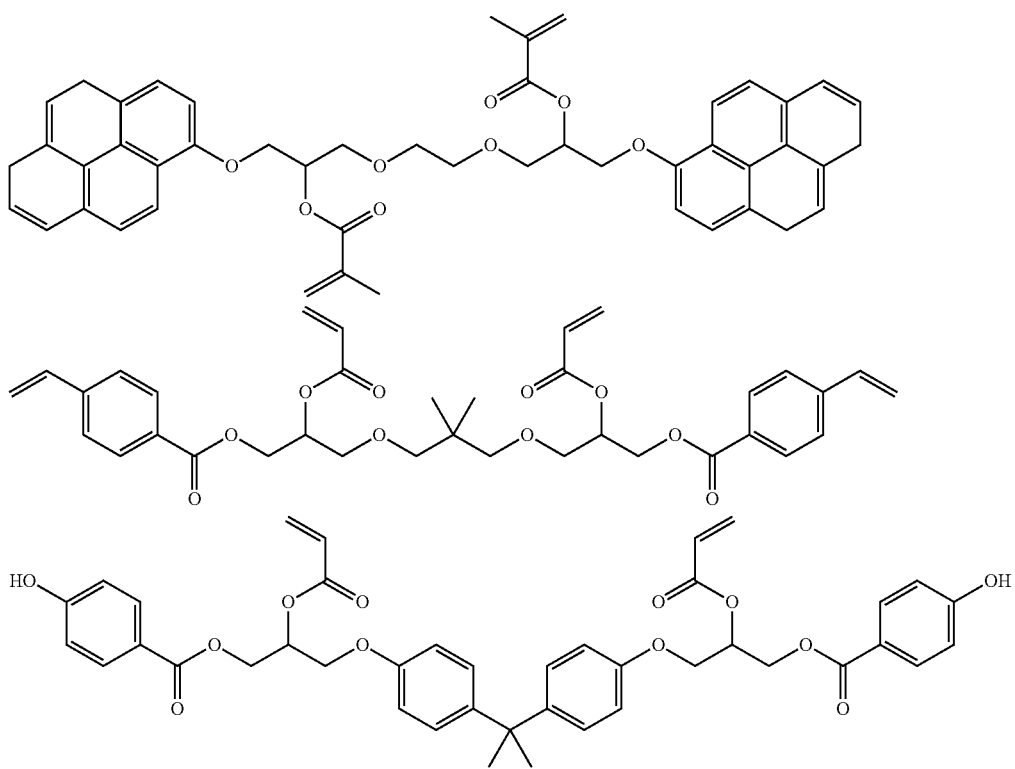

71
72
-continued
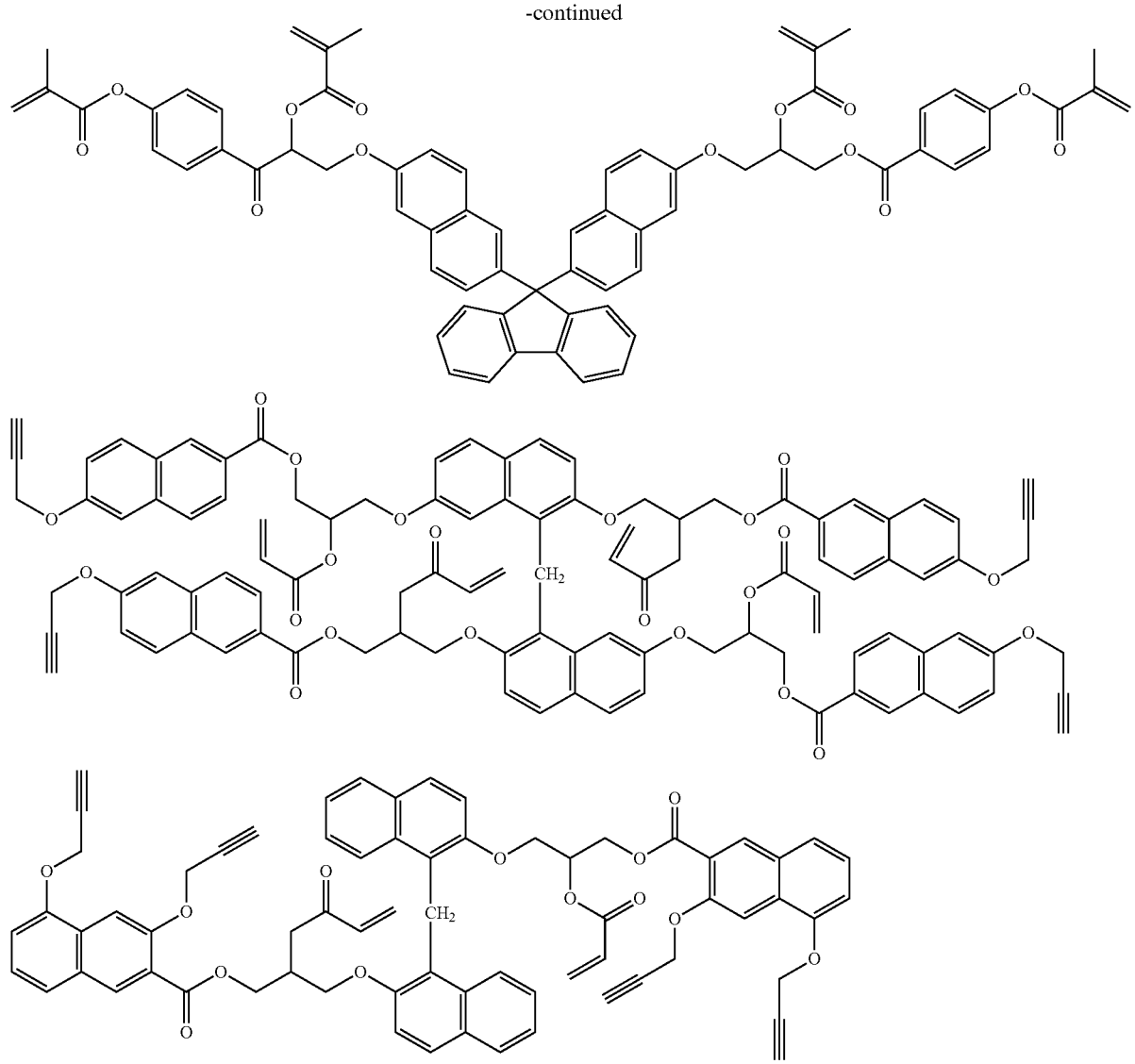
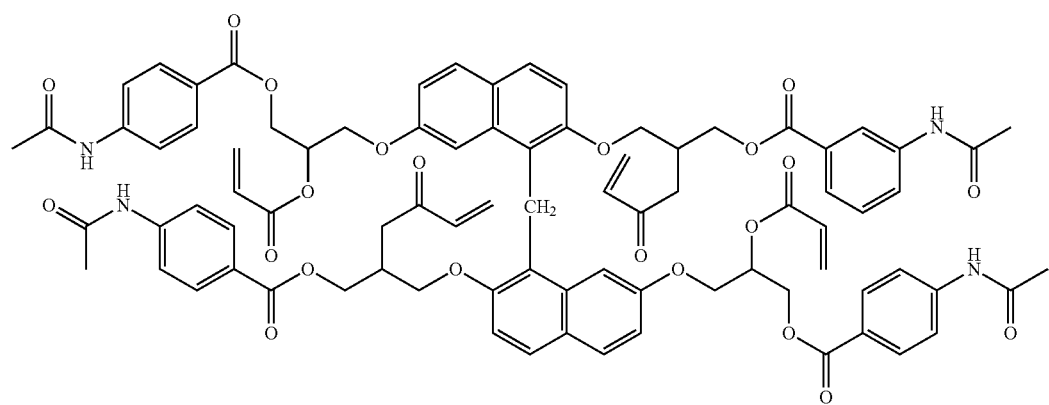

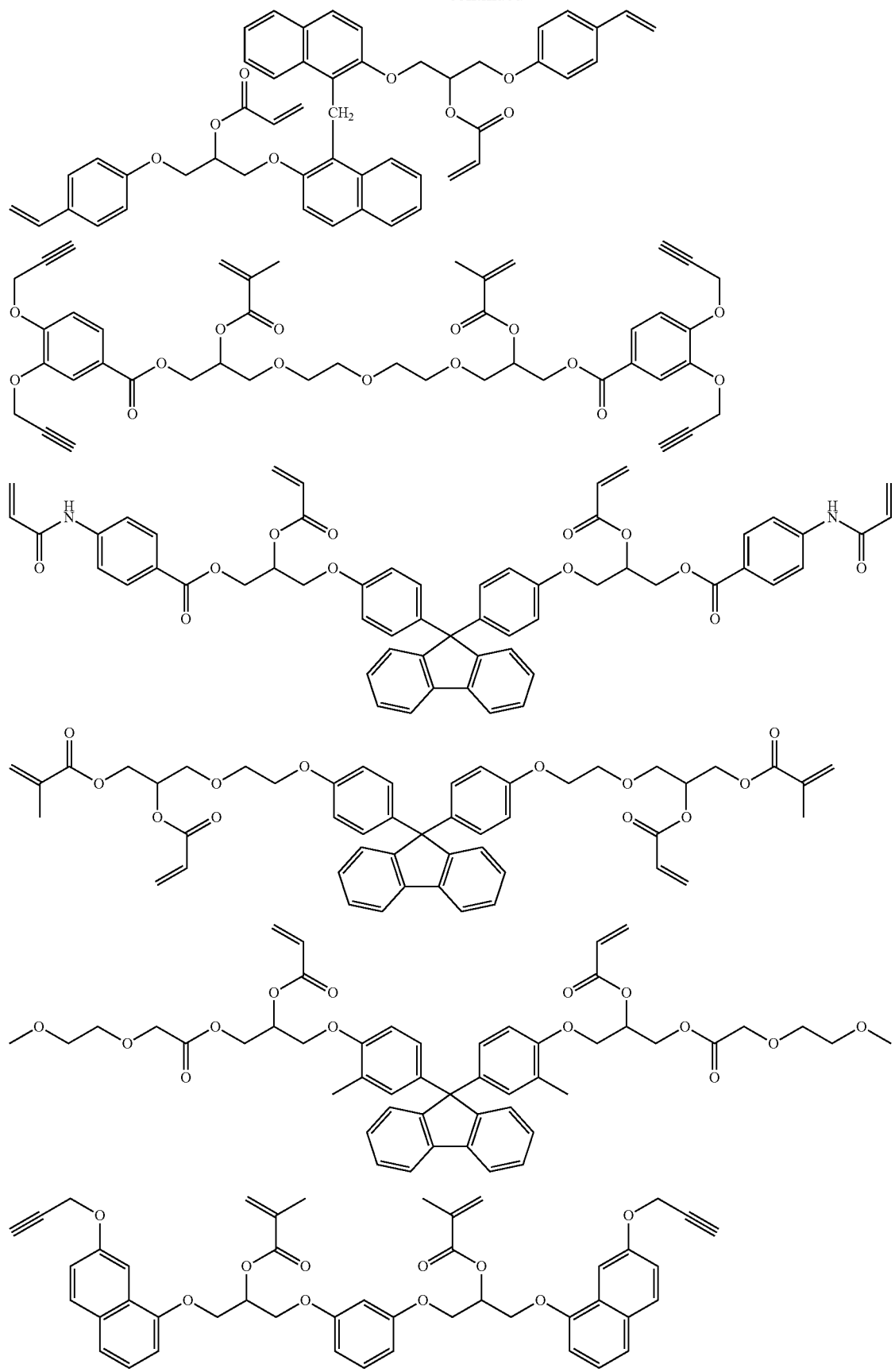

-continued
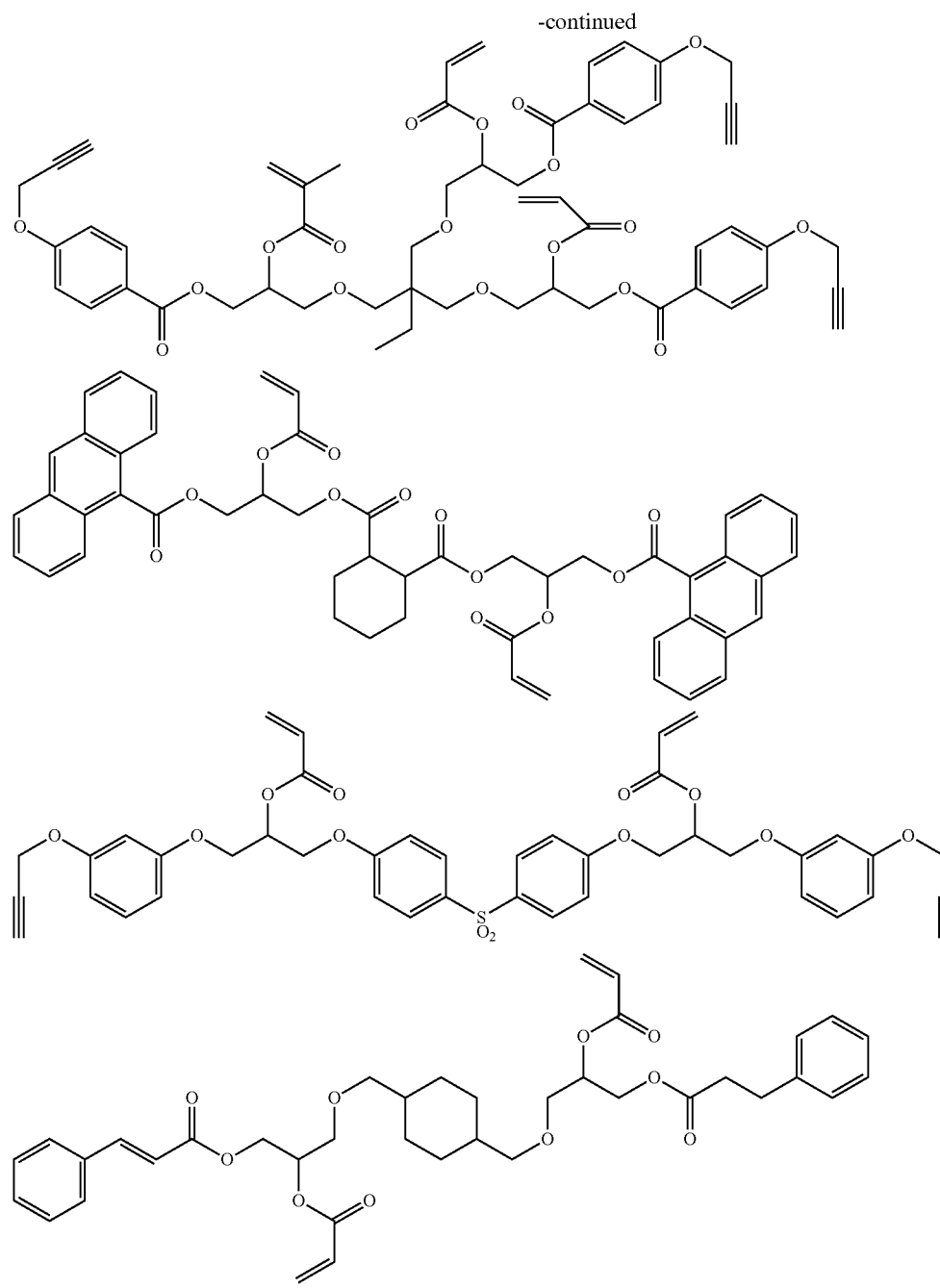
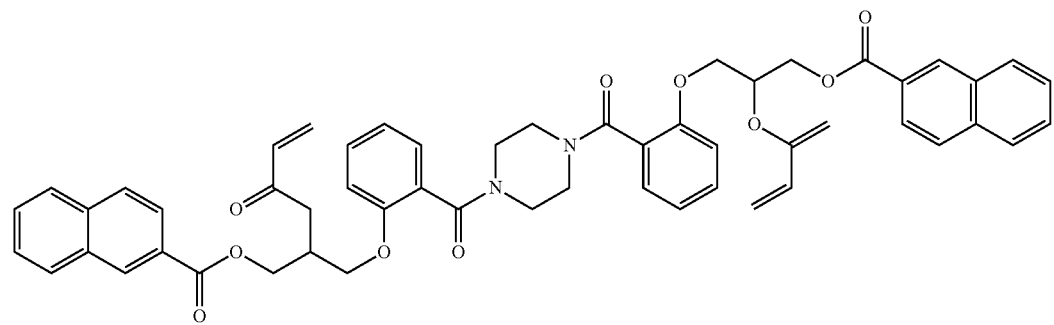

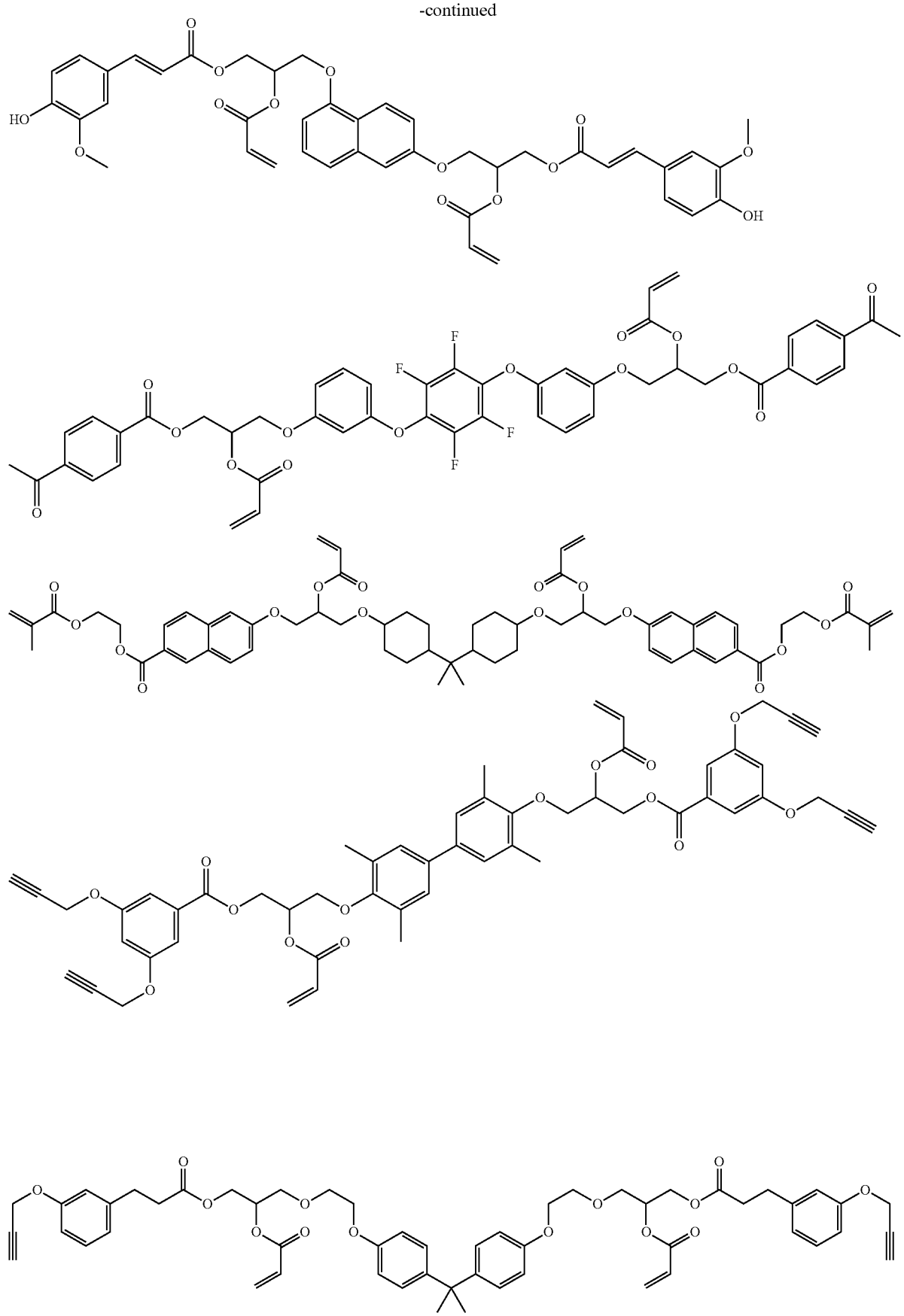

-continued
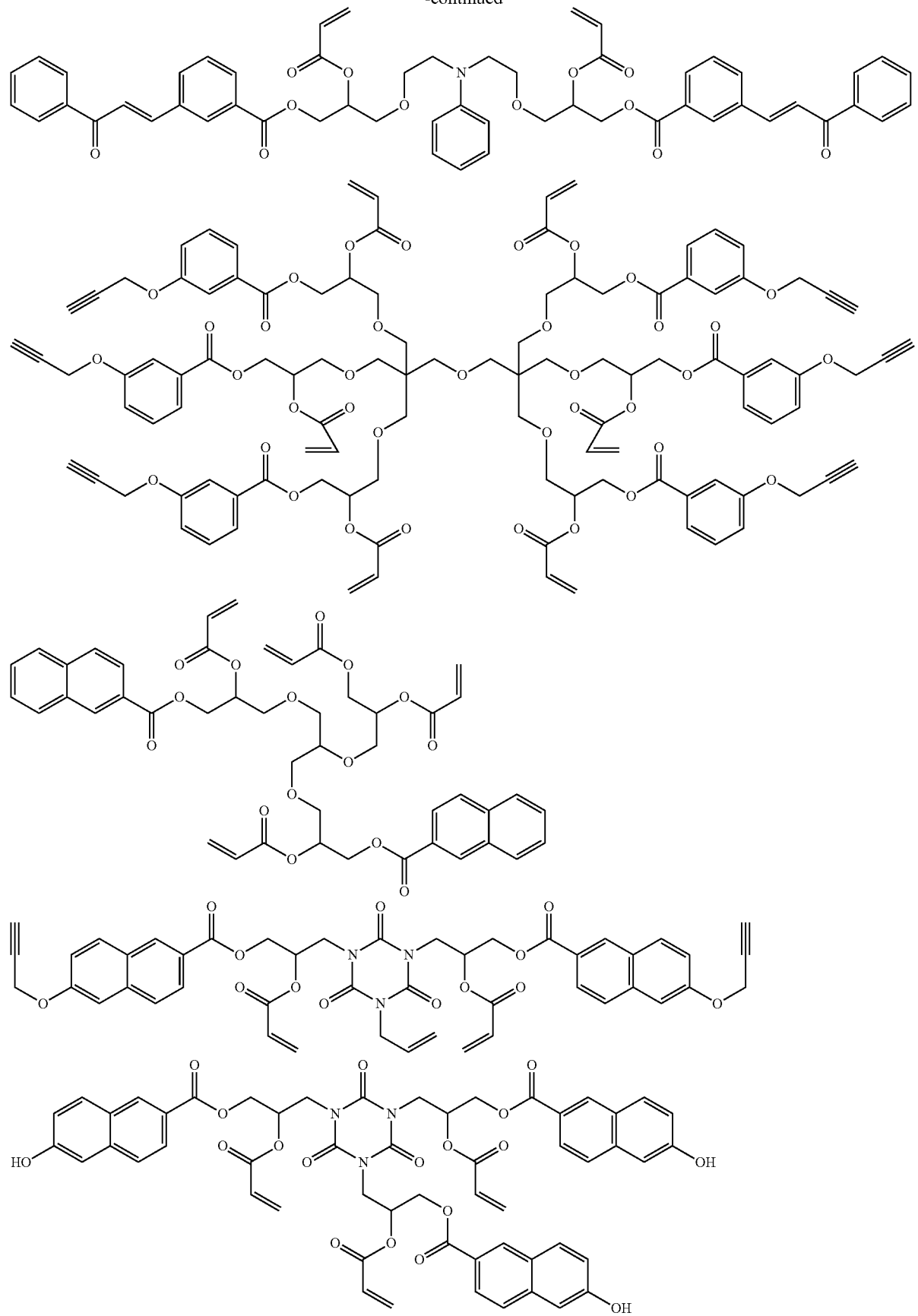

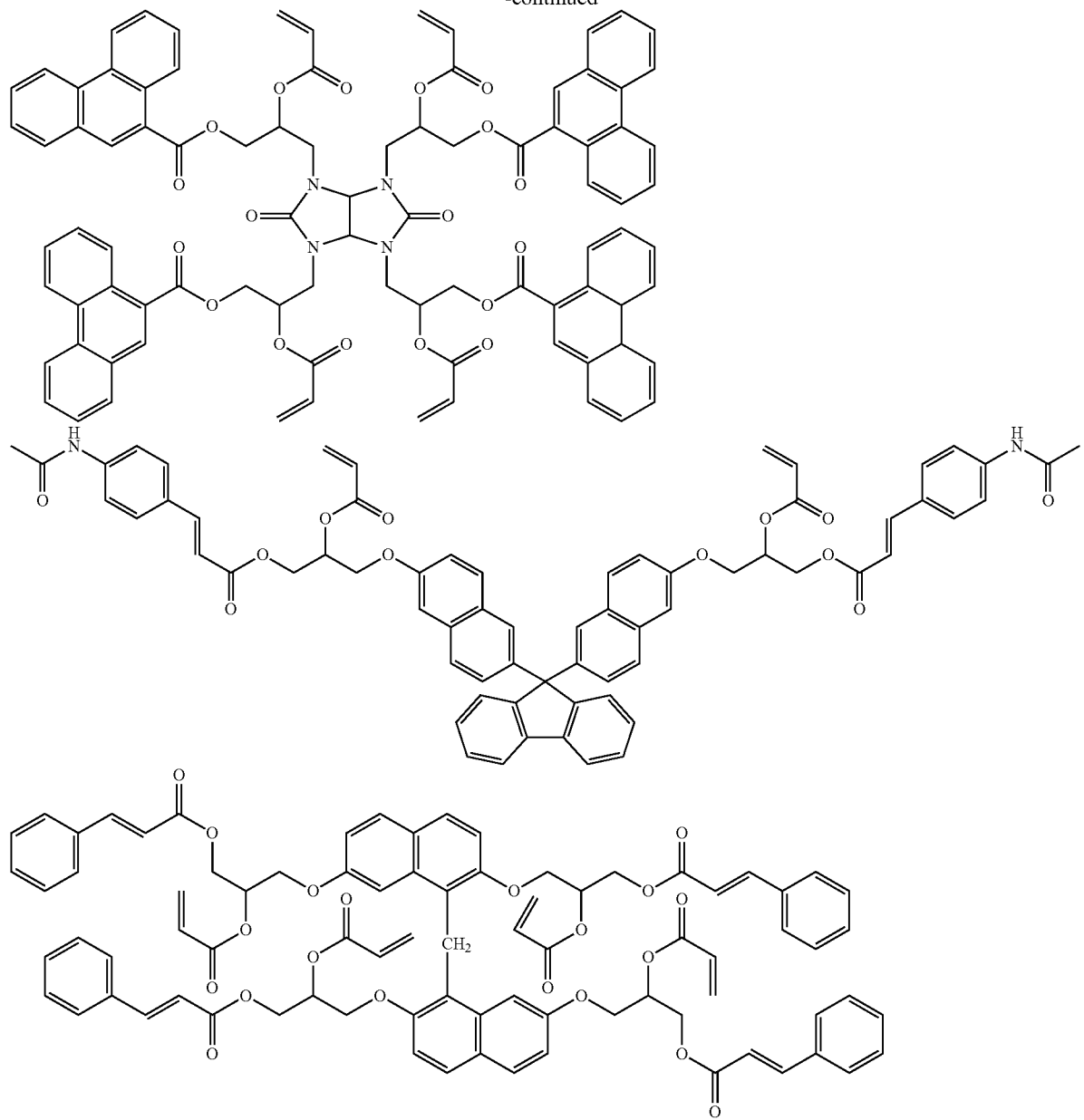
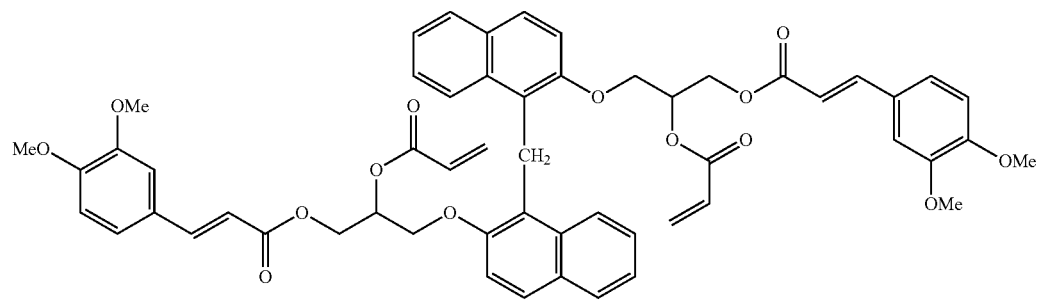

-continued

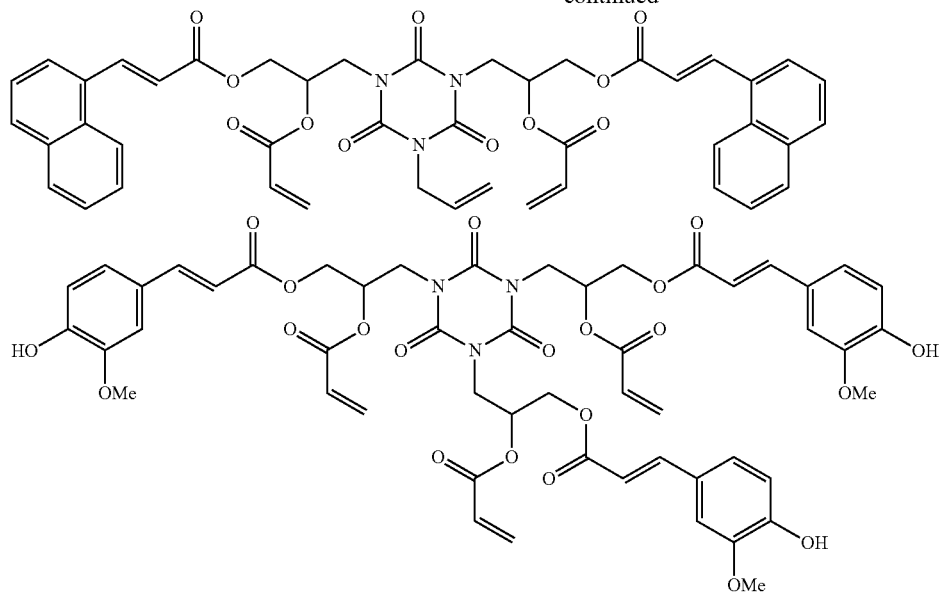

The compound shown by the general formula (1) preferably has a minimum complex viscosity of 10 Pa·s or less when the complex viscosity is measured within a range of 50° C. to 300° C. FIG. 1 is a graph showing the complex viscosity of an example of the compound shown by the general formula (1), as measured within a range of 50° C. to 300° C. The graph shows that the complex viscosity at 100° C. is 250 Pa·s, and the complex viscosity reaches a minimum of 0.8 Pa·s at 190° C. with heating. The complex viscosity then starts increasing, which indicates that the heat crosslinking reaction starts. Once the compound shown by the general formula (1) is heated, the complex viscosity decreases with the increase in temperature until the complex viscosity reaches a minimum at a certain temperature, and the complex viscosity then increases, as shown in FIG. 1. The temperature at which the complex viscosity becomes a minimum appears to be a temperature at which the compound shown by the general formula (1) begins the heat crosslinking reaction (crosslinking start temperature). The compound that has a minimum complex viscosity of 10 Pa·s or less measured within a range of 50° C. to 300° C. exhibits good thermal flowability. Thus, this compound enables a resist underlayer film composition containing the compound to have high filling and planarizing properties. In this regard, conventional thermosetting resist underlayer film compositions exhibit a maximum thermal flowability around the temperature at which the complex viscosity becomes a minimum during heating for curing, thereby improving the planarity once. However, some compositions then cause a significant film shrinkage of 10% or more, during heat curing. This film shrinkage shrinks a film in a certain proportion regardless of the film thickness. Thus, a concave portion of a substrate with a thick resist underlayer film more shrinks, whereas a convex portion of the substrate with a thin resist underlayer film less shrinks. As a result, the concave portion of the substrate after heat curing is more caved, and planarity is deteriorated. By contrast, the inventive resist underlayer film composition can significantly reduce the film shrinkage during curing by high energy beam irradiation, and thus can control deterioration of planarity, resulting in very excellent planarizing property.

The complex viscosity of the compound shown by the general formula (1) can be easily measured by a usual measurement apparatus that is commercially available. Examples of the measurement apparatus include MCR rheometer manufactured by Anton Paar Corp., and ARES rheometer manufactured by rheometric scientific Ltd. The measurement can be performed by, for example, setting the compound for the resist underlayer film composition containing no solvent (or from which a solvent has been removed) to the measurement apparatus, and measuring its complex viscosity between 50° C. and 300° C.

Additionally, the compound shown by the general formula (1) preferably has a complex viscosity of 1,000 Pa·s or less at 100° C. When the complex viscosity at 100° C. is 1,000 Pa·s or less, a resist underlayer film formed from a resist underlayer film composition containing this compound can have better planarity.

[(A') Compound Shown by Formula (3)]

The inventive resist underlayer film composition may further contain (A') a compound shown by the following general formula (3),

wherein W and "n" are as defined above, $X^2$ represents a monovalent organic group shown by the following general formula (3X),

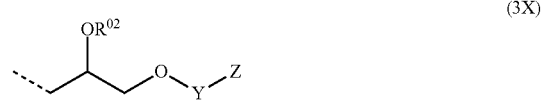

wherein the dotted line represents a bonding arm; Y and Z are as defined above; $R^{02}$ represents an acryloyl group, a methacryloyl group, or a hydrogen atom, provided that at least a part of $R^{02}$ is a hydrogen atom.

In the compound shown by the general formula (3), the proportion of hydrogen atoms in all $R^{02}$ is preferably 50% or less, more preferably 30% or less.

Additionally, Z in the general formula (3X) is preferably a group shown by the following general formula (1Z),

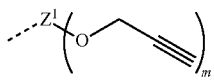
(1Z)

wherein the dotted line represents a bonding arm; $Z^1$ represents an (m+1)-valent aromatic group having 6 to 20 carbon atoms; and "m" represents an integer of 1 to 5.

Alternatively, it is preferred that in the general formula (3X), Z is a group shown by the following general formula (2Z), and Y is a carbonyl group,

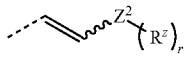
(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

Additionally, the compound shown by the general formula (3) preferably includes a compound shown by any one of the following general formulae (4-1) to (4-68),

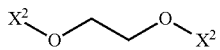
(4-1)

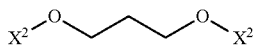
(4-2)

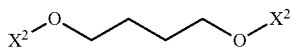
(4-3)

(4-4)

(4-5)

(4-6)

(4-7)

(4-8)

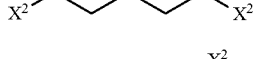

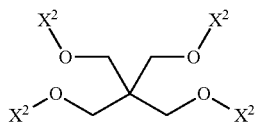
(4-9)

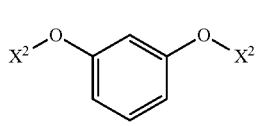
(4-10)

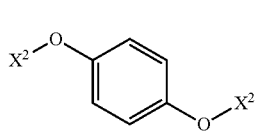
(4-11)

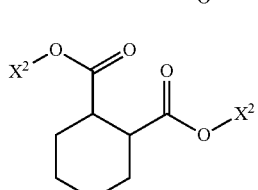
(4-12)

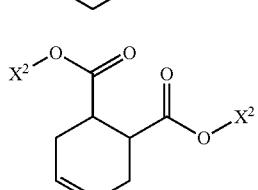
(4-13)

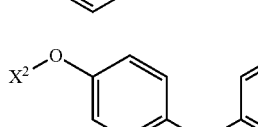
(4-14)

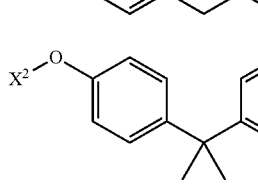
(4-15)

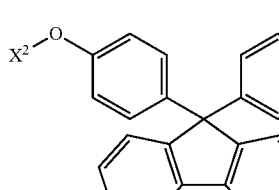
(4-16)

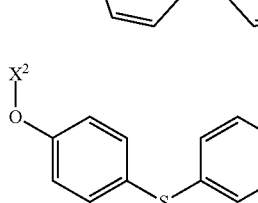
(4-17)

(4-18)

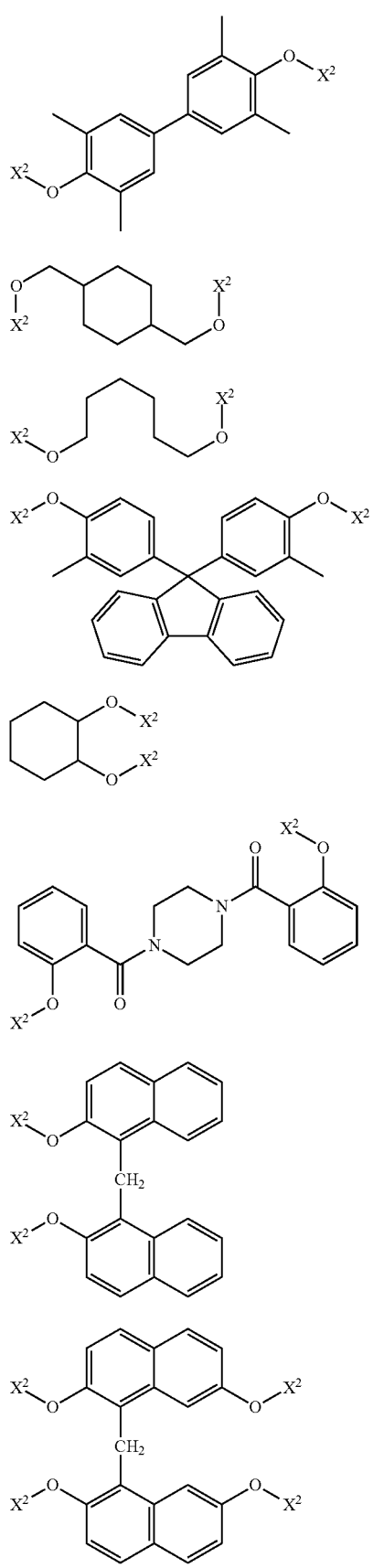
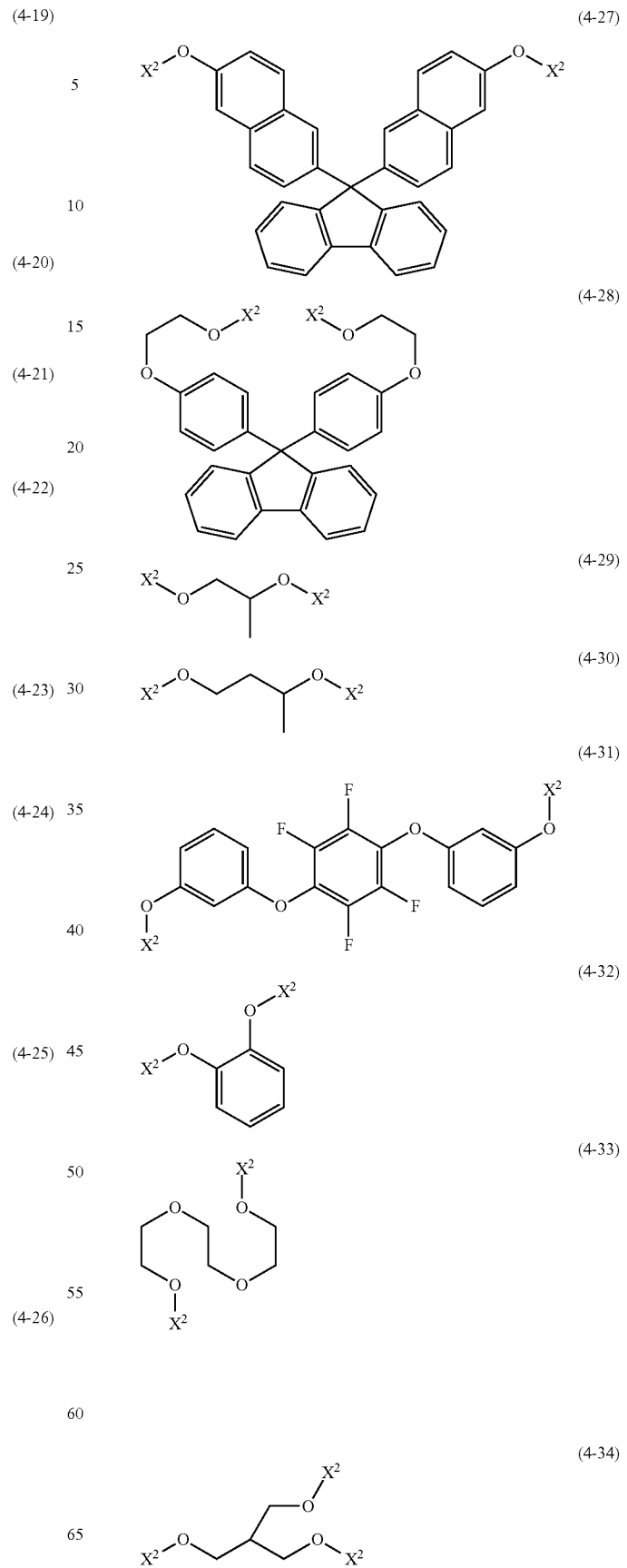

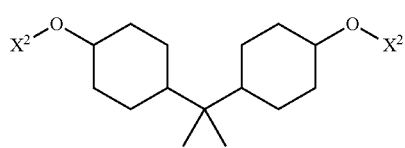 (4-35)
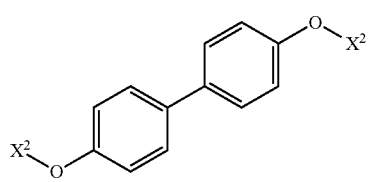 (4-36)
wherein $X^2$ is as defined above,
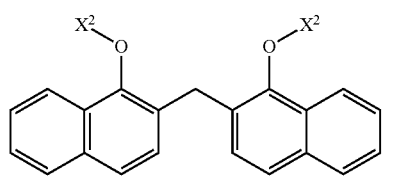 (4-37)
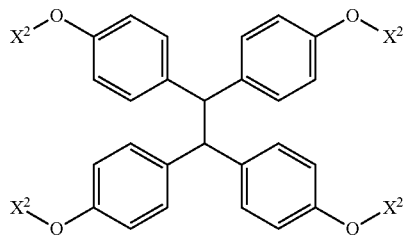 (4-38)
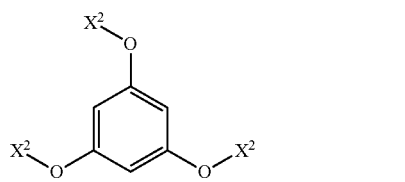 (4-39)
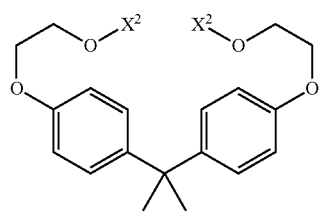 (4-40)
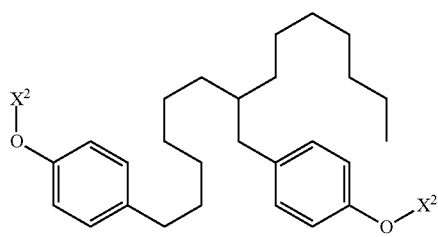 (4-41)
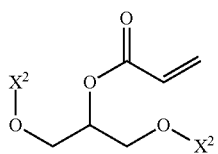 (4-42)
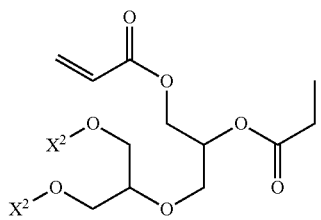 (4-43)
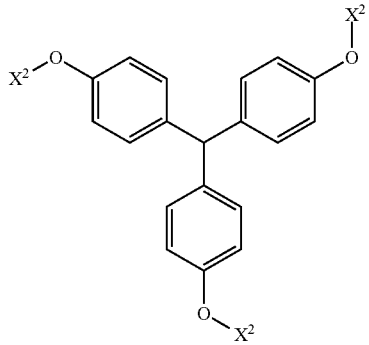 (4-44)
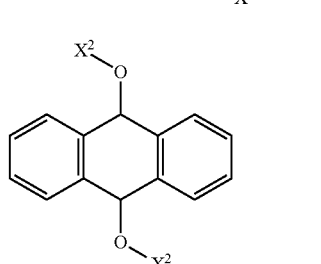 (4-45)
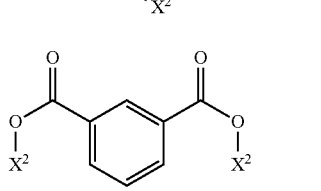 (4-46)
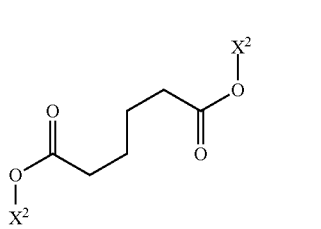 (4-47)
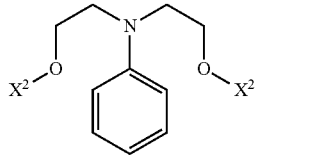 (4-48)

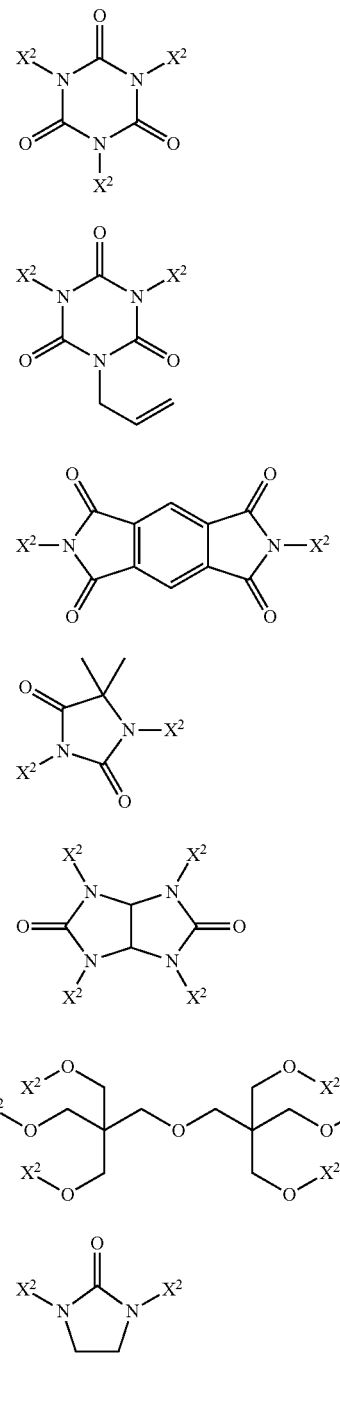
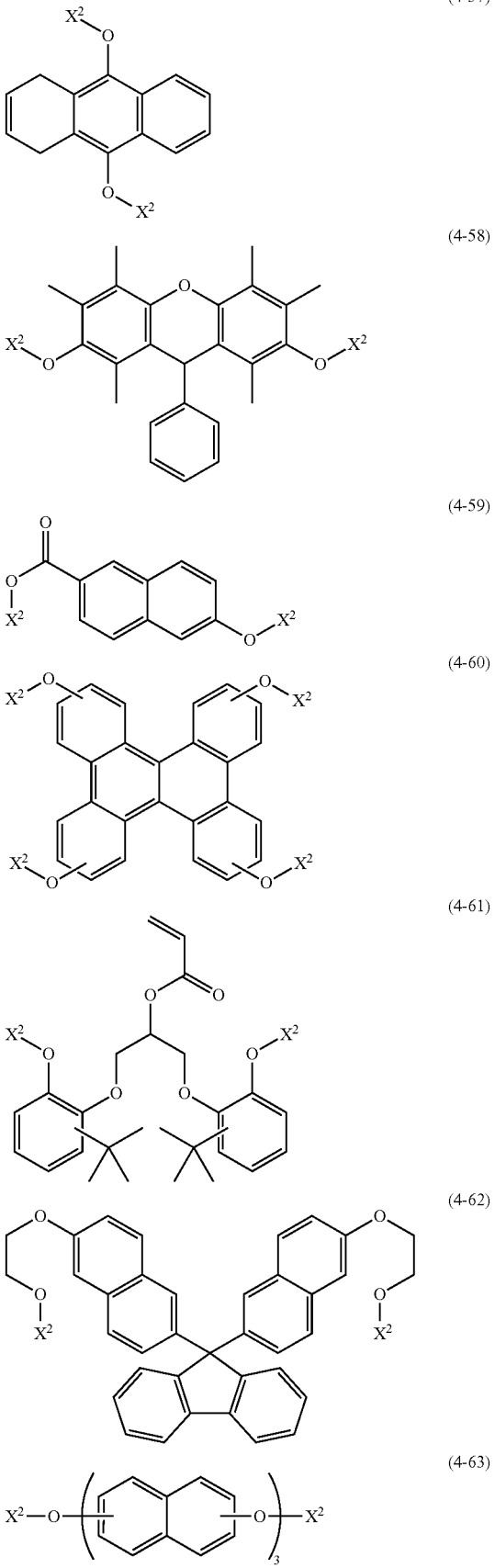

-continued

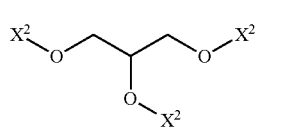
(4-64)

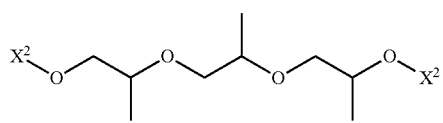
(4-65)

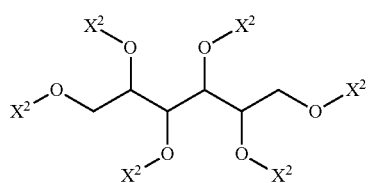
(4-66)

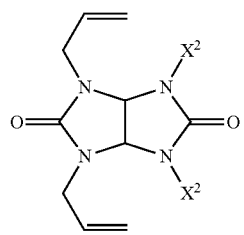
(4-67)

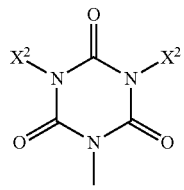
(4-68)

wherein $X^2$ is as defined above.

Thus, the inventive resist underlayer film composition may contain the compound shown by the general formula (3) (i.e., a compound corresponding to component (A) in which a part of $R^{01}$ in X is a hydrogen atom) as component (A'). The compound in which a part of $R^{01}$ is a hydrogen atom enables the inventive resist underlayer film composition to have excellent coating property and then film-forming property in some cases when it is applied on a substrate.

[(B) Organic Solvent]

The inventive resist underlayer film composition contains (B) an organic solvent. The organic solvent (B) that can be used in the inventive resist underlayer film composition is any solvent capable of dissolving (A) one or more than one compound shown by the general formula (1), and is preferably a solvent capable of further dissolving the component (A'), (C) a liquid polyfunctional acrylate compound having a boiling point of 200° C. or higher, (D) an acid generator, (E) a surfactant, (F) a crosslinking agent, (G) a plasticizer, (H) a colorant, (I) a photo-polymerization initiator, (J) a sensitizer, and (K) a stabilizer, described later. More specifically, an organic solvent having a boiling point of lower than 180° C. (hereinafter, also referred to as a "low-boiling point solvent"), such as solvents disclosed in paragraphs (0091) and (0092) of Japanese Unexamined Patent Application Publication No. 2007-199653, may be used. Above all, propylene glycol monomethyl ether acetate, propylene glycol monomethyl ether, propylene glycol monoethyl ether, propylene glycol monopropyl ether, 2-heptanone, cyclopentanone, cyclohexanone, and a mixture of two or more kinds thereof are preferably used. It is desirable to appropriately adjust the formulation amount of the organic solvent, depending on an intended thickness of the resist underlayer film. Generally, the formulation amount may be 100 to 50,000 parts by mass, based on 100 parts by mass of the compound shown by the general formula (1).

Moreover, the inventive resist underlayer film composition may contain, as the organic solvent, a mixture of one or more low-boiling point solvents and one or more organic solvents having a boiling point of 180° C. or higher (hereinafter, also referred to as a "high-boiling point solvent"). As the high-boiling point solvent, any solvent capable of dissolving (A) one or more than one compound shown by the general formula (1), such as hydrocarbons, alcohols, ketones, esters, ethers, and chlorinated solvents, can be used, without particular limitation. Illustrative examples thereof include 1-octanol, 2-ethylhexanol, 1-nonanol, 1-decanol, 1-undecanol, ethylene glycol, 1,2-propylene glycol, 1,3-butylene glycol, 2,4-pentanediol, 2-methyl-2,4-pentanediol, 2,5-hexanediol, 2,4-heptanediol, 2-ethyl-1,3-hexanediol, diethylene glycol, dipropylene glycol, triethylene glycol, tripropylene glycol, glycerin, n-nonyl acetate, ethylene glycol monohexyl ether, ethylene glycol mono-2-ethylhexyl ether, ethylene glycol monophenyl ether, ethylene glycol monobenzyl ether, diethylene glycol monomethyl ether, diethylene glycol monoethyl ether, diethylene glycol monoisopropyl ether, diethylene glycol mono-n-butyl ether, diethylene glycol monoisobutyl ether, diethylene glycol monohexyl ether, diethylene glycol mono-2-ethylhexyl ether, diethylene glycol monophenyl ether, diethylene glycol monobenzyl ether, diethylene glycol diethyl ether, diethylene glycol dibutyl ether, diethylene glycol butylmethyl ether, triethylene glycol dimethyl ether, triethylene glycol monomethyl ether, triethylene glycol n-butyl ether, triethylene glycol butylmethyl ether, triethylene glycol diacetate, tetraethylene glycol dimethyl ether, dipropylene glycol monomethyl ether, dipropylene glycol mono-n-propyl ether, dipropylene glycol mono-n-butyl ether, tripropylene glycol dimethyl ether, tripropylene glycol monomethyl ether, tripropylene glycol mono-n-propyl ether, tripropylene glycol mono-n-butyl ether, ethylene glycol monobutyl ether acetate, ethylene glycol monoethyl ether acetate, ethylene glycol monobutyl ether acetate, diethylene glycol monomethyl ether acetate, diethylene glycol monoethyl ether acetate, diethylene glycol monobutyl ether acetate, triacetin, propylene glycol monophenyl ether, propylene glycol diacetate, dipropylene glycol methyl-n-propyl ether, dipropylene glycol methyl ether acetate, 1,4-butanediol diacetate, 1,3-butylene glycol diacetate, 1,6-hexanediol diacetate, γ-butyrolactone, butyl adipate, diethyl sebacate, propylene carbonate, and N-methylpyrrolidone. These solvents may be used alone or in combination of two or more kinds.

The high-boiling point solvent may be appropriately selected, for example, from the above solvents, depending on the temperature at which the resist underlayer film composition is subjected to a heat treatment. The boiling point of the high-boiling point solvent is preferably 180° C. to 300° C., more preferably 200° C. to 300° C. This boiling point prevents an excessive evaporation rate at baking (heat treatment) due to low boiling point, thus providing sufficient thermal flowability. Moreover, the solvent having such a boiling point hardly remains in the film without evaporating after baking due to high boiling point, and thus does not adversely affect physical properties of the film, such as etching resistance.

When the high-boiling point solvent is used, the formulation amount of the high-boiling point solvent is preferably 1 to 30 parts by mass based on 100 parts by mass of the low-boiling point solvent. When the formulation amount is in this range, there is no fear of insufficient thermal flowability at baking due to lack of amount, as well as there is no fear of deterioration of physical properties of the film, such as etching resistance, due to excess amount.

Such a resist underlayer film composition can exhibit an improved thermal flowability by adding the high-boiling point solvent to (A) one or more than one compound shown by the general formula (1), and can achieve higher filling and planarizing properties.

[(C) Liquid Polyfunctional Acrylate Compound Having Boiling Point of 200° C. or Higher]

The inventive resist underlayer film composition preferably contains (C) a liquid polyfunctional acrylate compound having a boiling point of 200° C. or higher. The resist underlayer film composition containing such a compound can improve planarity when the composition is applied at room temperature, and enables formation of a resist underlayer film having high filling and planarizing properties, regardless of design of a substrate to be processed, such as pattern density.

The component (C) has a boiling point of 200° C. or higher at normal pressure (or when converted to normal pressure), and has low volatility at room temperature and normal pressure. Thus, most component (C) remains in the film when the resist underlayer film composition is applied. Moreover, the component (C) is liquid and fluid at room temperature, and thus serves to improve planarity when the resist underlayer film composition is applied. Furthermore, the component (C) contains two or more, preferably three or more acrylates in its molecule, which make the component curable by high energy beam irradiation, and thus does not inhibit curing of the resist underlayer film composition, resulting in little adverse effect by addition. Accordingly, the inventive resist underlayer film composition preferably contains the component (C), for such a resist composition can provide a resist underlayer film having excellent planarity and good curability by high energy beam irradiation, regardless of design of a substrate to be processed, such as pattern density. The boiling point of the component (C) at normal pressure (or when converted to normal pressure) is preferably 250° C. or higher, more preferably 300° C. or higher. The component (C) may be used alone or in combination of two or more kinds.

Additionally, the component (C) is preferably a polyacrylate of an acyclic polyol. The polyacrylate of an acyclic polyol has excellent flowability, and thus serves to significantly improve planarity in application and to improve coating property of the resist underlayer film composition containing this compound. In the present invention, the polyacrylate of an acyclic polyol indicates a compound having two or more acryloylated hydroxyl groups derived from an aliphatic polyhydric alcohol optionally containing an ether group. The hydroxyl groups may partially remain in the compound, or a compound in which no hydroxyl groups remain may be mixed with a compound in which hydroxyl groups partially remain.

The formulation amount of the component (C) is preferably 5 to 1,000 parts by mass, more preferably 10 to 500 parts by mass, based on 100 parts by mass of the component (A). When the formulation amount is 5 parts by mass or more, sufficient formulation effect can be obtained. When the formulation amount is 1,000 parts by mass or less, there is no fear that etching resistance is lowered, or planarity is deteriorated. Preferable examples of the component (C) are shown below, although not limited thereto. In the following formulae, R represents an acryloyl group or a hydrogen atom, and two or more R are acryloyl groups per molecule. "k" independently represents an integer of 0 to 10.

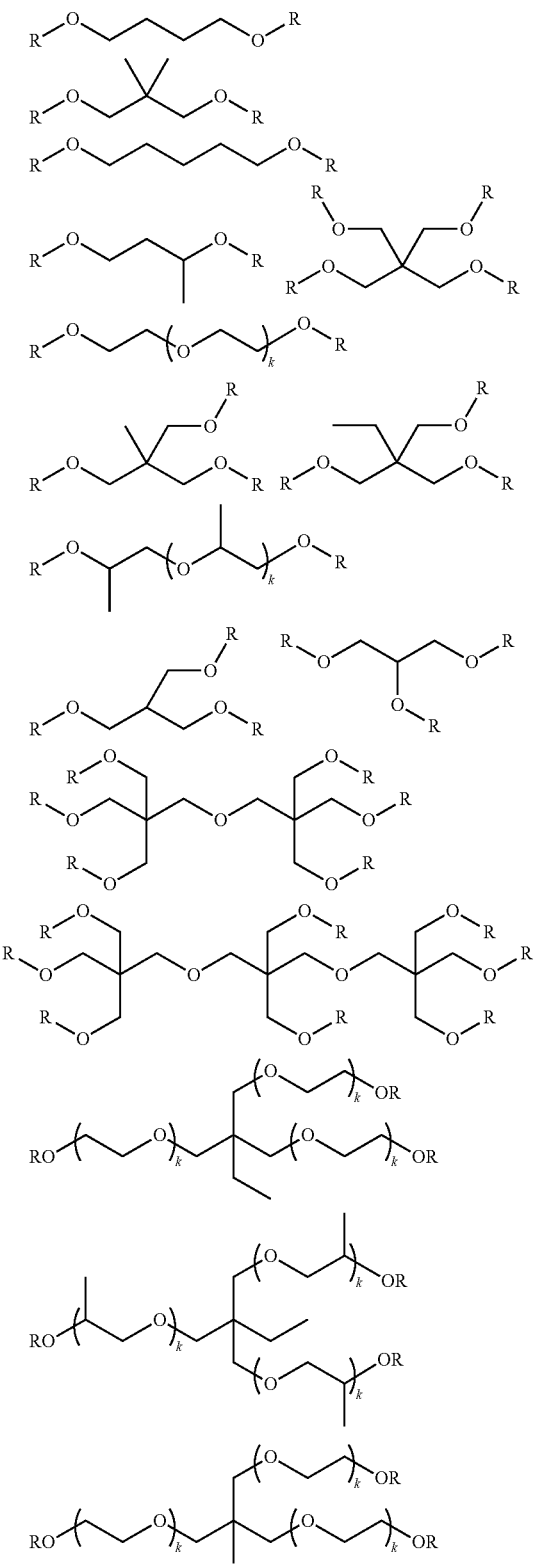

-continued

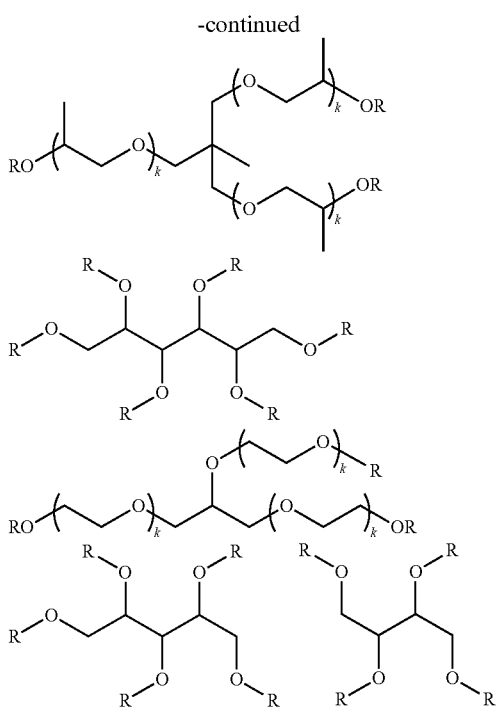

Preferable examples of the component (C) include, besides the above compounds, CN2300, CN2301, CN2302, CN2303, and CN2304 available from Sartomer Japan Inc., Viscoat #1000 and SIRIUS-501 available from Osaka organic chemical industry, Ltd., A-HBR-5, A-9300, A-9300-1CL, and A-9300-3CL available from Shin-Nakamura Chemical Co., Ltd., although not limited thereto.

To the inventive resist underlayer film composition, other substance may be further blended in addition to the components (A), (A'), and (C). The blending substance is mixed with the components (A), (A'), and (C), and serves to improve film-forming property by spin coating and filling property for a stepped substrate. In this case, the substance to be mixed is not particularly limited, and known substances can be used. More specifically, the substance is preferably an acrylic resin, a styrene resin, a phenol resin, a polyether resin, an epoxy resin, or a compound having a phenolic hydroxyl group. The formulation amount of the blending substance is preferably 1 to 100 parts by mass, more preferably 2 to 50 parts by mass, based on 100 parts by mass of the component (A).

[(D) Acid Generator]

Moreover, the inventive resist underlayer film composition may further contain (D) an acid generator to promote the curing reaction. The acid generator can be classified into a material that generates an acid by thermal decomposition and a material that generates an acid by light irradiation; any acid generators can be added. Illustrative examples thereof include materials disclosed in paragraphs (0061) to (0085) of Japanese Unexamined Patent Application Publication No. 2007-199653.

The acid generator may be used alone or in combination of two or more kinds. When the acid generator is added, the amount thereof is preferably 0.05 to 50 parts by mass, more preferably 0.1 to 10 parts by mass, based on 100 parts by mass of the component (A).

[(E) Surfactant]

The inventive resist underlayer film composition may further contain (E) a surfactant to improve coating property by spin coating. Illustrative examples of the surfactant include materials disclosed in paragraphs (0142) to (0147) of Japanese Unexamined Patent Application Publication No. 2009-269953.

[(F) Crosslinking Agent]

The inventive resist under layer film composition may further contain (F) a crosslinking agent to improve curability and further inhibit intermixing with a resist middle layer film and resist upper layer film to be formed on the resist underlayer film. The crosslinking agent is not particularly limited, and various known crosslinking agents can be widely used. Examples thereof include melamine, glycoluril, benzoguanamine, urea, β-hydroxyalkylamide, isocyanurate, aziridine, oxazoline, and epoxy crosslinking agents.

Illustrative examples of the melamine crosslinking agent include hexamethoxymethylated melamine, hexabutoxymethylated melamine, alkoxy- and/or hydroxy-substituted derivatives thereof, and partial self-condensates thereof. Illustrative examples of the glycoluril crosslinking agent include tetramethoxymethylated glycoluril, tetrabutoxymethylated glycoluril, alkoxy- and/or hydroxy-substituted derivatives thereof, and partial self-condensates thereof. Illustrative examples of the benzoguanamine crosslinking agent include tetramethoxymethylated benzoguanamine, tetrabutoxymethylated benzoguanamine, alkoxy- and/or hydroxy-substituted derivatives thereof, and partial self-condensates thereof. Illustrative examples of the urea crosslinking agent include dimethoxymethylated dimethoxyethyleneurea, alkoxy- and/or hydroxy-substituted derivatives thereof, and partial self-condensates thereof. Illustrative examples of the β-hydroxyalkylamide crosslinking agent include N,N,N',N'-tetra(2-hydroxyethyl)adipic acid amide. Illustrative examples of the isocyanurate crosslinking agent include triglycidyl isocyanurate and triallyl isocyanurate. Illustrative examples of the aziridine crosslinking agent include 4,4'-bis(ethyleneiminocarbonylamino)diphenylmethane and 2,2-bishydroxymethylbutanol-tris[3-(1-aziridinyl)propionate]. Illustrative examples of the oxazoline crosslinking agent include 2,2'-isopropylidene bis(4-benzyl-2-oxazoline), 2,2'-isopropylidene bis(4-phenyl-2-oxazoline), 2,2'-methylene bis(4,5-diphenyl-2-oxazoline), 2,2'-methylene bis(4-phenyl-2-oxazoline), 2,2'-methylene bis(4-t-butyl-2-oxazoline), 2,2'-bis(2-oxazoline), 1,3-phenylene bis(2-oxazoline), 1,4-phenylene bis(2-oxazoline), a 2-isopropenyloxazoline copolymer. Illustrative examples of the epoxy crosslinking agent include diglycidyl ether, ethylene glycol diglycidyl ether, 1,4-butanediol diglycidyl ether, 1,4-cyclohexanedimethanol diglycidyl ether, poly(glycidyl methacrylate), trimethylolethane triglycidyl ether, trimethylolpropane triglycidyl ether, pentaerythritol tetraglycidyl ether.

[(G) Plasticizer]

The inventive resist underlayer film composition may further contain (G) a plasticizer to further improve filling and planarizing properties. The plasticizer is not particularly limited, and various known plasticizers can be widely used. Examples thereof include low molecular weight compounds such as phthalate esters, adipate esters, phosphate esters, trimellitate esters, and citrate esters; polymers such as polyethers, polyesters, and polyacetal polymers disclosed in Japanese Unexamined Patent Application Publication No. 2013-253227.

[(H) Colorant]

The inventive resist underlayer film composition may contain (H) a colorant to further improve the resolution of patterning in the multilayer lithography. The colorant may be any compound having appropriate absorption at exposure wavelength; and various known colorants can be widely used. Examples thereof include benzenes, naphthalenes, anthracenes, phenanthrenes, pyrenes, isocyanuric acids, and triazines.

[(I) Photo-Polymerization Initiator]

Moreover, the inventive resist underlayer film composition may further contain (I) a photo-polymerization initiator to improve curing efficiency by high energy beam irradiation.

(I) the photo-polymerization initiator generates radicals by high energy beam irradiation, and initiates crosslinking reaction by polymerization of the components (A), (A'), and (C), improving curability of the inventive resist underlayer film composition. The photo-polymerization initiator may be any compound that generates radicals by high energy beam irradiation; and various known compounds can be widely used. Examples thereof include the following compounds.

(I) Benzophenone derivatives: e.g., benzophenone, methyl O-benzoylbenzoate, 4-benzoyl-4'-methyldiphenyl ketone, dibenzyl ketone, fluorenone
(II) Acetophenone derivatives: e.g., 2,2'-diethoxyacetophenone, 2-hydroxy-2-methylpropiophenone, 2,2-dimethoxy-1,2-diphenylethan-1-one (e.g., IRGACURE 651, available from BASF Corp.), 1-hydroxycyclohexyl phenyl ketone (e.g., IRGACURE 184, available from BASF Corp., Esacure KS300, available from DKSH Japan Corp.), 2-methyl-1-[4-(methylthio)phenyl]-2-morpholinopropan-1-one (e.g., IRGACURE 907, available from BASF Corp.), 2-hydroxy-1-{4-[4-(2-hydroxy-2-methylpropionyl)-benzyl]-phenyl}-2-methylpropan-1-one (e.g., IRGACURE 127, available from BASF Corp.), methyl phenylglyoxylate
(III) Thioxanthone derivatives: e.g., thioxanthone, 2-methylthioxanthone, 2-isopropylthioxanthone, 4-isopropylthioxanthone, 2-chlorothioxanthone, diethylthioxanthone
(IV) Benzyl derivative: e.g., benzyl, benzyldimethyl ketal, benzyl-β-methoxyethyl acetal
(V) Benzoin derivatives: e.g., benzoin, benzoin methyl ether, 2-hydroxy-2-methyl-1-phenylpropane-1-one (e.g., DAROCUR 1173, available from BASF Corp.)
(VI) Oxime compounds: e.g., 1-phenyl-1,2-butanedione-2-(O-methoxycarbonyl)oxime, 1-phenyl-1,2-propanedione-2-(O-methoxycarbonyl)oxime, 1-phenyl-1,2-propanedione-2-(O-ethoxycarbonyl)oxime, 1-phenyl-1,2-propanedione-2-(O-benzoyl)oxime, 1,3-diphenylpropanetrione-2-(O-ethoxycarbonyl)oxime, 1-phenyl-3-ethoxypropantrione-2-(O-benzoyl)oxime, 1,2-octanedione, 1-[4-(phenylthio)-2-(O-benzoyloxime)]ethanone (e.g., IRGACURE OXE 01, available from BASF Corp.), 1-[9-ethyl-6-(2-methylbenzoyl)-9H-carbazol-3-yl]-1-(O-acetyloxime) (e.g., IRGACURE OXE 02, available from BASF Corp.)
(VII) α-hydroxyketone compounds: e.g., 2-hydroxy-2-methyl-1-phenylpropan-1-one, 1-[4-(2-hydroxyethoxy)phenyl]-2-hydroxy-2-methyl-1-propan-1-one, 2-hydroxy-1-{4-[4-(2-hydroxy-2-methylpropionyl)-benzyl]phenyl}-2-methylpropane
(VIII) α-aminoalkylphenone compounds: e.g., 2-benzyl-2-dimethylamino-1-(4-morpholinophenyl)-butanone-1 (e.g., IRGACURE 369, available from BASF Corp.), 2-dimethylamino-2-(4-methylbenzyl)-1-(4-morpholin-4-yl-phenyl)butan-1-one (e.g., IRGACURE 379, available from BASF Corp.)
(IX) Phosphine oxide compounds: e.g., bis(2,4,6-trimethylbenzoyl)-phenylphosphine oxide (e.g., IRGACURE 819, available from BASF Corp.), bis(2,6-dimethoxybenzoyl)-2,4,4-trimethyl-pentylphosphine oxide, 2,4,6-trimethyl-benzoyldiphenylphosphine oxide (e.g., DAROCUR TPO, available from BASF Corp.)
(X) Titanocene compounds: e.g., bis(η5-2,4-cyclopentadien-1-yl)-bis(2,6-difluoro-3-(1H-pyrrol-1-yl) phenyl)titanium (IRGACURE 784, available from Ciba Specialty Chemicals Co., Ltd.)

When the photo-polymerization initiator is blended, the formulation amount thereof is preferably 0.1 to 10 mass %, more preferably 0.1 to 5 mass %, much more preferably 0.1 to 1 mass % in a solid (components other than the solvent) of the resist underlayer film composition. When the amount is 0.1 mass % or more, sufficient formulation effect can be obtained. When the amount is 10 mass % or less, physical properties and preservation stability of the resist underlayer film are not adversely affected.

[(J) Sensitizer]

Furthermore, the inventive resist underlayer film composition may contain (J) a sensitizer to improve curability by high energy beam irradiation.

(J) the sensitizer is also referred to as a curing accelerator. In particular, a combination with the photo-polymerization initiator can reduce exposure dose of high energy beam required for curing.

The sensitizer may be any compound that can improve radical generating efficiency by high energy beam irradiation; and various known compounds cam be widely used. Examples thereof include amines such as triethanolamine, diethanolamine, N-methyldiethanolamine, 2-methylaminoethylbenzoate, dimethylaminoacetophenone, isoamyl p-dimethylaminobenzoate, and ethyl p-dimethylaminobenzoate; hydrogen donors such as 2-mercaptobenzothiazole; and dye sensitizers such as xanthene, thioxanthene, coumarin, and thiocoumarin.

[(K) Stabilizer]

Moreover, the inventive resist underlayer film composition may contain (K) a stabilizer to improve preservation stability.

(K) the stabilizer can control deterioration of the components (A), (A'), and (C) due to polymerization or oxidation mainly by capturing radicals, thus improving preservation stability of the inventive resist underlayer film composition. The stabilizer may be any compound that has radical capture effect; and various known compounds, such as hindered amine photo-stabilizers and antioxidants, can be widely used. Examples thereof include the following compounds.

Examples of the hindered amine photo-stabilizer include hindered amine compounds such as 2,2,6,6-tetramethyl-4-piperidyl stearate, 1,2,2,6,6-pentamethyl-4-piperidyl stearate, 2,2,6,6-tetramethyl-4-piperidyl benzoate, bis(2,2,6,6-tetramethyl-4-piperidyl) sebacate, bis(1,2,2,6,6-tetramethyl-4-piperidyl) sebacate, bis(1-octoxy-2,2,6,6-tetramethyl-4-piperidyl)sebacate, tetrakis(2,2,6,6-tetramethyl-4-piperidyl)-1,2,3,4-butanetetracarboxylate, tetrakis(1,2,2,6,6-pentamethyl-4-piperidyl)-1,2,3,4-butanetetracarboxylate, bis(2,2,6,6-tetramethyl-4-piperidyl)·di(tridecyl)-1,2,3,4-butanetetracarboxylate, bis(1,2,2,6,6-pentamethyl-4-piperidyl)·di(tridecyl)-1,2,3,4-butanetetracarboxylate, bis(1,2,2,4,4-pentamethyl-4-piperidyl)-2-butyl-2-(3,5-di-t-4-hydroxybenzyl)malonate, a polycondensate of 1-(2-hydroxyethyl)-2,2,6,6-tetramethyl-4-piperidinol and diethyl succinate, a polycondensate of 1,6-bis(2,2,6,6-tetramethyl-4-piperidylamino)hexane and 2,4-dichloro-6-morpholino-s-triazine, a polycondensate of 1,6-bis(2,2,6,6-tetramethyl-4-piperidylamino)hexane and 2,4-dichloro-6-t-octylamino-s-triazine, 1,5,8,12-tetrakis[2,4-bis(N-butyl-N-(2,2,6,6- tetramethyl-4-piperidyl)amino)-s-triazin-6-yl]-1,5,8,12-tetraazadodecane, 1,5,8,12-tetrakis[2,4-bis(N-butyl-N-(1,2,2,6,6-pentamethyl-4-piperidyl)amino)-s-triazin-6-yl]-1,5,8-12-tetraazadodecane, 1,6,11-tris[2,4-bis(N-butyl-N-(2,2,6,6-tetramethyl-4-piperidyl)amino)-s-triazin-6-yl] aminoundecane, and 1,6,11-tris[2,4-bis(N-butyl-N-(1,2,2,6,6-pentamethyl-4-piperidyl)amino)-s-triazin-6-yl] aminoundecane.

As the antioxidant, various types of antioxidants are known, including thioether, phosphorus, hindered phenol, monoacrylate phenol, and nitroxide types. Above all, the following hindered phenol antioxidants are preferred.

Illustrative examples of the thioether antioxidant include AO-412 and AO-503 (both available from ADEKA Corp.).

Illustrative examples of the phosphorus antioxidant include Irgafos38, Irgafos168, IrgafosP-EPQ (all available from BASF Corp.), PEP-8 and PEP-36 (both available from ADEKA Corp.)

Illustrative examples of the hindered phenol antioxidant include 2,6-di-t-butyl-4-methylphenol, 2,6-di-t-butyl-4-ethylphenol, mono-(or di- or tri-) (α-methylbenzyl)phenol, 2,2'-methylene bis(4-ethyl-6-t-butylphenol), 2,2'-methylene bis(4-methyl-6-t-butylphenol), 4,4'-butylidene bis(3-methyl-6-t-butylphenol), 4,4'-thio bis(3-methyl-6-t-butylphenol), 2,5-di-1-butylhydroquinone, 2,5-di-t-amylhydroquinone, triethylene glycol bis[3-(3-t-butyl-5-methyl-4-hydroxyphenyl) propionate], 1,6-hexanediol bis[3-(3,5-di-t-butyl-4-hydroxyphenyl)propionate], 2,4-bis(n-octylthio)-6-(4-hydroxy-3,5-di-t-butylanilino)-1,3,5-triazine, pentaerythrityl-tetrakis[3-(3,5-di-t-butyl-4-hydroxyphenyl) propionate], 2,2-thio-diethylene bis[3-(3,5-di-t-butyl-4-hydroxyphenyl)propionate], octadecyl-3-(3,5-di-t-butyl-4-hydroxyphenyl) propionate, N,N'-hexamethylene bis(3,5-di-t-butyl-4-hydroxy-hydrocinnamamide), 3,5-di-t-butyl-4-hydroxybenzylphosphonate diethyl ester, 1,3,5-trimethyl-2,4,6-tris(3,5-di-t-butyl-4-hydroxybenzyl)benzene, bis(ethyl 3,5-di-t-butyl-4-hydroxybenzylphosphonate) calcium, tris (3,5-di-t-butyl-4-hydroxybenzyl)isocyanurate, 2,4-bis[(octylthio)methyl] o-cresol, N,N'-bis[3-(3,5-di-t-butyl-4-hydroxyphenyl)propionyl]hydrazine, tris(2,4-di-t-butylphenyl)phosphite, 2-(5-methyl-2-hydroxyphenyl) benzotriazole, 2-[2-hydroxy-3,5-bis(α,α-dimethylbenzyl) phenyl]-2H-benzotriazole, 2-(3,5-di-t-butyl-2-hydroxyphenyl)benzotriazole, 2-(3-t-butyl-5-methyl-2-hydroxyphenyl)-5-chlorobenzotriazole, 2-(3,5-di-t-butyl-2-hydroxyphenyl)-5-chlorobenzotriazole, 2-(3,5-di-t-amyl-2-hydroxyphenyl) benzotriazole, 2-(2'-hydroxy-5'-t-octylphenyl)benzotriazole, a condensate of methyl-3-[3-t-butyl-5-(2H-benzotriazol-2-yl)-4-hydroxyphenyl] propionate and polyethylene glycol (molecular weight: about 300), a hydroxyphenylbenzotriazole derivative, bis(1,2,2,6,6-pentamethyl-4-piperidyl) 2-(3,5-di-t-butyl-4-hydroxybenzyl)-2-n-butylmalonate, and 2,4-di-t-butylphenyl-2,5-di-butyl-4-hydroxybenzoate. As a trade name, there may be mentioned Nocrac 200, Nocrac M-17, Nocrac SP, Nocrac SP-N, Nocrac NS-5, Nocrac NS-6, Nocrac NS-30, Nocrac 300, Nocrac NS-7, Nocrac DAH (all available from Ouchi shinko chemical industrial Co., Ltd.), AO-20, AO-30, AO-40, AO-50, AO-60, AO-80, and AO-330 (all available from ADEKA Corp.), IRGANOX-245, IRGANOX-259, IRGANOX-565, IRGANOX-1010, IRGANOX-1024, IRGANOX-1035, IRGANOX-1076, IRGANOX-1081, IRGANOX-1098, IRGANOX-1222, IRGANOX-1330, and IRGANOX-1425WL (all available from BASF Corp.), Sumilizer GA-80 (available from Sumitomo Chemical Co., Ltd.), 4-methoxyphenol, and 4-t-butyl catechol, although not limited thereto.

Illustrative examples of the monoacrylate phenol antioxidant include 2-t-butyl-6-(3-t-butyl-2-hydroxy-5-methylbenzyl)-4-methylphenyl acrylate (trade name: Sumilizer GM), and 2,4-di-t-amyl-6-[1-(3,5-di-t-amyl-2-hydroxyphenyl) ethyl] phenyl acrylate (trade name: Sumilizer GS).

Illustrative examples of the nitroxide antioxidant include nitroxy free radicals derived from cyclic hydroxylamines such as 2,2,6,6-substituted-1-piperidinyloxy radical and 2,2,5,5-substituted-1-pyrrolidinyloxy radical. Preferable substituent is an alkyl group having 4 or less carbon atoms such as a methyl group and an ethyl group. The nitroxy free radical compound may be for example, but is not limited to, 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrrolidinyloxy radical, 1,1,3,3-tetramethyl-2-isoindolinyloxy radical, or N,N-di-t-butylamineoxy radical. Instead of the nitroxy free radicals, stable free radicals such as galvinoxyl free radicals may be used.

In the present invention, an antioxidant and a photo-stabilizer may be used in combination. By combining these additives, further effect can be obtained, and in particular, heat resistance can be improved. In addition, Tinuvin C353 or Tinuvin B75 (Both available from BASF Corp.) in which an antioxidant and a photo-stabilizer have been mixed, may be used.

<Method for Forming Resist Underlayer Film>

The present invention also provides a method for forming a resist underlayer film, including: applying the inventive resist underlayer film composition on a substrate to be processed; subjecting the resist underlayer film composition to a heat treatment at 50° C. to 300° C. for 10 to 600 seconds; and then irradiating the composition with a high energy beam to form a cured film.

The thickness of the resist underlayer film to be formed in the present invention is appropriately selected, and is preferably 30 to 20,000 nm, particularly preferably 50 to 15,000 nm. As described later, in case that the resist underlayer film is used for 3-layer or 4-layer process, a resist middle layer film and a resist upper layer film may be formed thereon. In case that the resist underlayer film is used for 2-layer process, a silicon-containing resist upper layer film, or a non-silicon containing resist upper layer film may be formed thereon.

The resist underlayer film composition can be applied on a substrate to be processed by a spin coating method or the like. The spin coating method allows the composition to have good filling property. After spin coating, if necessary, a heat treatment (pre-baking) may be performed, and the composition is irradiated with at high energy beam to form a resist underlayer film.

Pre-baking evaporates the solvent and causes the resist underlayer film composition to flow by heating, which enables adjustment of filling and planarizing properties. In pre-baking, the heat treatment is performed at 50° C. to 300° C. for 10 to 600 seconds. The pre-baking temperature and time may be adjusted according to use; and preferable range is at 80° C. to 250° C., for 30 to 300 seconds, approximately. When pre-baking is performed at 50° C. or higher for 10 seconds or more, sufficient heat treatment effect can be obtained. When the temperature is 300° C. or lower, thermal decomposition of the components is hardly caused, and there is no risk of reduction in film thickness and non-uniformity of the film surface. Moreover, when the time is 600 seconds or less, productivity is not reduced. Thus, the above range is preferable.

Alternatively, the inventive method for forming a resist underlayer film may include applying the resist underlayer film composition on a substrate to be processed, and irradiating the composition with a high energy beam without a heat treatment. This method can prevent deterioration of planarity due to the thermal shrinkage at forming the resist underlayer film, as described above.

In this method, the substrate to be processed may be a substrate having a structure or a step with a height of 30 nm or more.

In the inventive method for forming a resist underlayer film, a cured resist underlayer film can be obtained by irradiating an applied composition with a high energy beam. Herein, "curing" means a state where the film has very low solubility with respect to a solvent used in a resist middle layer film, a resist upper layer film, or the like applied thereon, such as propylene glycol monomethyl ether acetate, propylene glycol monomethyl ether, propylene glycol monoethyl ether, propylene glycol monopropyl ether, 2-heptanone, cyclopentanone, cyclohexanone, γ-butyrolactone, ethyl lactate, and a mixture of two or more kinds, and the film is not intermixed with the resist middle layer film and the resist upper layer film.

For high energy beam irradiation, any method can be employed without particular limitation, so long as it can crosslink the components of the resist underlayer film composition. The high energy beam irradiation may be performed, for example, with a light source such as an ultra-high-pressure mercury lamp, a flash UV lamp, a high-pressure mercury lamp, a low-pressure mercury lamp, a deep ultraviolet lamp, a xenon short arc lamp, a short arc metal halide lamp, a YAG laser excitation lamp, a xenon flash lamp, an argon excimer lamp, a krypton excimer lamp, a xenon excimer lamp, a krypton chloride excimer lamp, a xenon chloride excimer lamp, an electron beam irradiation device, and a laser light source (a light source such as a helium-cadmium laser or an excimer laser). Among them, a xenon excimer lamp is preferable since it has advantage of instant stability, and the device can be easily downsized, automated, in-lined, and thus easily incorporated into the semiconductor apparatus manufacturing process.

The high energy beam irradiation may be performed in an inert gas (e.g., nitrogen gas, argon gas, helium gas) atmosphere or in vacuum, if necessary. The high energy beam is preferably radiated with a minimum exposure dose required for sufficiently curing the resist underlayer film composition to obtain a plane resist underlayer film. An appropriate exposure dose of the high energy beam prevents decomposition and deformation of the resist underlayer film and deterioration of planarity. After high energy beam irradiation, if necessary, a heat treatment may be performed, which can promote curing of the resist underlayer film. In this case, the heat treatment is preferably performed at 100° C. to 300° C. for 10 to 600 seconds.

In this manner, the inventive method for forming a resist underlayer film enables formation of a resist underlayer film having excellent planarity, even on a stepped substrate to be processed, by high energy beam irradiation for curing.

<Patterning Process>
[2-Layer Resist Process]

Moreover, the present invention provides a patterning process for forming a pattern in a substrate to be processed, including the steps of: (I-1) applying the resist underlayer film composition on a substrate to be processed and irradiating the composition with a high energy beam to form a resist underlayer film; (I-2) forming a resist upper layer film on the resist underlayer film by using a resist upper layer film material composed of a photoresist composition; (I-3) subjecting the resist upper layer film to pattern exposure and development with a developer to form a pattern in the resist upper layer film; and (I-4) transferring the pattern to the resist underlayer film by dry etching using the resist upper layer film having the formed pattern as a mask.

The substrate to be processed may be a substrate on which a layer to be processed is formed. The substrate is not particularly limited, and may be made of a different material from the layer to be processed, such as Si, α-Si, p-Si, $SiO_2$, SiN, SiON, W, TiN, and Al. Examples of the layer to be processed include various Low-k films made of Si, $SiO_2$, SiON, SiN, p-Si, α-Si, W, TiN, W—Si, Al, Cu, Al—Si, or the like and stopper films thereof. The layer is typically formed with a thickness of 50 to 10,000 nm, particularly 100 to 5,000 nm. Moreover, the substrate to be processed may have a structure or a step with a height of 30 nm or more.

The resist underlayer film can be formed by the above-described method for forming a resist underlayer film according to the present invention. As described above, the resist underlayer film may be formed by applying the resist underlayer film composition on the substrate to be processed, performing a heat treatment at 50° C. to 300° C. for 10 to 600 seconds, and then irradiating the composition with the high energy beam, or by applying the resist underlayer film composition on the substrate to be processed, and irradiating the composition with the high energy beam without a heat treatment. When the used substrate to be processed has a structure or a step, the substrate can be filled and planarized by forming the resist underlayer film. Moreover, as the light source of the high energy beam for curing, an xenon excimer lamp can be used.

The resist upper layer film material used for forming the resist upper layer film may be a positive type or a negative type, and any resist upper layer film material composed of a common photoresist composition can be used. When the resist upper layer film is formed by using the resist upper layer film material composed of the photoresist composition, the spin coating method is preferably used as the resist underlayer film is formed. After spin coating of the resist upper layer film material composed of the photoresist composition, pre-baking is performed preferably at 60 to 180° C. for 10 to 300 seconds. Thereafter, exposure, post-exposure bake (PEB), and development are carried out according to conventional methods to obtain a resist upper layer film pattern. The thickness of the resist upper layer film is typically, but not particularly limited to, 30 to 500 nm, preferably 50 to 400 nm. Examples of the exposure light include a high energy beam having a wavelength of 300 nm or less, more specifically, an excimer laser beam of 248 nm, 193 nm, or 157 nm, a soft X-ray having a wavelength of 3 to 20 nm, an electron beam, and an X-ray.

The obtained resist upper layer film pattern is used as a mask for etching process of the resist underlayer film. The etching of the resist underlayer film may be performed with an etching gas mainly containing oxygen gas or hydrogen gas.

Further, the resist underlayer film is used as a mask for patterning the substrate to be processed by etching, ion implantation, or the like. The etching of the substrate to be processed can also be carried out according to a conventional method. For example, the substrate to be processed made of $SiO_2$, SiN, or silica low-dielectric insulator film can be etched mainly with a fluorocarbon gas; the substrate to be processed made of p-Si, Al, or W can be etched mainly with a chlorine- or bromine-based gas.

[3-Layer Resist Process]

Moreover, the present invention provides a patterning process for forming a pattern in a substrate to be processed, including the steps of: (II-1) applying the resist underlayer film composition on a substrate to be processed and irradiating the composition with a high energy beam to form a resist underlayer film; (II-2) forming a resist middle layer film on the resist underlayer film; (II-3) forming a resist upper layer film on the resist middle layer film by using a resist upper layer film material composed of a photoresist composition; (II-4) subjecting the resist upper layer film to pattern exposure and development with a developer to form a pattern in the resist upper layer film; (II-5) transferring the pattern to the resist middle layer film by dry etching using the resist upper layer film having the formed pattern as a mask; and (II-6) transferring the pattern to the resist underlayer film by dry etching using the resist middle layer film having the transferred pattern as a mask.

This 3-layer resist process can be performed in the same manner as in the 2-layer resist process except that the resist middle layer film is formed between the resist underlayer film and the resist upper layer film.

As the resist middle layer film formed on the resist underlayer film, for example, an inorganic hard mask intermediate film selected from a silicon oxide film, a silicon nitride film, or a silicon oxynitride film, or a silicon-containing resist middle layer film may be used.

In case that, the inorganic hard mask intermediate film is formed, any of a silicon oxide film, a silicon nitride film, and a silicon oxynitride film (a SiON film) is preferably formed by a CVD method or an ALD method. The method for forming the silicon nitride film is disclosed in, for example, Japanese Unexamined Patent Application Publication No. 2002-334869 and International Publication No. WO2004/066377. The thickness of the inorganic hard mask is typically 5 to 200 nm, preferably 10 to 100 nm. Above all, the SiON film, which has a high function as an antireflective film, is most preferably used.

In case that the silicon-containing resist middle layer film is formed, a polysilsesquioxane-based middle layer film is preferably formed by the spin coating method or the like. The polysilsesquioxane-based middle layer film can be easily provided with an anti-reflective effect, whereby the reflection can be advantageously suppressed in pattern exposure of the resist upper layer film, and thus excellent resolution can be obtained. In particular, when a composition containing many aromatic groups is used as the resist underlayer film composition for 193-nm exposure, a k-value and thus substrate reflection are rather increased. Nonetheless, the resist middle layer film can reduce the reflection, thereby enabling the substrate reflection to decrease to 0.5% or less. Preferably used as the resist middle layer film having an anti-reflective effect is a polysilsesquioxane which has a pendant anthracene for exposure of 248 nm or 157 nm, or a pendant phenyl group or a pendant light-absorbing group having a silicon-silicon bond for 193 nm exposure, and which is crosslinkable by acid or heat. In this case, the spin coating method is more convenient and takes lower cost to form the silicon-containing resist middle layer film than the CVD method.

When etching is performed by using as a mask the resist upper layer film pattern obtained from the resist upper layer film formed on such a resist middle layer film, the etching of the resist middle layer film in the 3-layer resist process can be performed, for example, with a fluorocarbon-based gas by using the resist pattern as a mask. In this manner, a resist middle layer film pattern is formed.

The etching process of the resist underlayer film using the resist middle layer film pattern as a mask can be performed with an etching gas mainly containing oxygen gas or hydrogen gas. In this manner, a resist underlayer film pattern is formed. Since the resist middle layer film containing silicon atoms has resistance to etching with am oxygen gas or a hydrogen gas, the etching of the resist underlayer film using the resist middle layer film as a mask is preferably performed with an etching gas mainly containing oxygen gas or hydrogen gas, as described above.

A subsequent etching of the substrate to be processed can also be carried out according to a conventional method, as in the 2-layer resist process. When the substrate to be processed is etched with a fluorocarbon-based gas, the silicon-containing resist middle layer film of the 3-layer process is removed together with processing the substrate. When the substrate is etched with a chlorine- or bromine-based gas, the silicon-containing resist underlayer film pattern needs to be removed by another dry etching with a fluorocarbon gas after processing the substrate.

[4-Layer Resist Process]

Moreover, the present invention provides a patterning process for forming a pattern in a substrate to be processed, including the steps of: (III-1) applying the resist underlayer film composition on a substrate to be processed and irradiating the composition with a high energy beam to form a resist underlayer film; (III-2) forming an inorganic hard mask intermediate film selected from a silicon oxide film, a silicon nitride film, or a silicon oxynitride film on the resist underlayer film; (III-3) forming an organic anti-reflective film, on the inorganic hard mask intermediate film; (III-4) forming a resist upper layer film on the organic anti-reflective film by using a resist upper layer film material composed of a photoresist composition; (III-5) subjecting the resist upper layer film to pattern exposure and development with a developer to form a pattern in the resist upper layer film; (III-6) transferring the pattern to the organic anti-reflective film and the inorganic hard mask intermediate film by dry etching using the resist upper layer film having the formed pattern as a mask; and (III-7) transferring the pattern to the resist underlayer film by dry etching using the inorganic hard mask intermediate film having the transferred pattern as a mask.

A photoresist film may be formed on the resist middle layer film as the resist upper layer film, or, as described above, an organic anti-reflective film (BARC) may be formed on the resist middle layer film, for example, by spin coating, and a resist upper layer film may be formed thereon. When a SiON film is used as the resist middle layer film, the reflection can be controlled by two anti-reflective films of the SiON film and the BARC film even in liquid immersion exposure at a high NA exceeding 1.0. Another merit of the BARC formation is to reduce footing of the resist upper layer film pattern, compared with a pattern just on the SiON film.

The 4-layer resist process can be performed in the same manner as in the 3-layer resist process except that the organic anti-reflective film (BARC) is formed between the inorganic hard mask intermediate film and the resist upper layer film.

The BARC can be formed from a known material, for example, by the spin coating method.

Figure 2:
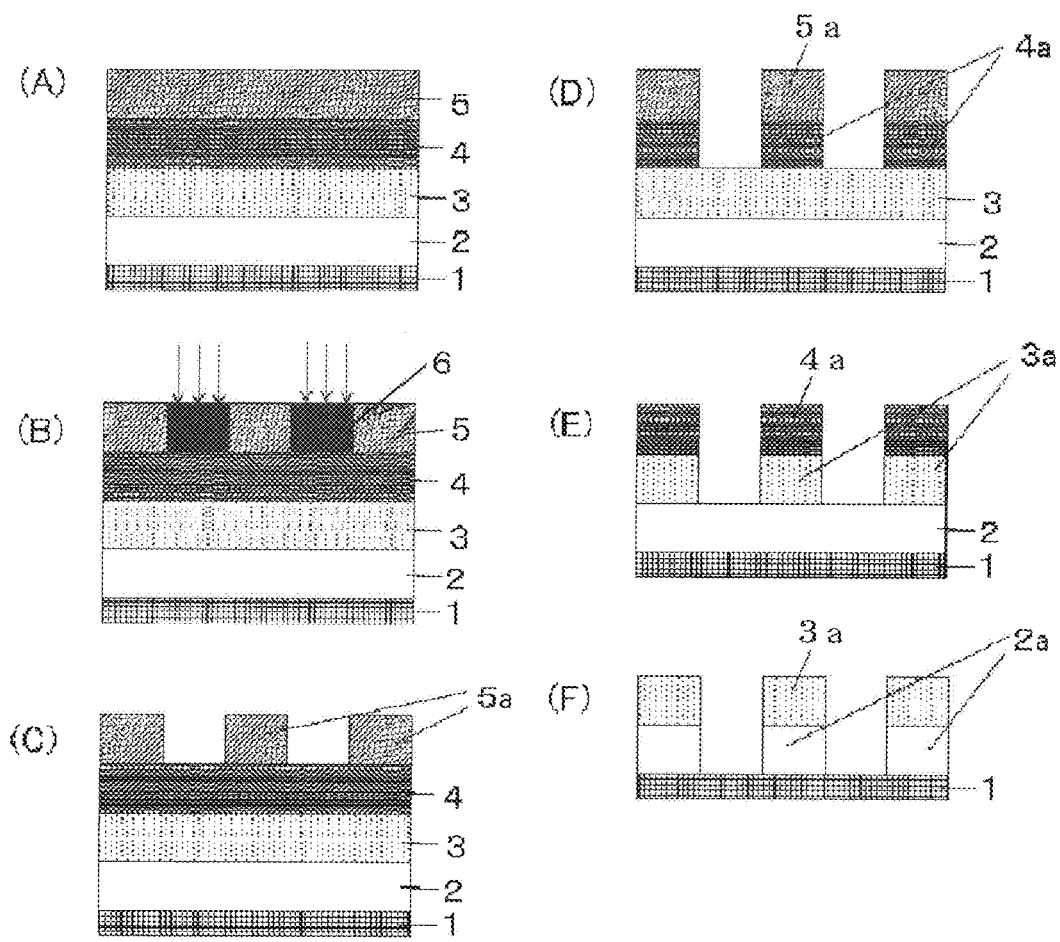
FIG. 2 is an explanatory view of an example of the patterning process by the 3-layer resist process according to the present invention.

FIG. 2 shows an example of the patterning process by the 3-layer resist process using a positive resist, according to the present invention. In the process of FIG. 2, after a resist underlayer film 3 is formed on a layer to be processed 2 on a substrate 1, a resist middle layer film 4 is formed thereon, and a resist upper layer film 5 is formed thereon (FIG. 2(A)). Then, an exposure portion 6 of the resist upper layer film 5 is exposed to light (FIG. 2(B)). Then, the film is subjected to post exposure baking (PEB) and development to form a resist upper layer film pattern 5*a* (FIG. 2(C)). Then, the resist middle layer film 4 is processed by etching with a CF (fluorocarbon) gas, using the resist upper layer film pattern 5*a* as a mask to form a resist middle layer film pattern 4*a* (FIG. 2(D)). After the resist upper layer film pattern 5*a* is removed, the resist underlayer film 3 is etched with oxygen- or hydrogen-based plasma, using the obtained resist middle layer film pattern 4*a* as a mask to form an resist underlayer film pattern 3*a* (FIG. 2(E)). Further, after the resist middle layer film pattern 4*a* is removed, the layer to be processed 2 is processed by etching using the resist underlayer film pattern 3*a* as a mask to form a pattern 2*a* in the layer to be processed (FIG. 2(F)).

In case that the inorganic hard mask intermediate film is used, the resist middle layer film 4 is replaced with the inorganic hard mask intermediate film. In case that the BARC is formed, the BARC is formed between the resist middle layer film 4 and the resist upper layer film 5. The etching of the BARC may be carried out continuously in advance of the etching of the resist middle layer film 4. Alternatively, after the BARC is etched alone, an etching apparatus may be changed to etch the resist middle layer film 4.

As described above, when a resist underlayer film is formed by using the inventive resist underlayer film composition, the surface of the resist underlayer film can be highly planarized even on a substrate to be processed having unevenness or steps, fluctuation in film thickness of a resist middle layer film and a resist upper layer film formed thereon can be controlled, and the reduction of a focus margin in lithography or a margin in a subsequent step of processing the substrate can be controlled. In other words, the inventive resist underlayer film composition can be suitably used for a multilayer resist process such as 2-layer resist process, 3-layer resist process using a resist middle layer film, or 4-layer resist process using an inorganic hard mask intermediate film and an organic anti-reflective film.

<Compound for Resist Underlayer Film Composition>

Furthermore, the present invention provides a compound for a resist underlayer film composition, shown by the following general formula (1), W—(X)$_n$  (1)

wherein W represents an n-valent organic group having 2 to 50 carbon atoms; X represents a monovalent organic group shown by the following general formula (1X); and "n" represents an integer of 1 to 10,

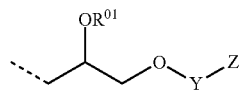
(1X)

wherein the dotted line represents a bonding arm; R$^{01}$ represents an acryloyl group or a methacryloyl group; Y represents a single bond or a carbonyl group; and Z represents a group shown by the following general formula (1Z),

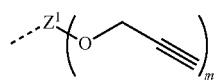
(1Z)

wherein the dotted line represents a bonding arm; Z$^1$ represents an (m+1)-valent aromatic group having 6 to 20 carbon atoms; and "m" represents an integer of 1 to 5.

Preferable examples of W, X, Y, Z$^1$, "n", and "m" are the same as described in the component (A) of the resist underlayer film composition.

Additionally, the compound for a resist underlayer film composition shown by the general formula (1) preferably includes a compound shown by any one of the following general formulae (2-1) to (2-68).

(2-1)

(2-2)

(2-3)

(2-4)

(2-5)

(2-6)

(2-7)

(2-8)

(2-9)

(2-10)

(2-11)

(2-12)

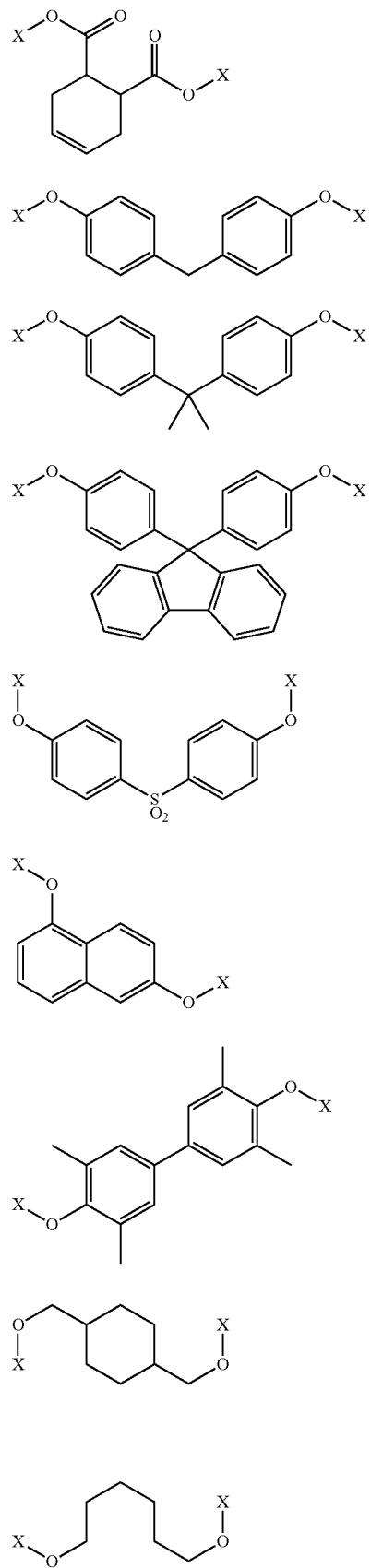
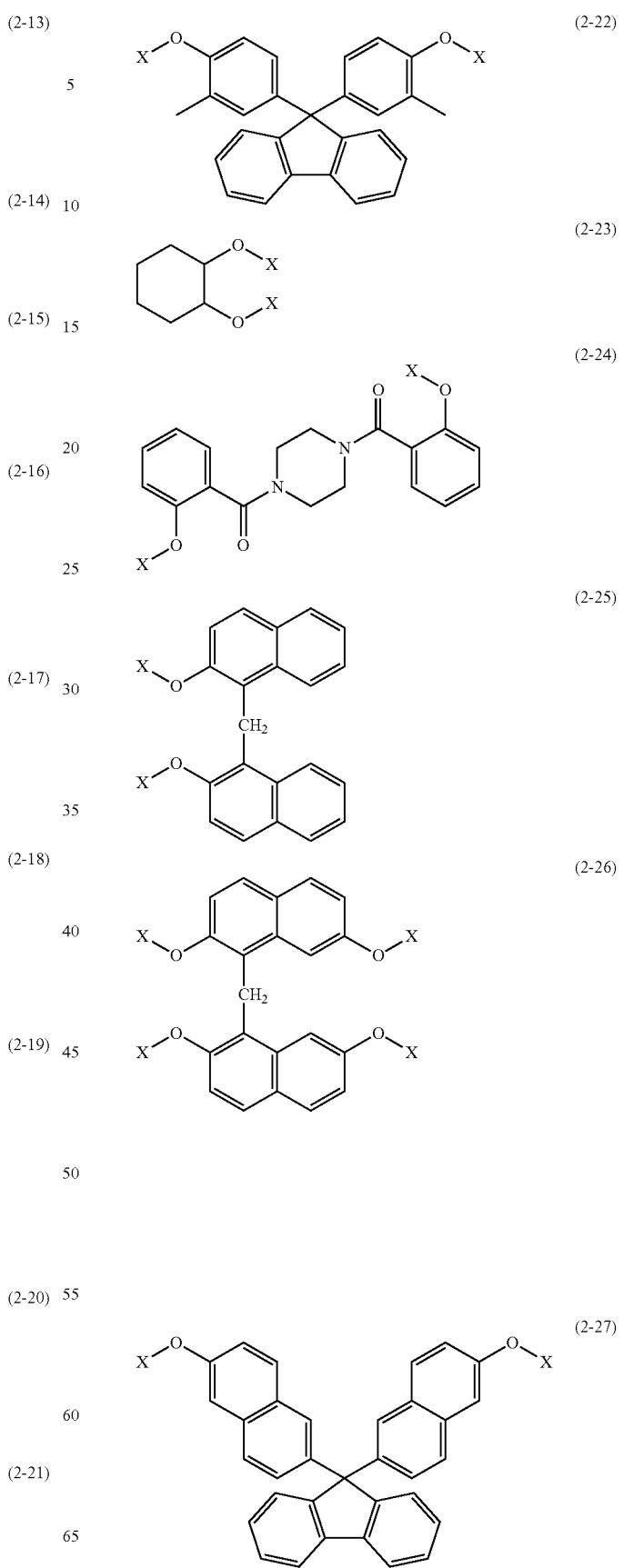

-continued
(2-28) 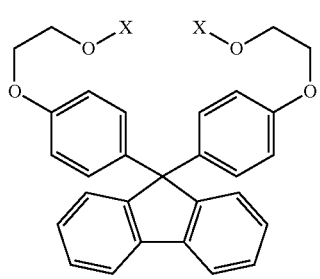
(2-29) 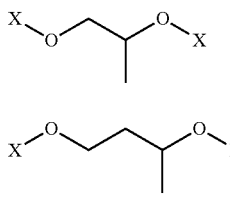
(2-30) 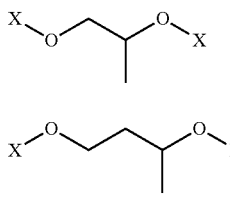
(2-31) 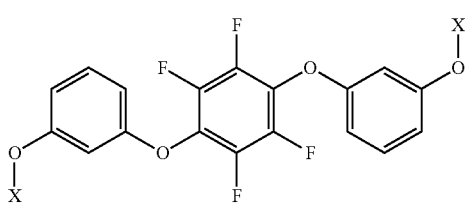
(2-32) 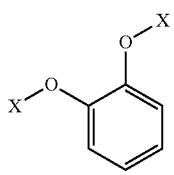
(2-33) 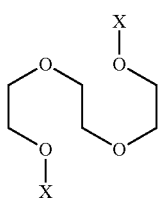
(2-34) 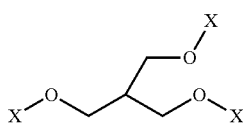
(2-35) 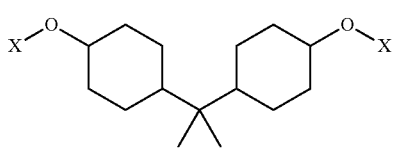
(2-36) 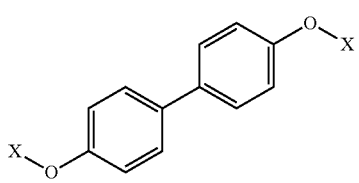
(2-37) 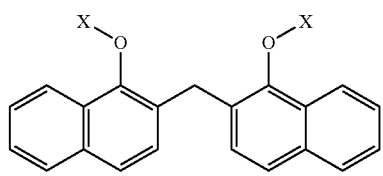
(2-38) 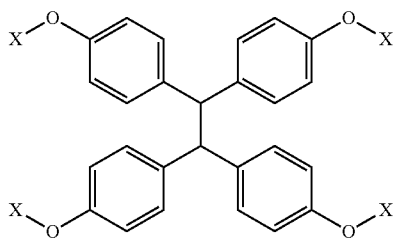
(2-39) 
(2-40) 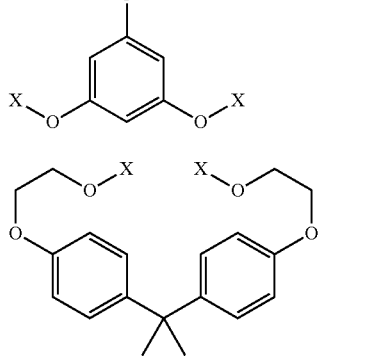
(2-41) 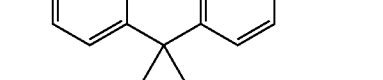
(2-42) 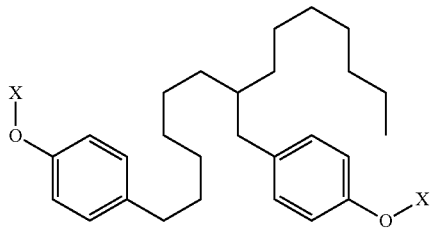
(2-43) 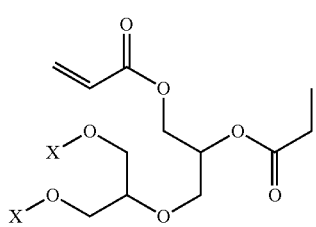
wherein X is as defined above.

(2-44)
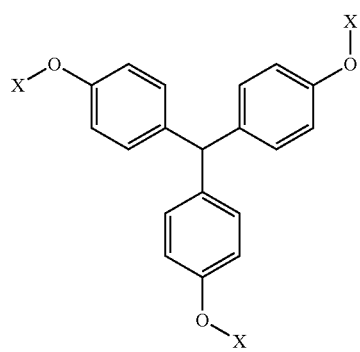
(2-51)
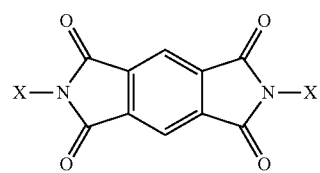
(2-45)
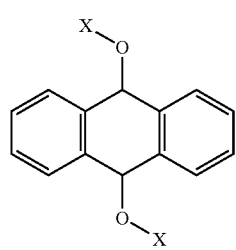
(2-52)
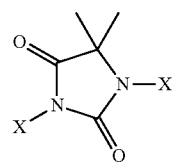
(2-53)
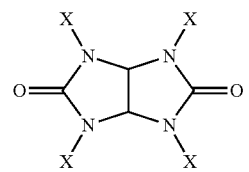
(2-46)
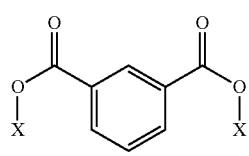
(2-54)
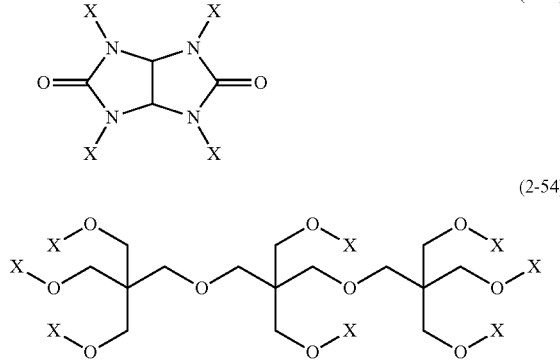
(2-47)
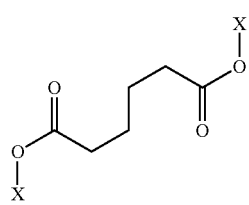
(2-55)
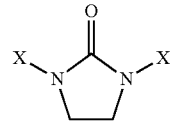
(2-48)
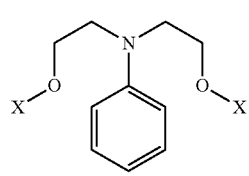
(2-56)
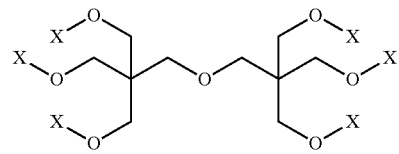
(2-49)
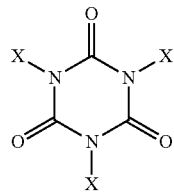
(2-57)
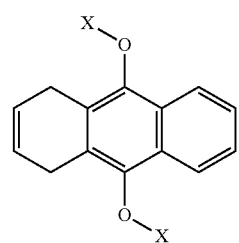
(2-50)
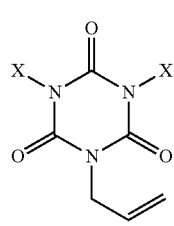
(2-58)
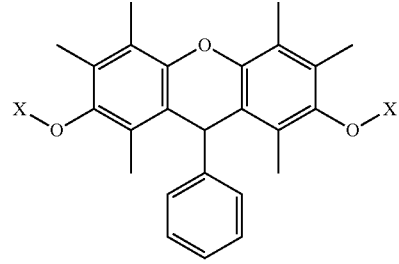

(2-59)
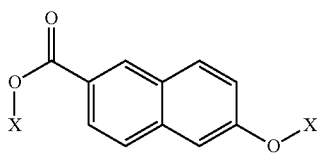

(2-60)
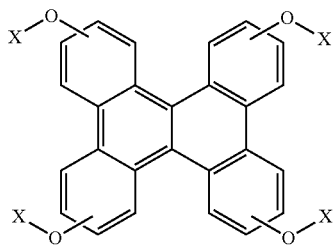

(2-61)
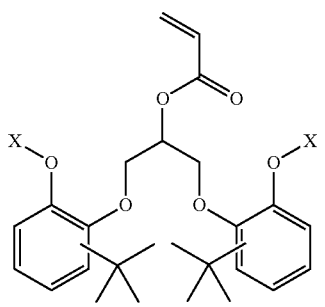

(2-62)
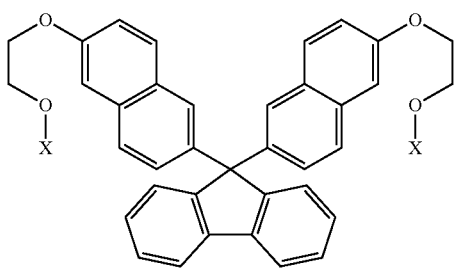

(2-63)
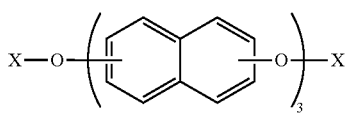

(2-64)
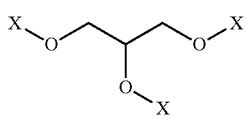

(2-65)
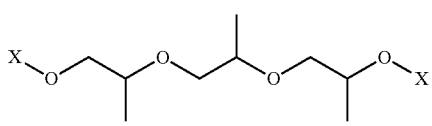

(2-66)
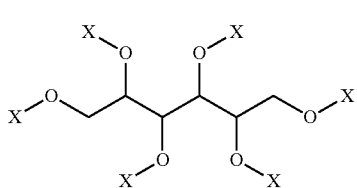

(2-67)
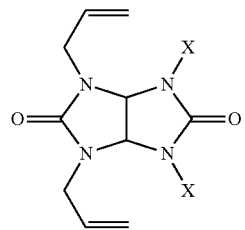

(2-68)
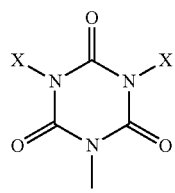

wherein X is as defined above.

Furthermore, the present invention provides a compound for a resist underlayer film composition, shown by the following general formula (1'), $$W\text{-}(X')_n \quad (1')$$

wherein W represents an n-valent organic group having 2 to 50 carbon atoms; X' represents a monovalent organic group shown by the following general formula (1X'); and "n" represents an integer of 1 to 10,

(1X')
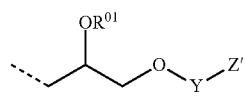

wherein the dotted line represents a bonding arm; $R^{01}$ represents an acryloyl group or a methacryloyl group; Y represents a carbonyl group; and Z' represents a group shown by the following general formula (2Z), (2Z)
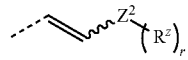

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

Preferable examples of W, X', $Z^2$, $R^Z$, "n", and "r" are the same as described in the component (A) of the resist underlayer film composition.

Additionally, the compound for a resist underlayer film composition shown by the general formula (1') preferably includes a compound shown by any one of the following general formulae (5-1) to (5-68).

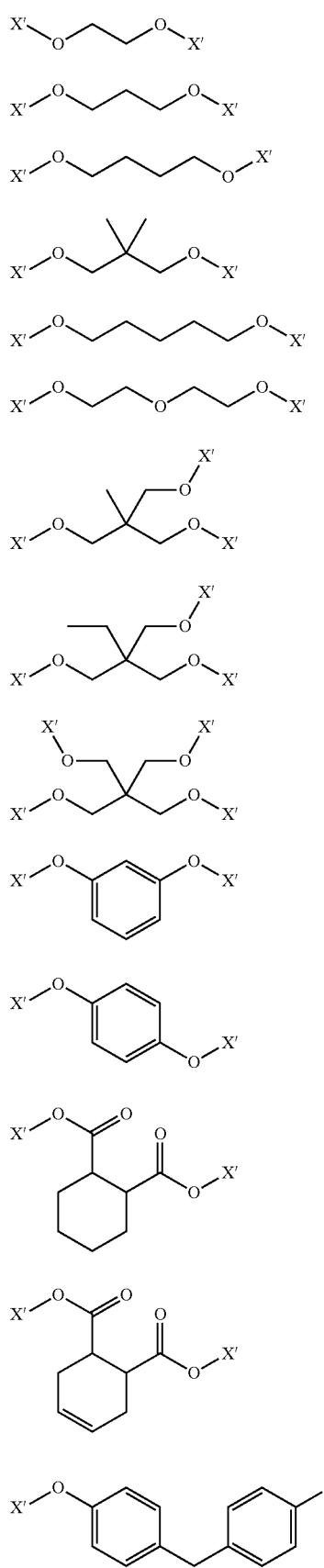
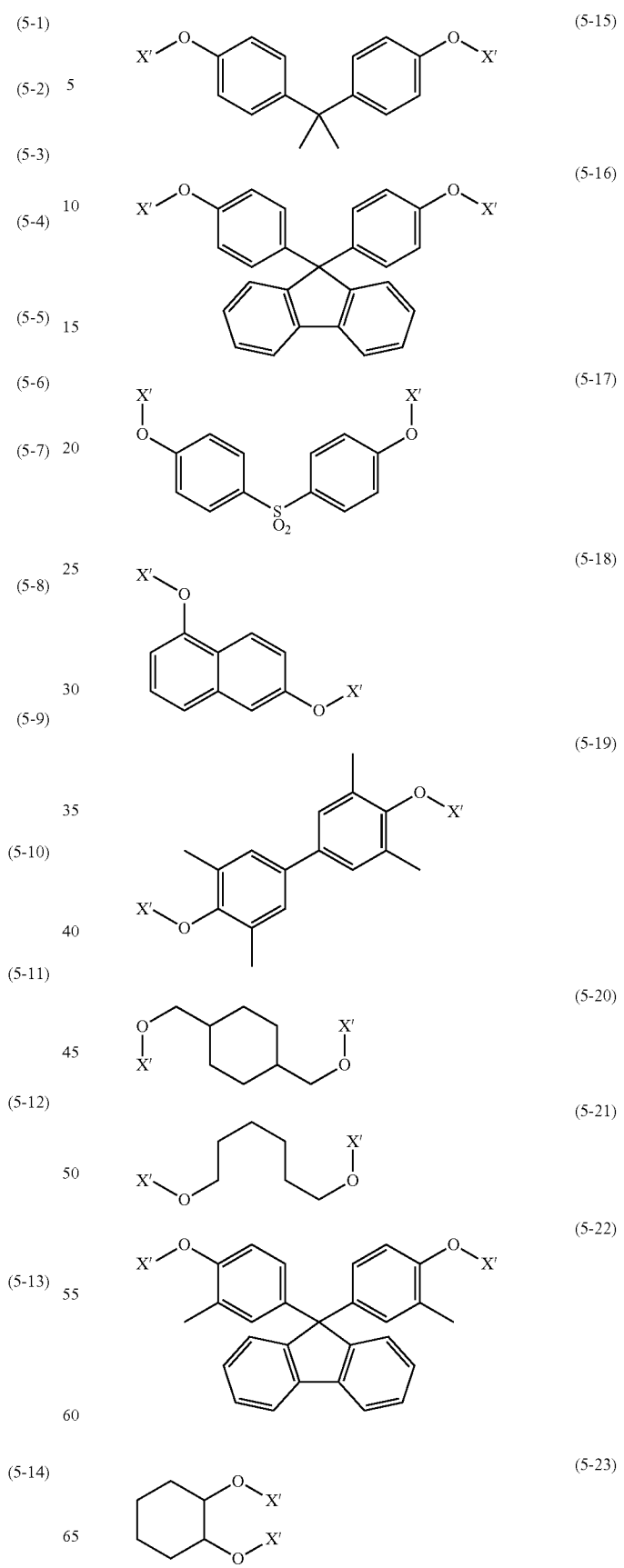

(5-24)
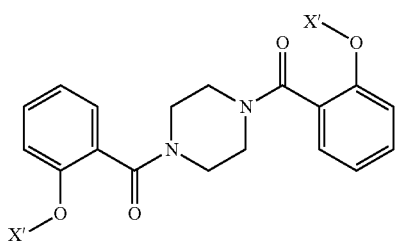
(5-25)
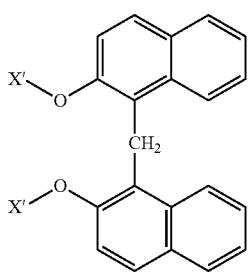
(5-26)
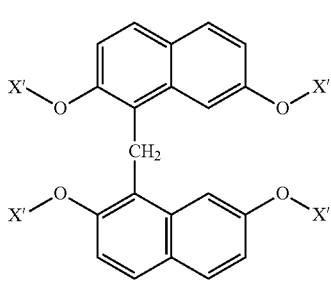
(5-27)
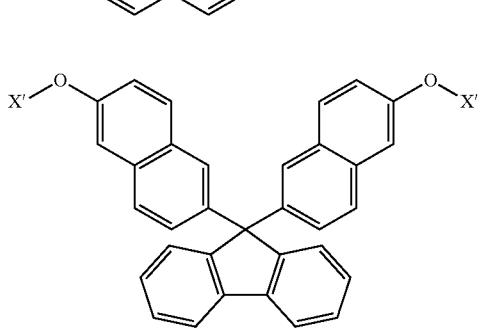
(5-28)
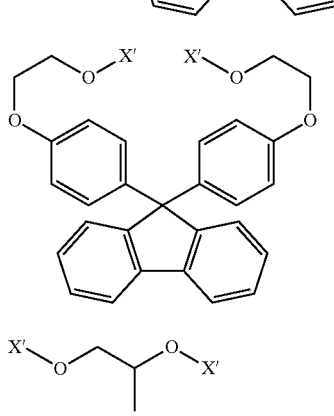
(5-29)
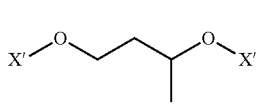
(5-30)
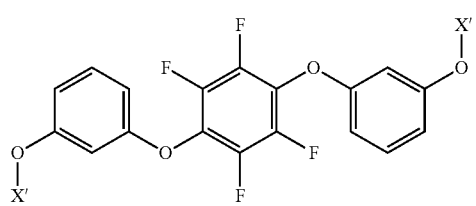
(5-31)
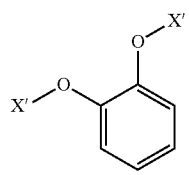
(5-32)
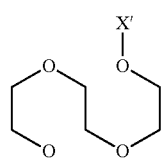
(5-33)
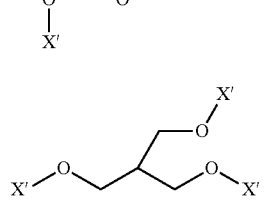
(5-34)
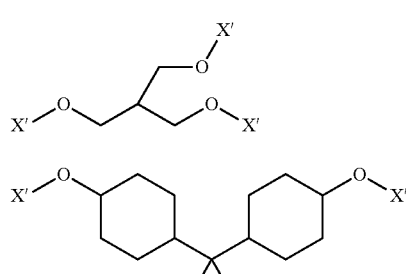
(5-35)
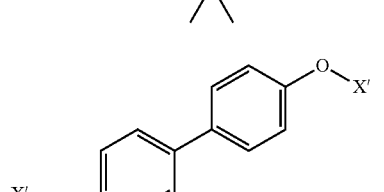
(5-36)
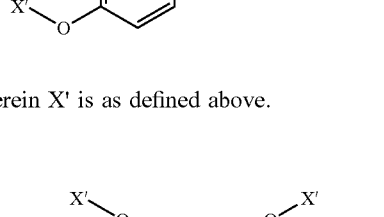
wherein X' is as defined above.
(5-37)
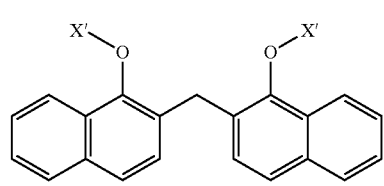
(5-38)
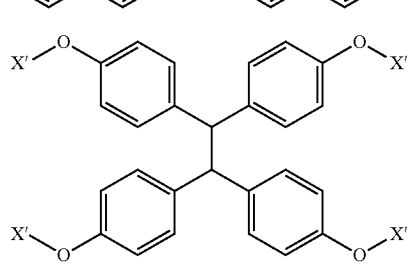

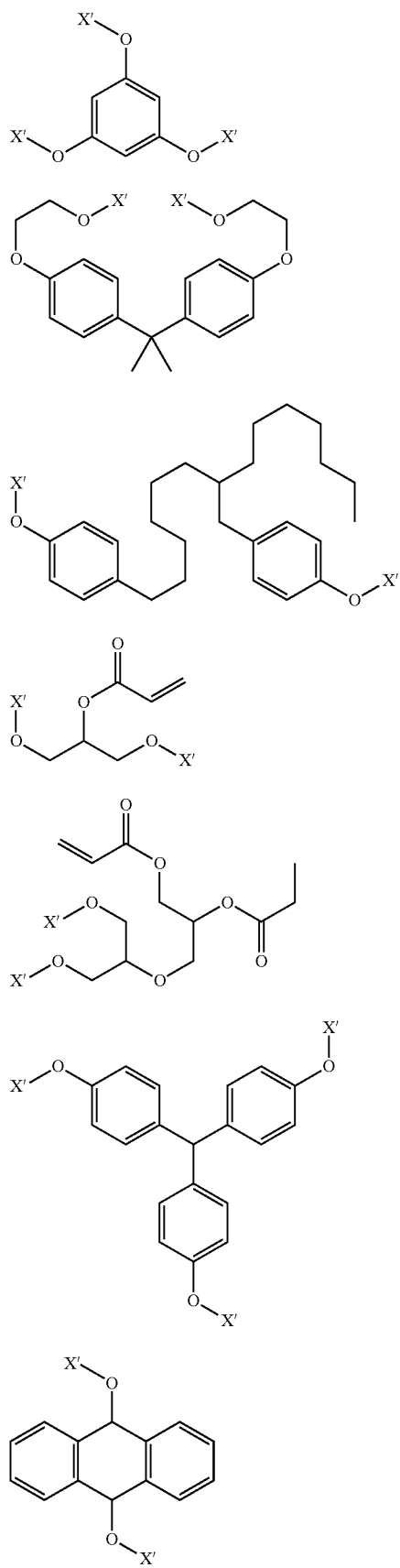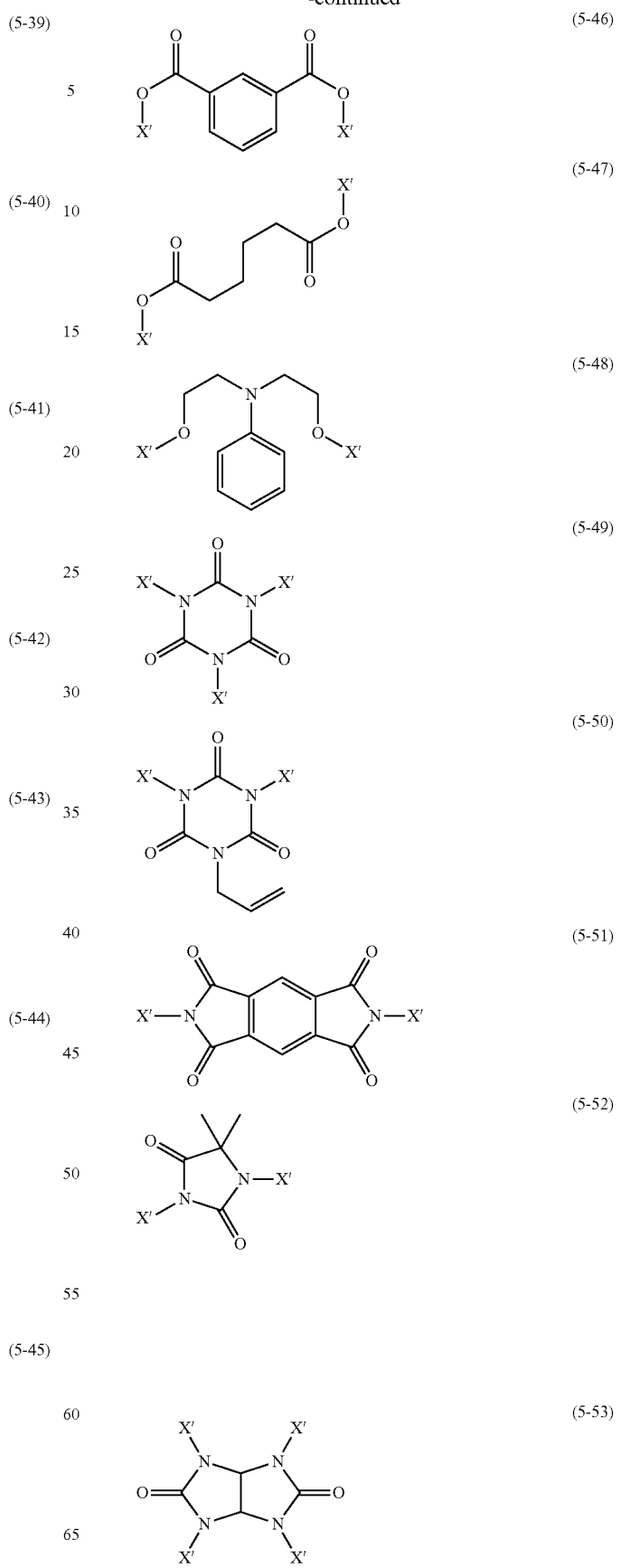

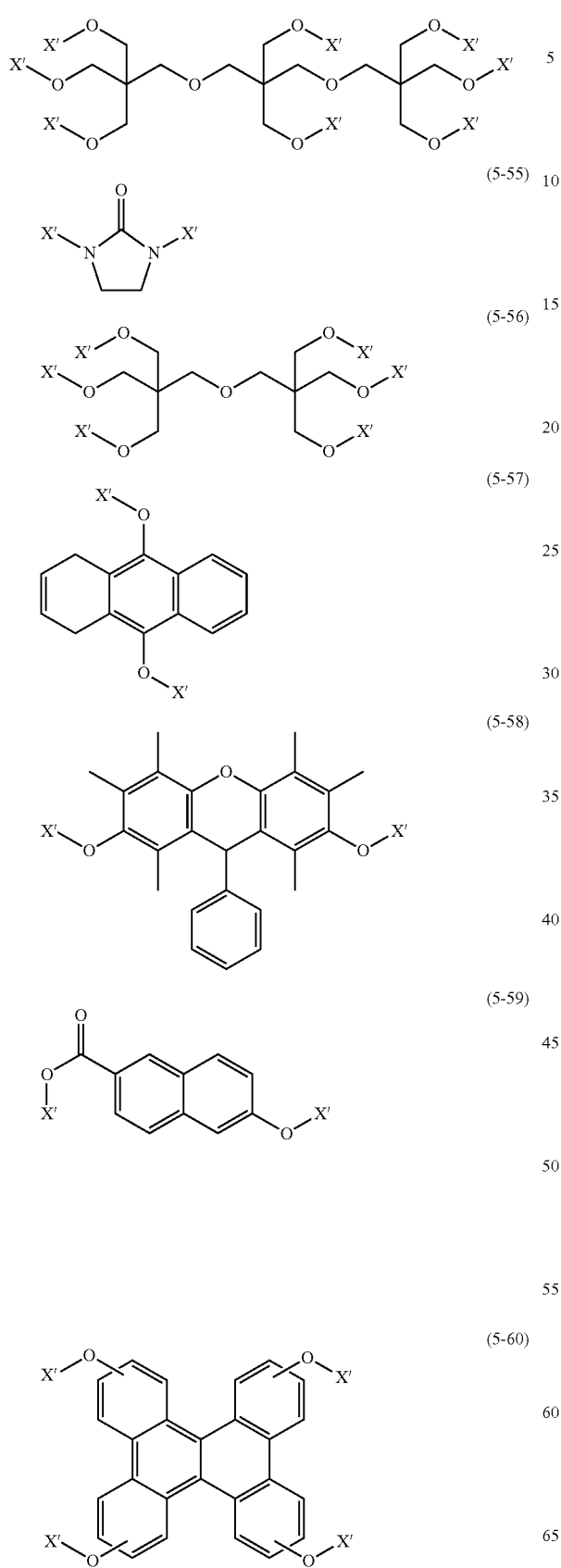
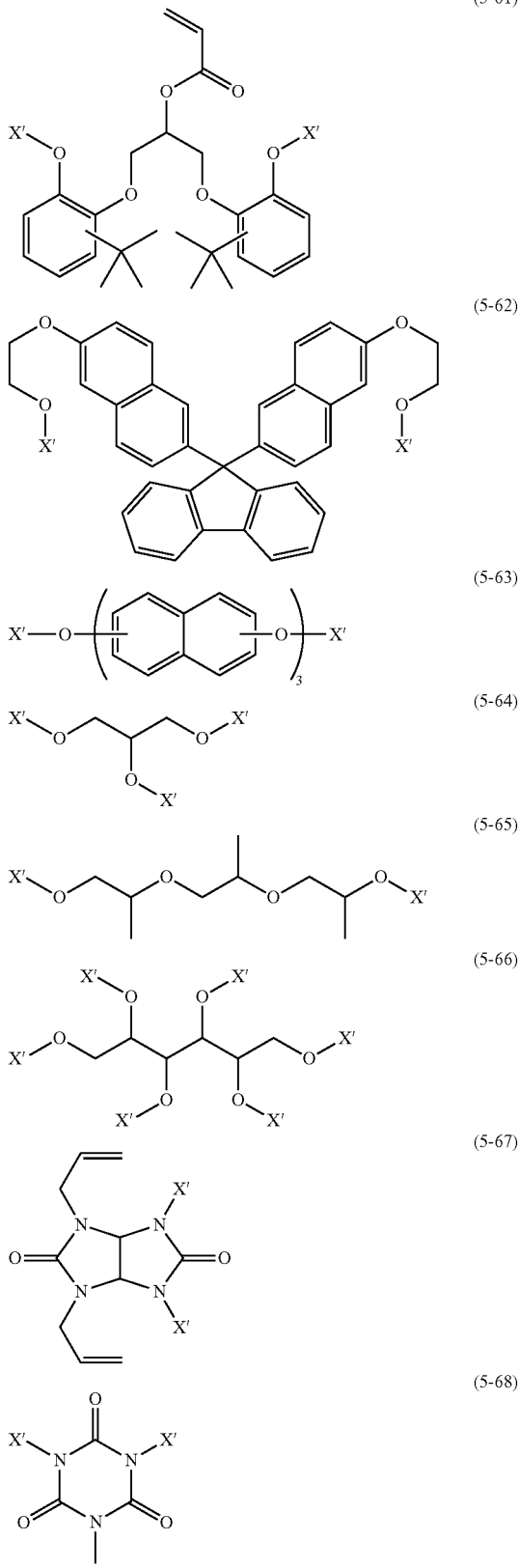
wherein X' is as defined above.
The inventive compound for a resist underlayer film composition can be produced by selecting an appropriate method, depending on the structure. Hereinafter, an explanation will be given about an exemplary method for synthesizing a compound shown by the following general formula (10), among the compound for a resist underlayer film composition shown by the formula (1). Specifically, the compound can be produced, for example, in the following 3-steps. The compounds (2-1) to (2-68) for a resist underlayer film composition can also be produced by a similar method, although the method for producing the compound for a resist underlayer film composition is not limited thereto.

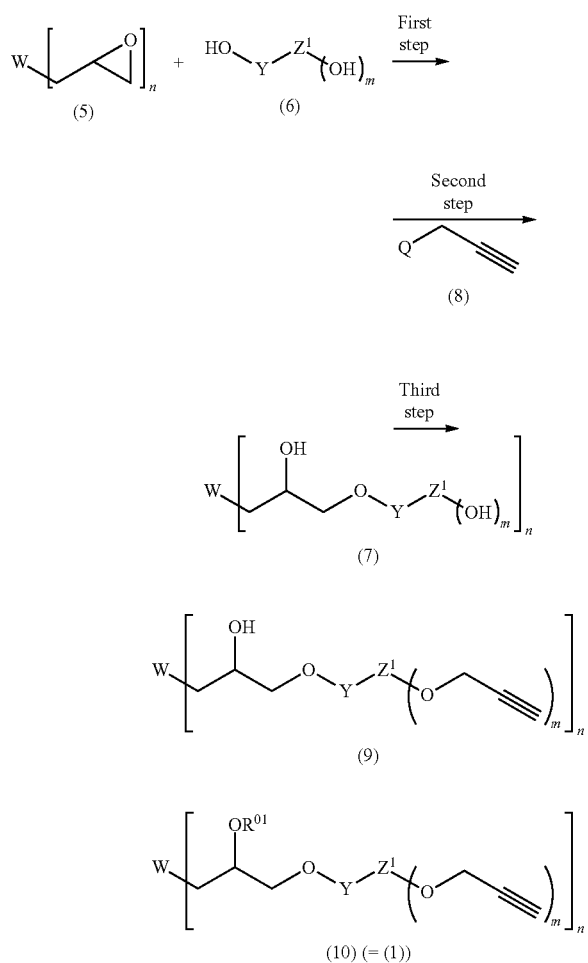

wherein W, "n", $R^{01}$, Y, $Z^1$, and "m" are as defined above, and Q represents an eliminating group such as a halogen atom.

The first step is epoxy ring-opening reaction of a glycidyl compound shown by the formula (5) with a OH-containing compound shown by the formula (6). The glycidyl compound, shown by the formula (5) used as a raw material is particularly preferably a poly-functional glycidyl ether, glycidyl ester, or N-glycidyl compound, and may be selected from various commercially available glycidyl compounds, for example, such as epoxy resins. The OH-containing compound shown by the formula (6) particularly preferably has a carboxylic acid (Y is a carbonyl group in the above formula) or a phenolic hydroxyl group (Y is a single bond and $Z^1$ is an aryl group in the above formula). In this reaction, the amount of the OH-containing compound shown by the formula (6) to the glycidyl compound shown by the formula (5) is preferably such an amount that (HO—Y—) groups in the OH-containing compound are 0.3 mol to 5 mol, particularly 0.5 mol to 3 mol, per 1 mol of glycidyl groups in the glycidyl compound.

The epoxy ring-opening reaction can be performed by mixing respective raw materials in a solvent or without a solvent, under cooling or heating. In the reaction, a reaction catalyst may be used together to promote the reaction. When a solvent is used in the reaction, the solvent is preferably selected from aliphatic hydrocarbons such as hexane and heptane; aromatic hydrocarbons such as toluene, xylene, trimethylbenzene, and methylnaphthalene; ethers such as diethyl ether, dibutyl ether, diethylene glycol diethyl ether, diethylene glycol dimethyl, ether, and tetrahydrofuran; ketones such as acetone, 2-butanone, and 4-methyl-2-pentanone; alcohols such as methanol, ethanol, 2-propanol, t-butyl alcohol, ethylene glycol monomethyl ether, propylene glycol monomethyl ether, and ethyl lactate; esters such as ethyl acetate, propylene glycol monomethyl ether acetate, and γ-butyrolactone; nitriles such as acetonitrile; amides such as N,N-dimethylformamide, N,N-dimethylacetamide, and N-methylpyrrolidone; halogenated hydrocarbons such as o-dichlorobenzene, methylene chloride, and 1,2-dichloroethane; and water; which may be used alone or in combination of two or more kinds.

When a reaction catalyst is used, the catalyst may be any material that can promote the reaction, and preferably, but is not particularly limited to, an acid catalyst, a base catalyst, or a salt compound. The acid catalyst may be any inorganic acid or organic acid. Illustrative examples thereof include hydrochloric acid, nitric acid, sulfuric acid, formic acid, oxalic acid, acetic acid, methanesulfonic acid, camphor sulfonic acid, tosic acid, trifluoromethane sulfonic acid, a cation exchange resin, sodium hydrogen sulfate, and pyridinium p-toluenesulfonate. The base catalyst may be any inorganic base or organic base. Illustrative examples thereof include amines such as pyridine, triethylamine, diisopropylethylamine, 4-dimethylaminopyridine, and imidazole; alkoxy metals such as sodium methoxide, sodium ethoxide, and potassium t-butoxide; carbonates such as sodium carbonate, potassium carbonate, and cesium carbonate; hydroxides such as sodium hydroxide, potassium hydroxide, and tetramethylammonium hydroxide; metal hydrides such as sodium hydride and potassium hydride; organic metals such as butyllithium and ethylmagnesium bromide; and metal amides such as lithium diisopropylamide; which may be used alone or in combination. Illustrative examples of the salt compound include iodides such as sodium iodide, lithium iodide, and tetrabutylammonium iodide; bromides such as sodium bromide, lithium bromide, magnesium bromide, tetraethylammonium bromide, tetrabutylammonium bromide, benzyltrimethylammonium bromide, benzyltriethylammonium bromide, trioctylmethylammonium bromide, tetrabutylphosphonium bromide, and tributyldodecylphosphonium bromide; chlorides such as lithium chloride, magnesium chloride, calcium chloride, tetraethylammonium chloride, tetrabutylammonium chloride, benzyltrimethylammonium chloride, benzyltriethylammonium chloride, trioctylmethylammonium chloride, tetrabutylphosphonium chloride, and tributyldodecylphosphonium chloride; which may be used alone or in combination. The amount of the reaction catalyst to be used is preferably in the range of $1 \times 10^{-5}$ to 1 mol, per 1 mol of the glycidyl compound shown by the formula (5).

The reaction temperature is preferably −20° C. to 200° C., more preferably 0° C. to 150° C. When a solvent is used, the temperature is preferably about the boiling point of the solvent or lower. When the reaction temperature is −20° C. or higher, the reaction does not delay. When the reaction temperature is 200° C. or lower, by-reaction such as decomposition reaction of the product hardly occurs. To improve the yield, the reaction time is preferably determined on trace of the reaction progress by thin layer chromatography, liquid chromatography, gel permeation chromatography or the like; in general, the reaction time is about 0.5 to 200 hours. After completion of the reaction, if necessary, a usual aqueous post-treatment (aqueous work-up) may be performed to obtain a compound shown by the formula (7). If necessary, the compound shown by the formula (7) may be purified by a conventional method, such as crystallization, liquid separation, chromatography, or absorption treatment, according to properties of the compound. In some cases, it may advance to the second step without additional treatment after the reaction.

As the reaction method, there may be mentioned a method in which the raw materials, the reaction catalyst, and the solvent as needed are charged at once; or a method in which the raw materials or a raw material solution is mixed and added dropwise alone or as a mixture, in the presence of the reaction catalyst.

The second step is propargyl etherification reaction of the phenolic hydroxyl group in the compound shown by the formula (7) with a compound shown by the formula (8). In this reaction, the amount of the compound shown by the formula (8) to the compound shown by the formula (7) is preferably such an amount that the compound shown by the formula (8) is 0.3 mol to 5 mol, particularly 0.7 mol to 3 mol, per 1 mol of phenolic hydroxyl groups in the compound shown by the formula (7).

The propargyl etherification reaction can be performed by mixing respective raw materials and a base in a solvent or without a solvent, under cooling or heating. In the reaction, a reaction catalyst may be used together to promote the reaction. When a solvent is used in the reaction, the solvent is preferably selected from aliphatic hydrocarbons such as hexane and heptane; aromatic hydrocarbons such as toluene, xylene, trimethylbenzene, and methylnaphthalene; ethers such as diethyl ether, dibutyl ether, diethylene glycol diethyl ether, diethylene glycol dimethyl ether, and tetrahydrofuran; ketones such as acetone, 2-butanone, and 4-methyl-2-pentanone; alcohols such as methanol, ethanol, 2-propanol, t-butyl alcohol, ethylene glycol monomethyl ether, propylene glycol monomethyl ether, and ethyl lactate; esters such as ethyl acetate, propylene glycol monomethyl ether acetate, and γ-butyrolactone; nitrites such as acetonitrile; amides such as N,N-dimethylformamide, N,N-dimethylacetamide, and N-methylpyrrolidone; halogenated hydrocarbons such as o-dichlorobenzene, methylene chloride, and 1,2-dichloroethane; and water; which may be used alone or in combination of two or more kinds.

The base may be any inorganic base or organic base. Illustrative examples thereof include amines such as pyridine, triethylamine, diisopropylethylamine, 4-dimethylaminopyridine, and imidazole; alkoxy metals such as sodium methoxide, sodium ethoxide, and potassium t-butoxide; carbonates such as sodium carbonate, potassium carbonate, and cesium carbonate; hydroxides such as sodium hydroxide, potassium hydroxide, and tetramethylammonium hydroxide; metal hydrides such as sodium hydride and potassium hydride; organic metals such as butyllithium and ethylmagnesium bromide; and metal amides such as lithium diisopropylamide; which may be used alone or in combination. The amount of the base to be used is preferably 0.5 mol to 20 mol, particularly 0.8 mol to 5 mol, per 1 mol of phenolic hydroxyl groups in the compound shown by the formula (7).

When a reaction catalyst is used, the catalyst may be any material that can promote the reaction, and preferably, but is not particularly limited to, a salt compound. Illustrative examples of the salt compound include iodides such as sodium iodide, lithium iodide, and tetrabutylammonium iodide; bromides such as sodium bromide, lithium bromide, magnesium bromide, tetraethylammonium bromide, tetrabutylammonium bromide, benzyltrimethylammonium bromide, benzyltriethylammonium bromide, trioctylmethylammonium bromide, tetrabutylphosphonium bromide, and tributyldodecylphosphonium bromide; chlorides such as tetraethylammonium chloride, tetrabutylammonium chloride, benzyltrimethylammonium chloride, benzyltriethylammonium chloride, trioctylmethylammonium chloride, tetrabutylphosphonium chloride, and tributyldodecylphosphonium chloride; oxo acid salts such as tetrabutylammonium hydrogen sulfate; which may be used alone or in combination. The amount of the reaction catalyst to be used is preferably in the range of $1 \times 10^{-5}$ to 5 mol, particularly $1 \times 10^{-4}$ to 1 mol, per 1 mol of the glycidyl compound shown by the formula (7).

The reaction temperature is preferably −20° C. to 150° C., more preferably 20° C. to 100° C. When a solvent is used, the temperature is preferably about the boiling point of the solvent or lower. When the reaction temperature is −20° C. or higher, the reaction does not delay. When the reaction temperature is 150° C. or lower, by-reaction such as decomposition reaction of the product hardly occurs. To improve the yield, the reaction time is preferably determined on trace of the reaction progress by thin layer chromatography, liquid chromatography, gel permeation chromatography or the like; in general, the reaction time is about 0.5 to 200 hours. After completion of the reaction, if necessary, a usual aqueous post-treatment (aqueous work-up) may be performed to obtain a compound shown by the formula (9). If necessary, the compound shown by the formula (9) may be purified by a conventional method, such as crystallization, liquid separation, chromatography, or absorption treatment, according to properties of the compound. In some cases, it may advance to the third step without additional treatment after the reaction.

The third step is esterification reaction or hydroxyl groups in the compound shown by the formula (9), and may be performed according to a conventional method, for example, a method using a (meth)acryloyl chloride or (meth)acrylic anhydride and a base; dehydration esterification using a (meth)acrylic acid and a dehydration condensation agent such as dicyclohexylcarbodiimide; a method using a (meth) acrylic acid or (meth)acrylic anhydride and an acid catalyst; ester exchange reaction using a (meth)acrylic acid ester and an ester exchange catalyst. If necessary, the obtained compound (i.e., the compound shown by the formula (1)) may be purified according to a conventional method, such as chromatography, crystallization, absorption, or liquid separation.

Next, an explanation will be given about an exemplary method for synthesizing a compound shown by the following general formula (13), among the compound for a resist underlayer film composition shown by the formula (1'). Specifically, the compound can be produced, for example, in the following 2-steps. The compounds (5-1) to (5-68) for a resist underlayer film composition can also be produced by a similar method, although the method for producing the compound for a resist underlayer film composition is not limited thereto.

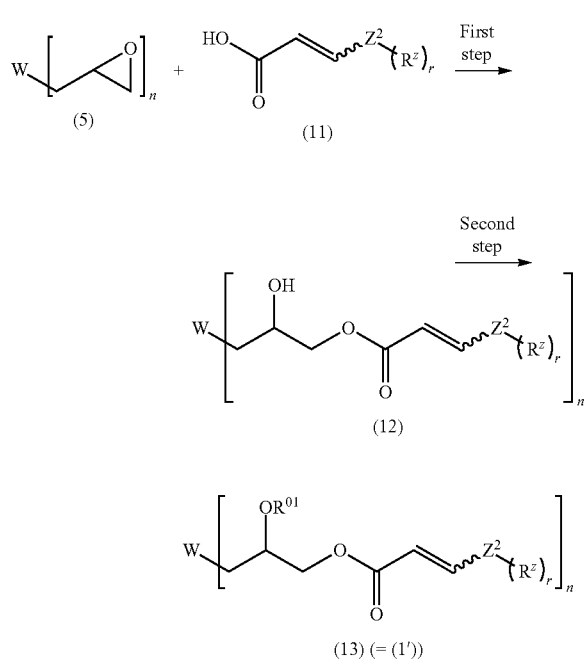

wherein W, "n", $R^Z$, $Z^2$, and "r" are as defined above.

The first step can be performed in the same manner as the first step in the method for producing the compound shown by the general formula (10). The second step can be performed in the same manner as the third step in the method for producing the compound shown by the general formula (10).

As described above, the inventive compound for a resist underlayer film composition can be easily produced, and is useful for the inventive resist underlayer film composition.

EXAMPLES

In the following, the present invention will be specifically described with reference to synthesis examples, examples, and comparative examples, but the present invention is not limited thereto. The molecular weight was measured as follows: Weight average molecular weight (Mw) and number average molecular weight (Mn) were measured by gel permeation chromatography (GPC) using tetrahydrofuran as an eluent in terms of polystyrene, and dispersity (Mw/Mn) was calculated therefrom. Moreover, the mass was determined by LC-TOF-MS (APCI, Positive).

Compounds (A-1) to (A-6), (A-9) and comparative compounds (A-7), (A-8), (A-10) used in examples and comparative examples are shown below.

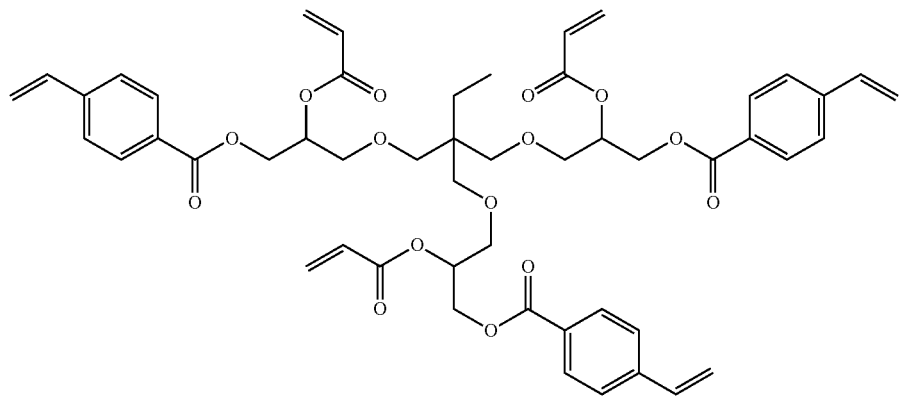

(A-1)

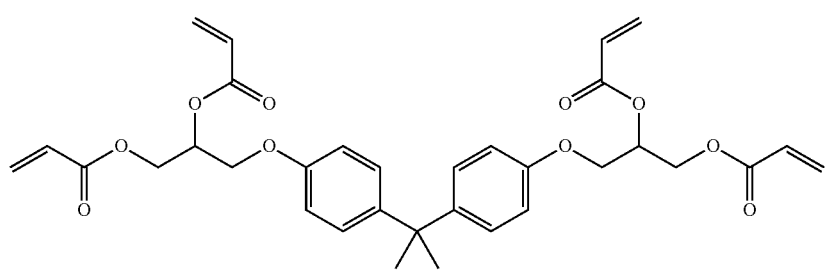

(A-2)

-continued
(A-3)
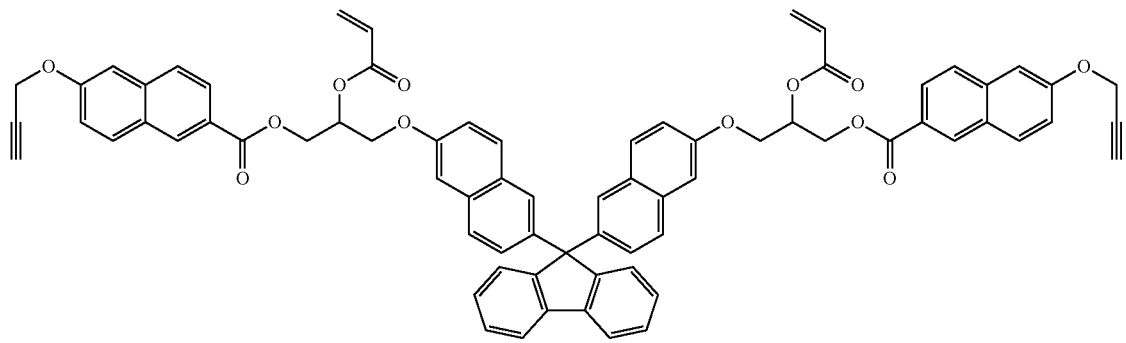
(A-4)
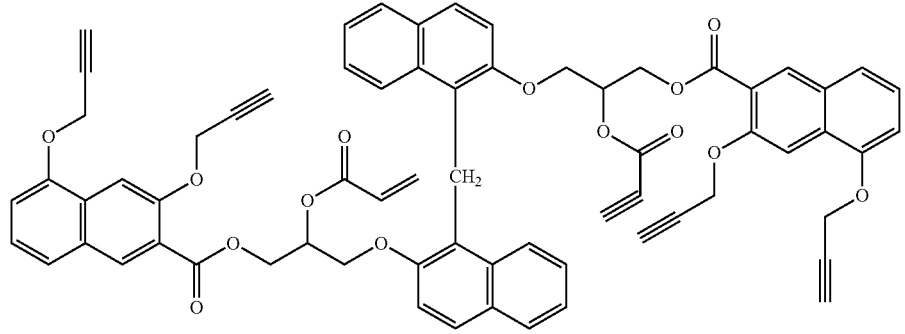
(A-5)
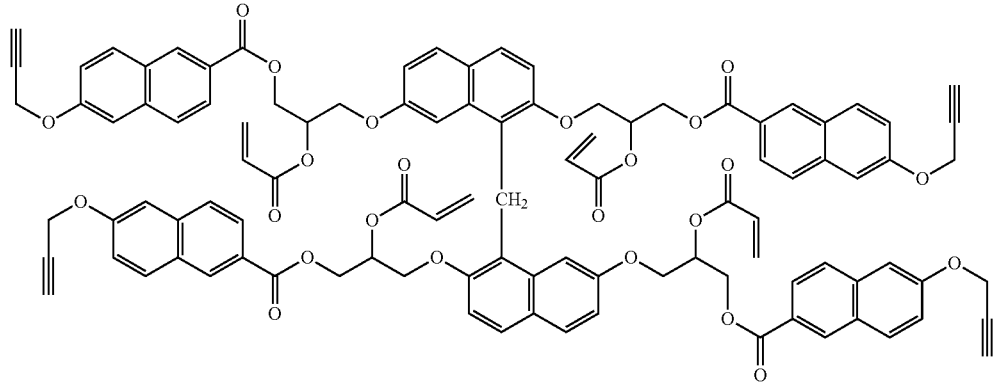
(A-6)
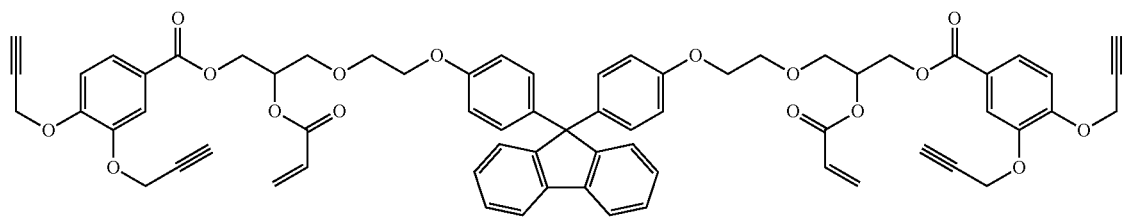
(A-7)
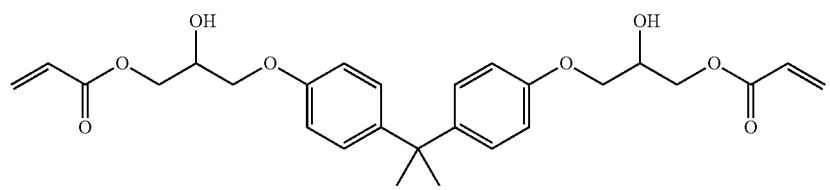

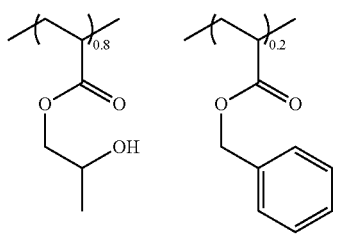

Mw 9,800

(A-8)

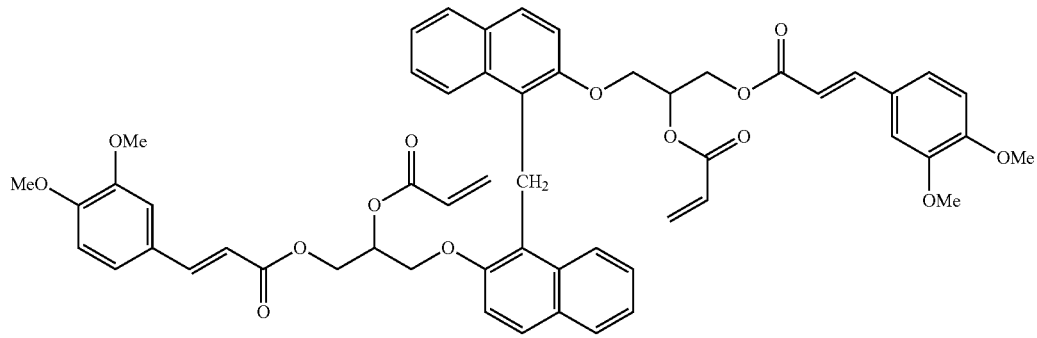

(A-9)

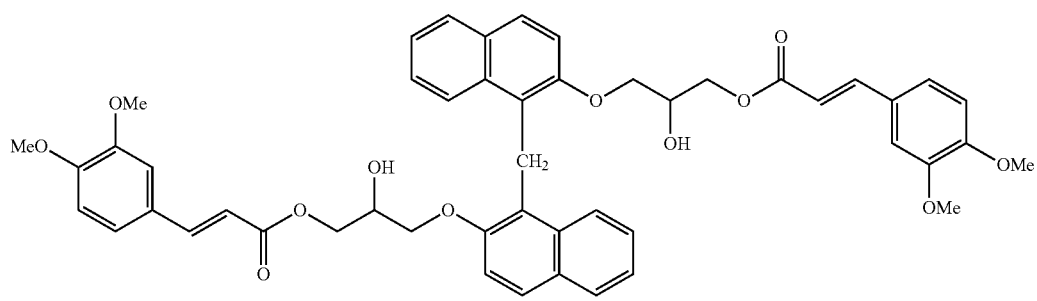

(A-10)

[Synthesis Example 1] Synthesis of Compound (A-3)

A mixture of 5.63 g of 9,9-bis(6-glycidyloxy-2-naphthyl)fluorene, 3.76 g of 6-hydroxy-2-naphthoic acid, 0.1 g of benzyltriethylammonium chloride, and 40 g of N-methylpyrrolidone was stirred at 120° C. for 20 hours. After cooling, 2.76 g of potassium carbonate and 2.62 g of propargyl bromide were added, and stirred at 60° C. for 20 hours. The solution was then diluted with ethyl acetate, washed with water three times, and condensed under reduced pressure to synthesize an intermediate product. To the obtained intermediate product, 40 g of N-methylpyrrolidone and 1.99 g of acryloyl chloride were added and stirred. To this solution, 2.23 g of triethylamine was added dropwise, and stirred for 20 hours. The solution was then diluted with ethyl acetate, washed with water three times, condensed under reduced pressure, and purified by silica gel column chromatography to obtain 8.98 g of compound (A-3) (yield: 80%). GPC analysis showed a weight average molecular weight (Mw) of 1,613 and a dispersity (Mw/Mn) of 1.10. LC-TOF-MS (APCI, Positive) showed 1,123 ([M+H]$^+$).

[Synthesis Examples 2 to 6] Synthesis of Compounds (A-1), (A-2), (A-4) to (A-6), (A-9)

Compounds (A-1), (A-2), (A-4) to (A-6), (A-9) were obtained in the same manner as in Synthesis Example 1 except that the kinds and the mole ratio of used raw materials were changed depending on the structure of each compound. Weight average molecular weight (Mw), dispersity (Mw/Mn), mass by LC-TOF-MS (APCI, Positive) of these compounds were measured. The results are shown below.

Compound (A-1): weight average molecular weight (Mw) 1,271, dispersity (Mw/Mn) 1.09, LC-TOF-MS (APCI, Positive) 909 ([M+H]$^+$)

Compound (A-2): weight average molecular weight (Mw) 770, dispersity (Mw/Mn) 1.07, LC-TOF-MS (APCI, Positive) 593 ([M+H]$^+$)

Compound (A-4): weight average molecular weight (Mw) 1,540, dispersity (Mw/Mn) 1.40, LC-TOF-MS (APCI, Positive) 1,081 ([M+H]$^+$)

Compound (A-5): weight average molecular weight (Mw) 2,701, dispersity (Mw/Mn) 1.43, LC-TOF-MS (APCI, Positive) 1,678 ([M+H]$^+$)

Compound (A-6): weight average molecular weight (Mw) 1,272, dispersity (Mw/Mn) 1.14, LC-TOF-MS (APCI, Positive) 1,119 ([M+H]$^+$)

Compound (A-9): weight average molecular weight (Mw) 1,043, dispersity (Mw/Mn) 1.20, LC-TOF-MS (APCI, Positive) 937 ([M+H]$^+$)

Measurement of Complex Viscosity of Compound

The complex viscosity of the compounds (A-1) to (A-6), (A-9) and comparative compounds (A-7), (A-8), (A-10) was measured by MCR rheometer, MCR 302 manufactured by Anton Paar Corp. The complex viscosity between 50° C. and 300° C. was measured with a measurement jig having an outer diameter of 20 mm, at 1% strain, 1 Hz frequency, and 5° C./min heating rate. Table 1 shows complex viscosity at 100° C. and minimum complex viscosity of the compounds (A-1) to (A-6), (A-9) and comparative compounds (A-7), (A-8), (A-10) as measured above.

TABLE 1

| Compound | Complex viscosity at 100° C. (Pa · s) | Minimum complex viscosity (Pa · s) |
| --- | --- | --- |
| A-1 | 0.4 | 0.04 |
| A-2 | 2.8 | 0.06 |
| A-3 | 168 | 0.26 |
| A-4 | 385 | 0.90 |
| A-5 | 855 | 1.50 |
| A-6 | 181 | 0.28 |
| A-7 | 4.2 | 0.09 |
| A-8 | 2990 | 26.6 |
| A-9 | 205 | 0.55 |
| A-10 | 506 | 1.20 |

Preparation of Resist Underlayer Film Composition (UL-1 to 10, Comparative UL-1 to 4)

The compounds (A-1) to (A-10) as component (A) and acrylate compounds (C-1), (C-2) as component (C) were dissolved in a solvent (component (B)) containing 0.1 mass % of PF636 (available from Oranova Solutions Inc.) as component (E), in the proportion shown in Table 2, and the solution was filtered through a 0.1-μm filter made of a fluorinated resin to prepare resist underlayer film compositions (UL-1 to 10, comparative UL-1 to 4).

TABLE 2

| Resist underlayer film composition | (A) Compound (part by mass) | (C) Acrylate compound (part by mass) | (B) Solvent (part by mass) |
| --- | --- | --- | --- |
| UL-1 | A-1 (100) | — | PGMEA (800) |
| UL-2 | A-2 (100) | — | PGMEA (800) |
| UL-3 | A-3 (100) | — | PGMEA (800) |
| UL-4 | A-4 (100) | — | PGMEA (800) |
| UL-5 | A-5 (100) | — | PGMEA (800) |
| UL-6 | A-6 (100) | — | PGMEA (800) |
| UL-7 | A-3 (75) | C-1 (25) | PGMEA (800) |
| UL-8 | A-9 (100) | — | PGMEA (800) |
| UL-9 | A-9 (70) | C-2 (30) | PGMEA (700) S1 (100) |
| UL-10 | A-4 (70) | C-2 (30) | PGMEA (720) S2 (80) |
| Comparative UL-1 | A-7 (100) | — | PGMEA (800) |
| Comparative UL-2 | A-7 (75) | C-1 (25) | PGMEA (800) |
| Comparative UL-3 | A-8 (20) | C-1 (80) | PGMEA (240) PFME (560) |
| Comparative UL-4 | A-10 (100) | — | PGMEA (800) |

PGMEA: propylene glycol monomethyl ether acetate

PGME: propylene glycol monomethyl ether

S1: diethylene glycol monobenzyl ether

S2: 1,6-diacetoxyhexane

Acrylate Compounds (C-1), (C-2)

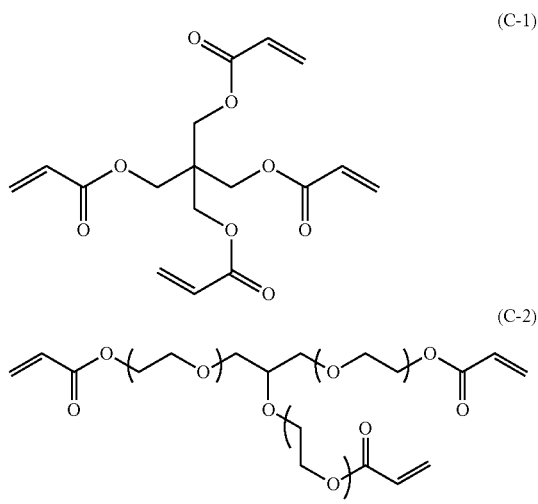

Solvent Resistance Evaluation and Optical Constant Measurement (Examples 1-1 to 1-11, Comparative Examples 1-1 to 1-4)

The prepared resist underlayer film compositions (UL-1 to 10, comparative UL-1 to 4) were each applied on a silicon substrate and pre-baked with a not plate at a temperature shown in Table 3 for 60 seconds. Then, the applied composition was irradiated with UV by a xenon excimer lamp (SUS713, manufactured by USHIO Inc., 172 nm wavelength, about 10 mW/cm² illumination) in a nitrogen atmosphere, with an illumination distance of 3 cm, for 30 seconds to form a resist underlayer film having a thickness of about 200 nm, and the film thickness was measured. Then, the substrate was soaked in a mixed solvent of PGME/PGMEA (mass ratio=70/30) for 60 seconds, and dried by a nitrogen gas stream. Thereafter, the film thickness was measured again, and the ratio of the film thicknesses before and after the solvent treatment was calculated to evaluate the solvent resistance. That is, the solvent resistance was determined as follows: Solvent resistance (%)=100×(Film thickness after solvent treatment)/(Film thickness before solvent treatment). The results are shown in Table 3. Table 3 also shows optical constants (refractive index n and extinction coefficient k) of each resist underlayer film at 193 nm after UV irradiation, measured by a spectroscopic ellipsometer with a variable incident light angle (VASE) manufactured by J. A. Woollam Co., Inc.

TABLE 3

| | Resist underlayer film composition | Pre-bake temperature | Solvent resistance (%) | Optical constant n/k |
| --- | --- | --- | --- | --- |
| Example 1-1 | UL-1 | 200° C. | 100 | 1.64/0.44 |
| Example 1-2 | UL-2 | 200° C. | 100 | 1.66/0.44 |
| Example 1-3 | UL-3 | 200° C. | 100 | 1.42/0.36 |
| Example 1-4 | UL-4 | 200° C. | 100 | 1.48/0.26 |
| Example 1-5 | UL-5 | 200° C. | 100 | 1.50/0.25 |
| Example 1-6 | UL-6 | 200° C. | 100 | 1.41/0.48 |
| Example 1-7 | UL-7 | 100° C. | 100 | 1.48/0.30 |
| Example 1-8 | UL-7 | none | 100 | 1.50/0.28 |
| Example 1-9 | UL-8 | 200° C. | 100 | 1.57/0.30 |
| Example 1-10 | UL-9 | 170° C. | 100 | 1.60/0.28 |
| Example 1-11 | UL-10 | 170° C. | 100 | 1.52/0.24 |

TABLE 3-continued

| Resist underlayer film composition | Pre-bake temperature | Solvent resistance (%) | Optical constant n/k |
|---|---|---|---|
| Comparative Example 1-1 | Comparative UL-1 | 200° C. | 67 | 1.66/0.54 |
| Comparative Example 1-2 | Comparative UL-2 | 100° C. | 99 | 1.67/0.41 |
| Comparative Example 1-3 | Comparative UL-3 | 100° C. | 99 | 1.75/0.08 |
| Comparative Example 1-4 | Comparative UL-4 | 200° C. | 6 | unmeasurable |

As shown in Table 3, Examples 1-1 to 1-11 using the inventive resist underlayer film compositions (UL-1 to 10) had good film-forming property, and the films were not reduced by the solvent treatment. Thus, it was demonstrated that a cured film having good solvent resistance could be obtained by UV irradiation. With respect to the optical constants, the reflection from the substrate can be significantly controlled when n-value ranges from 1.4 to 1.3 and k-value ranges from 0.1 to 0.5 approximately, and the film, can be used as the underlayer film for photoresist patterning, although it also depends on the film thickness and the type of the upper layer film. In Examples, all optical constants were in the appropriate range, and it was demonstrated that the films could be used as the underlayer film for photoresist patterning. By contrast, Comparative Examples using the comparative resist underlayer film compositions (comparative UL-1 to 4) had worse solvent resistance than Examples. Moreover, there was cases where k-value was more than 0.5 or less than 0.1. Among them, comparative UL-4 had significantly poor curability, and thus the evaluation was stopped at this point.

Preparation of Resist Upper Layer Film Composition (PR-1)

A resist upper layer film composition (ArF photoresist: PR-1) used for patterning was prepared by dissolving a polymer shown by ArF monolayer resist polymer 1, an acid generator PAG 1, and a basic compound amine 1 in a solvent containing 0.1 mass % FC-4430 (available from Sumitomo 3M Ltd.) in the proportion shown in Table 4, and filtering the solution through a 0.1-μm pore size filter made of a fluorinated resin.

TABLE 4

| Resist upper layer film composition | Polymer (part by mass) | Acid generator (part by mass) | Basic compound (part by mass) | Solvent (part by mass) |
|---|---|---|---|---|
| PR-1 | ArF monolayer resist polymer 1 (100) | PAG 1 (6.6) | amine 1 (0.8) | PGMEA (2,500) |

The ArF monolayer resist polymer 1, PAG 1, and amine 1 are shown below.

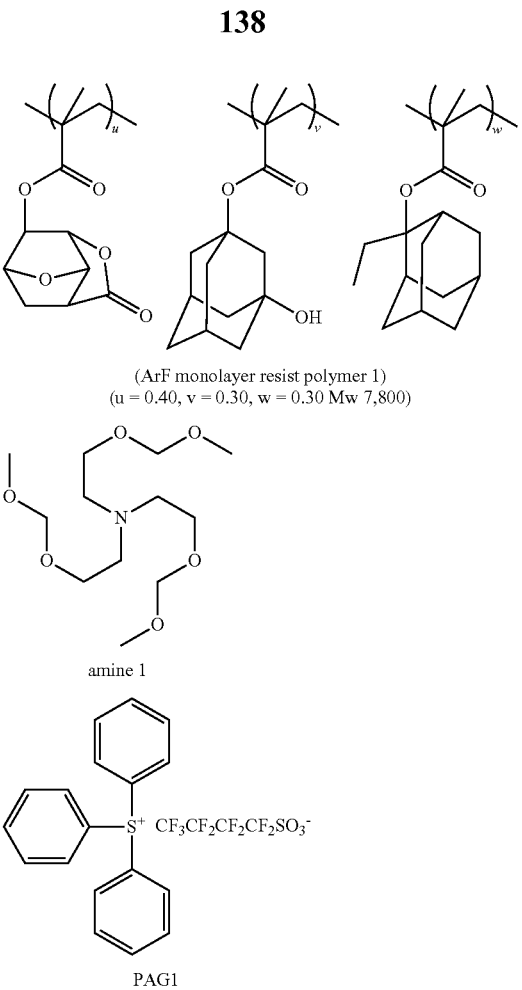

(ArF monolayer resist polymer 1)
(u = 0.40, v = 0.30, w = 0.30 Mw 7,800)

amine 1

PAG1

Etching Test With $CF_4/CHF_3$-Based Gas (Examples 2-1 to 2-11, Comparative Examples 2-1 to 2-4)

Samples on which the resist underlayer film was formed was prepared as in the solvent resistance evaluation test. Moreover, the resist upper layer film composition (PR-1) prepared as above was applied on a silicon substrate and baked at 105° C. for 60 seconds to prepare a sample on which the resist upper layer film having a thickness of 100 nm was formed. Etching test was performed on these samples with a $CF_4/CHF_3$-based gas under the following conditions.

| Etching conditions | |
|---|---|
| Chamber pressure | 40.0 Pa |
| RF power | 1,300 W |
| $CHF_3$ gas flow rate | 30 mL/min |
| $CF_4$ gas flow rate | 30 mL/min |
| Ar gas flow rate | 100 mL/min |
| Time | 60 sec |

Table 5 shows dry etching rate that was determined by dividing a difference between film thicknesses before and after dry etching measured with an etching apparatus TE-8500 manufactured by Tokyo Electron Ltd., by an etching time.

TABLE 5

| | Film composition | Pre-bake temperature | Etching rate (Å/s) |
|---|---|---|---|
| Example 2-1 | UL-1 | 200° C. | 34 |
| Example 2-2 | UL-2 | 200° C. | 36 |
| Example 2-3 | UL-3 | 200° C. | 23 |
| Example 2-4 | UL-4 | 200° C. | 25 |
| Example 2-5 | UL-5 | 200° C. | 27 |
| Example 2-6 | UL-6 | 200° C. | 28 |
| Example 2-7 | UL-7 | 100° C. | 30 |
| Example 2-8 | UL-7 | none | 32 |
| Example 2-9 | UL-8 | 200° C. | 28 |
| Example 2-10 | UL-9 | 170° C. | 36 |
| Example 2-11 | UL-10 | 170° C. | 34 |
| Comparative Example 2-1 | Comparative UL-1 | 200° C. | 38 |
| Comparative Example 2-2 | Comparative UL-2 | 100° C. | 45 |
| Comparative Example 2-3 | Comparative UL-3 | 100° C. | 70 |
| Comparative Example 2-4 | PR-1 | 105° C. | 48 |

As shown in Table 5, Examples 2-1 to 2-11 using the inventive resist underlayer film compositions (UL-1 to 10) had lower etching rate, and thus had higher dry etching resistance than Comparative Examples 2-1 to 2-4 using the resist upper layer film composition (PR-1) or the comparative resist underlayer film compositions (comparative UL-1 to 3). This indicates that the inventive resist underlayer film compositions (UL-1 to 10) are particularly suitable for: an etching mask used in dry etching processing of a Si-based substrate or the like.

Filling Property Evaluation (Examples 3-1 to 3-11)

Figure 3:
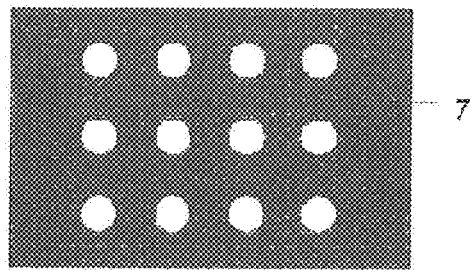
FIG. 3 is an explanatory view of a method for evaluating the filling property in examples and comparative examples.
Figure 3:
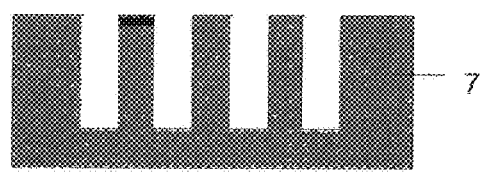
Figure 3:
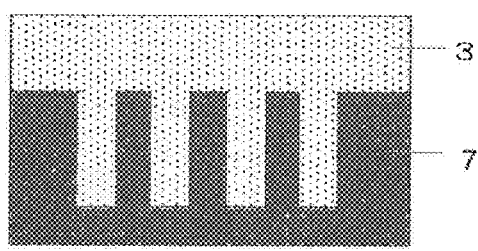

The resist underlayer film compositions (UL-1 to 10) were each applied on a SiO$_2$ wafer substrate having a dense hole pattern (hole diameter: 0.16 μm, hole depth: 0.50 μm, distance between the centers of the adjacent, two holes: 0.32 μm), pre-baked, and irradiated with UV in the same manner as above to form an resist underlayer film. The used substrate is a SiO$_2$ wafer substrate having a dense hole, pattern (a base substrate 7 having a dense hole pattern) as shown in FIG. 3(G) (downward view) and FIG. 3(H) (sectional view). Cross-sectional shapes of the obtained wafer substrates were observed by a scanning electron microscope (SEM), and whether the holes were filled with the resist underlayer film without voids or not was checked. The results are given in Table 6. When a resist underlayer film composition having poor filling property is used, voids occur inside the holes in this evaluation. When a resist underlayer film composition having good filling property is used, the holes of the base substrate 7 having the dense hole pattern are filled with the resist underlayer film 3 without voids in this evaluation, as shown in FIG. 3(I).

TABLE 6

| | Resist underlayer film composition | Pre-bake temperature | Presence/absence of void |
|---|---|---|---|
| Example 3-1 | UL-1 | 200° C. | absence |
| Example 3-2 | UL-2 | 200° C. | absence |
| Example 3-3 | UL-3 | 200° C. | absence |
| Example 3-4 | UL-4 | 200° C. | absence |
| Example 3-5 | UL-5 | 200° C. | absence |
| Example 3-6 | UL-6 | 200° C. | absence |
| Example 3-7 | UL-7 | 100° C. | absence |
| Example 3-8 | UL-7 | none | absence |
| Example 3-9 | UL-8 | 200° C. | absence |
| Example 3-10 | UL-9 | 170° C. | absence |
| Example 3-11 | UL-10 | 170° C. | absence |

As shown in Table 6, in Examples 3-1 to 3-11 using the inventive resist underlayer film compositions (UL-1 to 10), the hole pattern could be filled without voids, which indicates that the inventive resist underlayer film composition had excellent filling property.

Planarizing Property Evaluation (Examples 4-1 to 4-11, Comparative Examples 4-1 to 4-3)

Figure 4:
FIG. 4 is an explanatory view of a method for evaluating the planarizing property in examples and comparative examples.
Figure 4:
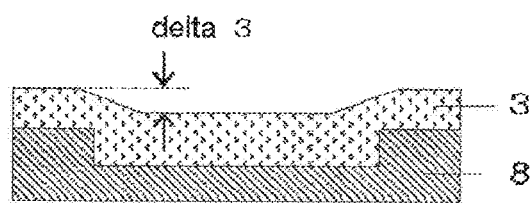

The resist underlayer film compositions (UL-1 to 10 and comparative UL-1 to 3) were each applied on a base substrate 8 (a SiO$_2$ wafer substrate) having a giant isolated trench pattern (FIG. 4(J), trench width: 10 μm or 50 μm, trench depth: 0.1 μm), pre-baked, and irradiated with UV in the same manner as above to form an resist underlayer film 3. Then, a difference between thicknesses at the trench portion and the non-trench portion of the resist underlayer film (delta 3 in FIG. 4(K)) was measured in case of a trench width of 10 μm by observing the cross-sectional shape of the wafer substrate with a scanning electron microscope (SEM), or in case of a trench width of 50 μm by using a probe type profiler. The results are shown in Table 7. In this evaluation, the smaller the difference between film thicknesses is, the better the planarizing property is.

TABLE 7

| | Resist underlayer film composition | Pre-bake temperature | Difference between, film thicknesses on substrate with 10 μm trench width (nm) | Difference between film thicknesses on substrate with 50 μm trench width (nm) |
|---|---|---|---|---|
| Example 4-1 | UL-1 | 200° C. | 20 | 50 |
| Example 4-2 | UL-2 | 200° C. | 20 | 50 |
| Example 4-3 | UL-3 | 200° C. | 20 | 40 |
| Example 4-4 | UL-4 | 200° C. | 15 | 40 |
| Example 4-5 | UL-5 | 200° C. | 15 | 40 |
| Example 4-6 | UL-6 | 200° C. | 15 | 40 |
| Example 4-7 | UL-7 | 100° C. | 10 | 35 |
| Example 4-8 | UL-7 | none | 15 | 30 |
| Example 4-9 | UL-8 | 200° C. | 20 | 45 |
| Example 4-10 | UL-9 | 170° C. | 10 | 25 |
| Example 4-11 | UL-10 | 170° C. | 10 | 20 |
| Comparative Example 4-1 | Comparative UL-1 | 200° C. | 40 | unmeasurable because of insufficient curing |
| Comparative Example 4-2 | Comparative UL-2 | 100° C. | 40 | 80 |
| Comparative Example 4-3 | Comparative UL-3 | 100° C. | 35 | 75 |

As shown in Table 7, Examples 4-1 to 4-11 using the inventive resist underlayer film compositions (UL-1 to 10) had smaller difference between film thicknesses at the trench portion and the non-trench portion of the resist underlayer film than Comparative Examples 4-1 to 4-3 using the comparative resist, underlayer film compositions (comparative UL-1 to 3), and thus had excellent planarizing property.

Pattern Formation Evaluation (Examples 5-1 to 5-11, Comparative Examples 5-1 to 5-3)

The resist underlayer film compositions (UL-1 to 10 and comparative UL-1 to 3) were each applied on a Si wafer substrate, pre-baked, and irradiated with UV in the same manner as above to form an resist underlayer film. The following resist middle layer film composition (SOG-1) was applied thereon and baked at 200° C. for 60 seconds to form a resist middle layer film having a thickness of 35 nm. The above resist upper layer film composition (PR-1) was applied thereon and baked at 105° C. for 60 seconds to form a resist upper layer film having a thickness of about 100 nm. A liquid immersion top coat composition (TC-1) was applied on the resist upper layer film and baked at 90° C. for 60 seconds to form a top coat having a thickness of 50 nm.

As the resist middle layer film composition (SOG-1), a propylene glycol ethyl ether solution containing 2% of the following ArF silicon-containing middle layer polymer 1 was used.

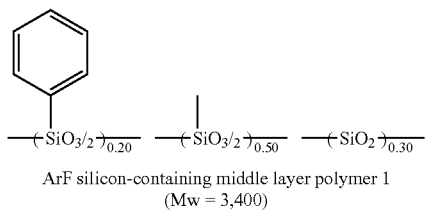

ArF silicon-containing middle layer polymer 1
(Mw = 3,400)

The used liquid immersion top coat composition (TC-1) was prepared by dissolving a top coat polymer in an organic solvent in the proportion shown in Table 8 and filtering the solution through a 0.1-μm filter made of a fluorinated resin.

TABLE 8

| No. | Polymer (part by mass) | Organic solvent (part by mass) |
|---|---|---|
| TC-1 | Top coat polymer (100) | Diisoamyl ether (2700) 2-methyl-1-butanol (270) |

The used top coat polymer is shown below.
Top coat polymer:
  Molecular weight (Mw)=8,800
  Dispersity (Mw/Mn)=1.69

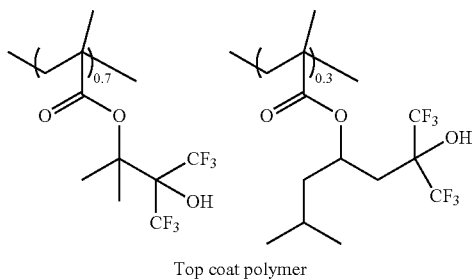

Top coat polymer

Then, the substrate was exposed to light with an ArF liquid immersion exposure apparatus (NSR-S610C manufactured by Nikon Corporation, NA: 1.30, σ: 0.98/0.65, 35° s-polarized dipole illumination, 6% halftone phase shift mask), baked at 100° C. for 60 seconds (PEB), and developed with a 2.38 mass % tetramethylammonium hydroxide (TMAH) aqueous solution for 30 seconds to obtain a 160 nm 1:1 positive line and space (L/S) resist upper layer film pattern.

Then, with an etching apparatus Telius manufactured by Tokyo Electron Ltd., the resist middle layer film was processed by dry etching using the resist upper layer film pattern as a mask, the resist underlayer film was processed by etching using the obtained resist middle layer film pattern as a mask to form a resist underlayer film pattern. The etching conditions are as follows.
(Condition for Transferring Resist Upper Layer Film Pattern to Resist Middle Layer Film)

| Chamber pressure | 10.0 Pa |
|---|---|
| RF power | 1,500 W |
| $CF_4$ gas flow rate | 75 mL/min |
| $O_2$ gas flow rate | 15 mL/min |
| Time | 15 sec |

(Condition for Transferring Resist Middle Layer Film Pattern to Resist Underlayer Film)

| Chamber pressure | 2.0 Pa |
|---|---|
| RF power | 500 W |
| Ar gas flow rate | 75 mL/min |
| $O_2$ gas flow rate | 45 mL/min |
| Time | 90 sec |

Whether the resist underlayer film pattern could be formed or not was observed by top-down SEM view of the wafer after etching of the underlayer film. The evaluation results are shown in Table 9.

TABLE 9

| | Resist underlayer film composition | Pre-bake | Resist underlayer film pattern |
|---|---|---|---|
| Example 5-1 | UL-1 | 200° C. | formable |
| Example 5-2 | UL-2 | 200° C. | formable |
| Example 5-3 | UL-3 | 200° C. | formable |
| Example 5-4 | UL-4 | 200° C. | formable |
| Example 5-5 | UL-5 | 200° C. | formable |
| Example 5-6 | UL-6 | 200° C. | formable |
| Example 5-7 | UL-7 | 100° C. | formable |
| Example 5-8 | UL-7 | none | formable |
| Example 5-9 | UL-8 | 200° C. | formable |
| Example 5-10 | UL-9 | 170° C. | formable |
| Example 5-11 | UL-10 | 170° C. | formable |
| Comparative Example 5-1 | Comparative UL-1 | 200° C. | unformable |
| Comparative Example 5-2 | Comparative UL-2 | 100° C. | unformable |
| Comparative Example 5-3 | Comparative UL-3 | 100° C. | unformable |

As shown in Table 9, all of Examples 5-1 to 5-11 using the inventive resist underlayer film compositions (UL-1 to 10) (i.e., the patterning process of the present invention) could favorably transfer the resist upper layer film pattern to the resist underlayer film, which indicates that they are suitable for a fine lithography by a multilayer resist method. By contrast, all of Comparative Examples 5-1 to 5-3 using the comparative resist underlayer film compositions (comparative UL-1 to 3) could not form a resist underlayer film pattern well. In Comparative Example 5-1, the resist underlayer film composition was insufficiently cured, and thus a problem seems to have occurred when the resist middle layer film was applied. In Comparative Example 5-2 and Comparative Example 5-3, the resist underlayer film pattern seems to have been excessively etched due to insufficient dry etching resistance of the resist underlayer film.

As described above, it was revealed that the resist underlayer film composition, the patterning process, the method for forming a resist underlayer film, and the compound for a resist underlayer film composition of the present invention can be suitably used in a multilayer resist process for fine patterning in the semiconductor apparatus manufacturing process, in particular, can be used in a multilayer resist process including processing an uneven substrate, and are extremely industrially useful.

It is to be noted that the present invention is not restricted to the foregoing embodiment. The embodiment is just an exemplification, and any examples that have substantially the same feature and demonstrate the same functions and effects as those in the technical concept described in claims of the present invention are included in the technical scope of the present invention.

The invention claimed is:

1. A resist underlayer film composition for use in a multilayer resist method, comprising:
   (A) an organic solvent; and
   (B) one or more than one compound shown by the following general formula (1),

(1)

wherein W represents an n-valent organic group having 2 to 50 carbon atoms; "n" represents an integer of 1 to 10; and X represents a monovalent organic group shown by the following general formula (1X),

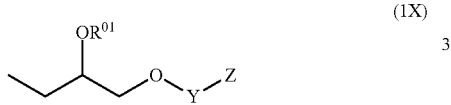

(1X)

wherein the dotted line represents a bonding arm; $R^{01}$ represents an acryloyl group or a methacryloyl group; Y represents a single bond or a carbonyl group; and Z is a group shown by the following general formula (1Z),

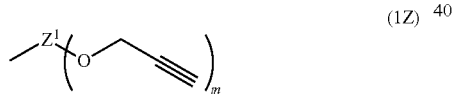

(1Z)

wherein the dotted line represents a bonding arm; $Z^1$ represents an (m+1)-valent aromatic group having 6 to 20 carbon atoms; and "m" represents an integer of 1 to 5.

2. A resist underlayer film composition for use in a multilayer resist method, comprising:
   (A) an organic solvent; and
   (B) one or more than one compound shown by the following general formula (1),

(1)

wherein W represents an n-valent organic group having 2 to 50 carbon atoms; "n" represents an integer of 1 to 10; and X represents a monovalent organic group shown by the following general formula (1X),

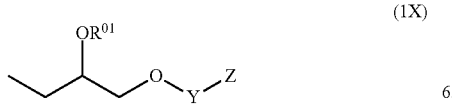

(1X)

wherein the dotted line represents a bonding arm; $R^{01}$ represents an acryloyl group or a methacryloyl group; Y represents a carbonyl group; and Z is a group shown by the following general formula (2Z):

(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

3. A resist underlayer film composition for use in a multilayer resist method, comprising:
   (A) an organic solvent;
   (B) one or more than one compound shown by the following general formula (1),

(1)

wherein W represents an n-valent organic group having 2 to 50 carbon atoms, "n" represents an integer of 1 to 10, and X represents a monovalent organic group shown by the following general formula (1X),

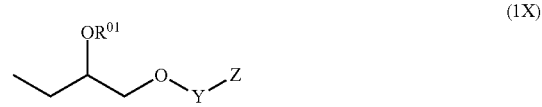

(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms; and (A') a compound shown by the following general formula (3),

(3)

wherein W represents an n-valent organic group having 2 to 50 carbon atoms; and "n" represents an integer of 1 to 10, $X^2$ represents a monovalent organic group shown by the following general formula (3X),

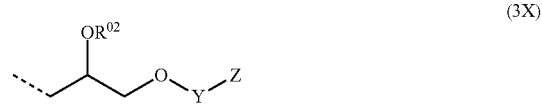

(3X)

wherein the dotted line represents a bonding arm; Y represents a single bond or a carbonyl group; and Z represents a monovalent organic group having 1 to 30 carbon atoms; $R^{02}$ represents an acryloyl group, a methacryloyl group, or a hydrogen atom, provided that at least a part of $R^{02}$ is a hydrogen atom.

4. The resist underlayer film composition according to claim 3, wherein Z in the general formula (3X) is a group shown by the following general formula (1Z),

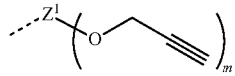
(1Z)

wherein the dotted line represents a bonding arm; $Z^1$ represents an (m+1)-valent aromatic group having 6 to 20 carbon atoms; and "m" represents an integer of 1 to 5.

5. The resist underlayer film composition according to claim 3, wherein in the general formula (3X), Z is a group shown by the following general formula (2Z), and Y is a carbonyl group,

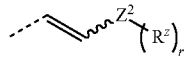
(2Z)

wherein the dotted line represents a bonding arm; $Z^2$ represents an (r+1)-valent aromatic group having 6 to 10 carbon atoms; $R^z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^z$ are contained, the plurality of $R^z$ are optionally bonded to each other to form a ring together with the carbon atoms bonded thereto; and "r" represents an integer of 0 to 5.

6. The resist underlayer film composition according to claim 3, wherein the compound shown by the general formula (3) comprises a compound shown by any one of the following general formulae (4-1) to (4-68),

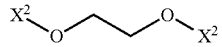
(4-1)

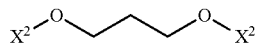
(4-2)

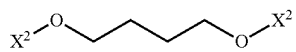
(4-3)

(4-4)

(4-5)

(4-6)

(4-7)

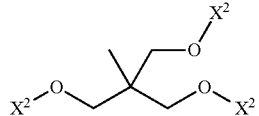

-continued

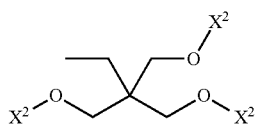
(4-8)

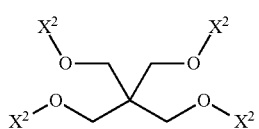
(4-9)

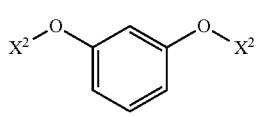
(4-10)

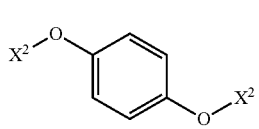
(4-11)

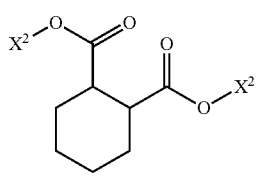
(4-12)

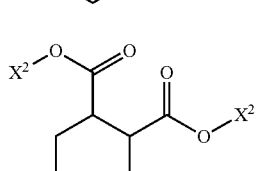
(4-13)

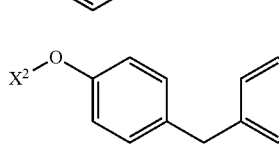
(4-14)

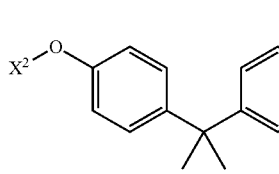
(4-15)

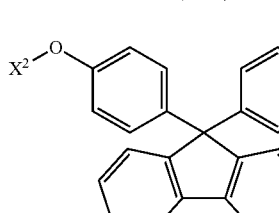
(4-16)

(4-17)

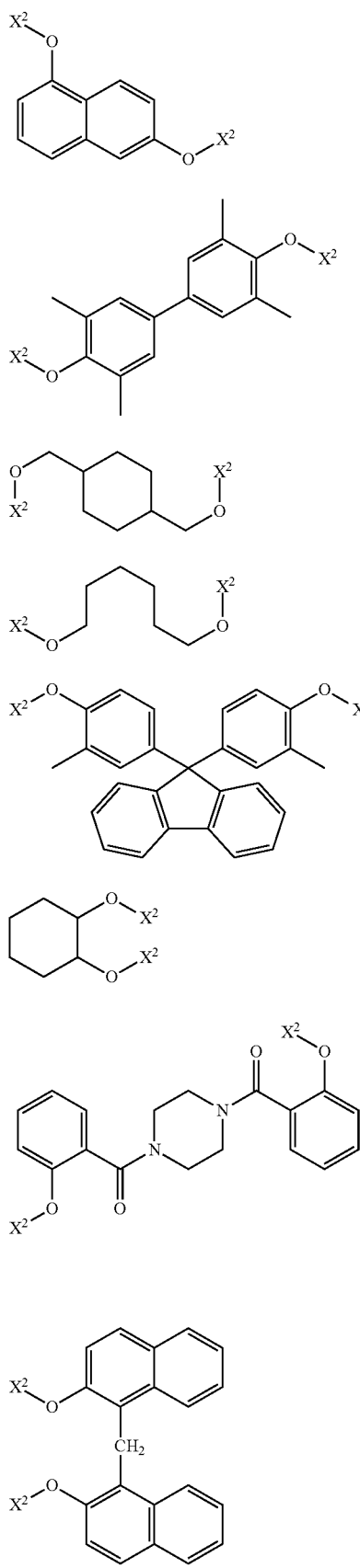
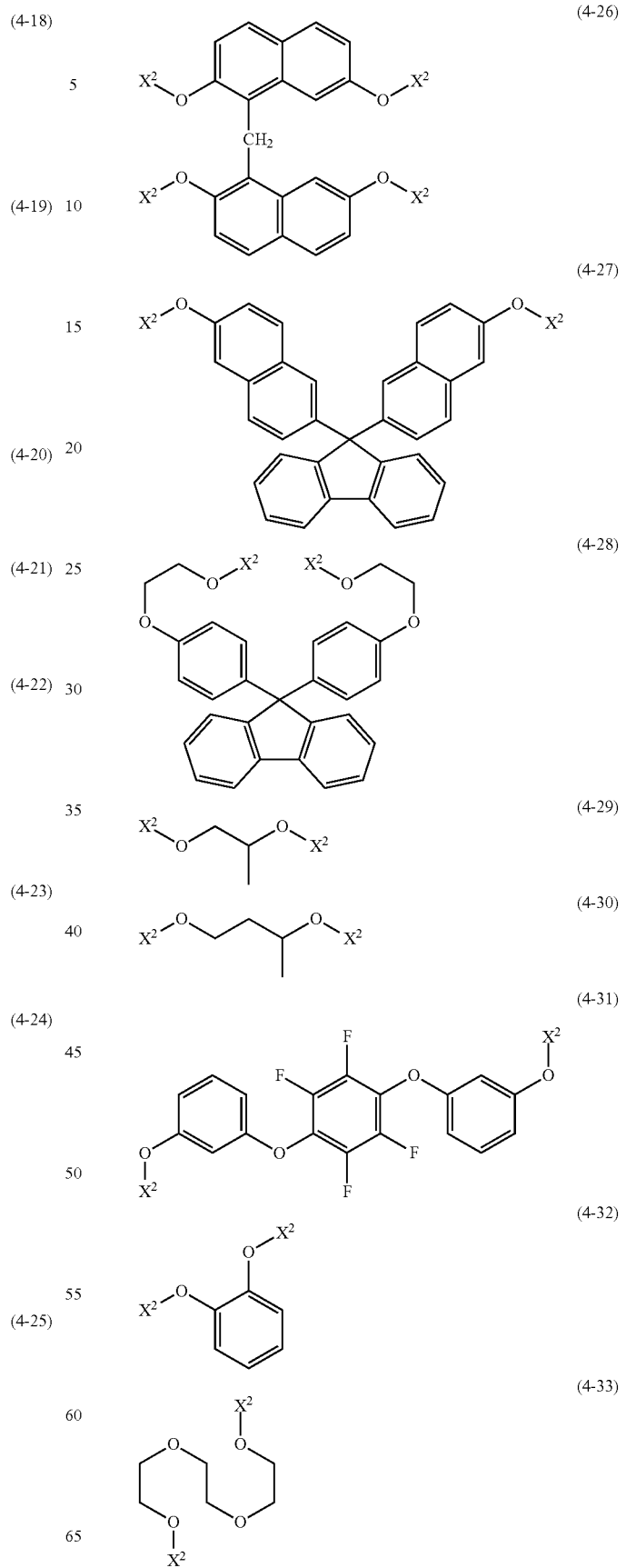

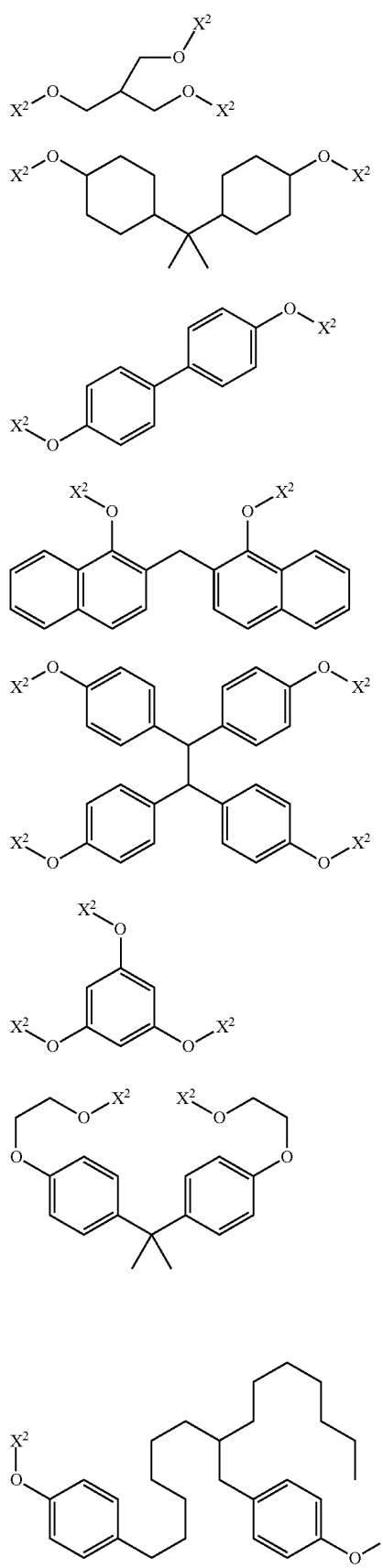
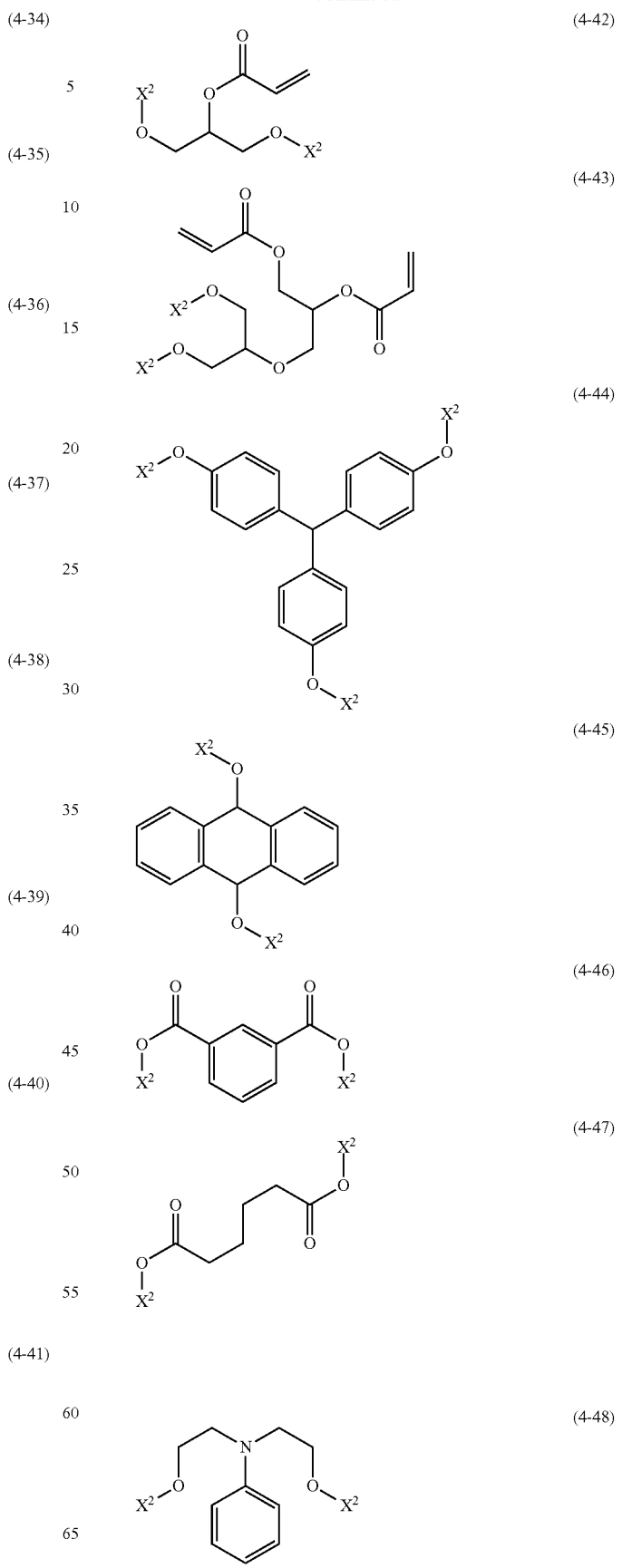

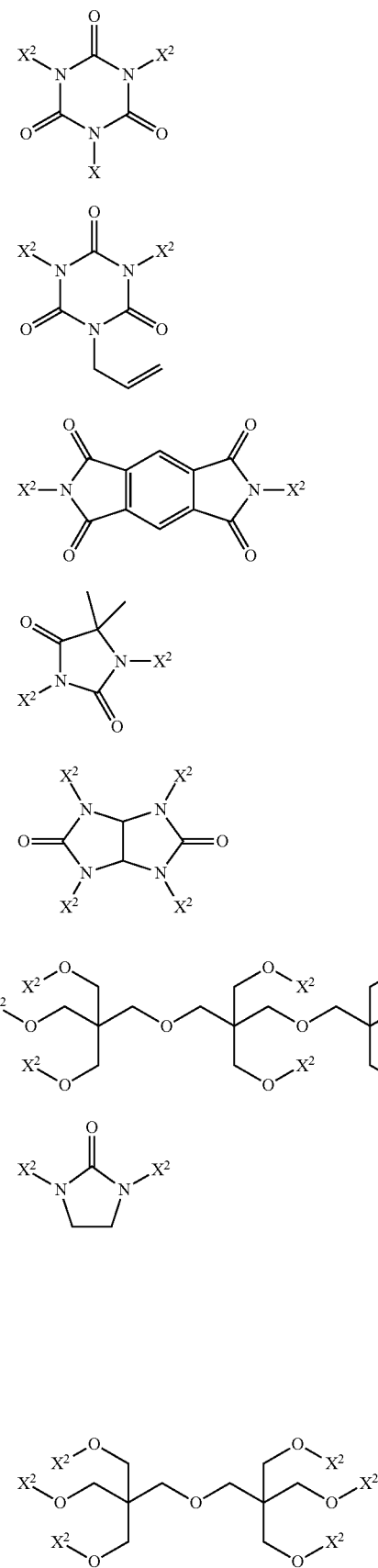
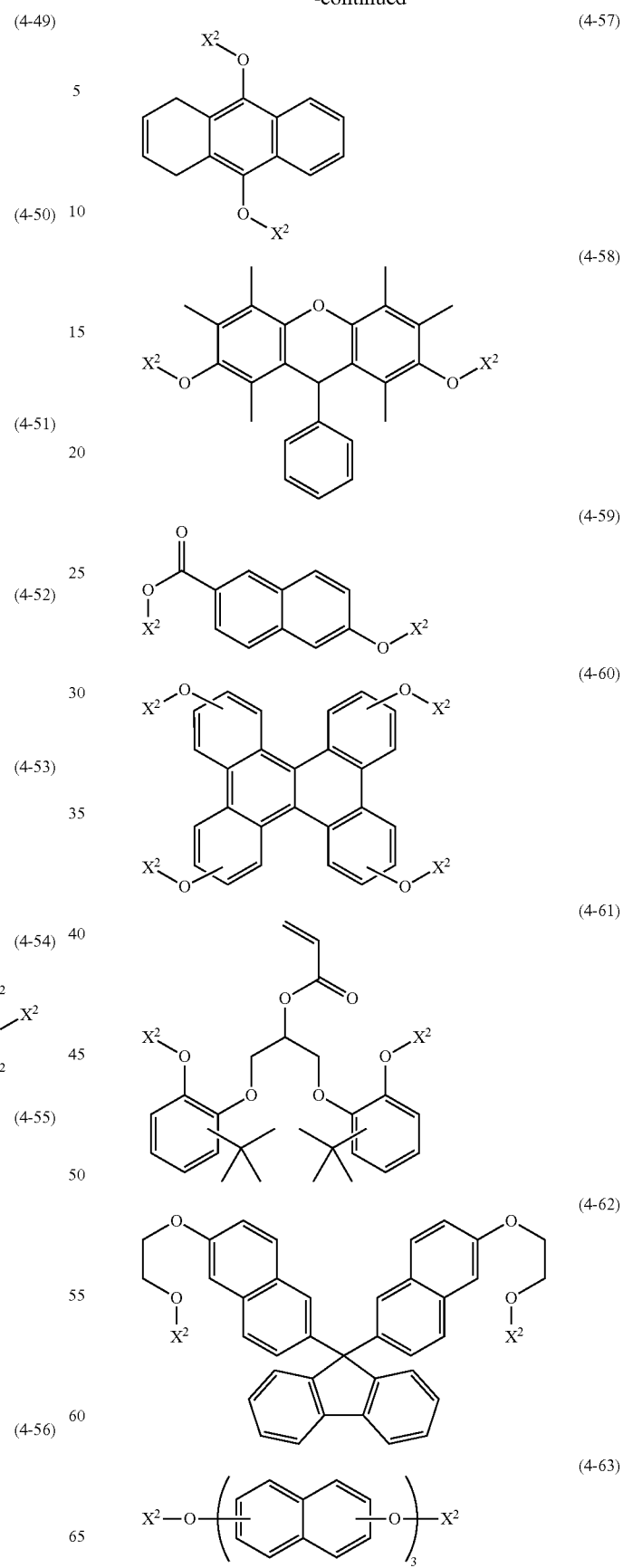

-continued

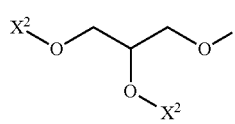
(4-64)

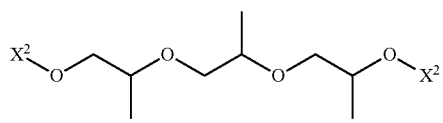
(4-65)

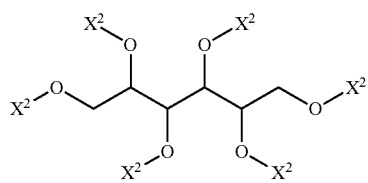
(4-66)

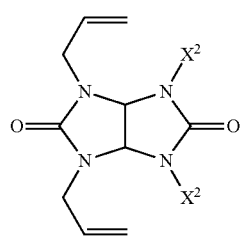
(4-67)

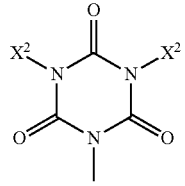
(4-68)

wherein $X^2$ represents a monovalent organic group shown by the following general formula (3X),

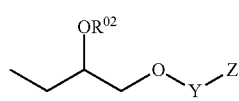
(3X)

wherein the dotted line represents a bonding arm; Y represents a single bond or a carbonyl group; and Z represents a monovalent organic group having 1 to 30 carbon atoms; $R^{02}$ represents an acryloyl group, a methacryloyl group, or a hydrogen atom, provided that at least a part of $R^{02}$ is a hydrogen atom.

7. A resist underlayer film composition for use in a multilayer resist method, comprising:
(A) an organic solvent; and
(B) one or more than one compound shown by the following general formula (1), W—(X)$_n$  (1)

wherein W represents an n-valent organic group having 2 to 50 carbon atoms, "n" represents an integer of 1 to 10, X represents a monovalent organic group shown by the following general formula (1X),

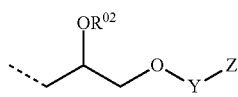
(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms;
wherein the organic solvent of component (A) is a mixture of one or more organic solvents having a boiling point of lower than 180° C. and one or more organic solvents having a boiling point of 180° C. or higher.

8. A resist underlayer film composition for use in a multilayer resist method, comprising:
(A) an organic solvent;
(B) one or more than one compound shown by the following general formulae selected from the group consisting of general formula (2-1), general formula (2-2), general formula (2-3), general formula (2-4), general formula (2-5), general formula (2-6), general formula (2-7), general formula (2-8), general formula (2-9), general formula (2-10), general formula (2-11), general formula (2-12), general formula (2-13), general formula (2-14), general formula (2-15), general formula (2-16), general formula (2-17), general formula (2-18), general formula (2-19), general formula (2-20), general formula (2-21), general formula (2-22), general formula (2-23), general formula (2-24), general formula (2-25), general formula (2-26), general formula (2-28), general formula (2-29), general formula (2-30), general formula (2-31), general formula (2-32), general formula (2-33), general formula (2-34), general formula (2-35), general formula (2-36), general formula (2-37), general formula (2-38), general formula (2-39), general formula (2-40), general formula (2-41), general formula (2-42), general formula (2-43), general formula (2-44), general formula (2-45), general formula (2-46), general formula (2-47), general formula (2-48), general formula (2-49), general formula (2-50), general formula (2-51), general formula (2-52), general formula (2-53), general formula (2-54), general formula (2-55), general formula (2-56), general formula (2-57), general formula (2-58), general formula (2-59), general formula (2-60), general formula (2-61), general formula (2-63), general formula (2-64), general formula (2-65), general formula (2-66), general formula (2-67), and general formula (2-68):

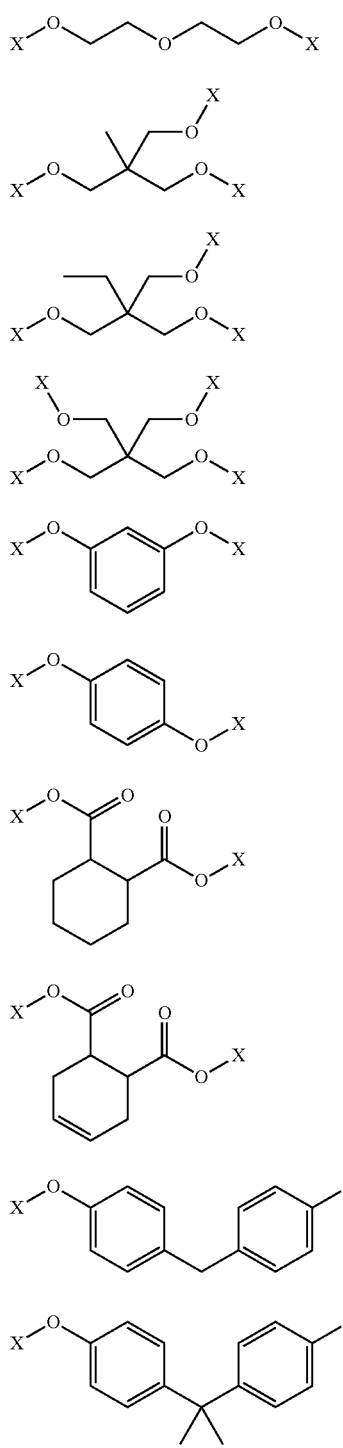
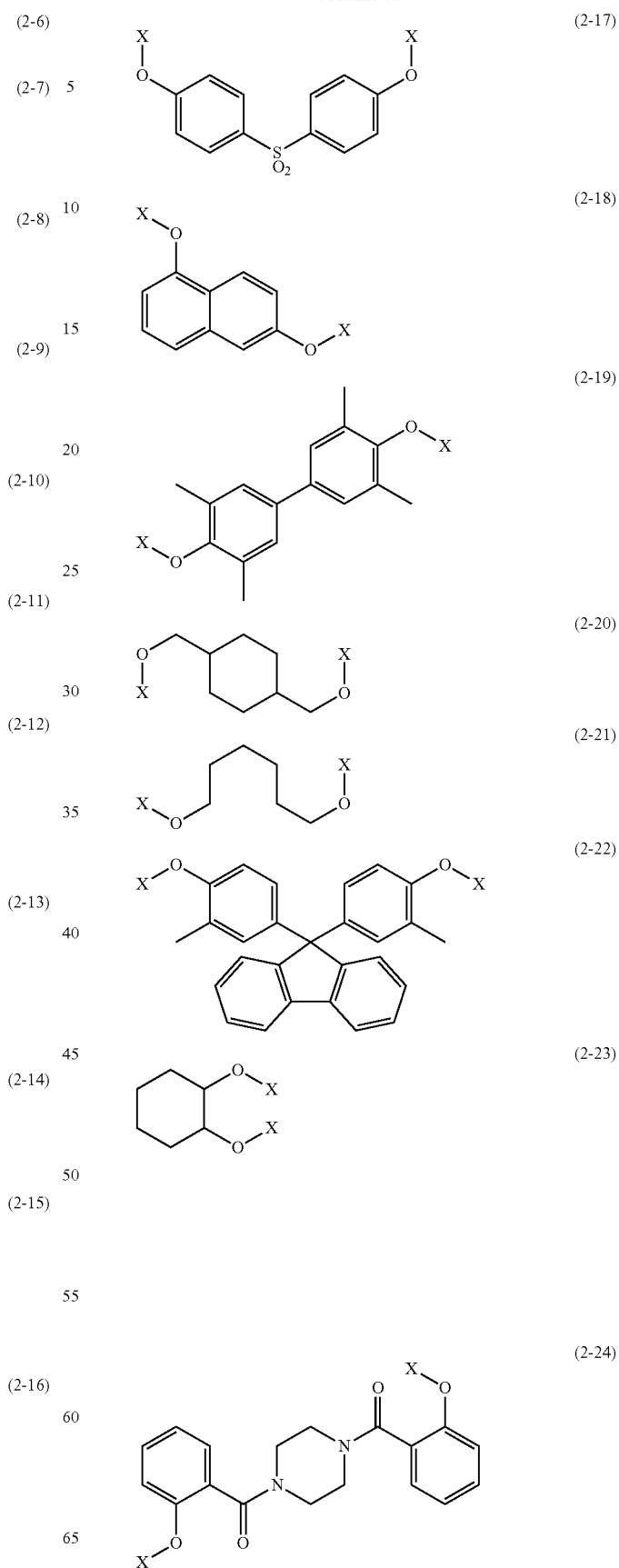

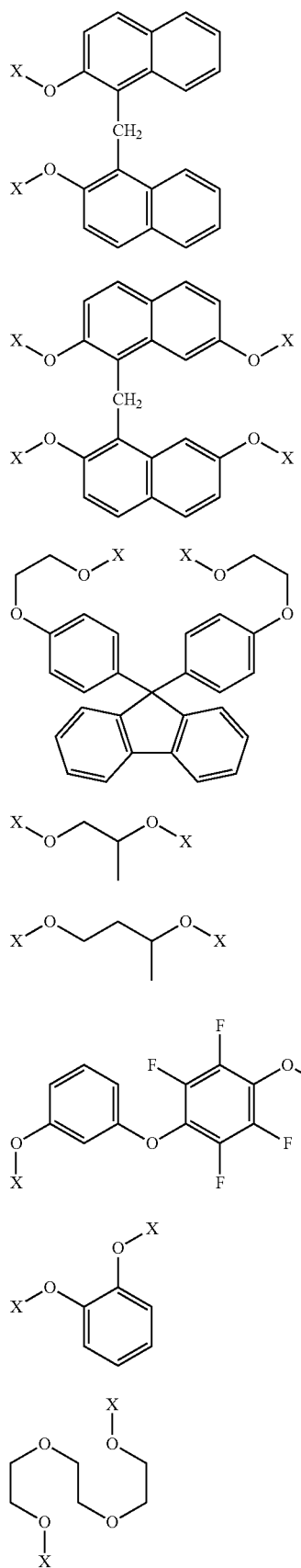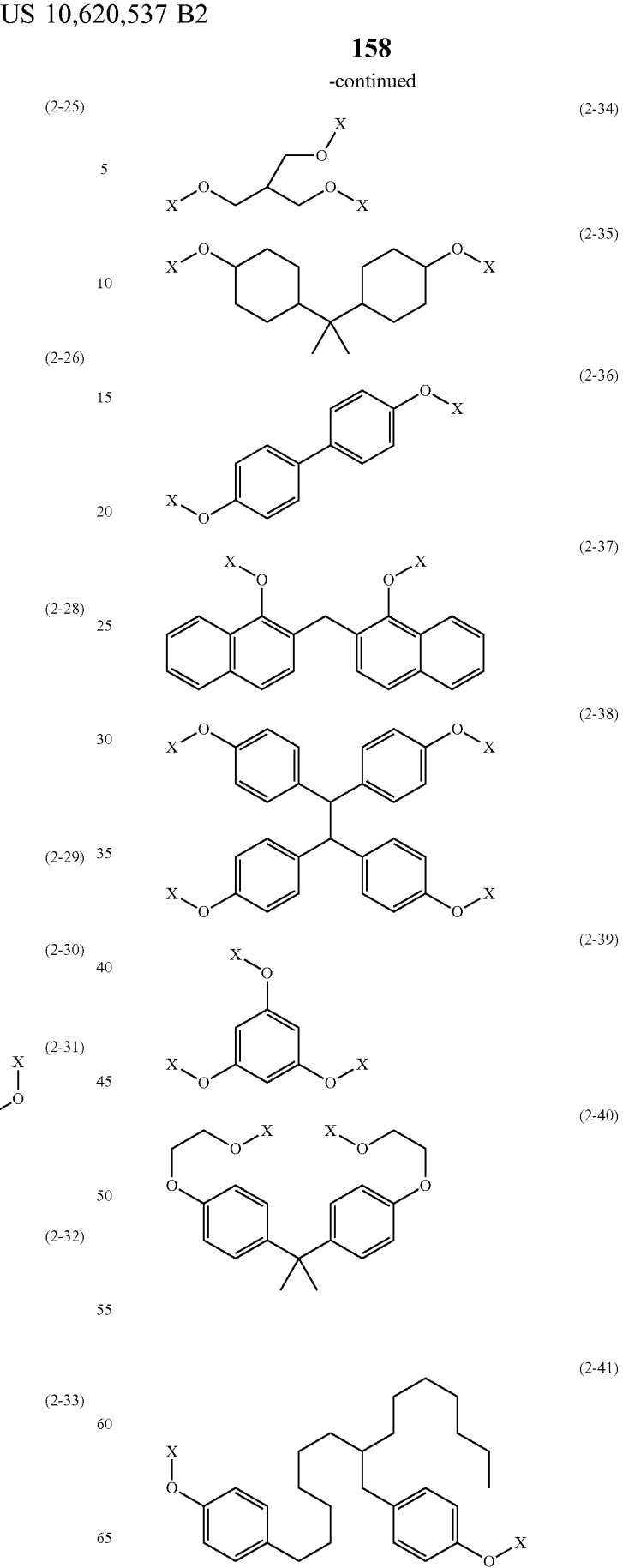

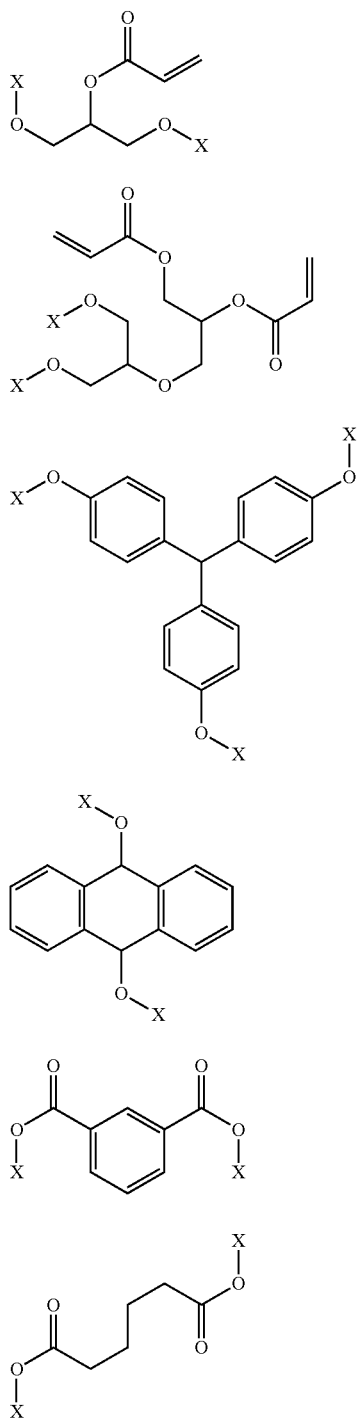
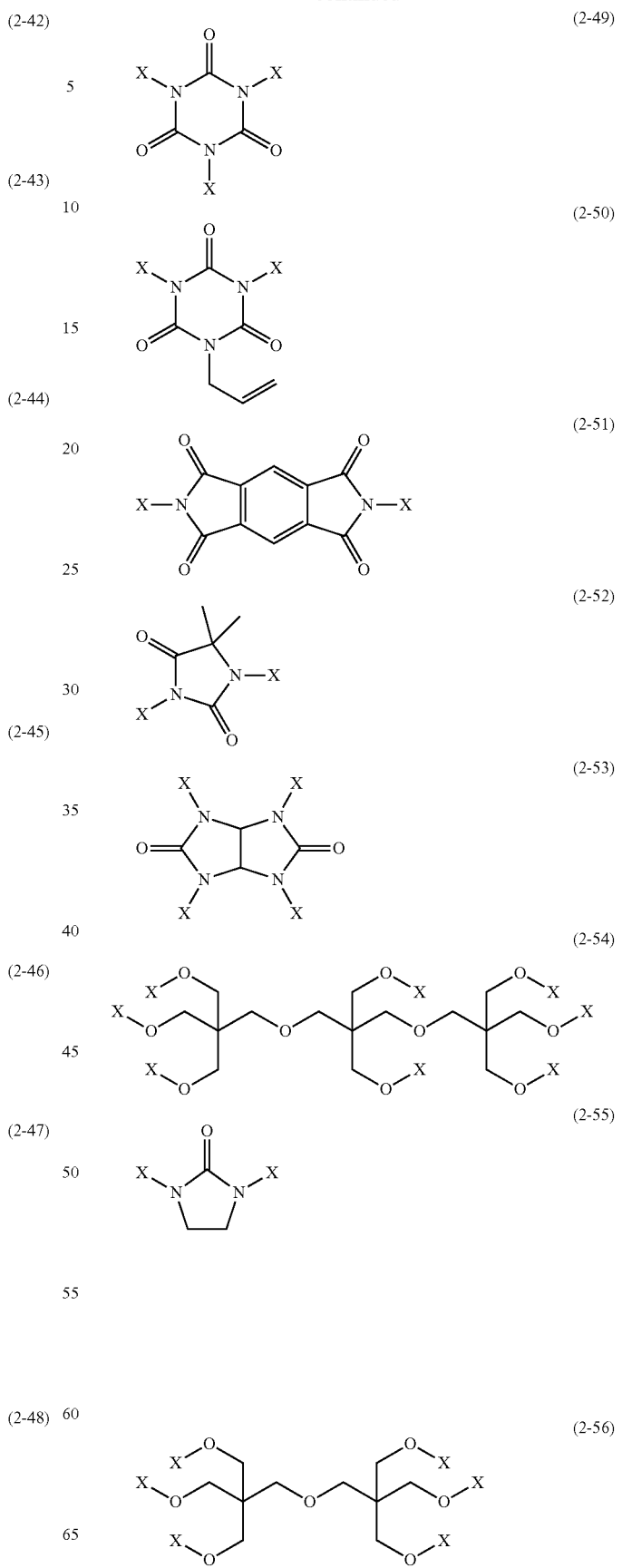

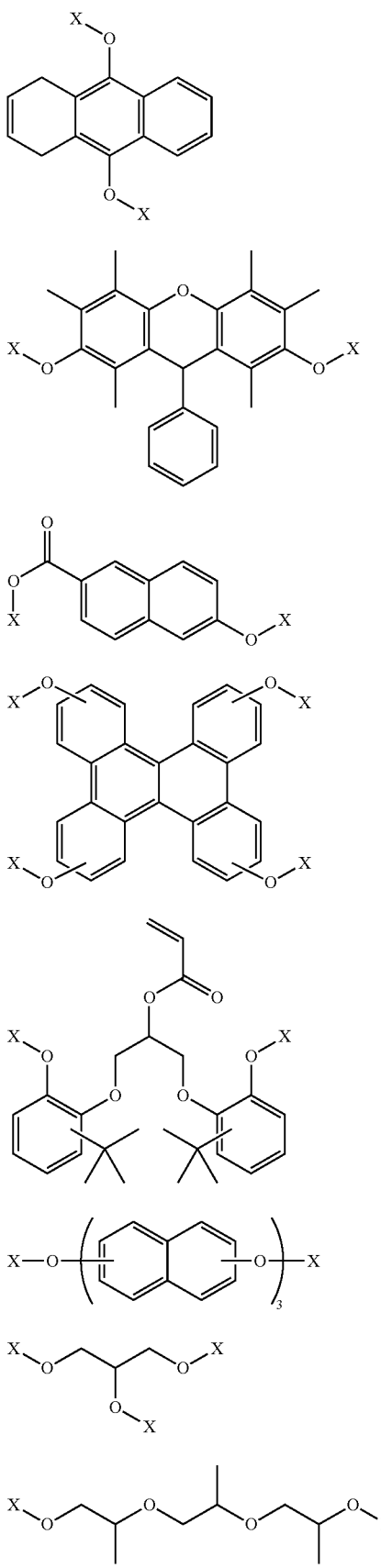

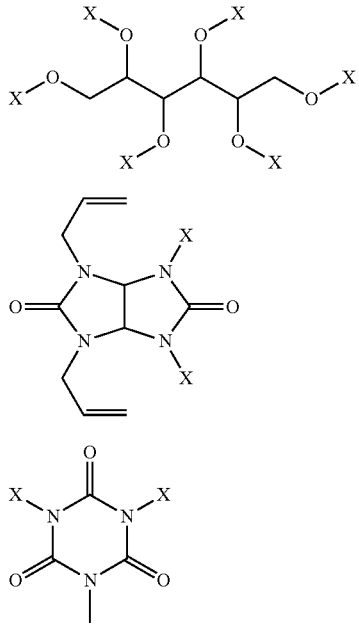

wherein X represents a monovalent organic group shown by the following general formula (1X),

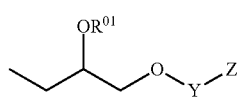
(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms; and (C) a liquid polyfunctional acrylate compound having a boiling point of 200° C. or higher.

9. The resist underlayer film composition according to claim 8, wherein the component (C) is a polyacrylate of an acyclic polyol.

10. A patterning process for forming a pattern in a substrate to be processed, the patterning process comprising:

applying a resist underlayer film composition on a substrate to be processed and irradiating the composition with a high energy beam to form a resist underlayer film;

forming a resist upper layer film on the resist underlayer film by using a resist upper layer film material composed of a photoresist composition;

subjecting the resist upper layer film to pattern exposure and development with a developer to form a pattern in the resist upper layer film; and transferring the pattern to the resist underlayer film by dry etching using the resist upper layer film having the formed pattern as a mask; wherein the resist underlayer film composition comprises:

(A) an organic solvent; and (B) one or more than one compound shown by the following general formula (1), $$W\text{-}(X)_n \quad (1)$$

wherein W represents an n-valent organic group having 2 to 50 carbon atoms, "n" represents an integer of 1 to 10, and X represents a monovalent organic group shown by the following general formula (1X),

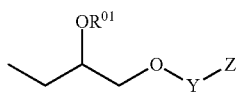

(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms.

11. A patterning process for forming a pattern in a substrate to be processed, the patterning process comprising:
applying a resist underlayer film composition on a substrate to be processed and irradiating the composition with a high energy beam to form a resist underlayer film;
forming a resist middle layer film on the resist underlayer film;
forming a resist upper layer film on the resist middle layer film by using a resist upper layer film material composed of a photoresist composition;
subjecting the resist upper layer film to pattern exposure and development with a developer to form a pattern in the resist upper layer film;
transferring the pattern to the resist middle layer film by dry etching using the resist upper layer film having the formed pattern as a mask; and
transferring the pattern to the resist underlayer film by dry etching using the resist middle layer film having the transferred pattern as a mask; wherein the resist underlayer film composition comprises:
(A) an organic solvent; and
(B) one or more than one compound shown by the following general formula (1),

(1)

wherein W represents an n-valent organic group having 2 to 50 carbon atoms, "n" represents an integer of 1 to 10, and X represents a monovalent organic group shown by the following general formula (1X),

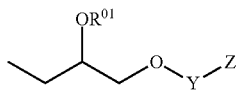

(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms.

12. The patterning process according to claim 11, wherein the resist underlayer film is formed by applying the resist underlayer film composition on the substrate to be processed, performing a heat treatment at 50° C. to 300° C. for 10 to 600 seconds, and then irradiating the composition with the high energy beam.

13. The patterning process according to claim 11, wherein the resist underlayer film is formed by applying the resist underlayer film composition on the substrate to be processed, and irradiating the composition with the high energy beam without a heat treatment.

14. The patterning process according to claim 11, wherein the substrate to be processed is a substrate having a structure or a step with a height of 30 nm or more.

15. The patterning process according to claim 11, wherein a light source of the high energy beam is a xenon excimer lamp.

16. A patterning process for forming a pattern in a substrate to be processed, the patterning process comprising:
applying a resist underlayer film composition on a substrate to be processed and irradiating the composition with a high energy beam to form a resist underlayer film;
forming an inorganic hard mask intermediate film selected from a silicon oxide film, a silicon nitride film, or a silicon oxynitride film on the resist underlayer film;
forming an organic anti-reflective film on the inorganic hard mask intermediate film;
forming a resist upper layer film on the organic anti-reflective film by using a resist upper layer film material composed of a photoresist composition;
subjecting the resist upper layer film to pattern exposure and development with a developer to form a pattern in the resist upper layer film;
transferring the pattern to the organic anti-reflective film and the inorganic hard mask intermediate film by dry etching using the resist upper layer film having the formed pattern as a mask; and
transferring the pattern to the resist underlayer film by dry etching using the inorganic hard mask intermediate film having the transferred pattern as a mask; wherein the resist underlayer film composition comprises:
(A) an organic solvent; and
(B) one or more than one compound shown by the following general formula (1),

(1)

wherein W represents an n-valent organic group having 2 to 50 carbon atoms, "n" represents an integer of 1 to 10, and X represents a monovalent organic group shown by the following general formula (1X),

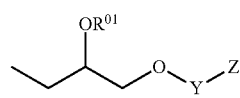

(1X)

wherein the dotted line represents a bonding arm, $R^{01}$ represents an acryloyl group or a methacryloyl group, Y represents a single bond or a carbonyl group, and Z represents a monovalent organic group having 1 to 30 carbon atoms.

17. A method for forming a resist underlayer film, the method comprising:
applying a resist underlayer film composition on a substrate to be processed;
subjecting the resist underlayer film composition to a heat treatment at 50° C. to 300° C. for 10 to 600 seconds; and
then irradiating the composition with a high energy beam to form a cured film;

wherein the resist underlayer film composition comprises:
(A) an organic solvent; and
(B) one or more than one compound shown by the following general formula (1), $$W\text{-}(X)_n \quad (1)$$

wherein W represents an n-valent organic group having 2 to 50 carbon atoms, "n" represents an integer of 1 to 10, and X represents a monovalent organic group shown by the following general formula (1X), $$(1X)$$

wherein the dotted line represents a bonding arm, $R^{01}$ represents an acryloyl group or a methacryloyl group, Y represents a single bond or a carbonyl group, and Z represents a monovalent organic group having 1 to 30 carbon atoms.

18. The method for forming a resist underlayer film according to claim 17, wherein the substrate to be processed is a substrate having a structure or a step with a height of 30 nm or more.

19. The method for forming a resist underlayer film according to claim 17, wherein a light source of the high energy beam is a xenon excimer lamp.

20. A method for forming a resist underlayer film, the method comprising:
applying a resist underlayer film composition on a substrate to be processed; and
irradiating the composition with a high energy beam to form a cured film without a heat treatment; wherein the resist underlayer film composition comprises:
(A) an organic solvent; and
(B) one or more than one compound shown by the following general formulae selected from the group consisting of general formula (2-1), general formula (2-2), general formula (2-3), general formula (2-4), general formula (2-5), general formula (2-6), general formula (2-7), general formula (2-8), general formula (2-9), general formula (2-10), general formula (2-11), general formula (2-12), general formula (2-13), general formula (2-14), general formula (2-15), general formula (2-16), general formula (2-17), general formula (2-18), general formula (2-19), general formula (2-20), general formula (2-21), general formula (2-22), general formula (2-23), general formula (2-24), general formula (2-25), general formula (2-26), general formula (2-28), general formula (2-29), general formula (2-30), general formula (2-31), general formula (2-32), general formula (2-33), general formula (2-34), general formula (2-35), general formula (2-36), general formula (2-37), general formula (2-38), general formula (2-39), general formula (2-40), general formula (2-41), general formula (2-42), general formula (2-43), general formula (2-44), general formula (2-45), general formula (2-46), general formula (2-47), general formula (2-48), general formula (2-49), general formula (2-50), general formula (2-51), general formula (2-52), general formula (2-53), general formula (2-54), general formula (2-55), general formula (2-56), general formula (2-57), general formula (2-58), general formula (2-59), general formula (2-60), general formula (2-61), general formula (2-63), general formula (2-64), general formula (2-65), general formula (2-66), general formula (2-67), and general formula (2-68):

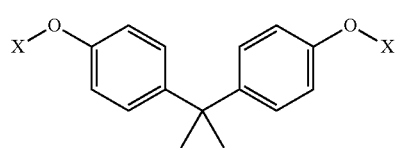
(2-15)
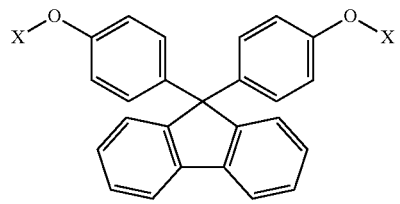
(2-16)
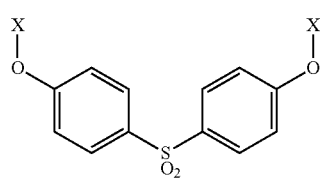
(2-17)
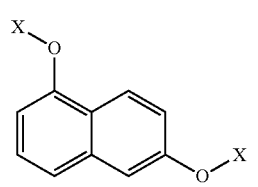
(2-18)
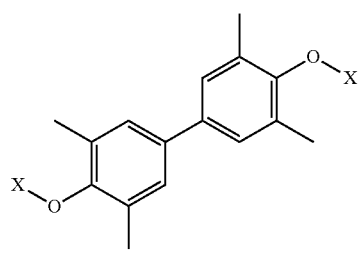
(2-19)
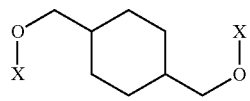
(2-20)
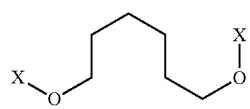
(2-21)
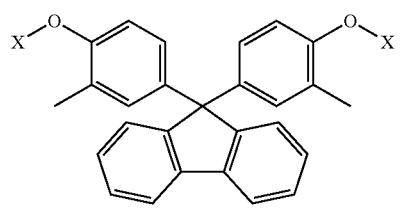
(2-22)
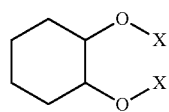
(2-23)
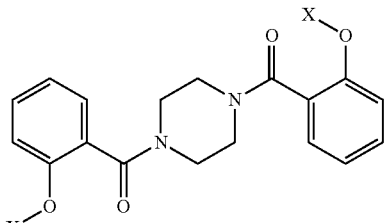
(2-24)
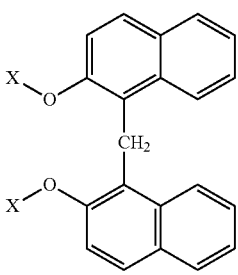
(2-25)
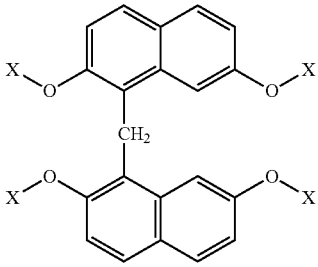
(2-26)
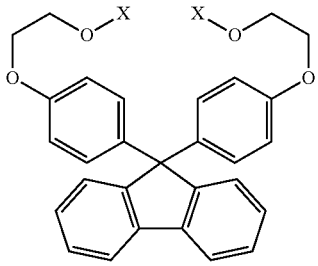
(2-28)
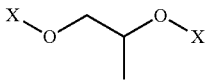
(2-29)
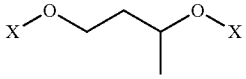
(2-30)
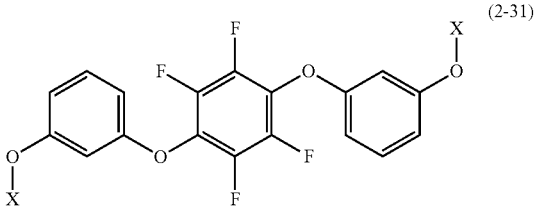
(2-31)
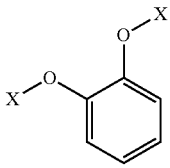
(2-32)

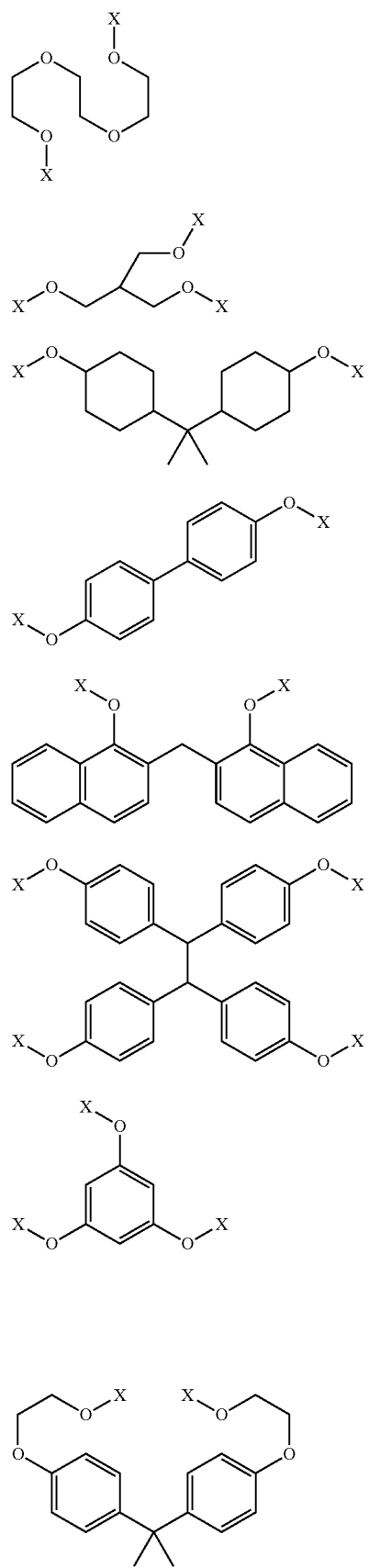

-continued
(2-48)
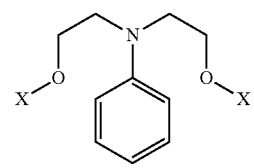
(2-49)
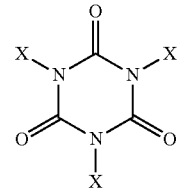
(2-50)
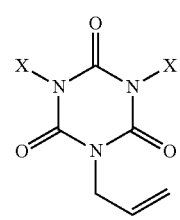
(2-51)
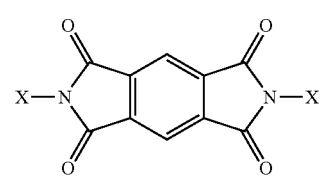
(2-52)
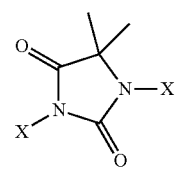
(2-53)
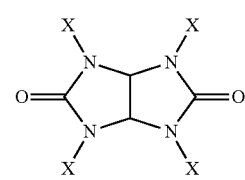
(2-54)
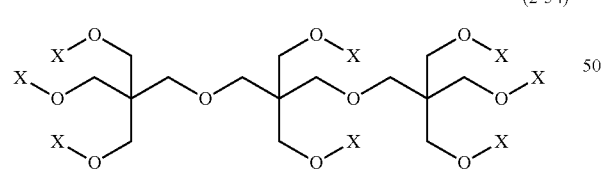
(2-55)
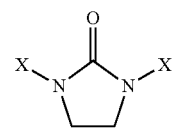
(2-56)
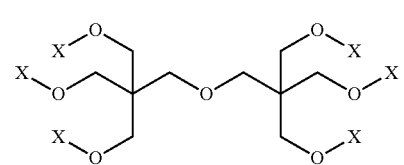
-continued
(2-57)
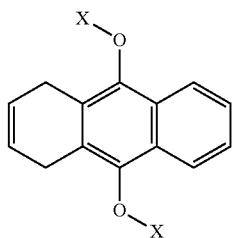
(2-58)
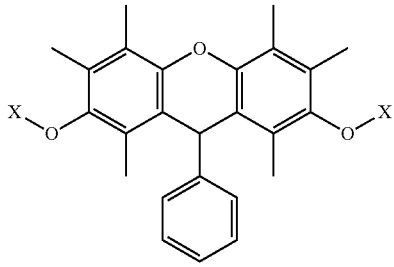
(2-59)
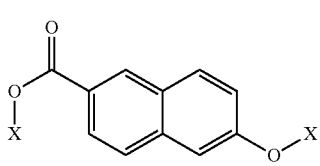
(2-60)
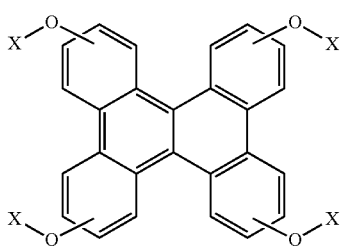
(2-61)
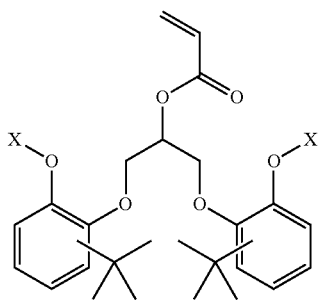
(2-63)
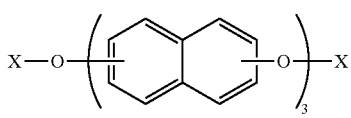
(2-64)
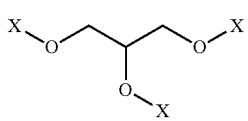
(2-65)
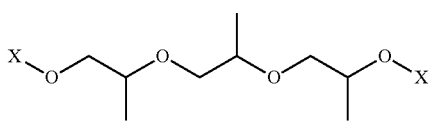

-continued (2-66)
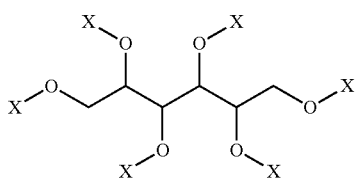

(2-67)
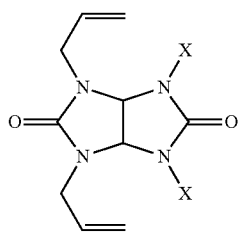

(2-68)
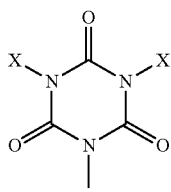

wherein X represents a monovalent organic group shown by the following general formula (1X), (1X)
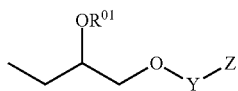

wherein the dotted line represents a bonding arm, $R^{01}$ represents an acryloyl group or a methacryloyl group, Y represents a single bond or a carbonyl group, and Z represents a monovalent organic group having 1 to 30 carbon atoms.

21. A compound for a resist underlayer film composition, shown by the following general formula (1), $$W\text{---}(X)_n \quad (1)$$

wherein W represents an n-valent organic group having 2 to 50 carbon atoms; X represents a monovalent organic group shown by the following general formula (1X); and "n" represents an integer of 1 to 10, (1X′)
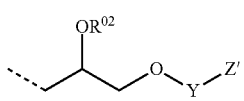

wherein the dotted line represents a bonding arm; $R^{01}$ represents an acryloyl group or a methacryloyl group; Y represents a single bond or a carbonyl group; and Z represents a group shown by the following general formula (1Z), (1Z)
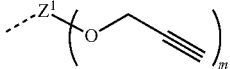

wherein the dotted line represents a bonding arm; $Z^1$ represents an (m+1)-valent aromatic group having 6 to 20 carbon atoms; and "m" represents an integer of 1 to 5.

22. The compound for a resist underlayer film composition according to claim 21, wherein the compound shown by the general formula (1) comprises a compound shown by any one of the following general formulae (2-1) to (2-68), (2-1)
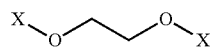

(2-2)
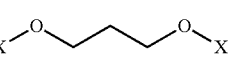

(2-3)
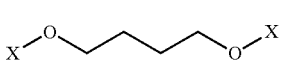

(2-4)

(2-5)
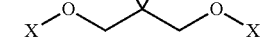

(2-6)
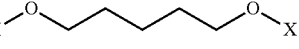

(2-7)
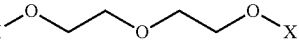

(2-8)

(2-9)

(2-10)
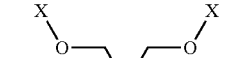

(2-11)
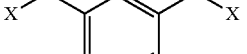

(2-12)
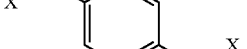

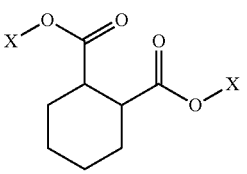

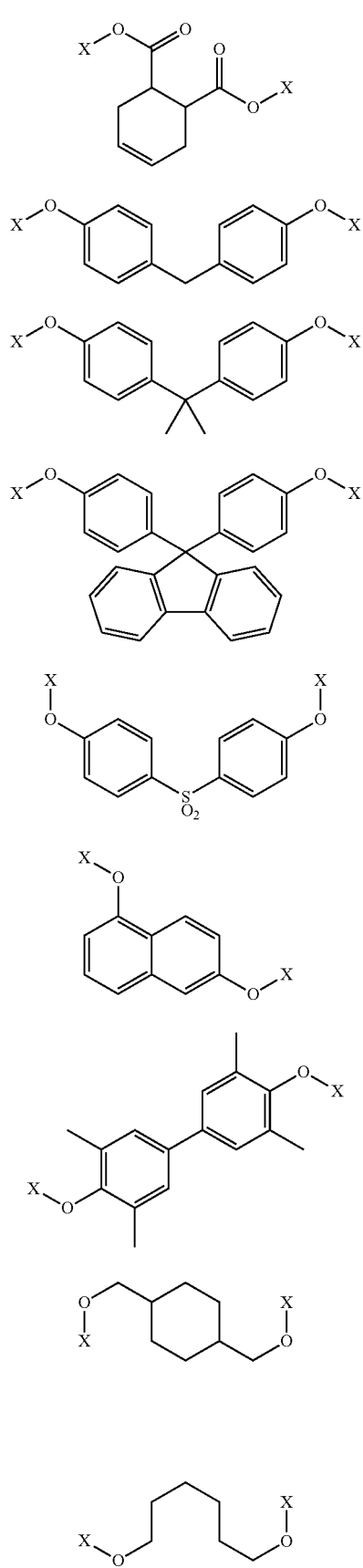
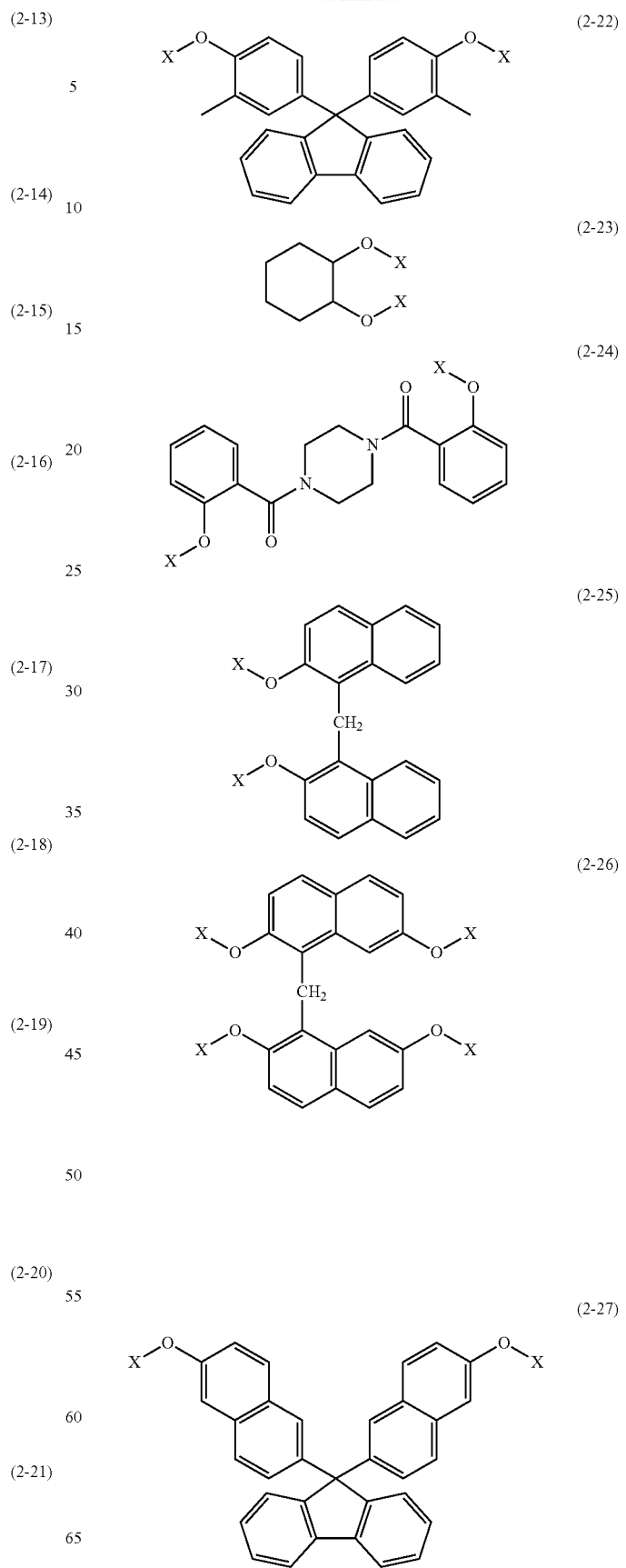

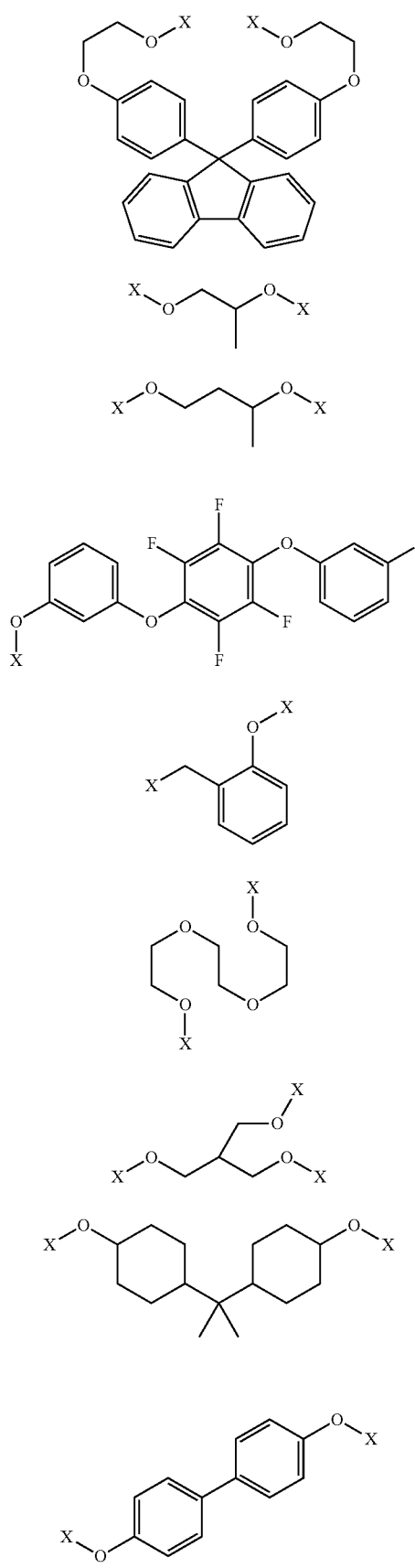
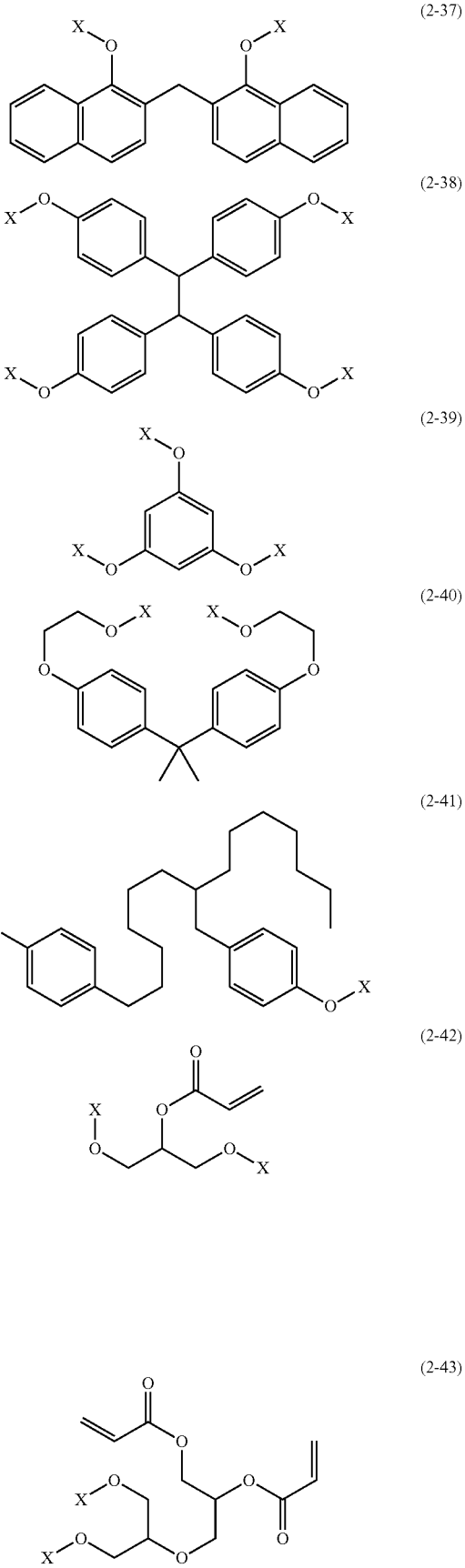

(2-44) 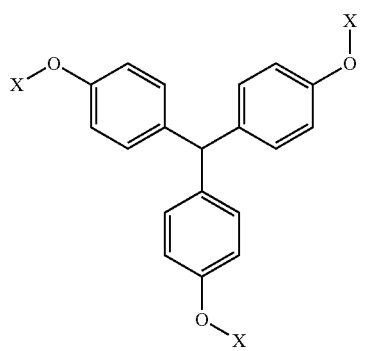
(2-45) 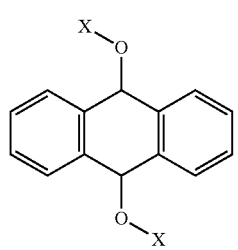
(2-46) 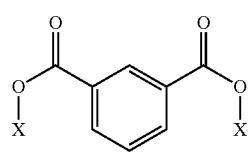
(2-47) 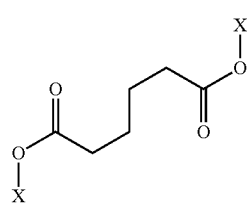
(2-48) 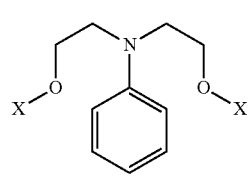
(2-49) 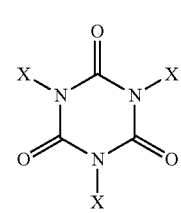
(2-50) 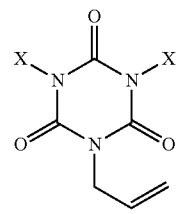
(2-51) 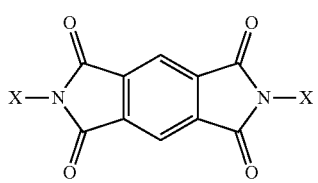
(2-52) 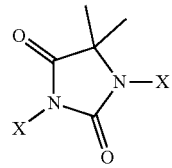
(2-53) 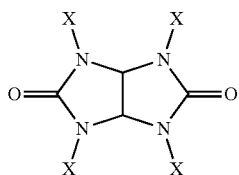
(2-54) 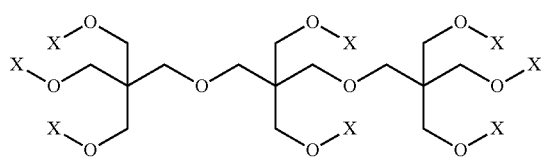
(2-55) 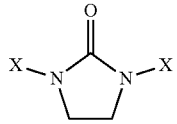
(2-56) 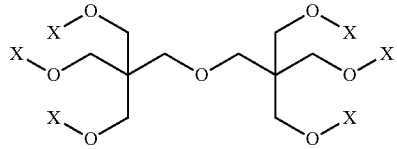
(2-57) 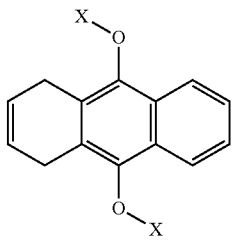
(2-58) 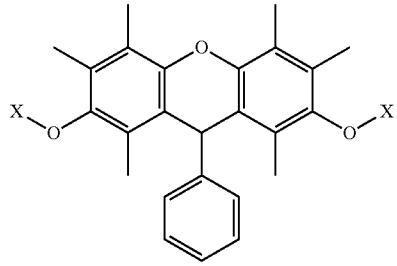

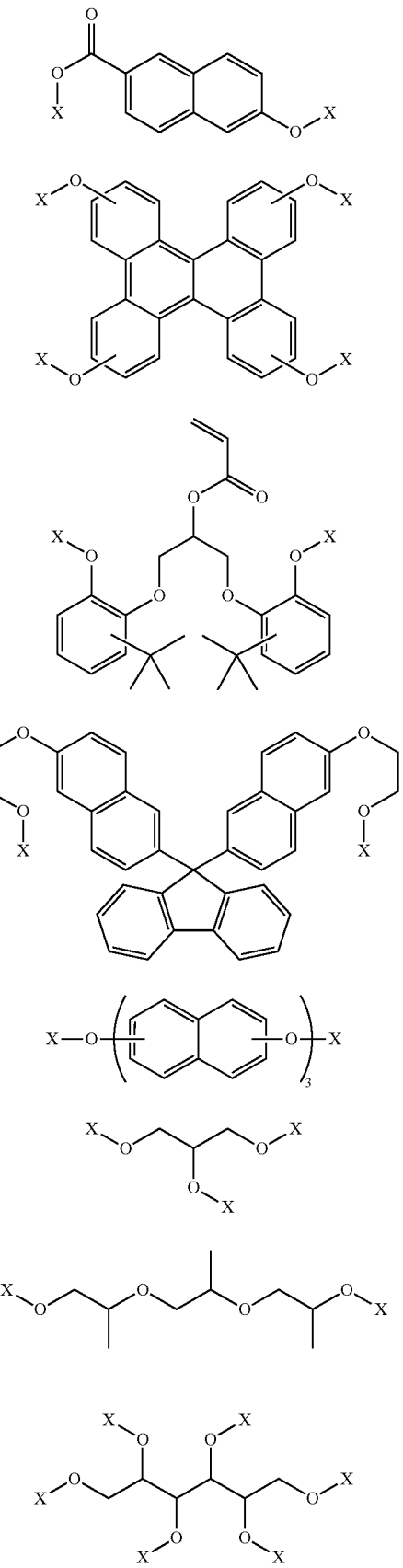

(2-59)
(2-60)
(2-61)
(2-62)
(2-63)
(2-64)
(2-65)
(2-66)

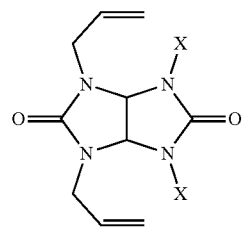

(2-67)

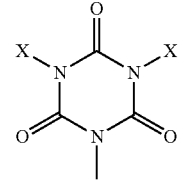

(2-68)

wherein X represents a monovalent organic group shown by the following general formula (1X)

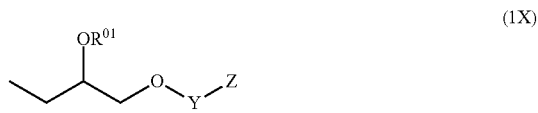

(1X)

wherein the dotted line represents a bonding arm; $R^{01}$ represents an acryloyl group or a methacryloyl group; Y represents a single bond or a carbonyl group; and Z represents a monovalent organic group having 1 to 30 carbon atoms.

23. A compound for a resist underlayer film composition, shown by the following general formula (1'),

(1')

wherein W represents an n-valent organic group having 2 to 50 carbon atoms; X' represents a monovalent organic group shown by the following general formula (1X'); and "n" represents an integer of 1 to 10,

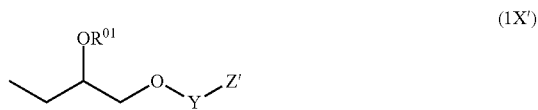

(1X')

wherein the dotted line represents a bonding arm; $R^{01}$ represents an acryloyl group or a methacryloyl group; Y represents a carbonyl group; and Z' represents a group shown by the following general formula (2Z),

(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

24. The compound for a resist underlayer film composition according to claim 23, wherein the compound shown by the general formula (1') comprises a compound shown by any one of the following general formulae (5-1) to (5-68),

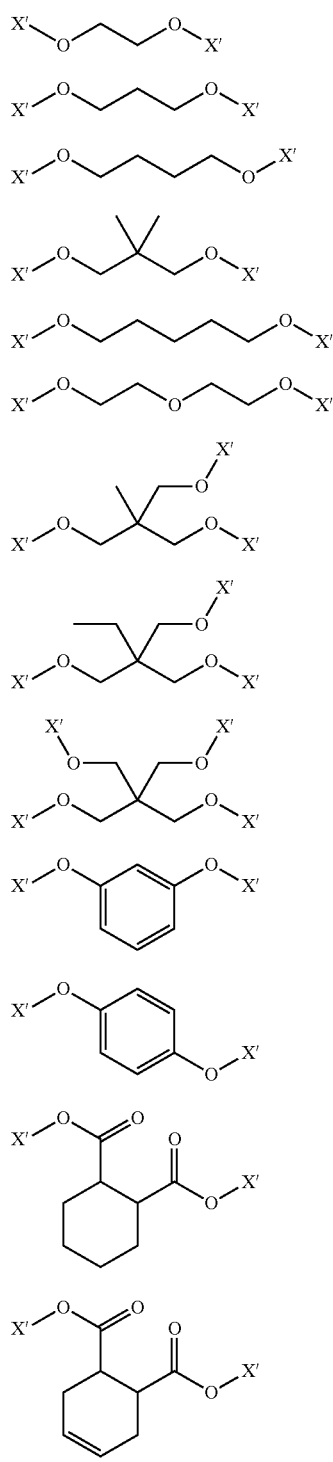

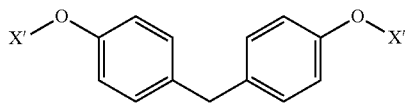

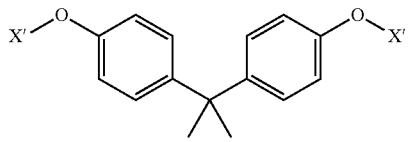

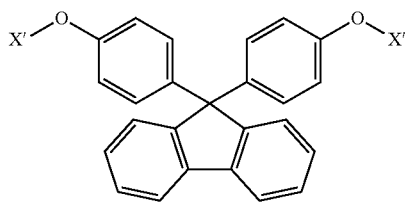

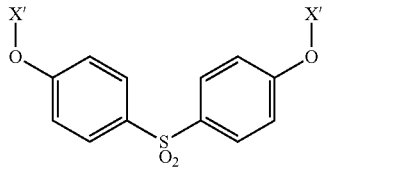

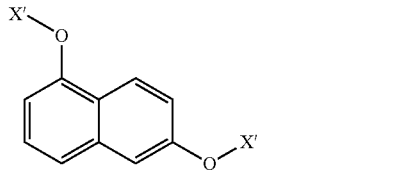

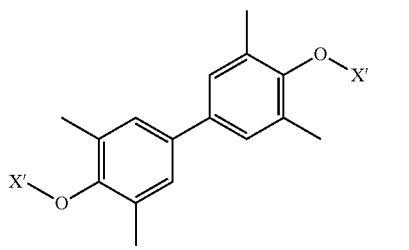

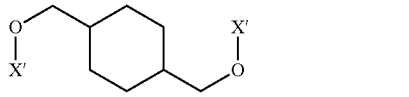

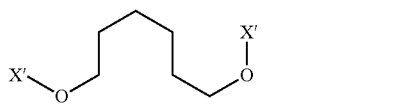

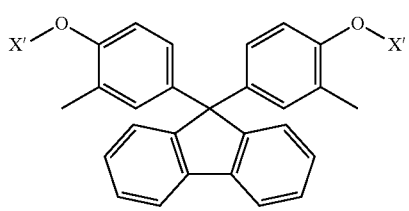

(5-23) 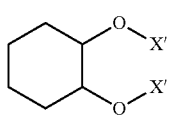
(5-24) 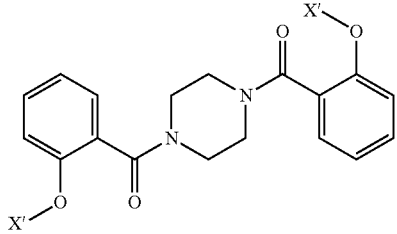
(5-25) 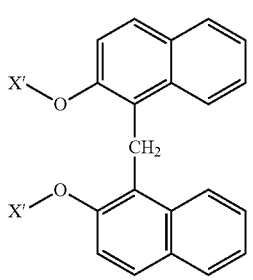
(5-26) 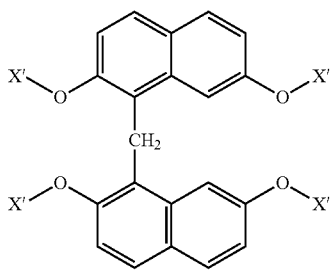
(5-27) 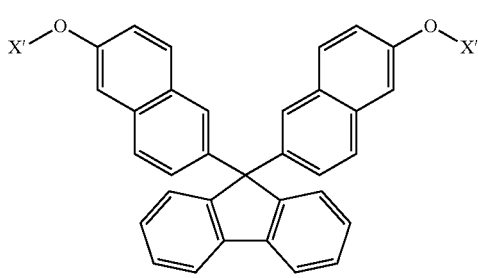
(5-28) 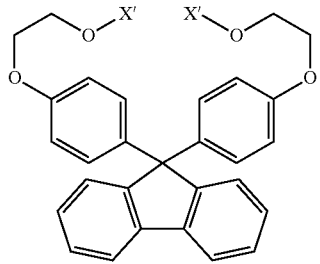
(5-29) 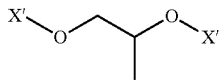
(5-30) 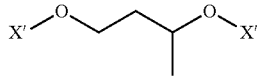
(5-31) 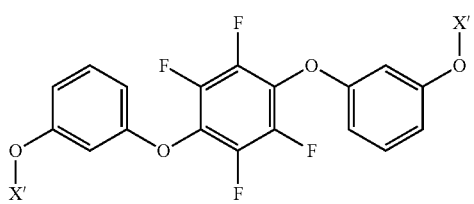
(5-32) 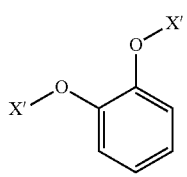
(5-33) 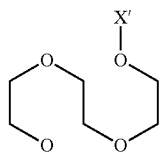
(5-34) 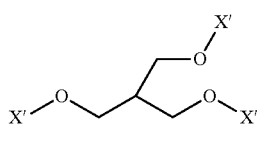
(5-35) 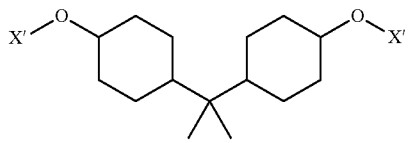
(5-36) 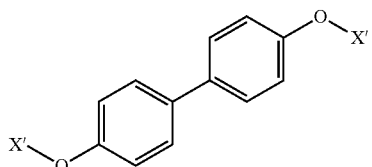
(5-37) 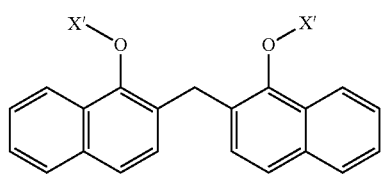
(5-38) 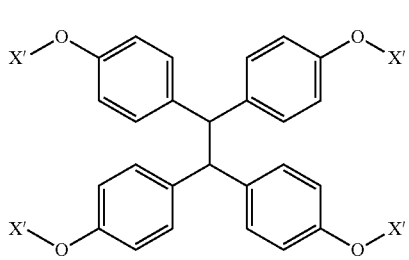

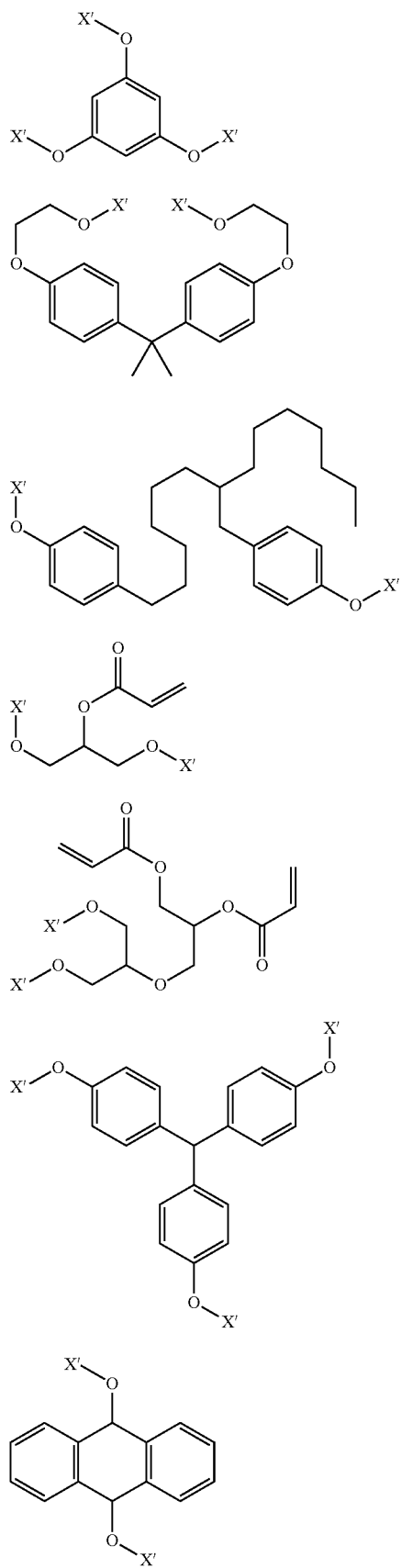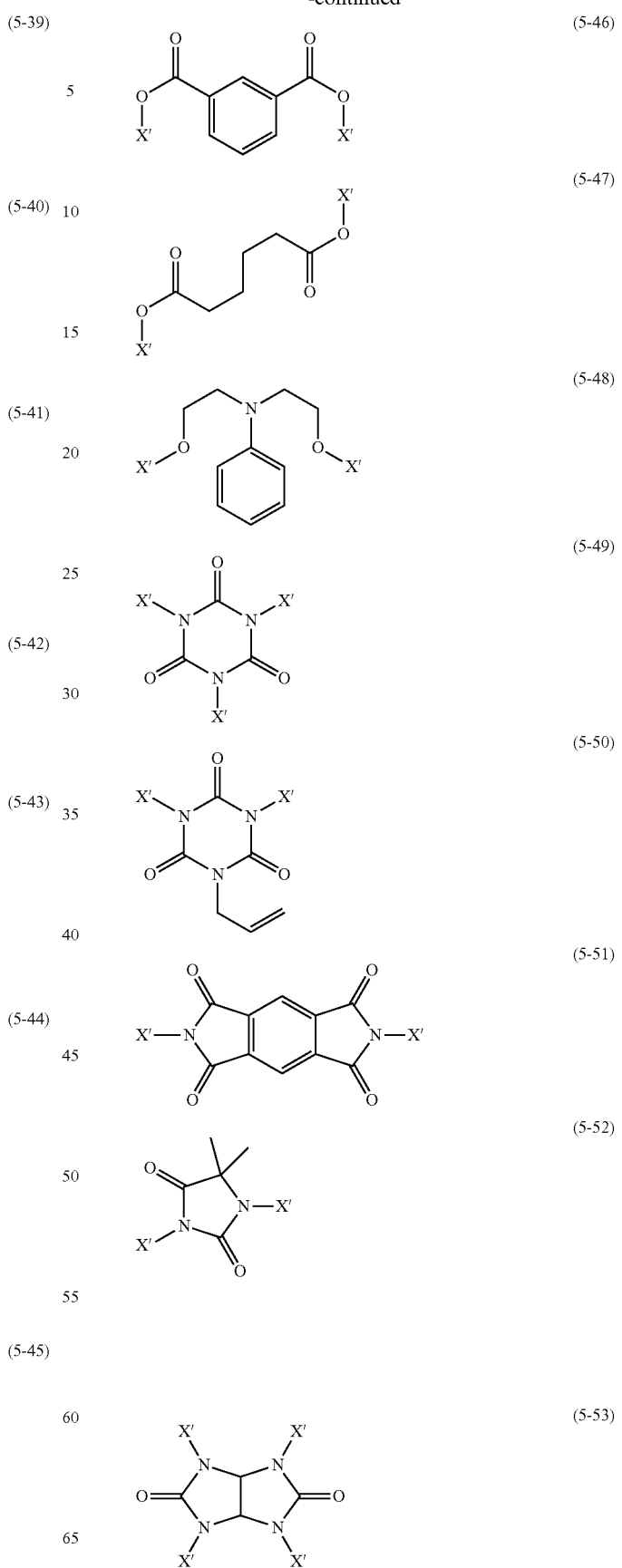

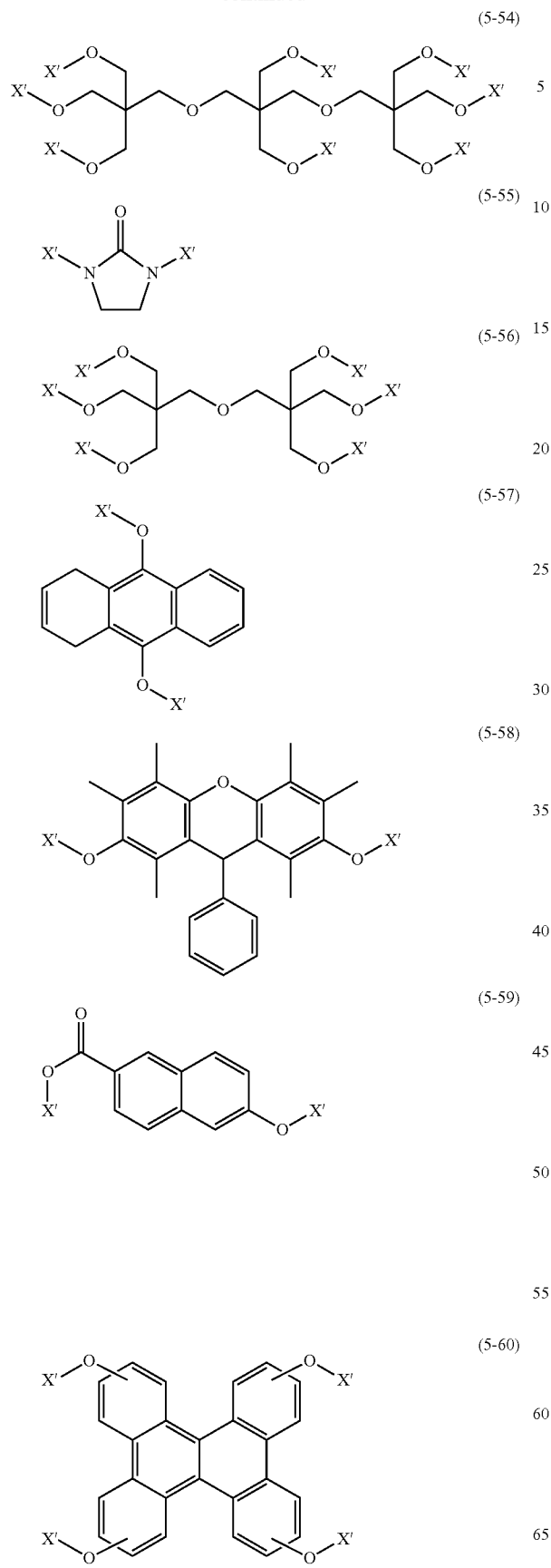
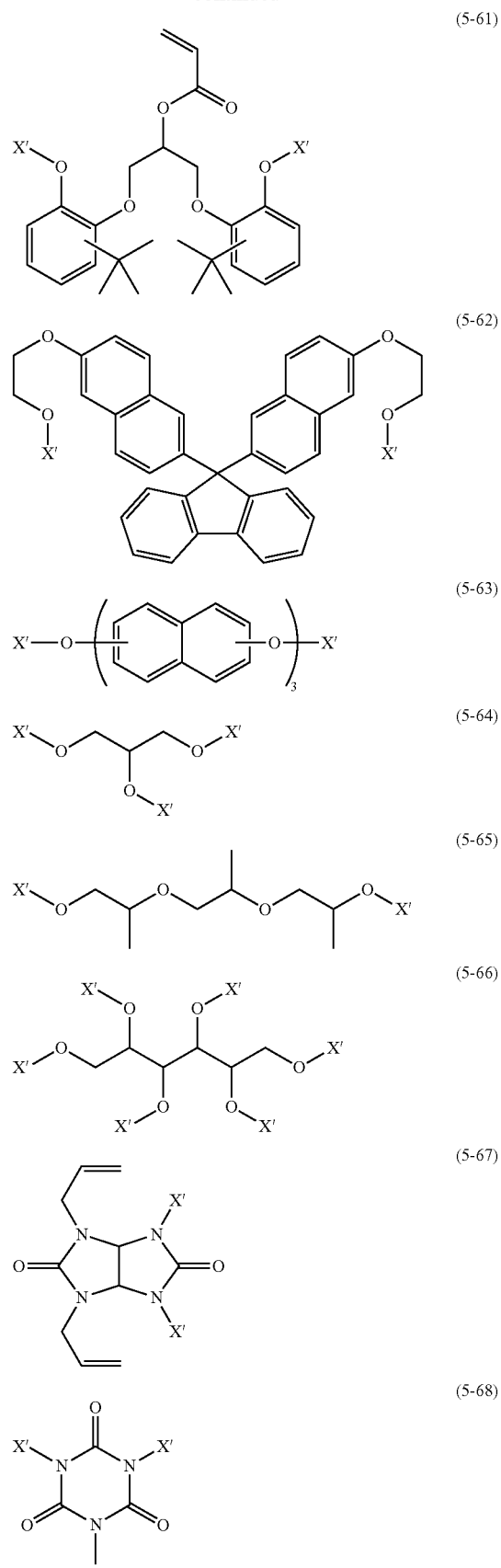

wherein X' represents a monovalent organic group shown by the following general formula (1X'); and "n" represents an integer of 1 to 10,

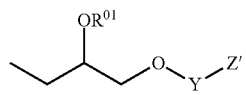
(1X')

wherein the dotted line represents a bonding arm; $R^{01}$ represents an acryloyl group or a methacryloyl group; Y represents a carbonyl group; and Z' represents a group shown by the following general formula (2Z),

(2Z)

wherein the dotted line represents a bonding arm; $Z^2$ represents an (r+1)-valent aromatic group having 6 to 10 carbon atoms; $R^Z$ represents a halogen atom, a hydroxyl group, a nitro group, or a monovalent organic group having 1 to 6 carbon atoms and optionally containing one or more atoms selected from the group consisting of an oxygen atom, a nitrogen atom, and a halogen atom; when a plurality of $R^Z$ are contained, the plurality of $R^Z$ are optionally bonded to each other to form a ring together with the carbon atoms bonded thereto; and "r" represents an integer of 0 to 5.

25. A resist underlayer film composition for use in a multilayer resist method, comprising:

(A) an organic solvent; and
(B) a compound shown by the following formula (2-15):

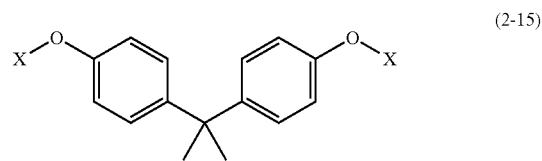
(2-15)

wherein
X represents a monovalent organic group shown by the following general formula (1X),

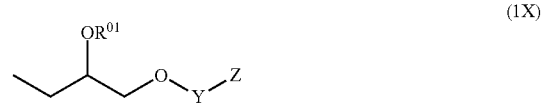
(1X)

wherein
the dotted line represents a bonding arm;
$R^{01}$ represents an acryloyl group or a methacryloyl group;
Y represents a single bond or a carbonyl group; and
Z represents a group shown by the following general formula (1Z),

(1Z)

wherein
the dotted line represents a bonding arm;
$Z^1$ represents an (m+1)-valent aromatic group having 6 to 20 carbon atoms; and
"m" represents an integer of 1 to 5.

* * * * *